United States Patent

Honma et al.

(10) Patent No.: US 12,354,652 B2
(45) Date of Patent: Jul. 8, 2025

(54) MEMORY DEVICE APPLYING PLURAL DIFFERENT READ VOLTAGES TO A WORD LINE IN A READ OPERATION

(71) Applicant: Kioxia Corporation, Tokyo (JP)

(72) Inventors: Mitsuaki Honma, Fujisawa Kanagawa (JP); Noboru Shibata, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 329 days.

(21) Appl. No.: 17/885,382

(22) Filed: Aug. 10, 2022

(65) Prior Publication Data

US 2023/0207000 A1    Jun. 29, 2023

(30) Foreign Application Priority Data

Dec. 24, 2021  (JP) .................................. 2021-210885

(51) Int. Cl.
G11C 16/26      (2006.01)
G11C 11/56      (2006.01)

(52) U.S. Cl.
CPC ...... G11C 11/5642 (2013.01); G11C 11/5671 (2013.01); G11C 16/26 (2013.01)

(58) Field of Classification Search
CPC .......................... G11C 11/5642; G11C 11/5671
See application file for complete search history.

(56) References Cited

U.S. PATENT DOCUMENTS

| | | |
|---|---|---|
| 8,837,213 B2 | 9/2014 | Shibata |
| 9,190,161 B2 | 11/2015 | Shibata |
| 9,224,476 B2 | 12/2015 | Shibata |
| 9,558,828 B2 | 1/2017 | Shibata |
| 9,640,265 B1 | 5/2017 | Honma |
| 9,799,406 B2 | 10/2017 | Sato et al. |
| 10,049,749 B2 | 8/2018 | Shibata |
| 10,249,377 B2 | 4/2019 | Kasai et al. |
| 10,566,051 B2 | 2/2020 | Shibata et al. |
| 10,714,170 B2 | 7/2020 | Shibata et al. |
| 10,916,300 B2 | 2/2021 | Shibata |
| 10,943,651 B2 | 3/2021 | Shibata et al. |

(Continued)

FOREIGN PATENT DOCUMENTS

JP      4892307 B2    12/2011

OTHER PUBLICATIONS

U.S. Appl. No. 17/874,968, First Named Inventor: Noboru Shibata; Title: "Semiconductor Memory Device, Memory System, and Write Method"; filed Jul. 27, 2022.

*Primary Examiner* — Alfredo Bermudez Lozada
(74) *Attorney, Agent, or Firm* — Holtz, Holtz & Volek PC

(57) ABSTRACT

According to one embodiment, a memory device is configured to execute an efficient read operation is provided. The memory device includes a plurality of memory cells, a word line, and a controller. Each of the memory cells stores first to fifth bit data based on the threshold voltage. The memory cells store a first page to a fifth page respectively corresponding to the first bit data to the fifth bit data. A word line is coupled to the memory cells. A controller executes a read operation for reading data from the memory cells by applying a read voltage to the word line. Numbers of times the controller applies read voltages different from one another to the word line in read operations for the first page to the fifth page are 7, 6, 6, 6, and 6, respectively.

18 Claims, 106 Drawing Sheets

(56) References Cited

U.S. PATENT DOCUMENTS

| | | |
|---|---|---|
| 11,011,239 B2 | 5/2021 | Shibata et al. |
| 11,238,925 B2 | 2/2022 | Shibata et al. |
| 2005/0213393 A1 | 9/2005 | Lasser |
| 2008/0062758 A1 | 3/2008 | Honma et al. |
| 2020/0303000 A1* | 9/2020 | Takahashi .............. G11C 16/32 |
| 2021/0151099 A1 | 5/2021 | Shibata et al. |
| 2021/0264990 A1 | 8/2021 | Shibata et al. |
| 2021/0358542 A1 | 11/2021 | Lee et al. |
| 2021/0398598 A1 | 12/2021 | Shibuya et al. |
| 2022/0115064 A1 | 4/2022 | Shibata et al. |

* cited by examiner

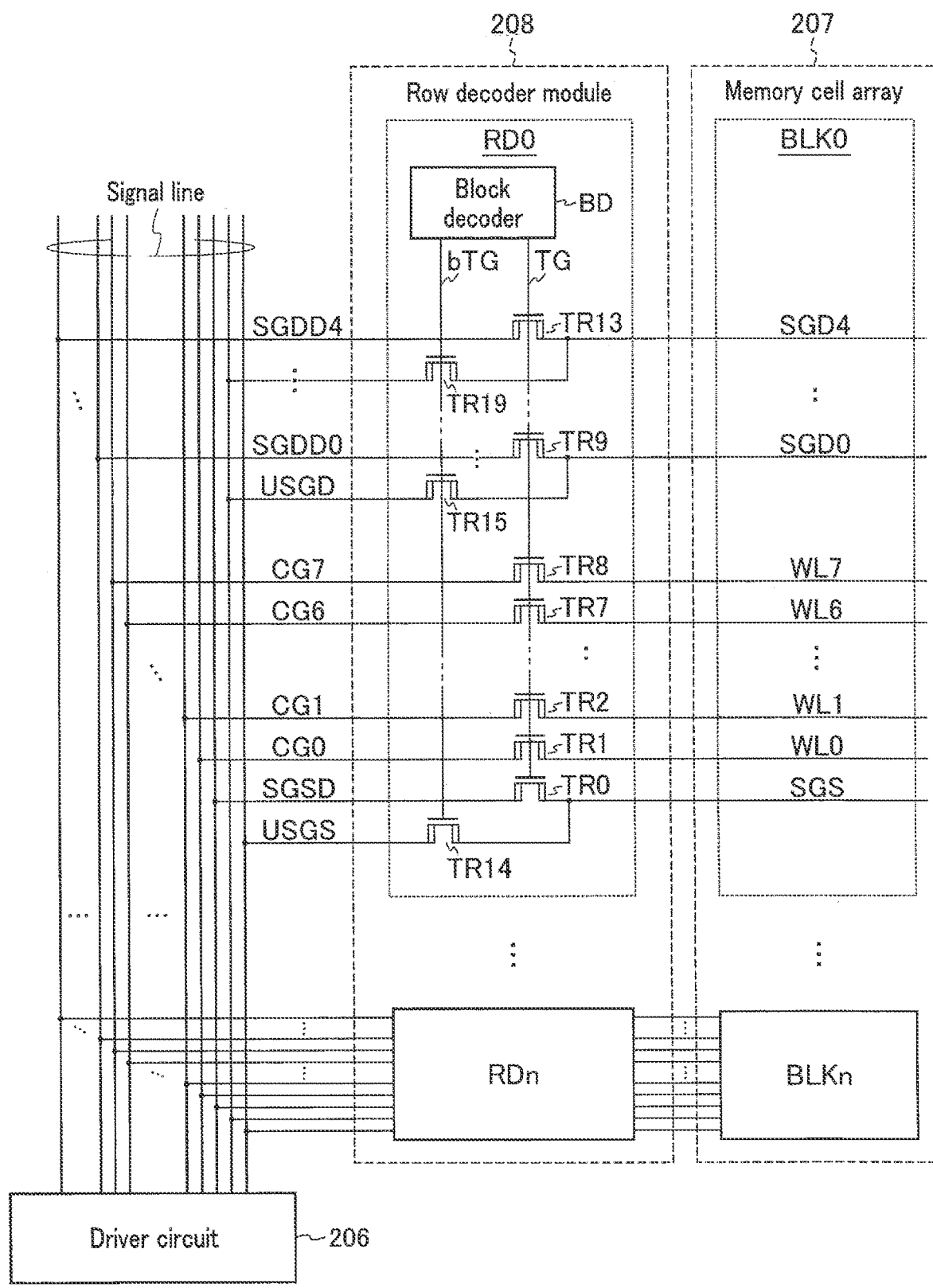
F I G. 5

FIG. 8

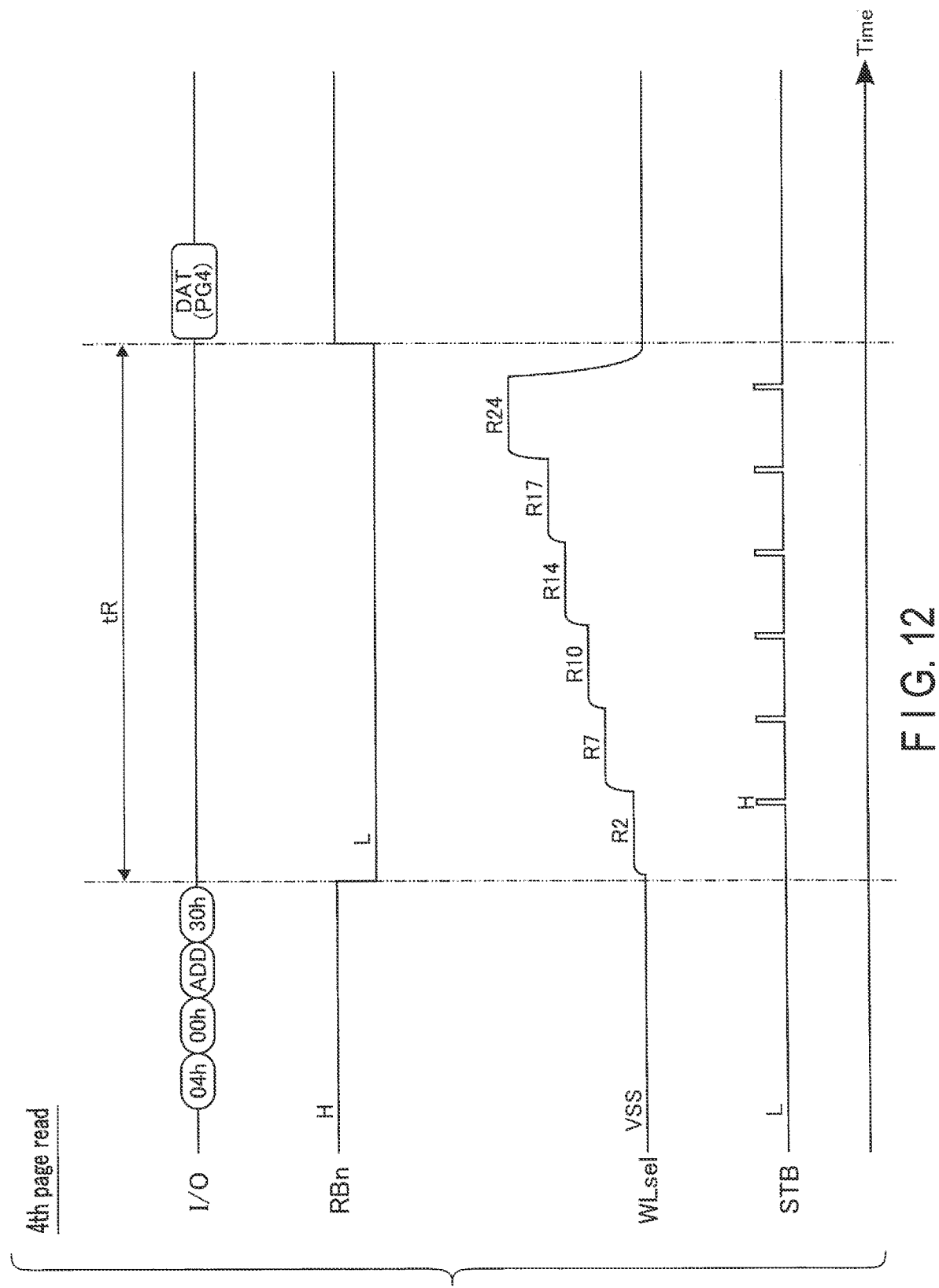
F I G. 12

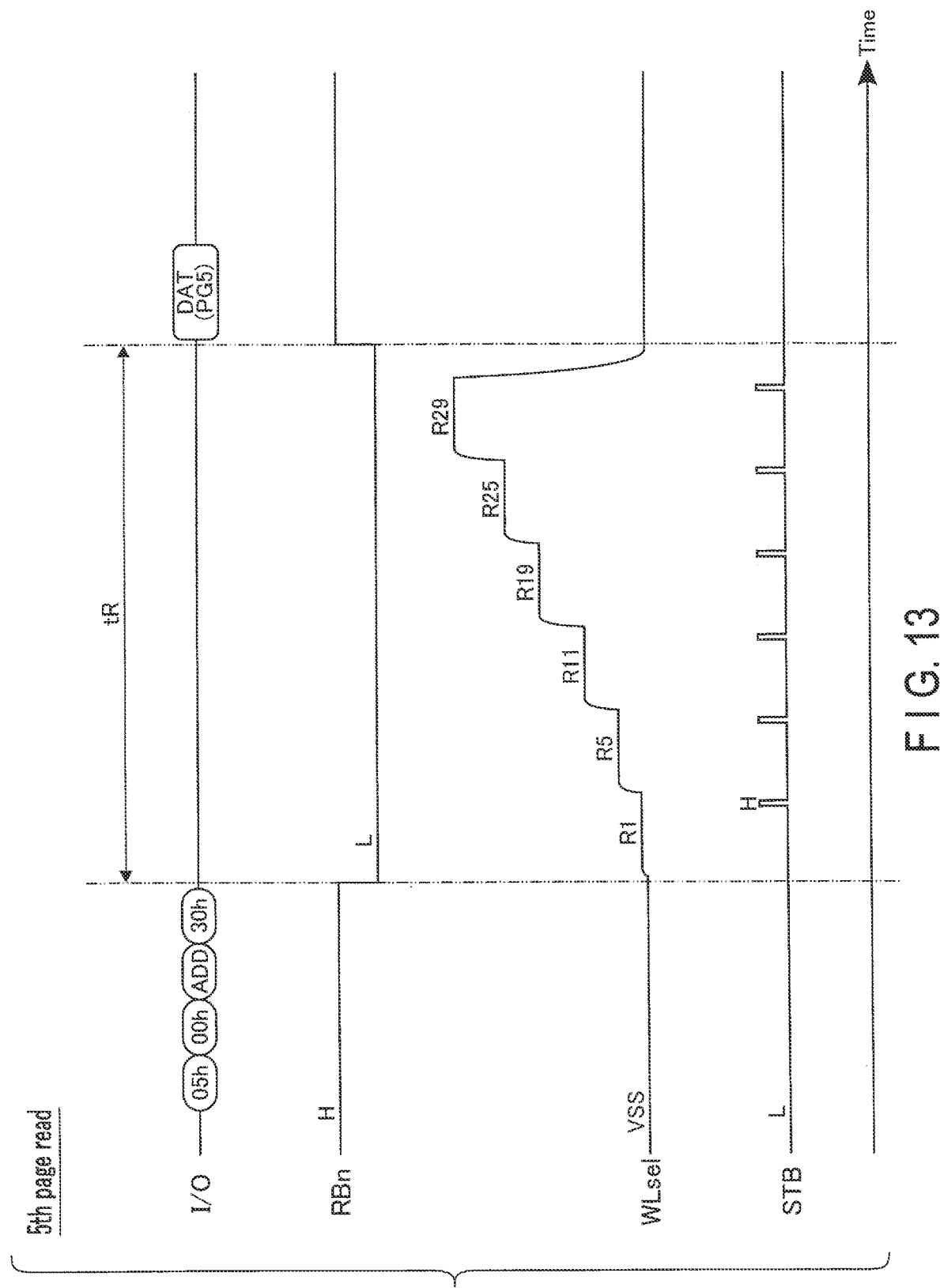
F I G. 13

1st modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 17 | 19 | 3 | 11 | 15 | 13 | 12 | 8 | 0 | 2 | 18 | 22 | 23 | 7 | 5 | 1 | 9 | 25 | 27 | 26 | 10 | 14 | 6 | 4 | 20 | 21 | 29 |
| 1st page | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | 1 | 0 | 0 | 0 | 0 | 0 | 0 | 1 | 1 |
| 2nd page | 1 | 1 | 1 | 1 | 1 | 1 | 0 | 0 | 1 | 1 | 1 | 1 | 1 | 0 | 0 | 0 | 0 | 0 | 0 | 0 | 1 | 1 | 1 | 1 | 0 | 0 | 0 | 0 | 0 | 1 | 0 | 0 |
| 3rd page | 1 | 1 | 0 | 0 | 0 | 0 | 0 | 0 | 0 | 0 | 1 | 1 | 1 | 1 | 0 | 0 | 1 | 1 | 0 | 0 | 0 | 0 | 0 | 0 | 1 | 1 | 1 | 1 | 0 | 0 | 0 | 1 |
| 4th page | 1 | 1 | 0 | 0 | 0 | 0 | 1 | 1 | 0 | 0 | 0 | 0 | 1 | 1 | 1 | 0 | 0 | 1 | 1 | 0 | 0 | 1 | 1 | 0 | 0 | 1 | 1 | 0 | 0 | 0 | 0 | 0 |
| 5th page | 1 | 0 | 0 | 1 | 1 | 0 | 0 | 1 | 1 | 0 | 0 | 1 | 0 | 0 | 0 | 0 | 0 | 1 | 1 | 1 | 1 | 1 | 0 | 0 | 0 | 0 | 1 | 0 | 0 | 0 | 1 | 1 |

Read voltage

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 1st page | | | | | | | R7 | | | | | | | | | R15 | | | | | | | | | R25 | | | | R29 | | | |
| 2nd page | | | | | | R6 | | R8 | | | | | | | | | R16 | | | | R20 | | | | | | | | R28 | | R30 | |
| 3rd page | | R2 | | | | | | | | R9 | | R11 | | R13 | | | | R17 | | R19 | | R21 | | R23 | | R25 | | R27 | | | | R31 |
| 4th page | | R2 | | R4 | | | R6 | | R8 | | | | R12 | | R14 | | | R17 | | R19 | | R21 | | R23 | | R25 | | R27 | | | | |
| 5th page | R1 | | | R3 | | R5 | | R7 | | R9 | | R11 | | | | | | R17 | | | | | R23 | | | | R26 | | | R30 | | |

FIG. 14

2nd modification
Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 8 | 9 | 1 | 5 | 7 | 23 | 19 | 18 | 26 | 10 | 14 | 12 | 4 | 0 | 16 | 17 | 25 | 27 | 11 | 3 | 2 | 6 | 22 | 20 | 21 | 29 | 13 | 15 |
| 1st page | 1 | 1 | 1 | 1 | 0 | 1 | 1 | 0 | 0 | 1 | 1 | 1 | 1 | 0 | 0 | 0 | 0 | 0 | 1 | 1 | 1 | 1 | 1 | 0 | 0 | 0 | 1 | 1 | 1 | 1 | 0 | 1 |
| 2nd page | 1 | 1 | 1 | 1 | 1 | 1 | 0 | 0 | 1 | 0 | 0 | 0 | 0 | 0 | 0 | 0 | 0 | 0 | 0 | 0 | 0 | 0 | 1 | 0 | 0 | 0 | 0 | 0 | 1 | 1 | 1 | 1 |
| 3rd page | 1 | 1 | 0 | 0 | 1 | 0 | 0 | 1 | 1 | 0 | 0 | 0 | 1 | 1 | 1 | 1 | 0 | 0 | 0 | 0 | 0 | 0 | 0 | 0 | 0 | 1 | 1 | 1 | 0 | 0 | 0 | 1 |
| 4th page | 1 | 1 | 0 | 0 | 0 | 0 | 0 | 0 | 1 | 1 | 1 | 1 | 0 | 0 | 1 | 1 | 0 | 0 | 0 | 0 | 1 | 1 | 1 | 1 | 1 | 1 | 0 | 0 | 0 | 0 | 0 | 1 |
| 5th page | 1 | 0 | 0 | 0 | 0 | 1 | 1 | 0 | 1 | 1 | 0 | 0 | 0 | 0 | 0 | 0 | 0 | 0 | 0 | 1 | 1 | 1 | 1 | 1 | 0 | 0 | 0 | 0 | 1 | 1 | 1 | 1 |

Read voltage

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 1st page | R1 | | R4 | | R6 | | | R9 | | | R12 | R13 | | | | R18 | | R20 | | R22 | R23 | | | R26 | | | R29 | R30 | |
| 2nd page | | R2 | | | | R5 | | | R8 | | | | | | | | R17 | | | R21 | | | | R25 | | R27 | | | | |
| 3rd page | | | R3 | | | | R7 | | | R10 | R11 | | | R14 | R15 | | | | R19 | | | | | | | | R28 | | | |
| 4th page | | | | | | | | | | | | | | | | R16 | | | | | | R24 | | | | | | | R31 | |
| 5th page | | | | | | | | | | | | | | | | | | | | | | | | | | | | | | |

4th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 25 | 17 | 19 | 23 | 7 | 15 | 14 | 12 | 4 | 0 | 16 | 18 | 26 | 27 | 11 | 3 | 1 | 5 | 21 | 20 | 22 | 6 | 2 | 10 | 8 | 9 | 13 | 29 |
| 1st page | 1 | 1 | 1 | 1 | 1 | 1 | 1 | 0 | 0 | 0 | 0 | 0 | 0 | 0 | 1 | 1 | 1 | 1 | 0 | 0 | 0 | 0 | 1 | 1 | 1 | 0 | 0 | 0 | 0 | 0 | 0 | 1 |
| 2nd page | 1 | 1 | 1 | 1 | 0 | 0 | 0 | 0 | 0 | 1 | 1 | 1 | 0 | 0 | 0 | 0 | 1 | 1 | 1 | 0 | 0 | 0 | 0 | 1 | 1 | 0 | 0 | 1 | 0 | 0 | 0 | 1 |
| 3rd page | 1 | 1 | 0 | 0 | 0 | 0 | 1 | 1 | 1 | 1 | 1 | 1 | 1 | 1 | 0 | 0 | 0 | 1 | 0 | 0 | 1 | 1 | 0 | 0 | 1 | 1 | 1 | 0 | 0 | 1 | 0 | 1 |
| 4th page | 1 | 0 | 0 | 0 | 0 | 1 | 0 | 1 | 1 | 1 | 0 | 0 | 1 | 0 | 0 | 0 | 0 | 1 | 1 | 1 | 1 | 0 | 0 | 0 | 0 | 1 | 0 | 1 | 0 | 0 | 0 | 0 |
| 5th page | 1 | 0 | 0 | 0 | 1 | 1 | 1 | 1 | 1 | 1 | 1 | 0 | 0 | 0 | 0 | 0 | 0 | 1 | 1 | 1 | 1 | 1 | 0 | 0 | 0 | 0 | 0 | 0 | 0 | 1 | 1 | 1 |

Read voltage

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 1st page | | R1 | | | | | R8 | | | | | | | R18 | | | | | | R22 | | | | | | R31 | | | | | | |
| 2nd page | | | R2 | | | R5 | | R9 | | | | R14 | | | | | R19 | | | | | R25 | | | R27 | | R30 | | | | | |
| 3rd page | | | | R3 | | R6 | R7 | | | R11 | | | R13 | | | R16 | | R20 | | | R23 | | | R26 | | | | R28 | | | | |
| 4th page | | | | | R4 | | | | R10 | | R12 | | | R15 | | R17 | | | R21 | | | R24 | | | | | | | R29 | | | |
| 5th page | | | | | | | | | | | | | | | | | | | | | | | | | | | | | | | | |

FIG. 20

5th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 8 | 0 | 2 | 3 | 19 | 23 | 22 | 20 | 4 | 12 | 13 | 9 | 1 | 17 | 16 | 18 | 26 | 10 | 14 | 6 | 7 | 5 | 21 | 29 | 25 | 27 | 11 | 15 |
| 1st page | 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 | 0 | 0 | 1 | 1 | 1 | 1 | 1 | 1 |
| 2nd page | 1 | 1 | 1 | 1 | 1 | 0 | 0 | 0 | 1 | 1 | 1 | 1 | 1 | 0 | 0 | 0 | 0 | 0 | 0 | 0 | 0 | 1 | 1 | 1 | 1 | 0 | 0 | 1 | 1 | 1 | 1 | 1 |
| 3rd page | 1 | 1 | 0 | 0 | 0 | 0 | 0 | 0 | 1 | 0 | 0 | 1 | 1 | 0 | 0 | 0 | 0 | 0 | 0 | 0 | 0 | 1 | 1 | 1 | 1 | 1 | 0 | 0 | 0 | 0 | 1 | 1 |
| 4th page | 1 | 1 | 1 | 0 | 0 | 0 | 0 | 1 | 1 | 1 | 1 | 1 | 0 | 0 | 0 | 0 | 1 | 1 | 1 | 1 | 1 | 1 | 1 | 1 | 1 | 0 | 0 | 0 | 0 | 1 | 1 | 1 |
| 5th page | 1 | 0 | 0 | 0 | 0 | 0 | 0 | 1 | 1 | 0 | 0 | 0 | 0 | 0 | 0 | 1 | 1 | 1 | 0 | 0 | 0 | 0 | 0 | 0 | 1 | 1 | 0 | 0 | 0 | 1 | 1 | 1 |

Read voltage

| | R1 | R2 | R3 | R4 | R5 | R6 | R7 | R8 | R9 | R10 | R11 | R12 | R13 | R14 | R15 | R16 | R17 | R18 | R19 | R20 | R21 | R22 | R23 | R24 | R25 | R26 | R27 | R28 | R29 | R30 | R31 |
|---|---|---|---|---|---|---|---|---|---|---|---|---|---|---|---|---|---|---|---|---|---|---|---|---|---|---|---|---|---|---|---|
| 1st page | | | | R4 | | | | R8 | | | | R12 | | | | R16 | | | | R20 | | | | R24 | | | | R28 | | | | |
| 2nd page | | | R3 | | R5 | | | | | | R11 | | R13 | | | | R17 | | | | R21 | | R23 | | R25 | | R27 | | | | | |
| 3rd page | | R2 | | | | R6 | | | R9 | | | | | | R15 | | | | | R20 | | R22 | | R24 | | R26 | | | R29 | | | |
| 4th page | | | | | | | R7 | | | R10 | | | | R14 | | | | R18 | | | | | | | | | | | | | | |
| 5th page | R1 | | | | | | | | | | | | | | | | | | R19 | | | | | | | | | | | R30 | R31 |

FIG. 22

6th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 17 | 19 | 3 | 11 | 15 | 13 | 12 | 8 | 0 | 2 | 18 | 22 | 20 | 4 | 5 | 1 | 9 | 25 | 27 | 26 | 10 | 14 | 6 | 7 | 23 | 21 | 29 |
| 1st page | 1 | 1 | 1 | 1 | 1 | 1 | 1 | 0 | 0 | 0 | 0 | 0 | 0 | 0 | 0 | 1 | 1 | 0 | 0 | 0 | 0 | 0 | 1 | 1 | 0 | 0 | 0 | 0 | 0 | 1 | 1 | 1 |
| 2nd page | 1 | 1 | 1 | 1 | 0 | 0 | 0 | 0 | 0 | 1 | 1 | 1 | 1 | 1 | 0 | 0 | 0 | 0 | 0 | 0 | 1 | 1 | 1 | 1 | 1 | 0 | 0 | 0 | 0 | 1 | 1 | 1 |
| 3rd page | 1 | 1 | 0 | 0 | 0 | 0 | 1 | 1 | 1 | 1 | 1 | 1 | 0 | 0 | 0 | 0 | 1 | 1 | 1 | 1 | 0 | 0 | 0 | 0 | 1 | 1 | 1 | 1 | 1 | 0 | 0 | 1 |
| 4th page | 1 | 1 | 1 | 0 | 0 | 1 | 1 | 1 | 1 | 1 | 0 | 0 | 0 | 1 | 1 | 1 | 0 | 0 | 0 | 1 | 1 | 1 | 0 | 0 | 0 | 0 | 1 | 1 | 1 | 1 | 0 | 0 |
| 5th page | 1 | 0 | 0 | 0 | 0 | 0 | 1 | 1 | 1 | 1 | 1 | 0 | 0 | 0 | 0 | 1 | 1 | 0 | 0 | 1 | 1 | 0 | 0 | 1 | 1 | 0 | 0 | 0 | 1 | 1 | 1 | 1 |

Read voltage

| | R1 | R2 | R3 | R4 | R5 | R6 | R7 | R8 | R9 | R10 | R11 | R12 | R13 | R14 | R15 | R16 | R17 | R18 | R19 | R20 | R21 | R22 | R23 | R24 | R25 | R26 | R27 | R28 | R29 | R30 | R31 |
|---|---|---|---|---|---|---|---|---|---|---|---|---|---|---|---|---|---|---|---|---|---|---|---|---|---|---|---|---|---|---|---|
| 1st page | | | | | | | R7 | | | | | | | | | | | | | | | R22 | | | | | | | | R30 | |
| 2nd page | | | | R4 | | | | | R9 | | | | | | | R16 | | | | | R21 | | | | | R26 | | | | | R31 |
| 3rd page | | R2 | | | | R6 | | | | | R11 | | | | | | R17 | | | | R21 | | | | R25 | | | | | R30 | |
| 4th page | | | R3 | | R5 | | | | | R10 | | | | R14 | | R16 | | | R19 | | | R22 | | | | R26 | | | R29 | | R31 |
| 5th page | R1 | | | | | R6 | | R8 | | | R11 | | | | R15 | | | R18 | R19 | | R21 | | R23 | | R25 | | | R28 | R29 | R30 | R31 |

8th modification
Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 17 | 1 | 5 | 13 | 15 | 11 | 3 | 19 | 18 | 22 | 20 | 4 | 12 | 14 | 10 | 26 | 27 | 25 | 9 | 8 | 0 | 2 | 6 | 7 | 23 | 21 | 29 |
| 1st page | 1 | 1 | 1 | 1 | 1 | 1 | 0 | 0 | 0 | 0 | 0 | 0 | 1 | 1 | 0 | 1 | 0 | 0 | 0 | 0 | 1 | 1 | 1 | 0 | 0 | 0 | 0 | 0 | 0 | 1 | 1 | 1 |
| 2nd page | 1 | 1 | 1 | 1 | 0 | 1 | 0 | 0 | 1 | 1 | 0 | 0 | 0 | 0 | 0 | 0 | 0 | 1 | 1 | 1 | 1 | 1 | 0 | 0 | 0 | 0 | 0 | 0 | 1 | 1 | 0 | 1 |
| 3rd page | 1 | 1 | 0 | 0 | 0 | 0 | 0 | 1 | 1 | 1 | 1 | 1 | 0 | 0 | 0 | 0 | 1 | 1 | 0 | 0 | 1 | 1 | 0 | 0 | 0 | 0 | 0 | 1 | 1 | 1 | 1 | 1 |
| 4th page | 1 | 1 | 0 | 0 | 0 | 1 | 1 | 1 | 1 | 1 | 1 | 1 | 1 | 1 | 0 | 0 | 0 | 0 | 0 | 0 | 0 | 0 | 0 | 1 | 0 | 0 | 1 | 1 | 1 | 1 | 0 | 0 |
| 5th page | 1 | 0 | 0 | 0 | 0 | 1 | 1 | 1 | 1 | 1 | 1 | 1 | 1 | 1 | 1 | 1 | 0 | 0 | 0 | 0 | 0 | 1 | 1 | 1 | 0 | 0 | 0 | 0 | 1 | 1 | 1 | 1 |

Read voltage

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 1st page | R1 | | R2 | | R3 | | R4 | | | R6 | | | | | R11 | | R16 | | | R20 | | | R23 | | R25 | | R27 | | R29 | | R31 |
| 2nd page | | | | R5 | | | | R7 | | | R9 | | | | | | | | R17 | | | R21 | | | | | | | | | | |
| 3rd page | | | | | | | | R8 | | | R10 | | R12 | | | | | | R18 | | | R22 | | | | | R26 | | R28 | | R30 | |
| 4th page | | | | | | | | | | | | | R13 | | | | | | | R19 | | | | | | | | | | | | |
| 5th page | | | | | | | | | | | | | | R14 | R15 | | | | | | | | | R24 | | | | | | | | |

12th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 17 | 19 | 3 | 11 | 15 | 13 | 12 | 8 | 0 | 2 | 18 | 22 | 23 | 7 | 5 | 1 | 9 | 25 | 29 | 21 | 20 | 4 | 6 | 14 | 10 | 26 | 27 |
| 1st page | 1 | 1 | 1 | 1 | 1 | 1 | 1 | 0 | 0 | 0 | 0 | 0 | 0 | 0 | 0 | 1 | 1 | 1 | 0 | 0 | 0 | 0 | 1 | 1 | 1 | 1 | 0 | 0 | 0 | 0 | 1 | 1 |
| 2nd page | 1 | 1 | 1 | 0 | 0 | 0 | 0 | 0 | 0 | 1 | 1 | 1 | 1 | 1 | 1 | 0 | 0 | 0 | 0 | 0 | 1 | 1 | 1 | 1 | 0 | 0 | 0 | 1 | 0 | 1 | 1 | 1 |
| 3rd page | 1 | 1 | 0 | 0 | 0 | 0 | 0 | 0 | 0 | 1 | 1 | 1 | 1 | 1 | 1 | 1 | 1 | 1 | 1 | 1 | 0 | 0 | 0 | 0 | 1 | 0 | 1 | 1 | 0 | 0 | 0 | 0 |
| 4th page | 1 | 1 | 1 | 0 | 0 | 0 | 0 | 1 | 0 | 0 | 1 | 0 | 0 | 0 | 0 | 1 | 1 | 1 | 0 | 0 | 0 | 0 | 1 | 1 | 0 | 1 | 1 | 1 | 0 | 1 | 0 | 1 |
| 5th page | 1 | 0 | 0 | 0 | 0 | 1 | 1 | 1 | 1 | 1 | 1 | 1 | 0 | 0 | 0 | 0 | 0 | 1 | 1 | 1 | 1 | 1 | 1 | 1 | 1 | 0 | 0 | 0 | 0 | 0 | 1 | 1 |

Read voltage

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| 1st page | | | | R4 | | | R7 | | | | | R13 | | | R15 | | | R18 | | | R21 | | | R24 | | | R26 | | | R28 | R30 | |
| 2nd page | | | R3 | | | R6 | | R8 | R9 | | | R12 | | | | R16 | | | | R20 | | R22 | R23 | | | R25 | | R27 | | R29 | | |
| 3rd page | | R2 | | | | | | | | R10 | R11 | | | R14 | | | R17 | | R19 | | | | | | | | | | | | | |
| 4th page | | | | | R5 | | R6 | | | | | | | | | | | | | | | | | | | R25 | | | | | | |
| 5th page | R1 | | | | | | | | | | | | | | | | | R17 | | | | | | | | | | | | | | R31 |

14th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 17 | 19 | 3 | 11 | 15 | 13 | 12 | 8 | 0 | 2 | 18 | 22 | 20 | 4 | 5 | 1 | 9 | 25 | 29 | 21 | 23 | 7 | 6 | 14 | 10 | 26 | 27 |
| 1st page | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 |
| 2nd page | 1 | 1 | 1 | 0 | 0 | 0 | 0 | 0 | 0 | 0 | 0 | 1 | 1 | 1 | 1 | 1 | 1 | 1 | 0 | 0 | 0 | 0 | 0 | 0 | 0 | 0 | 0 | 0 | 1 | 1 | 1 | 1 |
| 3rd page | 1 | 1 | 0 | 0 | 0 | 1 | 1 | 1 | 1 | 1 | 0 | 0 | 0 | 0 | 0 | 0 | 1 | 1 | 1 | 1 | 1 | 0 | 0 | 0 | 0 | 0 | 1 | 1 | 1 | 1 | 0 | 0 |
| 4th page | 1 | 0 | 0 | 0 | 0 | 0 | 1 | 1 | 1 | 0 | 0 | 0 | 1 | 1 | 1 | 0 | 0 | 0 | 0 | 0 | 1 | 1 | 0 | 0 | 1 | 1 | 1 | 1 | 1 | 0 | 0 | 1 |
| 5th page | 1 | 0 | 0 | 0 | 0 | 1 | 1 | 1 | 1 | 0 | 0 | 1 | 1 | 0 | 0 | 0 | 0 | 1 | 0 | 1 | 1 | 1 | 1 | 1 | 1 | 1 | 0 | 0 | 0 | 0 | 1 | 1 |

Read voltage

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 1st page | R7 | | | | | | | | | | | | | | | | | | | | | | | R26 | | | | | | | |
| 2nd page | R3 | | | | | | | | R8 | | | | | | | R18 | | | | | | | | R24 | | | | | R30 | | | |
| 3rd page | R2 | | R5 | | | R9 | | | | | R13 | | | | | R17 | | | R20 | | | R23 | | | R26 | | | R29 | | | | |
| 4th page | R1 | | R4 | | | | R8 | | R11 | | | R14 | | | R17 | | | R20 | | | R22 | | R25 | | | R27 | | | | R30 | | |
| 5th page | R1 | | R4 | | | R7 | | | R10 | | | R13 | | R15 | | | R17 | | R19 | | R21 | | | | | R26 | | | | R30 | | R31 |

15th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 17 | 19 | 3 | 11 | 15 | 13 | 5 | 1 | 0 | 2 | 18 | 22 | 20 | 4 | 12 | 8 | 9 | 25 | 29 | 21 | 23 | 7 | 6 | 14 | 10 | 26 | 27 |
| 1st page | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 1 | 1 | 1 | 1 | 0 | 0 | 0 | 0 | 0 | 1 |
| 2nd page | 1 | 1 | 1 | 1 | 0 | 0 | 0 | 0 | 1 | 1 | 1 | 1 | 1 | 1 | 1 | 1 | 0 | 0 | 0 | 0 | 1 | 1 | 1 | 1 | 0 | 0 | 0 | 0 | 1 | 1 | 1 | 1 |
| 3rd page | 1 | 1 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 0 | 0 | 0 | 1 | 1 | 1 | 0 | 0 |
| 4th page | 1 | 0 | 0 | 0 | 0 | 1 | 1 | 1 | 1 | 0 | 0 | 1 | 1 | 0 | 1 | 1 | 0 | 0 | 0 | 0 | 0 | 1 | 1 | 0 | 0 | 1 | 1 | 1 | 1 | 1 | 1 | 1 |
| 5th page | 1 | 0 | 0 | 0 | 1 | 1 | 1 | 1 | 1 | 1 | 1 | 1 | 1 | 1 | 0 | 0 | 0 | 0 | 0 | 0 | 1 | 1 | 1 | 1 | 1 | 1 | 0 | 0 | 0 | 0 | 0 | 1 |

Read voltage

| | R1 | R2 | R3 | R4 | R5 | R6 | R7 | R8 | R9 | R10 | R11 | R12 | R13 | R14 | R15 | R16 | R17 | R18 | R19 | R20 | R21 | R22 | R23 | R24 | R25 | R26 | R27 | R28 | R29 | R30 | R31 |
|---|---|---|---|---|---|---|---|---|---|---|---|---|---|---|---|---|---|---|---|---|---|---|---|---|---|---|---|---|---|---|---|
| 1st page | | | | | | | R7 | | | | | | | | | | | | | | | | | | | R26 | | | | | |
| 2nd page | | | | R4 | | | | | | | R11 | | | | | | | | | R20 | | | | R24 | | | | R28 | | | |
| 3rd page | | R2 | | | | R6 | | | | R10 | | | | R14 | | | | R18 | | | | R22 | | | | | | | R29 | | |
| 4th page | R1 | | | | R5 | | | R8 | | | R11 | | | | R15 | | R17 | | | | R21 | | R23 | | R25 | | R27 | | | | |
| 5th page | R1 | | R3 | | | | | | R9 | | | R12 | R13 | | | R16 | | | R19 | | | | | | | R26 | | | | | R31 |

16th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 8 | 10 | 14 | 6 | 22 | 20 | 21 | 29 | 13 | 12 | 4 | 0 | 16 | 17 | 19 | 23 | 7 | 5 | 1 | 9 | 25 | 27 | 26 | 18 | 2 | 3 | 11 | 15 |
| 1st page | 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 |
| 2nd page | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 |
| 3rd page | 1 | 0 | 0 | 0 | 0 | 0 | 1 | 1 | 1 | 1 | 1 | 1 | 1 | 1 | 1 | 0 | 0 | 0 | 0 | 0 | 0 | 0 | 0 | 0 | 0 | 1 | 1 | 1 | 1 | 1 | 1 | 1 |
| 4th page | 1 | 1 | 1 | 0 | 0 | 1 | 1 | 1 | 0 | 0 | 0 | 1 | 1 | 0 | 0 | 0 | 0 | 1 | 1 | 1 | 1 | 1 | 1 | 1 | 1 | 1 | 0 | 0 | 0 | 1 | 1 | 1 |
| 5th page | 1 | 0 | 0 | 0 | 0 | 0 | 0 | 0 | 0 | 0 | 1 | 1 | 0 | 0 | 0 | 0 | 0 | 1 | 1 | 1 | 1 | 1 | 1 | 1 | 1 | 0 | 0 | 0 | 0 | 1 | 1 | 1 |

Read voltage

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| 1st page | R1 | | | | R8 | | | | R9 | | | | R16 | | | | R17 | | | | R24 | | | | R25 | | | | | | | |
| 2nd page | | R2 | | | | | | | | R10 | | | | R12 | | | | R18 | | | | R20 | | | | R26 | | | | R28 | | |
| 3rd page | | | R3 | | | R6 | | | | | R11 | | | | R14 | | | | R19 | | | | R22 | | | | R27 | | | | R30 | |
| 4th page | | | | R4 | | | R7 | | | | | R13 | | | R15 | | | | | R21 | | | R23 | | | | | | | | | |
| 5th page | | | | | R5 | | | | | | | | | | | | | | | | | | | | | | | | | | | R31 |

21st modification
Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 8 | 10 | 14 | 6 | 22 | 18 | 26 | 27 | 25 | 9 | 1 | 5 | 7 | 23 | 19 | 17 | 16 | 0 | 2 | 3 | 11 | 15 | 13 | 12 | 4 | 20 | 21 | 29 |
| 1st page | 1 | 1 | 1 | 1 | 1 | 1 | 0 | 0 | 1 | 1 | 1 | 1 | 0 | 0 | 0 | 0 | 1 | 1 | 1 | 1 | 0 | 0 | 0 | 0 | 0 | 0 | 0 | 0 | 0 | 0 | 0 | 1 |
| 2nd page | 1 | 1 | 1 | 0 | 0 | 0 | 0 | 1 | 0 | 0 | 0 | 0 | 1 | 1 | 1 | 0 | 0 | 0 | 0 | 1 | 1 | 0 | 0 | 0 | 1 | 1 | 1 | 1 | 0 | 0 | 0 | 1 |
| 3rd page | 1 | 1 | 0 | 0 | 0 | 1 | 1 | 1 | 1 | 1 | 0 | 0 | 0 | 0 | 1 | 1 | 1 | 0 | 0 | 0 | 0 | 0 | 0 | 1 | 1 | 1 | 0 | 0 | 0 | 0 | 1 | 1 |
| 4th page | 1 | 0 | 0 | 0 | 0 | 0 | 0 | 0 | 0 | 0 | 0 | 1 | 1 | 1 | 1 | 1 | 1 | 1 | 1 | 1 | 1 | 0 | 0 | 0 | 0 | 0 | 0 | 0 | 0 | 0 | 0 | 1 |
| 5th page | 1 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 |

Read voltage

| | R1 | R2 | R3 | R4 | R5 | R6 | R7 | R8 | R9 | R10 | R11 | R12 | R13 | R14 | R15 | R16 | R17 | R18 | R19 | R20 | R21 | R22 | R23 | R24 | R25 | R26 | R27 | R28 | R29 | R30 | R31 |
|---|---|---|---|---|---|---|---|---|---|---|---|---|---|---|---|---|---|---|---|---|---|---|---|---|---|---|---|---|---|---|---|
| 1st page | | | | | | | | | | | | | | | | | | | | | | | | | | | | | | | |
| 2nd page | | | | | | | | | | | | | | | | | | | | | | | | | | | | | | | |
| 3rd page | | | | | | | | | | | | | | | | | | | | | | | | | | | | | | | |
| 4th page | | | | | | | | | | | | | | | | | | | | | | | | | | | | | | | |
| 5th page | | | | | | | | | | | | | | | | | | | | | | | | | | | | | | | |

FIG. 40

23rd modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 25 | 17 | 19 | 18 | 26 | 10 | 14 | 12 | 4 | 5 | 1 | 3 | 2 | 6 | 22 | 20 | 16 | 0 | 8 | 9 | 13 | 29 | 21 | 23 | 7 | 15 | 11 | 27 |
| 1st page | 1 | 1 | 1 | 1 | 1 | 1 | 1 | 1 | 1 | 0 | 0 | 0 | 0 | 0 | 0 | 0 | 0 | 0 | 0 | 1 | 1 | 1 | 0 | 0 | 0 | 0 | 1 | 1 | 0 | 0 | 1 | 1 |
| 2nd page | 1 | 1 | 1 | 1 | 1 | 0 | 0 | 0 | 0 | 1 | 1 | 1 | 1 | 0 | 0 | 0 | 0 | 0 | 1 | 1 | 0 | 0 | 1 | 1 | 1 | 1 | 0 | 0 | 0 | 0 | 1 | 1 |
| 3rd page | 1 | 1 | 0 | 0 | 0 | 0 | 0 | 0 | 0 | 0 | 1 | 1 | 1 | 1 | 1 | 0 | 0 | 1 | 1 | 0 | 0 | 0 | 0 | 0 | 1 | 1 | 0 | 0 | 1 | 1 | 1 | 0 |
| 4th page | 1 | 1 | 0 | 0 | 0 | 0 | 0 | 1 | 1 | 1 | 0 | 0 | 1 | 1 | 0 | 0 | 1 | 1 | 0 | 0 | 0 | 0 | 0 | 1 | 1 | 1 | 0 | 0 | 1 | 1 | 1 | 1 |
| 5th page | 1 | 0 | 0 | 0 | 1 | 1 | 1 | 1 | 0 | 0 | 0 | 1 | 1 | 0 | 0 | 1 | 1 | 0 | 0 | 0 | 0 | 0 | 0 | 1 | 1 | 1 | 1 | 1 | 1 | 1 | 1 | 1 |

Read voltage

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 1st page | | R1 | | R2 | | | | | R3 | | | | | | | | | R18 | | R21 | | | | | | R25 | | R28 | | | | |
| 2nd page | | | | | R4 | | | | | R8 | | | R12 | | | | | | R19 | | R22 | | | | R26 | | | | R29 | | | |
| 3rd page | | | R5 | | | | | | | | R10 | | | R14 | | | R17 | | | | | R23 | | | | | R27 | | | R30 | | |
| 4th page | | | | R6 | | | | R9 | | | | R11 | | R15 | | | R16 | | | | | | R24 | | | | | R31 | | | | |
| 5th page | R2? | | | | R7 | | | | | | R13 | | | R16 | | | | | | | | | | | R27 | | | | | | | |

26th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 0 | 2 | 3 | 11 | 15 | 13 | 29 | 21 | 20 | 22 | 18 | 26 | 10 | 14 | 6 | 7 | 23 | 19 | 17 | 1 | 5 | 4 | 12 | 8 | 9 | 25 | 27 |
| 1st page | 1 | 1 | 1 | 1 | 1 | 0 | 0 | 0 | 0 | 0 | 0 | 1 | 1 | 1 | 1 | 1 | 1 | 0 | 0 | 0 | 0 | 1 | 1 | 1 | 1 | 0 | 0 | 0 | 0 | 0 | 1 | 1 |
| 2nd page | 1 | 1 | 1 | 0 | 0 | 0 | 0 | 0 | 1 | 1 | 0 | 0 | 0 | 0 | 1 | 1 | 1 | 1 | 1 | 0 | 0 | 0 | 0 | 0 | 0 | 0 | 0 | 1 | 1 | 1 | 0 | 1 |
| 3rd page | 1 | 1 | 1 | 0 | 0 | 0 | 0 | 1 | 0 | 1 | 1 | 1 | 1 | 0 | 0 | 0 | 0 | 0 | 1 | 1 | 1 | 1 | 0 | 0 | 1 | 1 | 1 | 1 | 1 | 1 | 0 | 0 |
| 4th page | 1 | 1 | 0 | 0 | 0 | 0 | 0 | 1 | 0 | 1 | 1 | 1 | 0 | 0 | 0 | 0 | 0 | 1 | 1 | 1 | 1 | 1 | 1 | 1 | 1 | 1 | 0 | 0 | 0 | 0 | 0 | 1 |
| 5th page | 1 | 0 | 0 | 0 | 0 | 0 | 0 | 1 | 1 | 1 | 1 | 1 | 1 | 0 | 0 | 0 | 0 | 0 | 0 | 0 | 1 | 1 | 1 | 1 | 1 | 1 | 0 | 0 | 0 | 1 | 1 | 1 |

Read voltage

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| 1st page | | | | | R5 | | | | | | | R11 | | | | | | | | | | | R21 | | R24 | | | R27 | | | R30 | |
| 2nd page | | R2 | | R4 | | R6 | | R8 | | | R10 | | R12 | | | R15 | | R17 | | R19 | | | R22 | | | R25 | | | R28 | | | |
| 3rd page | | | R3 | | | | R7 | | R9 | | | | | | R14 | | R16 | | R18 | | | | | R23 | | | R26 | | | R29 | | |
| 4th page | | | | | | | | | | | | | R13 | | | | | | | R20 | | | | | | | | | | | | |
| 5th page | R1 | | | | | | | | | | | | | | | | | | | | | | | | | | | | | | | R31 |

F I G. 44

27th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 8 | 0 | 4 | 20 | 22 | 23 | 7 | 5 | 1 | 9 | 25 | 27 | 19 | 3 | 2 | 6 | 14 | 12 | 13 | 29 | 21 | 17 | 16 | 18 | 26 | 10 | 11 | 15 |
| 1st page | 1 | 1 | 1 | 1 | 0 | 0 | 0 | 1 | 1 | 1 | 1 | 0 | 0 | 0 | 1 | 1 | 0 | 0 | 0 | 0 | 0 | 1 | 1 | 1 | 1 | 1 | 1 | 1 | 1 | 1 | 1 | 1 |
| 2nd page | 1 | 1 | 1 | 1 | 0 | 0 | 0 | 0 | 0 | 0 | 0 | 0 | 0 | 0 | 0 | 1 | 1 | 1 | 1 | 1 | 1 | 1 | 1 | 1 | 0 | 0 | 0 | 0 | 0 | 1 | 1 | 1 |
| 3rd page | 1 | 1 | 0 | 0 | 0 | 0 | 0 | 0 | 0 | 0 | 1 | 1 | 1 | 1 | 1 | 1 | 1 | 1 | 1 | 1 | 0 | 0 | 0 | 0 | 0 | 0 | 0 | 1 | 1 | 0 | 0 | 1 |
| 4th page | 1 | 1 | 1 | 1 | 1 | 0 | 0 | 0 | 0 | 1 | 1 | 1 | 1 | 1 | 1 | 1 | 1 | 1 | 1 | 0 | 0 | 0 | 0 | 1 | 1 | 0 | 0 | 0 | 0 | 0 | 0 | 1 |
| 5th page | 1 | 0 | 0 | 0 | 0 | 0 | 0 | 0 | 0 | 1 | 1 | 1 | 1 | 1 | 1 | 1 | 1 | 1 | 0 | 0 | 0 | 0 | 0 | 1 | 1 | 1 | 0 | 0 | 0 | 0 | 1 | 1 |

Read voltage

| | | |
|---|---|---|
| 1st page | R4, R7, R14, R17, R23 | |
| 2nd page | R5, R10, R19, R24, R29 | |
| 3rd page | R3, R11, R16, R21, R28 | |
| 4th page | R2, R6, R13, R20, R25, R30 | |
| 5th page | R1, R9, R12, R18, R22, R26, R27, R31 | |

29th modification
Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 0 | 4 | 12 | 14 | 15 | 11 | 3 | 2 | 6 | 22 | 20 | 21 | 29 | 13 | 9 | 8 | 10 | 26 | 18 | 19 | 23 | 7 | 5 | 1 | 17 | 25 | 27 |
| 1st page | 1 | 1 | 1 | 1 | 1 | 0 | 0 | 0 | 0 | 0 | 0 | 0 | 0 | 0 | 0 | 1 | 1 | 1 | 1 | 1 | 0 | 0 | 1 | 1 | 1 | 1 | 0 | 0 | 1 | 1 | 1 | 1 |
| 2nd page | 1 | 1 | 1 | 1 | 0 | 0 | 1 | 1 | 1 | 1 | 0 | 0 | 0 | 0 | 1 | 1 | 0 | 1 | 1 | 0 | 0 | 1 | 0 | 0 | 1 | 0 | 0 | 0 | 0 | 0 | 0 | 1 |
| 3rd page | 1 | 1 | 0 | 0 | 0 | 0 | 1 | 1 | 1 | 1 | 0 | 0 | 1 | 1 | 0 | 0 | 0 | 1 | 0 | 0 | 1 | 1 | 0 | 0 | 0 | 0 | 1 | 1 | 0 | 0 | 0 | 0 |
| 4th page | 1 | 1 | 0 | 0 | 0 | 0 | 0 | 0 | 1 | 1 | 1 | 1 | 0 | 0 | 0 | 0 | 1 | 0 | 0 | 1 | 1 | 0 | 0 | 1 | 0 | 1 | 1 | 0 | 0 | 1 | 0 | 1 |
| 5th page | 1 | 0 | 0 | 1 | 0 | 0 | 0 | 0 | 0 | 1 | 1 | 1 | 1 | 0 | 0 | 1 | 1 | 1 | 1 | 1 | 0 | 0 | 0 | 0 | 1 | 1 | 1 | 1 | 1 | 1 | 1 | 1 |

Read voltage

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 1st page | | | | | R5 | | | | | | | | | | | | | | | | | | R26 | | | | | | | | | |
| 2nd page | | R2 | | R4 | | R6 | R7 | | | | | | | | | | | | | | | | | | | | R27 | | R28 | | R30 | |
| 3rd page | | | R3 | | | | | R8 | | R10 | R11 | | | | | | | | | | | | | | | | | | | | | |
| 4th page | | | | | | | | | R9 | | | R12 | R13 | | R15 | R16 | | | R19 | R20 | R21 | | | R24 | R25 | | | | | R29 | | R31 |
| 5th page | R1 | | | | | | | | | | | | | R14 | | | R17 | R18 | | | | R22 | R23 | | | | | | | | | |

FIG. 48

31st modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 25 | 17 | 19 | 23 | 7 | 5 | 1 | 9 | 8 | 12 | 4 | 6 | 22 | 18 | 26 | 10 | 14 | 15 | 13 | 29 | 21 | 20 | 16 | 0 | 2 | 3 | 11 | 27 |
| 1st page | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 |
| 2nd page | 1 | 1 | 1 | 1 | 0 | 0 | 0 | 0 | 0 | 0 | 0 | 0 | 1 | 1 | 1 | 1 | 1 | 0 | 0 | 0 | 0 | 1 | 1 | 1 | 1 | 1 | 0 | 0 | 0 | 0 | 0 | 1 |
| 3rd page | 1 | 1 | 0 | 0 | 0 | 0 | 1 | 1 | 1 | 1 | 0 | 0 | 0 | 0 | 0 | 1 | 0 | 0 | 1 | 1 | 1 | 1 | 0 | 0 | 0 | 1 | 1 | 0 | 0 | 1 | 1 | 0 |
| 4th page | 1 | 0 | 0 | 1 | 0 | 0 | 1 | 1 | 1 | 0 | 0 | 0 | 0 | 0 | 1 | 1 | 0 | 1 | 1 | 0 | 0 | 1 | 1 | 0 | 0 | 0 | 0 | 0 | 0 | 1 | 1 | 1 |
| 5th page | 1 | 0 | 0 | 0 | 1 | 1 | 1 | 0 | 1 | 0 | 0 | 1 | 0 | 1 | 1 | 0 | 0 | 0 | 0 | 0 | 1 | 1 | 1 | 1 | 1 | 0 | 0 | 0 | 0 | 0 | 1 | 1 |

Read voltage

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| 1st page | | | | | | | | | | | | | | | | | R16 | | | | | | | | | | | | | | | |
| 2nd page | | | | | R5 | | | R8 | | | R11 | | | | | | | R17 | | | | R21 | | | | R26 | | | | | R30 | |
| 3rd page | | R3 | | | | R6 | R7 | | R9 | R10 | | R12 | R13 | R14 | R15 | | | | R18 | R19 | R20 | | R22 | R23 | R24 | | R27 | | | R29 | | R31 |
| 4th page | R1 | R2 | | R4 | | | | | | | | | | | | | | | | | | | | | | R25 | | | R28 | | | |
| 5th page | | | | | | | | | | | | | | | | | | | | | | | | | | | | | | | | |

FIG. 49

32nd modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 17 | 1 | 5 | 7 | 6 | 14 | 10 | 26 | 27 | 25 | 9 | 8 | 0 | 2 | 18 | 22 | 20 | 4 | 12 | 13 | 29 | 21 | 23 | 19 | 3 | 11 | 15 |
| 1st page | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 |
| 2nd page | 1 | 1 | 1 | 0 | 0 | 0 | 0 | 0 | 0 | 0 | 0 | 1 | 1 | 1 | 0 | 0 | 0 | 0 | 0 | 0 | 0 | 0 | 1 | 1 | 1 | 1 | 1 | 1 | 1 | 0 | 0 | 1 |
| 3rd page | 1 | 1 | 0 | 0 | 0 | 0 | 0 | 1 | 1 | 1 | 1 | 1 | 1 | 1 | 0 | 0 | 0 | 0 | 0 | 1 | 1 | 1 | 1 | 1 | 1 | 1 | 0 | 0 | 0 | 0 | 0 | 1 |
| 4th page | 1 | 1 | 0 | 0 | 0 | 1 | 1 | 1 | 1 | 1 | 1 | 0 | 0 | 1 | 1 | 0 | 0 | 1 | 0 | 0 | 0 | 0 | 0 | 0 | 1 | 0 | 0 | 1 | 1 | 1 | 1 | 1 |
| 5th page | 1 | 1 | 0 | 0 | 1 | 1 | 1 | 1 | 0 | 0 | 0 | 0 | 1 | 1 | 1 | 1 | 0 | 0 | 0 | 0 | 0 | 1 | 0 | 0 | 1 | 1 | 1 | 1 | 1 | 1 | 1 | 1 |

Read voltage

| | | | | | | | | | | | | | | | | |
|---|---|---|---|---|---|---|---|---|---|---|---|---|---|---|---|---|
| 1st page | R6 | | | | | | R17 | | | | | | | | | |
| 2nd page | R3 | R10 | R12 | | | R20 | R23 | R25 | R29 | | | | | | | |
| 3rd page | R2 | R7 | R11 | R15 | R19 | R22 | R26 | R30 | | | | | | | | |
| 4th page | R4 | R8 | R13 | R16 | R18 | R21 | R24 | R27 | R31 | | | | | | | |
| 5th page | R1 | R5 | R9 | R14 | R28 | | | | | | | | | | | |

34th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 25 | 27 | 19 | 3 | 1 | 9 | 8 | 12 | 14 | 6 | 2 | 0 | 16 | 17 | 21 | 23 | 7 | 15 | 11 | 10 | 26 | 18 | 22 | 20 | 4 | 5 | 13 | 29 |
| 1st page | 1 | 1 | 1 | 1 | 1 | 1 | 1 | 0 | 0 | 0 | 0 | 0 | 0 | 0 | 0 | 0 | 1 | 1 | 1 | 1 | 1 | 1 | 0 | 0 | 1 | 1 | 1 | 1 | 0 | 0 | 1 | 1 |
| 2nd page | 1 | 1 | 1 | 1 | 1 | 1 | 0 | 0 | 0 | 1 | 1 | 1 | 1 | 1 | 0 | 0 | 0 | 0 | 0 | 0 | 0 | 1 | 1 | 1 | 0 | 0 | 0 | 0 | 0 | 0 | 1 | 1 |
| 3rd page | 1 | 1 | 0 | 0 | 0 | 0 | 0 | 0 | 0 | 0 | 0 | 0 | 1 | 1 | 0 | 0 | 0 | 1 | 1 | 1 | 1 | 1 | 1 | 1 | 0 | 0 | 1 | 1 | 1 | 1 | 1 | 1 |
| 4th page | 1 | 0 | 0 | 0 | 0 | 1 | 1 | 1 | 1 | 0 | 0 | 0 | 0 | 0 | 0 | 0 | 0 | 0 | 1 | 1 | 1 | 1 | 1 | 1 | 1 | 0 | 0 | 0 | 0 | 0 | 0 | 1 |
| 5th page | 1 | 0 | 0 | 1 | 1 | 1 | 1 | 1 | 1 | 1 | 0 | 0 | 0 | 0 | 0 | 1 | 1 | 1 | 1 | 1 | 1 | 1 | 1 | 0 | 0 | 0 | 0 | 0 | 0 | 1 | 1 | 1 |

Read voltage

| | | | | | | | | | | | | | | | | |
|---|---|---|---|---|---|---|---|---|---|---|---|---|---|---|---|---|
| 1st page | | | | | | | R7 | | | | | | | R16 | | | R28 |
| 2nd page | | R2 | | | R6 | | | R8 | R9 | | R11 | | R13 | | | R20 | |
| 3rd page | | | R3 | | R5 | | | | | R10 | | R12 | | | R18 | | R24 R25 R26 |
| 4th page | R1 | | | R4 | | | | | | | | | | R14 R15 | | R21 R22 | R27 |
| 5th page | | | | | | | | | | | | | | | R17 | | R23 R29 R30 R31 |

36th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 25 | 27 | 11 | 3 | 2 | 6 | 22 | 20 | 21 | 29 | 13 | 9 | 8 | 0 | 16 | 18 | 26 | 10 | 14 | 12 | 4 | 5 | 1 | 17 | 19 | 23 | 7 | 15 |
| 1st page | 1 | 1 | 1 | 1 | 1 | 1 | 1 | 0 | 0 | 0 | 0 | 1 | 1 | 1 | 1 | 0 | 0 | 0 | 1 | 1 | 1 | 0 | 0 | 0 | 0 | 0 | 0 | 1 | 1 | 1 | 0 | 0 |
| 2nd page | 1 | 1 | 1 | 1 | 0 | 0 | 0 | 0 | 0 | 0 | 1 | 1 | 1 | 0 | 0 | 0 | 0 | 0 | 0 | 0 | 0 | 0 | 0 | 1 | 1 | 0 | 0 | 0 | 1 | 1 | 1 | 1 |
| 3rd page | 1 | 0 | 0 | 0 | 1 | 0 | 0 | 0 | 1 | 1 | 1 | 0 | 1 | 1 | 1 | 1 | 1 | 0 | 0 | 1 | 0 | 1 | 1 | 1 | 0 | 1 | 0 | 0 | 0 | 0 | 0 | 0 |
| 4th page | 1 | 0 | 0 | 0 | 0 | 1 | 1 | 0 | 0 | 0 | 0 | 1 | 0 | 0 | 0 | 1 | 0 | 0 | 0 | 1 | 0 | 1 | 0 | 0 | 0 | 0 | 1 | 0 | 0 | 1 | 1 | 1 |
| 5th page | 1 | 1 | 0 | 0 | 1 | 1 | 0 | 1 | 0 | 1 | 0 | 0 | 1 | 1 | 0 | 1 | 0 | 1 | 0 | 0 | 0 | 0 | 1 | 0 | 0 | 1 | 1 | 1 | 0 | 1 | 1 | 1 |

Read voltage

| | | | | | | | | | | | | | | | | |
|---|---|---|---|---|---|---|---|---|---|---|---|---|---|---|---|---|
| 1st page | R1 | | | R6 | R7 | | | R10 | | R13 | R14 | | | R17 | R18 | | R21 | | | | R27 | | R30 | |
| 2nd page | | R2 | | | | R8 | | | R11 | | | R15 | | | | R19 | | R22 | | R26 | | R28 | | |
| 3rd page | | | R3 | | | | R9 | | R12 | | | | R16 | | | | R20 | | R24 | | | | R29 | R31 |
| 4th page | | | R4 | R5 | | | | | | | | | | | | | | R23 | | R25 | | | | |
| 5th page | | | | | | | | | | | | | | | | | | | | | | | | |

39th modification
Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 0 | 4 | 12 | 14 | 15 | 11 | 27 | 25 | 17 | 21 | 20 | 22 | 6 | 2 | 3 | 1 | 9 | 8 | 10 | 26 | 18 | 19 | 23 | 7 | 5 | 13 | 29 |
| 1st page | 1 | 1 | 1 | 1 | 1 | 0 | 0 | 0 | 0 | 0 | 0 | 0 | 0 | 1 | 1 | 1 | 1 | 0 | 0 | 0 | 0 | 0 | 0 | 0 | 1 | 1 | 1 | 1 | 0 | 0 | 1 | 1 |
| 2nd page | 1 | 1 | 1 | 1 | 0 | 0 | 0 | 1 | 1 | 0 | 0 | 0 | 0 | 0 | 0 | 1 | 1 | 0 | 0 | 0 | 1 | 0 | 0 | 0 | 0 | 1 | 1 | 0 | 0 | 0 | 1 | 1 |
| 3rd page | 1 | 1 | 0 | 0 | 0 | 0 | 1 | 1 | 0 | 0 | 1 | 0 | 0 | 0 | 1 | 0 | 0 | 0 | 0 | 1 | 0 | 0 | 0 | 1 | 0 | 0 | 1 | 1 | 1 | 1 | 1 | 1 |
| 4th page | 1 | 0 | 0 | 1 | 0 | 0 | 0 | 0 | 1 | 1 | 0 | 0 | 0 | 1 | 0 | 0 | 1 | 1 | 1 | 1 | 1 | 1 | 0 | 1 | 1 | 1 | 1 | 1 | 1 | 0 | 0 | 1 |
| 5th page | 1 | 0 | 0 | 0 | 0 | 0 | 0 | 0 | 0 | 1 | 1 | 1 | 1 | 1 | 1 | 0 | 0 | 0 | 1 | 1 | 1 | 1 | 1 | 0 | 0 | 0 | 1 | 1 | 1 | 1 | 1 | 1 |

Read voltage

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 1st page | R1 | | | | R5 | | | | | | R11 | | | | | R17 | | | | | | | | R24 | | | | R28 | | | |
| 2nd page | | R2 | | | R4 | | | R7 | | | | | | R13 | | | | | | | R21 | | | | R25 | | | | | | R30 | |
| 3rd page | | | R3 | | | | R6 | | R9 | | R10 | | R12 | | R14 | | | | | R20 | | R22 | | R23 | | | R27 | | | | | R31 |
| 4th page | | | | | | | | | R8 | | | | | | R15 | R16 | | R18 | R19 | | | | | | | | | | | R29 | | |
| 5th page | | | | | | | | | | R9 | | R11 | | | | | | | | | | | R22 | | | R26 | | | | | | |

F I G. 57

40th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 17 | 21 | 23 | 7 | 6 | 14 | 12 | 8 | 0 | 2 | 3 | 19 | 27 | 25 | 9 | 1 | 5 | 4 | 20 | 22 | 18 | 26 | 10 | 11 | 15 | 13 | 29 |
| 1st page | 1 | 1 | 1 | 1 | 1 | 1 | 1 | 1 | 0 | 0 | 0 | 0 | 0 | 0 | 0 | 0 | 1 | 1 | 1 | 0 | 0 | 0 | 1 | 1 | 1 | 1 | 1 | 0 | 0 | 1 | 1 | 1 |
| 2nd page | 1 | 1 | 1 | 0 | 0 | 0 | 0 | 0 | 0 | 0 | 0 | 0 | 1 | 0 | 0 | 0 | 1 | 1 | 1 | 0 | 0 | 0 | 0 | 0 | 0 | 1 | 1 | 1 | 1 | 1 | 1 | 1 |
| 3rd page | 1 | 1 | 0 | 0 | 0 | 0 | 1 | 1 | 1 | 1 | 1 | 1 | 1 | 0 | 0 | 0 | 0 | 0 | 0 | 1 | 1 | 0 | 1 | 1 | 0 | 0 | 0 | 0 | 0 | 0 | 0 | 0 |
| 4th page | 1 | 1 | 1 | 1 | 0 | 0 | 0 | 1 | 1 | 1 | 0 | 1 | 0 | 0 | 1 | 1 | 1 | 1 | 0 | 0 | 0 | 0 | 0 | 0 | 1 | 1 | 1 | 1 | 1 | 0 | 0 | 0 |
| 5th page | 1 | 0 | 0 | 0 | 0 | 1 | 1 | 1 | 1 | 0 | 0 | 0 | 0 | 0 | 0 | 1 | 1 | 1 | 1 | 1 | 1 | 1 | 0 | 0 | 0 | 0 | 0 | 1 | 1 | 1 | 1 | 1 |

Read voltage

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 1st page | R1 | | | | | | | R8 | | | | | | | | R16 | | | | | | | | | | | R27 | | | | |
| 2nd page | | R2 | | | | | | | | | | R12 | | | | | R17 | | | | | | | | R25 | | | | | | |
| 3rd page | | | R3 | | | R6 | R7 | | | | R11 | | | | | | | | | R20 | | R22 | | | | R26 | | | | | | |
| 4th page | | | | R4 | | R5 | | | R9 | | R10 | | | R13 | R14 | R15 | | R18 | | | | | | R24 | | | | | R28 | | | |
| 5th page | | | | | | | | | | | | | | | | | | | R19 | | R21 | | R23 | | | | | | | R29 | R30 | R31 |

44th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 17 | 21 | 5 | 7 | 15 | 11 | 10 | 8 | 0 | 4 | 20 | 22 | 23 | 19 | 1 | 9 | 25 | 27 | 26 | 18 | 2 | 6 | 14 | 12 | 13 | 29 |
| 1st page | 1 | 1 | 1 | 1 | 1 | 1 | 1 | 0 | 0 | 0 | 0 | 0 | 0 | 0 | 0 | 0 | 1 | 1 | 1 | 0 | 1 | 1 | 1 | 1 | 1 | 0 | 0 | 0 | 0 | 0 | 0 | 1 |
| 2nd page | 1 | 1 | 1 | 1 | 1 | 0 | 0 | 0 | 0 | 0 | 0 | 1 | 1 | 1 | 0 | 0 | 0 | 1 | 0 | 1 | 1 | 1 | 1 | 0 | 0 | 0 | 0 | 1 | 1 | 1 | 1 | 1 |
| 3rd page | 1 | 1 | 0 | 0 | 0 | 0 | 1 | 1 | 1 | 1 | 0 | 0 | 0 | 0 | 1 | 1 | 1 | 1 | 1 | 0 | 0 | 0 | 0 | 1 | 1 | 1 | 0 | 0 | 0 | 0 | 1 | 1 |
| 4th page | 1 | 0 | 0 | 0 | 0 | 1 | 1 | 1 | 1 | 1 | 1 | 1 | 1 | 1 | 1 | 0 | 0 | 1 | 1 | 1 | 1 | 1 | 0 | 0 | 1 | 1 | 1 | 1 | 1 | 0 | 0 | 0 |
| 5th page | 0 | 0 | 0 | 0 | 1 | 1 | 1 | 1 | 1 | 1 | 1 | 0 | 0 | 0 | 0 | 0 | 0 | 1 | 1 | 1 | 1 | 0 | 0 | 0 | 0 | 0 | 0 | 0 | 0 | 0 | 1 | 1 |

Read voltage

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| 1st page | | | | R4 | | | R7 | | | | | | | | R15 | | | | | R19 | | | R22 | | | R26 | | | | | R31 | |
| 2nd page | | R2 | | | R5 | | | | R9 | | | R13 | | | | R16 | | | R18 | | | R21 | | | R25 | | | R28 | | | | |
| 3rd page | | R3 | | | | R6 | | | R8 | | | R12 | | | | | R17 | | | R20 | | | R23 | | | R27 | | | | R30 | | |
| 4th page | R1 | | | | | | | | | R10 | | | | R14 | | | | | | | | | | R24 | | | | | R29 | | | |
| 5th page | | | | | | | | R11 | | | | | | | | | | | | | | | | | | | | | | | | |

45th modification
Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 0 | 1 | 9 | 11 | 15 | 14 | 6 | 2 | 3 | 19 | 17 | 21 | 20 | 4 | 12 | 8 | 10 | 26 | 18 | 22 | 23 | 7 | 5 | 13 | 29 | 25 | 27 |
| 1st page | 1 | 1 | 1 | 1 | 1 | 0 | 0 | 0 | 0 | 1 | 1 | 0 | 0 | 0 | 1 | 1 | 1 | 1 | 0 | 0 | 0 | 0 | 1 | 1 | 1 | 1 | 0 | 0 | 0 | 1 | 1 | 1 |
| 2nd page | 1 | 1 | 1 | 0 | 0 | 0 | 0 | 0 | 0 | 1 | 1 | 0 | 0 | 0 | 0 | 0 | 1 | 1 | 0 | 0 | 0 | 1 | 1 | 0 | 0 | 0 | 0 | 0 | 1 | 1 | 0 | 1 |
| 3rd page | 1 | 1 | 0 | 0 | 0 | 0 | 0 | 0 | 0 | 1 | 1 | 1 | 0 | 0 | 0 | 1 | 1 | 1 | 1 | 1 | 1 | 0 | 0 | 1 | 1 | 0 | 0 | 1 | 1 | 1 | 1 | 1 |
| 4th page | 1 | 0 | 0 | 0 | 0 | 0 | 1 | 1 | 1 | 1 | 1 | 0 | 0 | 1 | 1 | 1 | 0 | 1 | 0 | 0 | 0 | 0 | 0 | 0 | 0 | 0 | 0 | 0 | 0 | 0 | 0 | 1 |
| 5th page | 1 | 0 | 0 | 0 | 0 | 0 | 1 | 1 | 1 | 1 | 0 | 0 | 0 | 0 | 0 | 1 | 1 | 0 | 0 | 0 | 0 | 0 | 0 | 0 | 0 | 1 | 1 | 1 | 1 | 1 | 1 | 1 |

Read voltage

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 1st page | R1 | | R2 | | R3 | | R4 | | R5 | | R6 | | R7 | | R8 | | R9 | | R10 | | R11 | | R12 | | R13 | | R14 | | R15 | | R16 | |
| 2nd page | | | | | | | | | | | | | | | | | | | | | | | | | | | | | | | | |
| 3rd page | | | | | | | | | | | | | | | | | | | | | | | | | | | | | | | | |
| 4th page | | | | | | | | | | | | | | | | | | | | | | | | | | | | | | | | |
| 5th page | | | | | | | | | | | | | | | | | | | | | | | | | | | | | | | | |

(Read voltages R1–R31 are distributed across pages.)

FIG. 64

47th modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 0 | 4 | 12 | 14 | 15 | 11 | 3 | 2 | 6 | 22 | 20 | 21 | 17 | 1 | 9 | 8 | 10 | 26 | 18 | 19 | 23 | 7 | 5 | 13 | 29 | 25 | 27 |
| 1st page | 1 | 1 | 1 | 1 | 1 | 1 | 0 | 0 | 0 | 0 | 0 | 0 | 0 | 0 | 0 | 1 | 1 | 1 | 1 | 1 | 0 | 0 | 1 | 1 | 1 | 1 | 0 | 0 | 1 | 1 | 1 | 1 |
| 2nd page | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 1 | 1 | 1 | 1 |
| 3rd page | 1 | 1 | 1 | 1 | 0 | 0 | 0 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 |
| 4th page | 1 | 1 | 1 | 0 | 0 | 0 | 0 | 0 | 0 | 0 | 0 | 1 | 1 | 1 | 1 | 0 | 0 | 0 | 1 | 1 | 1 | 1 | 1 | 1 | 1 | 1 | 1 | 1 | 1 | 1 | 0 | 1 |
| 5th page | 1 | 0 | 0 | 0 | 0 | 0 | 0 | 0 | 0 | 1 | 1 | 1 | 1 | 0 | 0 | 0 | 0 | 1 | 1 | 1 | 1 | 0 | 0 | 0 | 1 | 1 | 1 | 1 | 1 | 1 | 1 | 1 |

Read voltage

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 1st page | | | | | R5 | | | | | | | | | | | R14 | | | | | | | | | | | | | | | | |
| 2nd page | | | R3 | | | R6 | R7 | | | | | | | | | | | | | | | | | | | R25 | R26 | | | | | |
| 3rd page | | R2 | | | | | | R8 | | | R11 | | | | | | | R17 | | | | | | | | | | | | | | |
| 4th page | | | | R4 | | | | | R9 | R10 | | | R13 | | | | R16 | | R18 | | R20 | | R22 | R23 | | | R27 | | | R30 | | |
| 5th page | R1 | | | | | | | | | | | R12 | | | R15 | | | | | R19 | | R21 | | | R24 | | | | R28 | R29 | | R31 |

49th modification
Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 0 | 2 | 10 | 26 | 27 | 25 | 17 | 21 | 23 | 7 | 6 | 14 | 12 | 8 | 9 | 1 | 5 | 4 | 20 | 22 | 18 | 19 | 3 | 11 | 15 | 13 | 29 |
| 1st page | 1 | 1 | 1 | 1 | 1 | 0 | 0 | 0 | 0 | 0 | 1 | 1 | 1 | 1 | 0 | 0 | 0 | 0 | 0 | 0 | 0 | 0 | 0 | 0 | 1 | 1 | 1 | 0 | 0 | 0 | 0 | 1 |
| 2nd page | 1 | 1 | 1 | 1 | 0 | 0 | 0 | 1 | 1 | 1 | 1 | 0 | 0 | 0 | 0 | 0 | 0 | 1 | 1 | 0 | 0 | 0 | 0 | 0 | 0 | 0 | 1 | 1 | 1 | 1 | 1 | 1 |
| 3rd page | 1 | 1 | 0 | 0 | 0 | 0 | 0 | 1 | 1 | 0 | 0 | 0 | 1 | 1 | 1 | 1 | 1 | 1 | 0 | 0 | 1 | 1 | 1 | 1 | 0 | 0 | 0 | 1 | 0 | 1 | 0 | 1 |
| 4th page | 1 | 1 | 0 | 0 | 0 | 0 | 1 | 1 | 0 | 0 | 1 | 1 | 0 | 1 | 1 | 1 | 0 | 0 | 0 | 0 | 0 | 0 | 0 | 0 | 1 | 1 | 1 | 1 | 1 | 1 | 0 | 1 |
| 5th page | 1 | 0 | 0 | 0 | 0 | 0 | 0 | 0 | 0 | 1 | 1 | 1 | 1 | 1 | 1 | 0 | 0 | 0 | 0 | 1 | 1 | 1 | 0 | 0 | 0 | 0 | 1 | 1 | 1 | 1 | 1 | 1 |

Read voltage

| 1st page | R5 | R14 | R23 | R27 |
|---|---|---|---|---|
| 2nd page | R4 | R7 | R11 | R18 | R25 |
| 3rd page | R3 | R6 | R10 | R13 | R16 | R21 | R24 | R28 |
| 4th page | R2 | R8 | R12 | R17 | R20 | R26 | R29 |
| 5th page | R1 | R9 | R15 | R19 | R22 | R30 | R31 |

51st modification
Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 8 | 0 | 2 | 6 | 14 | 12 | 13 | 9 | 25 | 27 | 19 | 3 | 1 | 5 | 4 | 20 | 22 | 23 | 7 | 15 | 11 | 10 | 26 | 18 | 16 | 17 | 21 | 29 |
| 1st page | 1 | 1 | 1 | 1 | 0 | 0 | 0 | 0 | 0 | 0 | 0 | 0 | 1 | 1 | 1 | 0 | 0 | 0 | 0 | 1 | 1 | 1 | 0 | 0 | 0 | 1 | 1 | 1 | 1 | 1 | 1 | 1 |
| 2nd page | 1 | 1 | 1 | 1 | 1 | 1 | 0 | 0 | 0 | 0 | 1 | 1 | 1 | 1 | 0 | 0 | 0 | 0 | 0 | 0 | 0 | 0 | 1 | 1 | 1 | 1 | 0 | 0 | 0 | 0 | 0 | 1 |
| 3rd page | 1 | 1 | 1 | 1 | 0 | 0 | 0 | 1 | 1 | 1 | 1 | 1 | 1 | 0 | 0 | 0 | 0 | 1 | 1 | 1 | 0 | 0 | 1 | 1 | 0 | 0 | 0 | 0 | 0 | 1 | 1 | 1 |
| 4th page | 1 | 1 | 0 | 0 | 0 | 0 | 1 | 1 | 1 | 0 | 0 | 1 | 1 | 1 | 1 | 1 | 0 | 0 | 0 | 0 | 0 | 1 | 1 | 1 | 1 | 1 | 1 | 1 | 0 | 0 | 0 | 0 |
| 5th page | 1 | 0 | 0 | 0 | 0 | 0 | 0 | 0 | 0 | 0 | 1 | 1 | 0 | 0 | 1 | 1 | 1 | 1 | 0 | 0 | 0 | 1 | 1 | 1 | 1 | 0 | 0 | 0 | 0 | 1 | 1 | 1 |

Read voltage

| 1st page | R4 | | | | R11 | | | | R15 | | | | R22 | | | | R26 | | | |
|---|---|---|---|---|---|---|---|---|---|---|---|---|---|---|---|---|---|---|---|---|
| 2nd page | R3 | | R5 | | | | R10 | | R14 | | | | R19 | | R23 | | R25 | | R27 | |
| 3rd page | R2 | | R6 | | R8 | | | R12 | | R16 | | R18 | | R20 | | R24 | | | | R30 |
| 4th page | | R7 | | R9 | | R13 | | | R17 | | | | R21 | | | | | R28 | | |
| 5th page | R1 | | | | | | | | | | | | | | | | | | R29 | R31 |

F I G. 69

52nd modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 16 | 17 | 19 | 23 | 7 | 6 | 14 | 10 | 26 | 27 | 25 | 9 | 8 | 0 | 2 | 18 | 22 | 20 | 4 | 12 | 13 | 15 | 11 | 3 | 1 | 5 | 21 | 29 |
| 1st page | 1 | 1 | 1 | 1 | 1 | 1 | 1 | 1 | 0 | 0 | 0 | 1 | 1 | 1 | 0 | 0 | 0 | 0 | 0 | 1 | 1 | 0 | 0 | 0 | 0 | 0 | 0 | 0 | 0 | 0 | 1 | 1 |
| 2nd page | 1 | 1 | 1 | 0 | 0 | 0 | 0 | 0 | 0 | 0 | 1 | 1 | 1 | 1 | 1 | 1 | 0 | 0 | 0 | 0 | 0 | 0 | 1 | 1 | 1 | 0 | 0 | 0 | 0 | 0 | 0 | 1 |
| 3rd page | 1 | 1 | 0 | 0 | 0 | 0 | 0 | 1 | 1 | 1 | 1 | 0 | 0 | 1 | 0 | 0 | 0 | 0 | 0 | 1 | 1 | 1 | 1 | 1 | 1 | 1 | 0 | 0 | 0 | 1 | 1 | 1 |
| 4th page | 1 | 0 | 0 | 0 | 0 | 1 | 0 | 1 | 1 | 1 | 1 | 0 | 0 | 1 | 1 | 1 | 0 | 0 | 1 | 0 | 0 | 0 | 0 | 0 | 0 | 1 | 0 | 1 | 1 | 0 | 0 | 1 |
| 5th page | 1 | 0 | 0 | 0 | 1 | 1 | 1 | 1 | 1 | 1 | 0 | 0 | 0 | 0 | 1 | 1 | 0 | 0 | 0 | 0 | 0 | 0 | 0 | 0 | 1 | 1 | 1 | 1 | 1 | 1 | 1 | 1 |

Read voltage

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 1st page | R1 | | | | | | | R8 | | | | | | | | | R17 | | | | | | | R24 | | | | | | | R30 | |
| 2nd page | | R2 | | | | | | | | | R11 | | | | | R16 | | | | | | R22 | | | | R26 | | | | | | R31 |
| 3rd page | | | R3 | | | | R7 | | | R10 | | | R13 | | | | | | R19 | | | | | | R25 | | | | | R29 | | |
| 4th page | | | | R4 | | R6 | | | R9 | | | | R12 | | R15 | | | R18 | | R21 | | | R23 | | | | R27 | | | | | |
| 5th page | | | | | R5 | | | | | | | | | R14 | | | | | | | R20 | | | | | | | R28 | | | | |

FIG. 70

53rd modification

Data allocation

| State ID | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Data set ID | 31 | 30 | 28 | 24 | 8 | 9 | 13 | 29 | 21 | 20 | 22 | 6 | 2 | 0 | 16 | 17 | 25 | 27 | 11 | 3 | 1 | 5 | 4 | 12 | 14 | 10 | 26 | 18 | 19 | 23 | 7 | 15 |
| 1st page | 1 | 1 | 1 | 1 | 0 | 0 | 0 | 1 | 1 | 1 | 1 | 0 | 0 | 0 | 1 | 1 | 1 | 1 | 0 | 0 | 0 | 0 | 0 | 0 | 0 | 1 | 1 | 1 | 1 | 1 | 0 | 0 |
| 2nd page | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 1 | 1 | 1 | 1 | 0 | 0 | 1 | 1 | 1 |
| 3rd page | 1 | 1 | 0 | 0 | 0 | 0 | 1 | 1 | 1 | 1 | 1 | 1 | 1 | 1 | 1 | 1 | 0 | 0 | 0 | 0 | 0 | 1 | 1 | 1 | 1 | 1 | 0 | 1 | 1 | 1 | 1 | 1 |
| 4th page | 1 | 0 | 0 | 0 | 0 | 0 | 0 | 0 | 0 | 0 | 1 | 1 | 1 | 1 | 1 | 1 | 0 | 0 | 1 | 1 | 1 | 1 | 0 | 0 | 0 | 1 | 0 | 1 | 1 | 1 | 1 | 1 |
| 5th page | 1 | 0 | 0 | 0 | 0 | 1 | 1 | 1 | 1 | 0 | 0 | 0 | 0 | 0 | 0 | 1 | 1 | 1 | 1 | 1 | 1 | 1 | 0 | 0 | 0 | 0 | 0 | 1 | 1 | 1 | 1 | 1 |

Read voltage

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| 1st page | | R1 | | | R4 | | | R7 | | | | R11 | | | R14 | | | | R18 | | | | | | | R26 | | | | R30 | | |
| 2nd page | | | R2 | | | | R6 | | | | | | R12 | | | R16 | | | | | | | | R23 | | | | | R28 | | | |
| 3rd page | | | R3 | | | R5 | | | R8 | | | | | | | | R17 | | | R19 | R20 | | R22 | | | | | R27 | | R29 | | R31 |
| 4th page | | | | | | | | | R9 | | | | R13 | | | R15 | | | | | R21 | | | | R25 | | | | | | | |
| 5th page | | | | | | | | | | R10 | | | | | | | | | | | | | | | R24 | | | | | | | |

FIG. 71

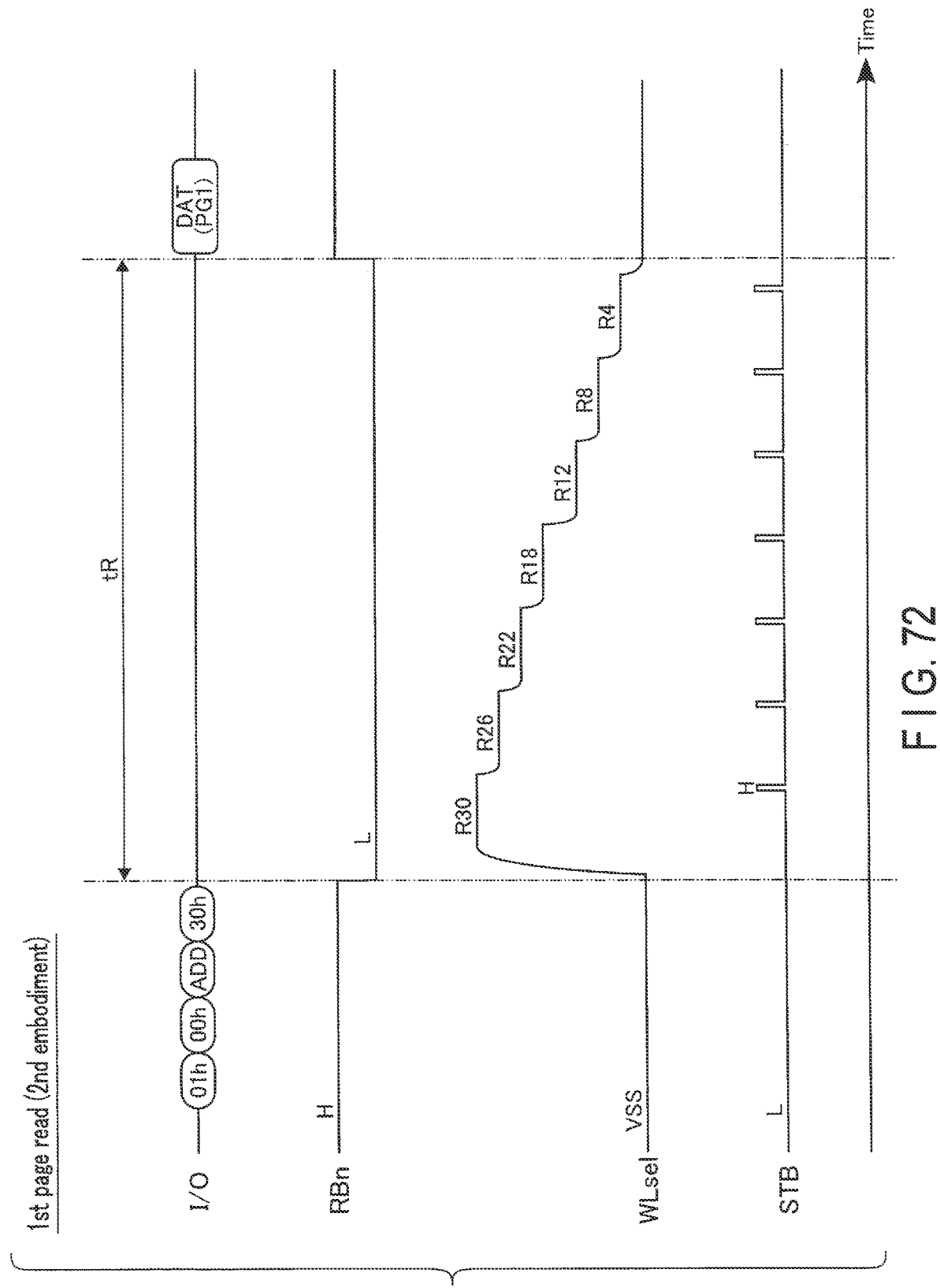
F I G. 72

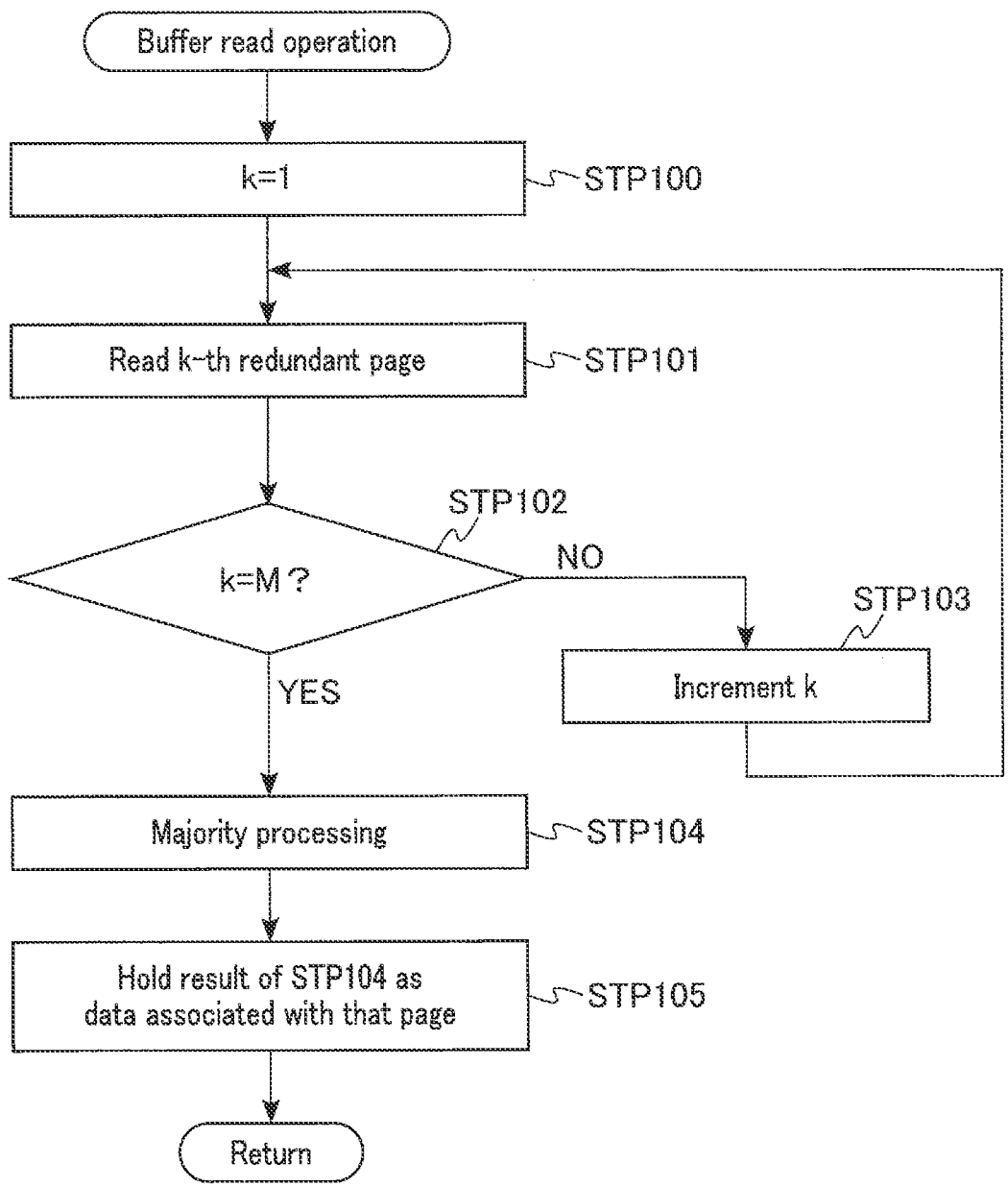
F I G. 90

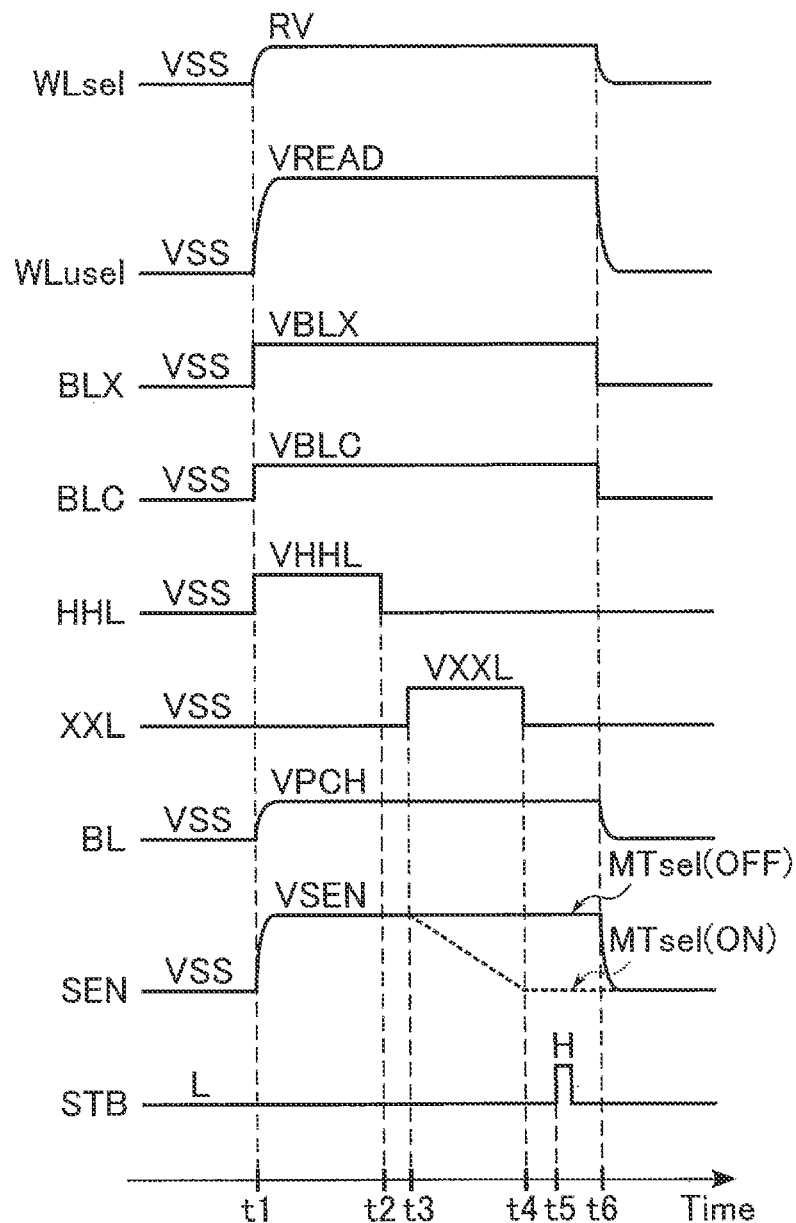
F I G. 91

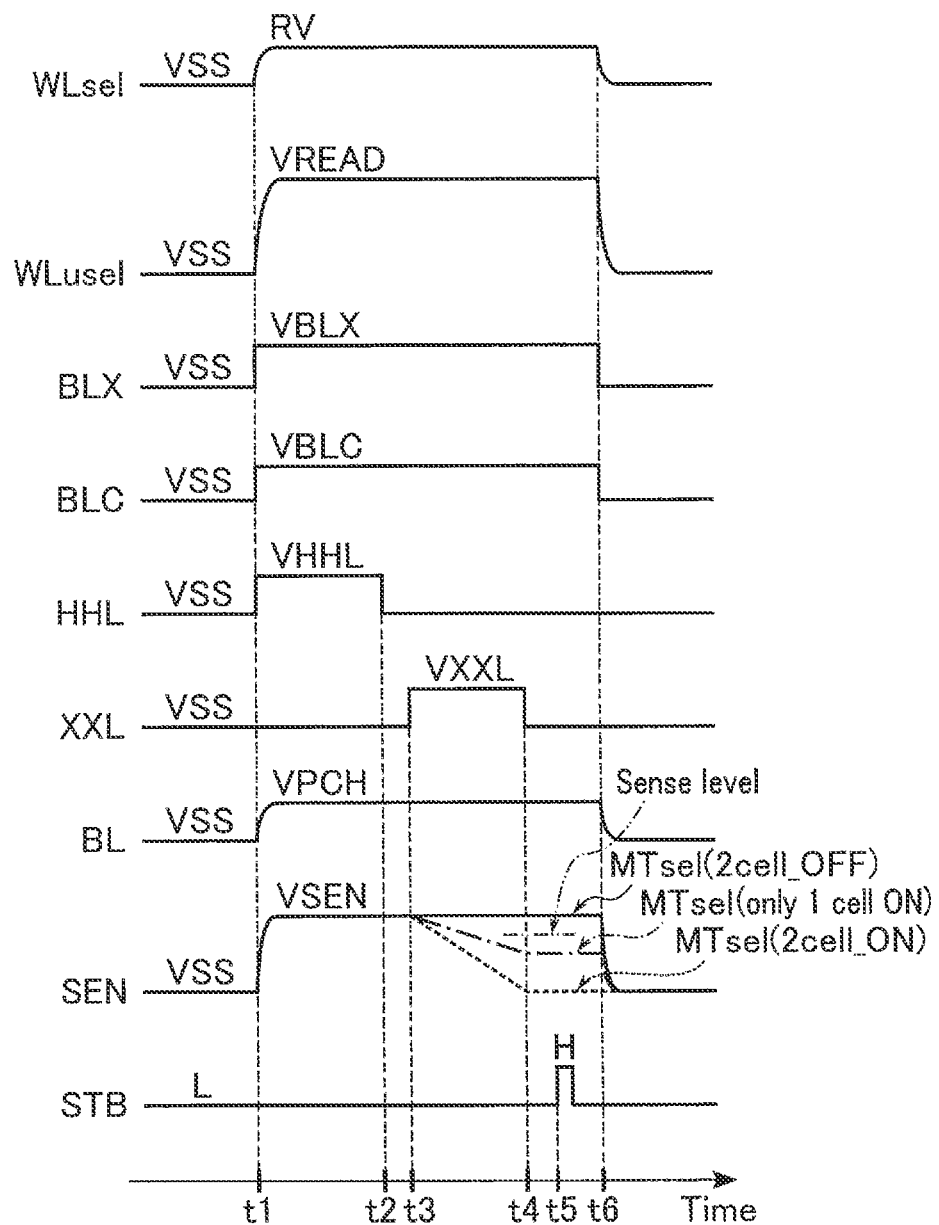
F I G. 94

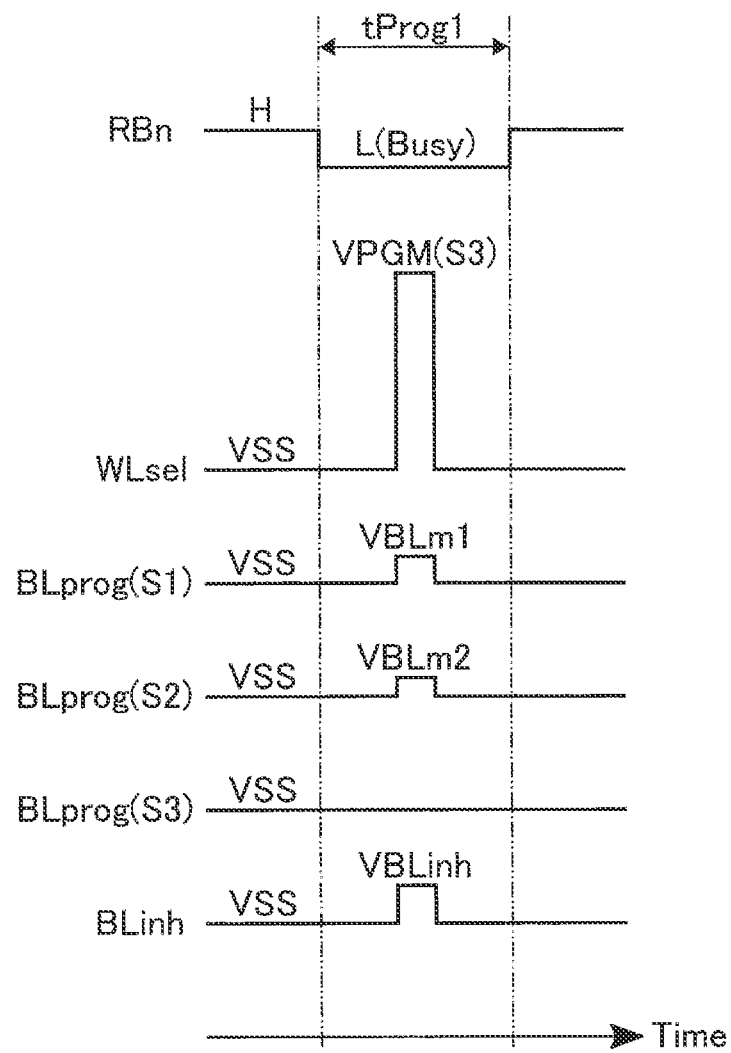
F I G. 101

|  | First memory cell transistor MTa | | |
|---|---|---|---|
|  | S0 | S1 | S2 |
| Second memory cell transistor MTb S0 | ○ | ○ | ○ |
| S1 | ○ | — | ○ |
| S2 | ○ | ○ | ○ |

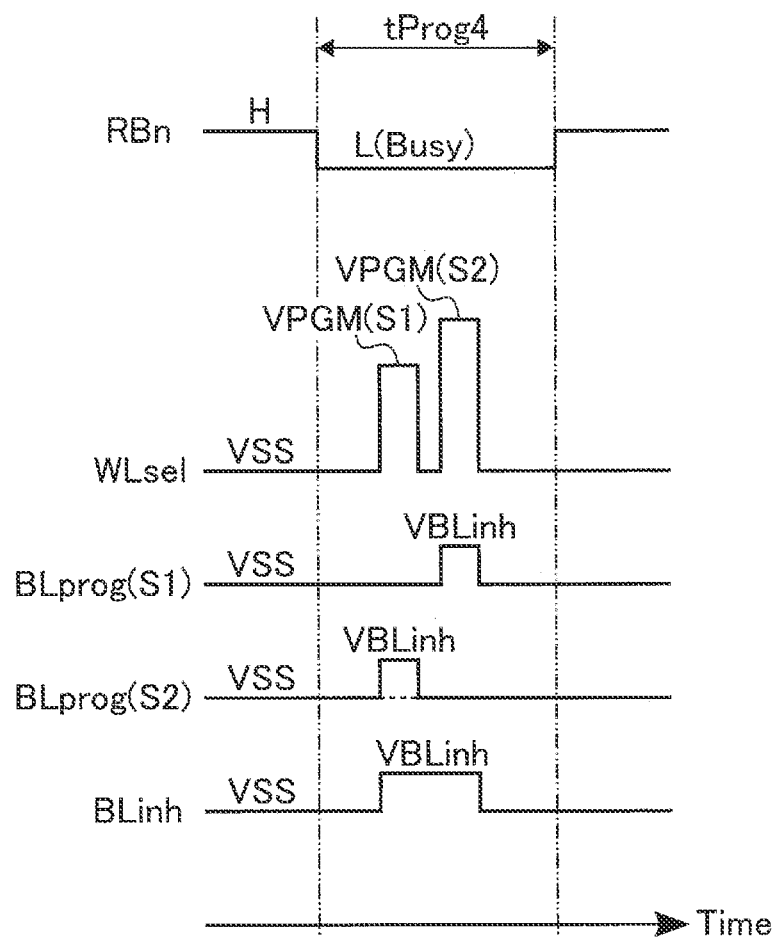
F I G. 106

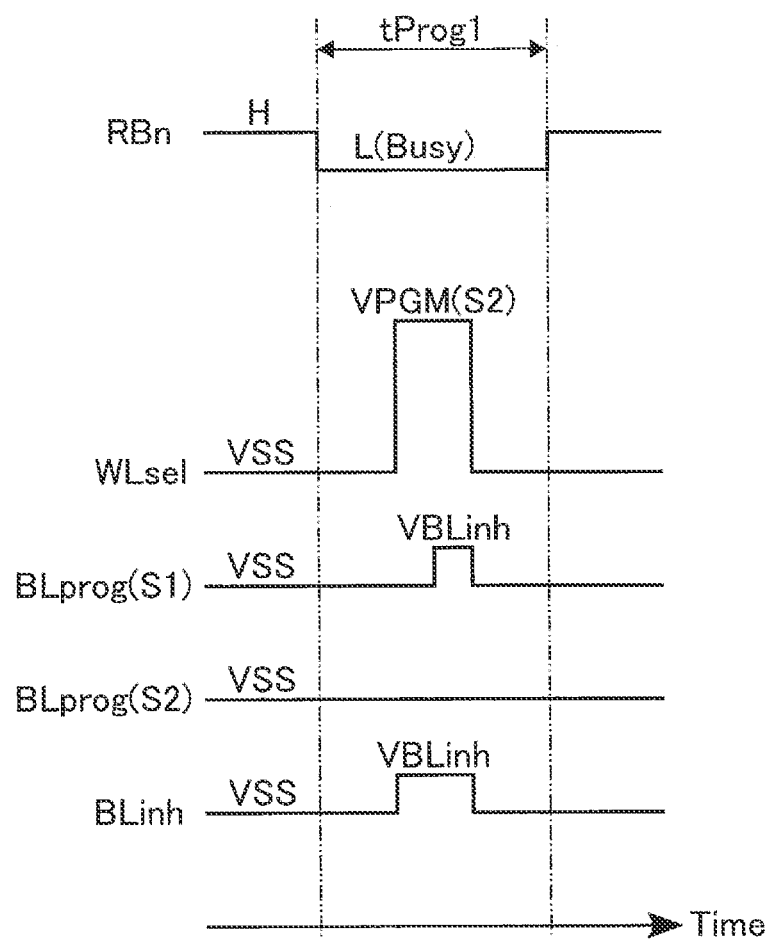
F I G. 108

|  | First memory cell transistor MTa | | |
|---|---|---|---|
|  | S0 | S1 | S2 |
| Second memory cell transistor MTb S0 | ○ | ○ | ○ |
| S1 | ○ | ○ | ○ |
| S2 | ○ | ○ | — |
F I G. 109
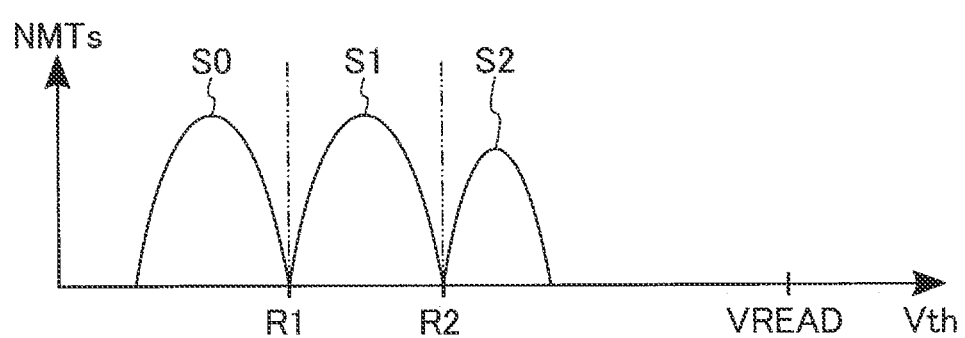
F I G. 110

|  | First memory cell transistor MTa | | | | | |
|---|---|---|---|---|---|---|
|  | S0 | S1 | S2 | S3 | S4 | S5 |
| Second memory cell transistor MTb S0 | ○ | ○ | ○ | ○ | ○ | ○ |
| S1 | ○ | ○ | ○ | ○ | ○ | ○ |
| S2 | ○ | ○ | — | — | ○ | ○ |
| S3 | ○ | ○ | — | — | ○ | ○ |
| S4 | ○ | ○ | ○ | ○ | ○ | ○ |
| S5 | ○ | ○ | ○ | ○ | ○ | ○ |

|  | First memory cell transistor MTa | | | | | |
|---|---|---|---|---|---|---|
|  | S0 | S1 | S2 | S3 | S4 | S5 |
| Second memory cell transistor MTb S0 | ○ | ○ | ○ | ○ | ○ | ○ |
| S1 | ○ | ○ | ○ | ○ | ○ | ○ |
| S2 | ○ | ○ | ○ | ○ | ○ | ○ |
| S3 | ○ | ○ | ○ | ○ | ○ | ○ |
| S4 | ○ | ○ | ○ | ○ | — | — |
| S5 | ○ | ○ | ○ | ○ | — | — |
F I G. 113
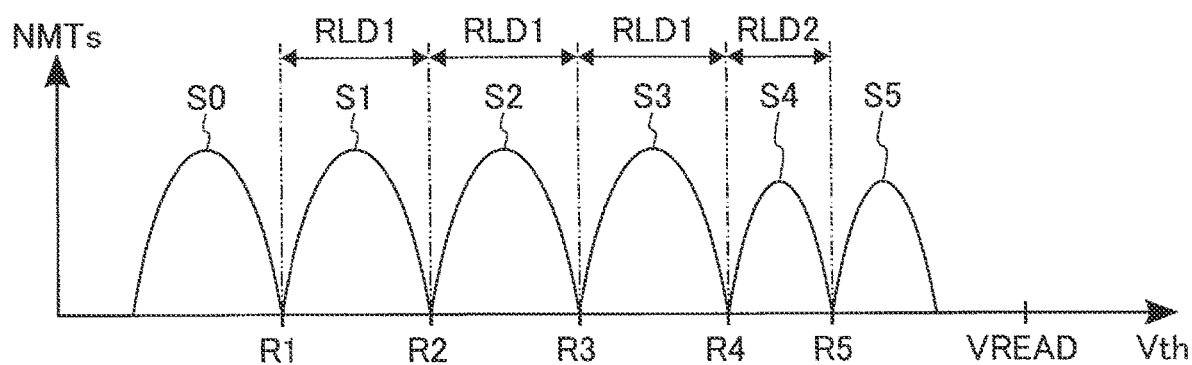
F I G. 114

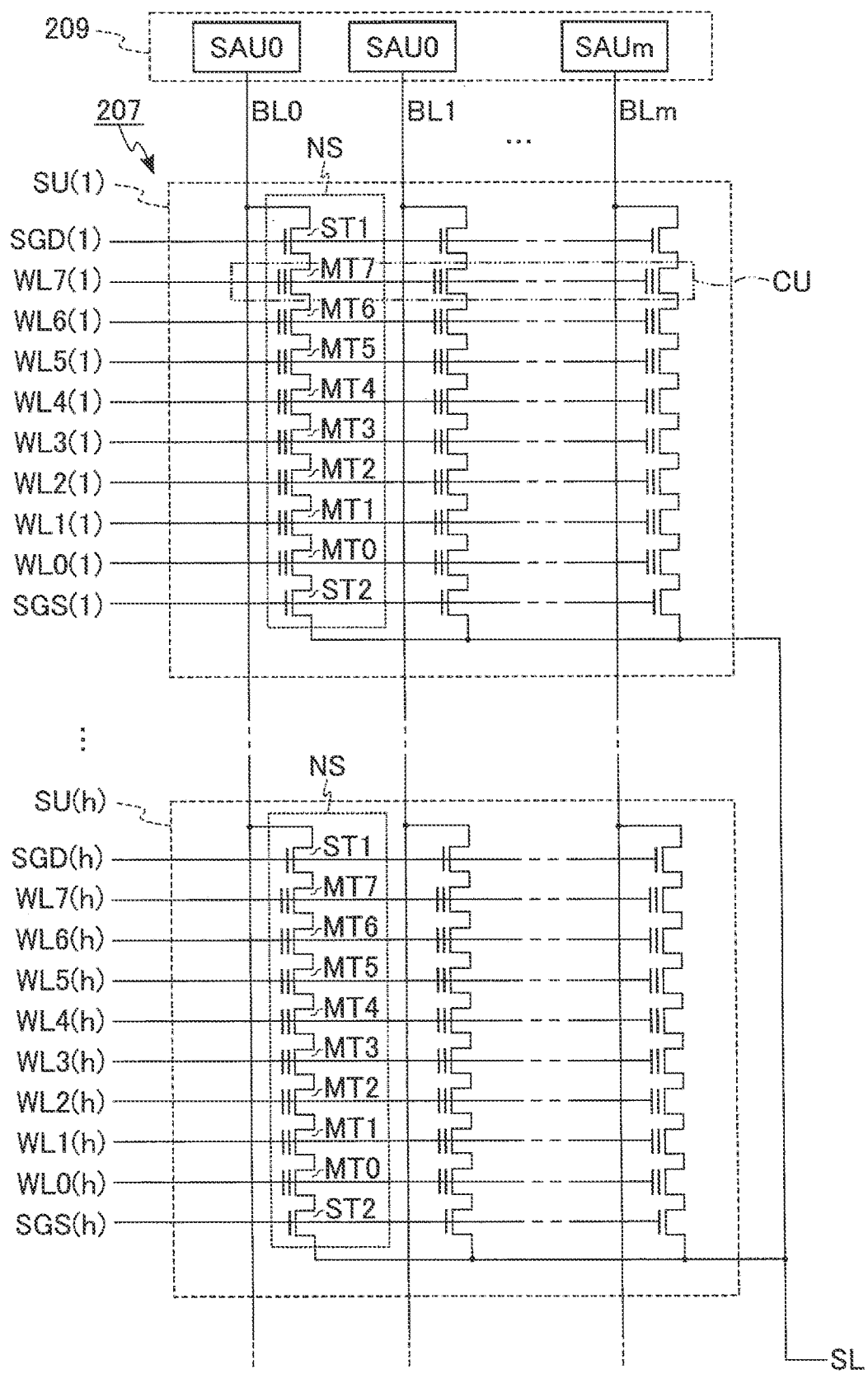
F I G. 115

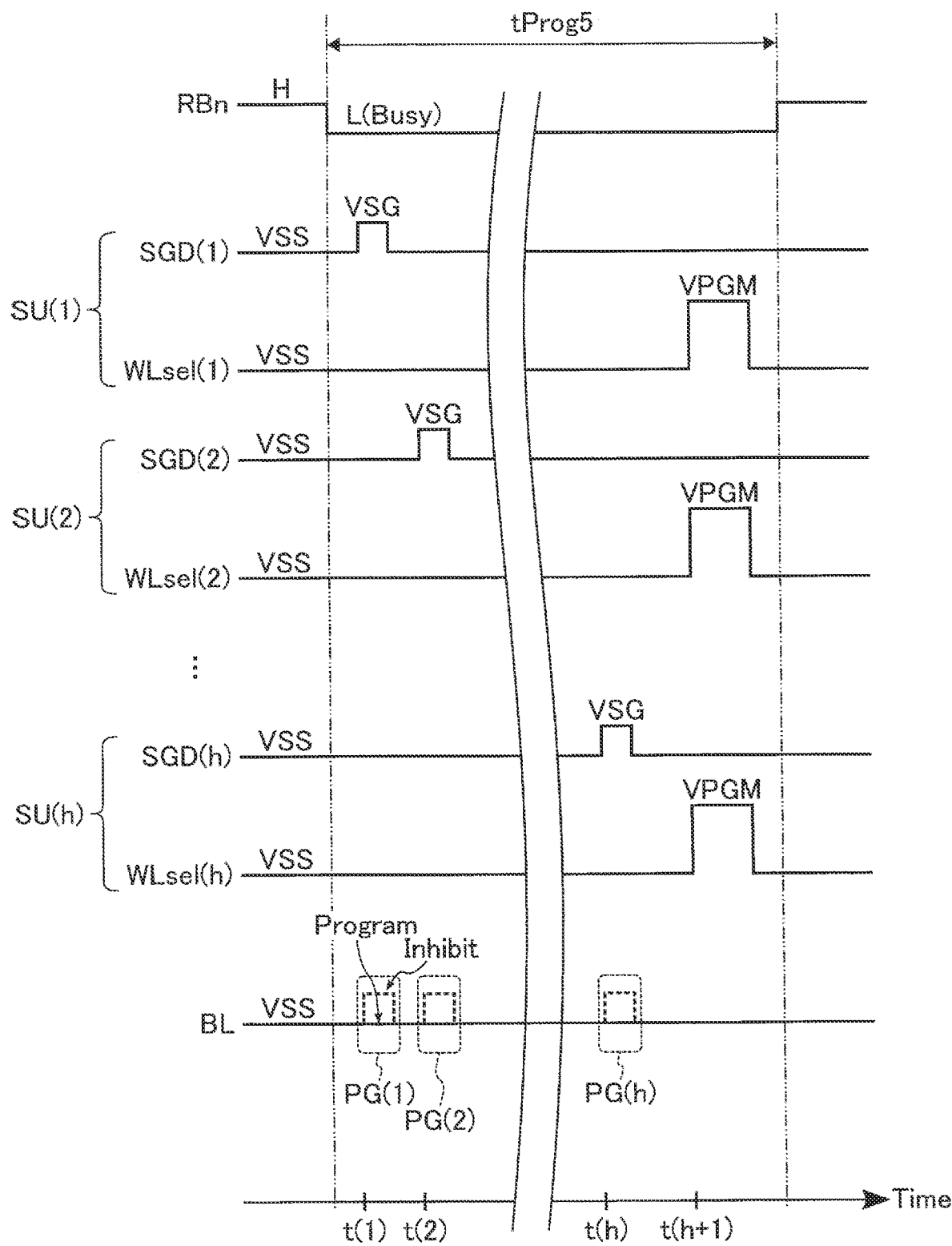
F I G. 117

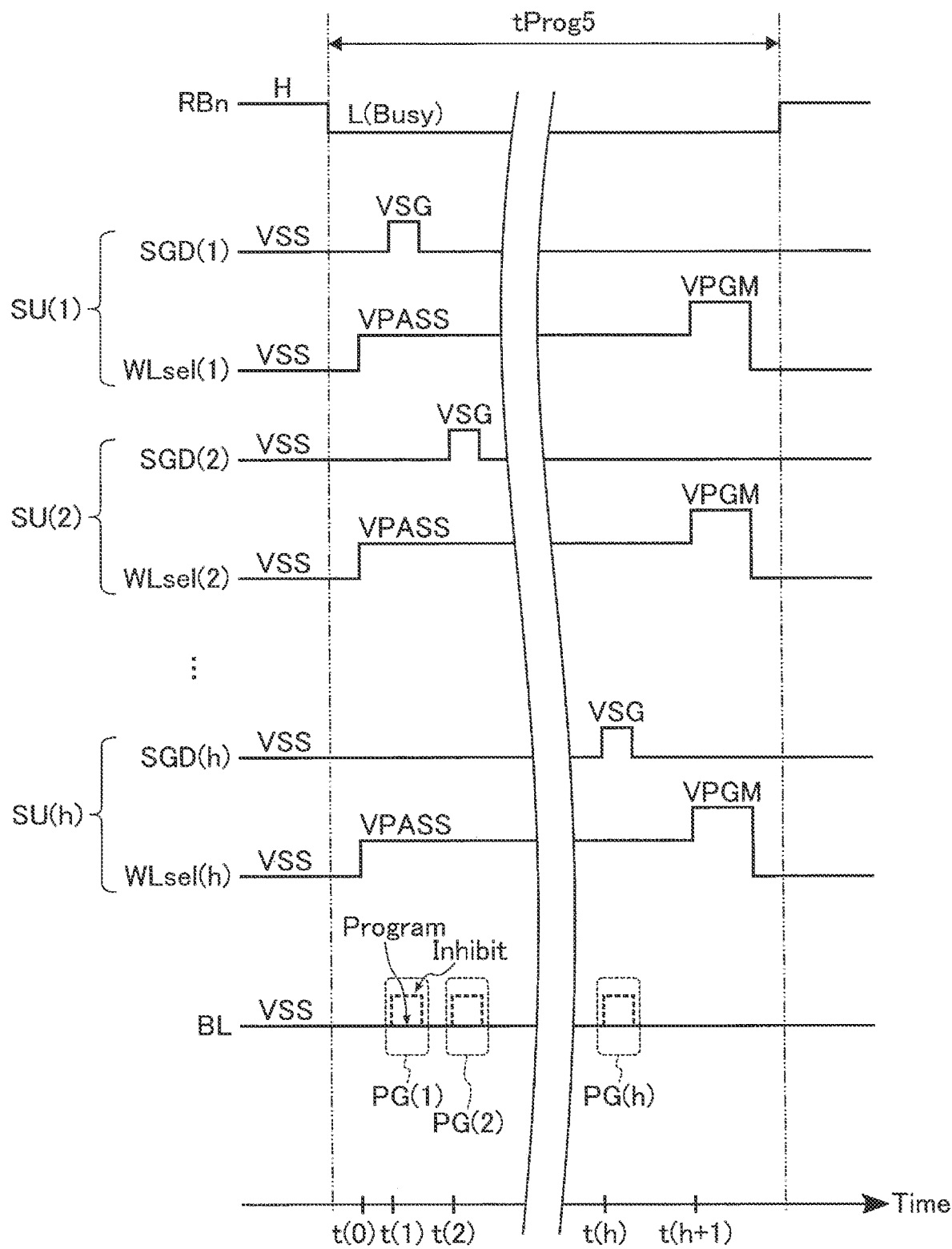
F I G. 118

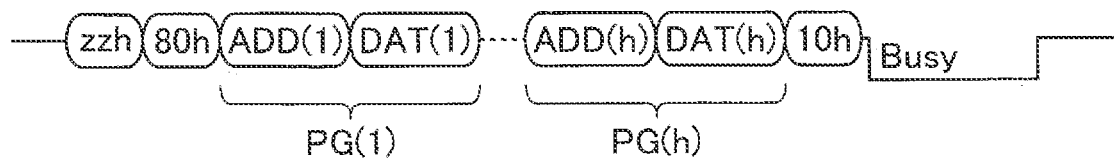
F I G. 119

MEMORY DEVICE APPLYING PLURAL DIFFERENT READ VOLTAGES TO A WORD LINE IN A READ OPERATION

CROSS-REFERENCE TO RELATED APPLICATIONS

This application is based upon and claims the benefit of priority from Japanese Patent Application No. 2021-210885, filed Dec. 24, 2021, the entire contents of which are incorporated herein by reference.

FIELD

Embodiments described herein relate generally to a memory device.

BACKGROUND

There is known a NAND flash memory capable of storing data in a nonvolatile manner.

BRIEF DESCRIPTION OF THE DRAWINGS

FIG. 5 is a circuit diagram illustrating an example of a circuit configuration of a row decoder module in the memory device of the first embodiment.

FIG. 8 is a table illustrating a setting of a data allocation and a read voltage for use in the memory device of the first embodiment.

FIG. 12 is a timing chart illustrating an example of fourth page read in the memory system of the first embodiment.

FIG. 13 is a timing chart illustrating an example of fifth page read in the memory system of the first embodiment.

FIG. 14 is a table illustrating a setting of a data allocation and a read voltage for a first modification.

FIG. 16 is a table illustrating a setting of a data allocation and a read voltage for a second modification.

FIG. 18 is a table illustrating a setting of a data allocation and a read voltage for a third modification.

FIG. 20 is a table illustrating a setting of a data allocation and a read voltage for a fourth modification.

FIG. 22 is a table illustrating a setting of a data allocation and a read voltage for a fifth modification.

FIG. 24 is a table illustrating a setting of a data allocation and a read voltage for a sixth modification.

FIG. 25 is a table illustrating a setting of a data allocation and a read voltage for a seventh modification.

FIG. 26 is a table illustrating a setting of a data allocation and a read voltage for an eighth modification.

FIG. 27 is a table illustrating a setting of a data allocation and a read voltage for a ninth modification.

FIG. 28 is a table illustrating a setting of a data allocation and a read voltage for a tenth modification.

FIG. 29 is a table illustrating a setting of a data allocation and a read voltage for an 11th modification.

FIG. 30 is a table illustrating a setting of a data allocation and a read voltage for a 12th modification.

FIG. 31 is a table illustrating a setting of a data allocation and a read voltage for a 13th modification.

FIG. 32 is a table illustrating a setting of a data allocation and a read voltage for a 14th modification.

FIG. 33 is a table illustrating a setting of a data allocation and a read voltage for a 15th modification.

FIG. 34 is a table illustrating a setting of a data allocation and a read voltage for a 16th modification.

FIG. 35 is a table illustrating a setting of a data allocation and a read voltage for a 17th modification.

FIG. 36 is a table illustrating a setting of a data allocation and a read voltage for an 18th modification.

FIG. 37 is a table illustrating a setting of a data allocation and a read voltage for a 19th modification.

FIG. 38 is a table illustrating a setting of a data allocation and a read voltage for a 20th modification.

FIG. 39 is a table illustrating a setting of a data allocation and a read voltage for a 21st modification.

FIG. 40 is a table illustrating a setting of a data allocation and a read voltage for a 22nd modification.

FIG. 41 is a table illustrating a setting of a data allocation and a read voltage for a 23rd modification.

FIG. 42 is a table illustrating a setting of a data allocation and a read voltage for a 24th modification.

FIG. 43 is a table illustrating a setting of a data allocation and a read voltage for a 25th modification.

FIG. 44 is a table illustrating a setting of a data allocation and a read voltage for a 26th modification.

FIG. 45 is a table illustrating a setting of a data allocation and a read voltage for a 27th modification.

FIG. 46 is a table illustrating a setting of a data allocation and a read voltage for a 28th modification.

FIG. 47 is a table illustrating a setting of a data allocation and a read voltage for a 29th modification.

FIG. 48 is a table illustrating a setting of a data allocation and a read voltage for a 30th modification.

FIG. 49 is a table illustrating a setting of a data allocation and a read voltage for a 31st modification.

FIG. 50 is a table illustrating a setting of a data allocation and a read voltage for a 32nd modification.

FIG. 51 is a table illustrating a setting of a data allocation and a read voltage for a 33rd modification.

FIG. 52 is a table illustrating a setting of a data allocation and a read voltage for a 34th modification.

FIG. 53 is a table illustrating a setting of a data allocation and a read voltage for a 35th modification.

FIG. 54 is a table illustrating a setting of a data allocation and a read voltage for a 36th modification.

FIG. 55 is a table illustrating a setting of a data allocation and a read voltage for a 37th modification.

FIG. 56 is a table illustrating a setting of a data allocation and a read voltage for a 38th modification.

FIG. 57 is a table illustrating a setting of a data allocation and a read voltage for a 39th modification.

FIG. 58 is a table illustrating a setting of a data allocation and a read voltage for a 40th modification.

FIG. 59 is a table illustrating a setting of a data allocation and a read voltage for a 41st modification.

FIG. 60 is a table illustrating a setting of a data allocation and a read voltage for a 42nd modification.

FIG. 61 is a table illustrating a setting of a data allocation and a read voltage for a 43rd modification.

FIG. 62 is a table illustrating a setting of a data allocation and a read voltage for a 44th modification.

FIG. 63 is a table illustrating a setting of a data allocation and a read voltage for a 45th modification.

FIG. 64 is a table illustrating a setting of a data allocation and a read voltage for a 46th modification.

FIG. 65 is a table illustrating a setting of a data allocation and a read voltage for a 47th modification.

FIG. 66 is a table illustrating a setting of a data allocation and a read voltage for a 48th modification.

FIG. 67 is a table illustrating a setting of a data allocation and a read voltage for a 49th modification.

FIG. 68 is a table illustrating a setting of a data allocation and a read voltage for a 50th modification.

FIG. 69 is a table illustrating a setting of a data allocation and a read voltage for a 51st modification.

FIG. 70 is a table illustrating a setting of a data allocation and a read voltage for a 52nd modification.

FIG. 71 is a table illustrating a setting of a data allocation and a read voltage for a 53rd modification.

FIG. 72 is a timing chart illustrating an example of first page read in a memory system of a second embodiment.

FIG. 90 is a flowchart illustrating a first example of a buffer read operation of the memory system of the sixth embodiment.

FIG. 91 is a timing chart illustrating an example of a redundant page read of the memory device of the sixth embodiment.

FIG. 94 is a timing chart illustrating an example of a redundant page batch read of the memory device of the sixth embodiment.

FIG. 101 is a timing chart illustrating a fourth example of a multiple-value write operation of the memory device of the seventh embodiment.

FIG. 106 is a timing chart illustrating a first example of a multiple-value write operation of the memory device of the eighth embodiment.

FIG. 108 is a timing chart illustrating a third example of a multiple-value write operation of the memory device of the eighth embodiment.

FIG. 109 is a table illustrating an example of a combination of states of memory cell transistors for use in share coding of a memory device of a first modification of the eighth embodiment.

FIG. 110 is a schematic diagram illustrating an example of a threshold voltage distribution of memory cell transistors of the memory device of the first modification of the eighth embodiment.

FIG. 113 is a table illustrating an example of a combination of states of memory cell transistors for use in share coding of the memory device of a third modification of the eighth embodiment.

FIG. 114 is a schematic diagram illustrating an example of a threshold voltage distribution of memory cell transistors of the memory device of the third modification of the eighth embodiment.

FIG. 115 is a circuit diagram illustrating an example of a circuit configuration of a memory cell array provided in a memory device of a ninth embodiment.

FIG. 117 is a timing chart illustrating a first example of a multiple-value write operation of the memory device of the ninth embodiment.

FIG. 118 is a timing chart illustrating a second example of a multiple-value write operation of the memory device of the ninth embodiment.

FIG. 119 is a sequence diagram showing an example of a command sequence of a multiple-value write operation of the memory device of the ninth embodiment.

DETAILED DESCRIPTION

In general, according to one embodiment, a memory device includes a plurality of memory cells, a word line, and a controller. Each of the memory cells is configured to store 5-bit data including first bit data, second bit data, third bit data, fourth bit data, and fifth bit data based on a threshold voltage. The memory cells configured to store a first page, a second page, a third page, a fourth page, and a fifth page, respectively including the first bit data, the second bit data, the third bit data, the fourth bit data, and the fifth bit data. The word line is coupled to the plurality of memory cells The controller is configured to execute a read operation for reading data from the plurality of memory cells by applying a read voltage to the word line. Numbers of times the controller applies read voltages different from one another to the word line in read operations for the first page, the second page, the third page, the fourth page, and the fifth page are 7, 6, 6, 6, and 6, respectively.

Hereinafter, embodiments will be described with reference to the accompanying drawings. Each embodiment illustrates an apparatus and a method for embodying the technical idea of the invention. The drawings are schematic or conceptual. The dimensions and scales of the drawings are not necessarily the same as those of actual products. In the description below, elements having substantially the same functions and configurations will be denoted by the same reference symbols. The numbers after the letters of reference symbols are referred to by reference symbols containing the same letters and are used to distinguish between elements having similar configurations.

[1] First Embodiment

Hereinafter, the first embodiment will be described.
[1-1] Configuration
[1-1-1] Configuration of Information Processing System 1

Figure 1:
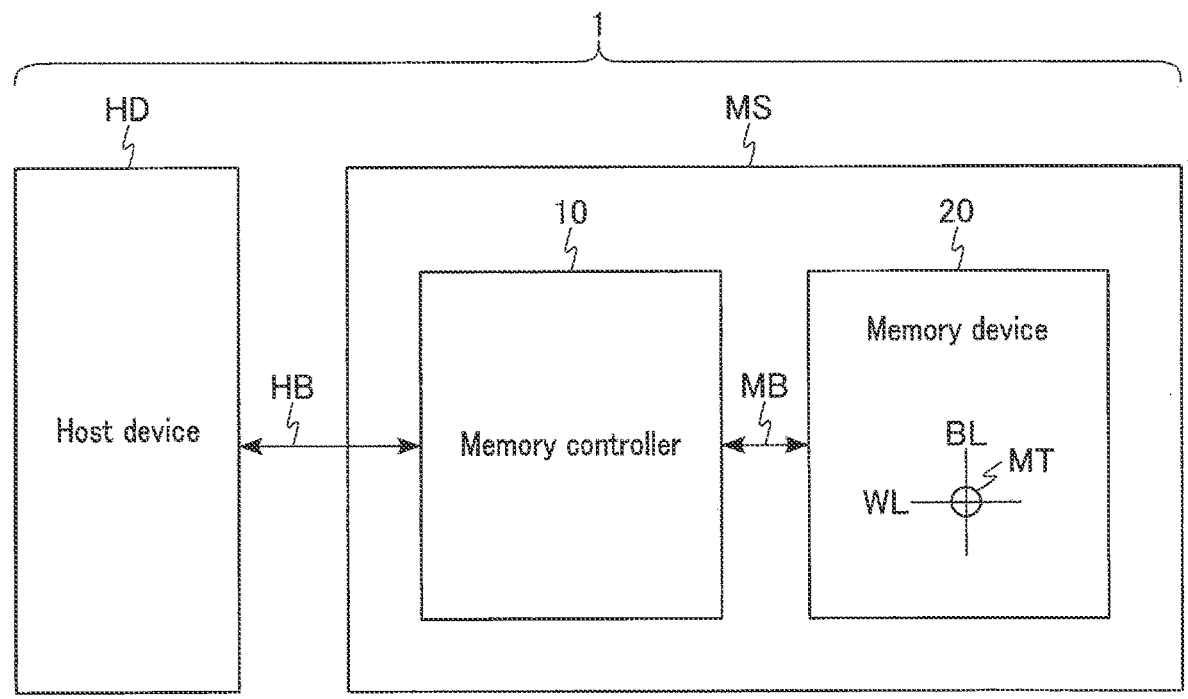
FIG. 1 is a block diagram illustrating a configuration of an information processing system according to a first embodiment.

FIG. 1 is a block diagram illustrating a configuration of an information processing system 1 according to the first embodiment. As illustrated in FIG. 1, the information processing system 1 includes, for example, a host device HD and a memory system MS. The host device HD is an electronic device, such as a personal computer, a personal digital assistance, a server, or the like. The memory system MS is a storage medium, such as a memory card, a solid state drive (SSD), or the like. The memory system MS includes, for example, a memory controller 10 and a memory device 20.

The memory controller 10 is, for example, a semiconductor integrated circuit configured as a system-on-chip (SoC). The memory controller 10 is coupled to the host device HD via a host bus HB. The memory controller 10 is coupled to the memory device 20 via a memory bus MB. The memory controller 10 controls the memory device 20 based on an instruction received from the host device HD. For example, the memory controller 10 controls the memory device 20 to execute a read operation, a write operation, an erase operation, etc.

The memory device 20 is a semiconductor memory device that stores data in a non-volatile manner. The memory device 20 is, for example, a NAND-type flash memory. In the NAND-type flash memory, the unit of read and write of data is referred to as a "page". The memory device 20 includes a plurality of memory cell transistors MT, a plurality of bit lines BL, and a plurality of word lines WL. Each memory cell transistor MT is associated with a single bit line BL and a single word line WL. A column address is assigned to each of the bit lines BL. A page address is assigned to each of word lines WL.
[1-1-2] Hardware Configuration of Memory Controller 10

Figure 2:
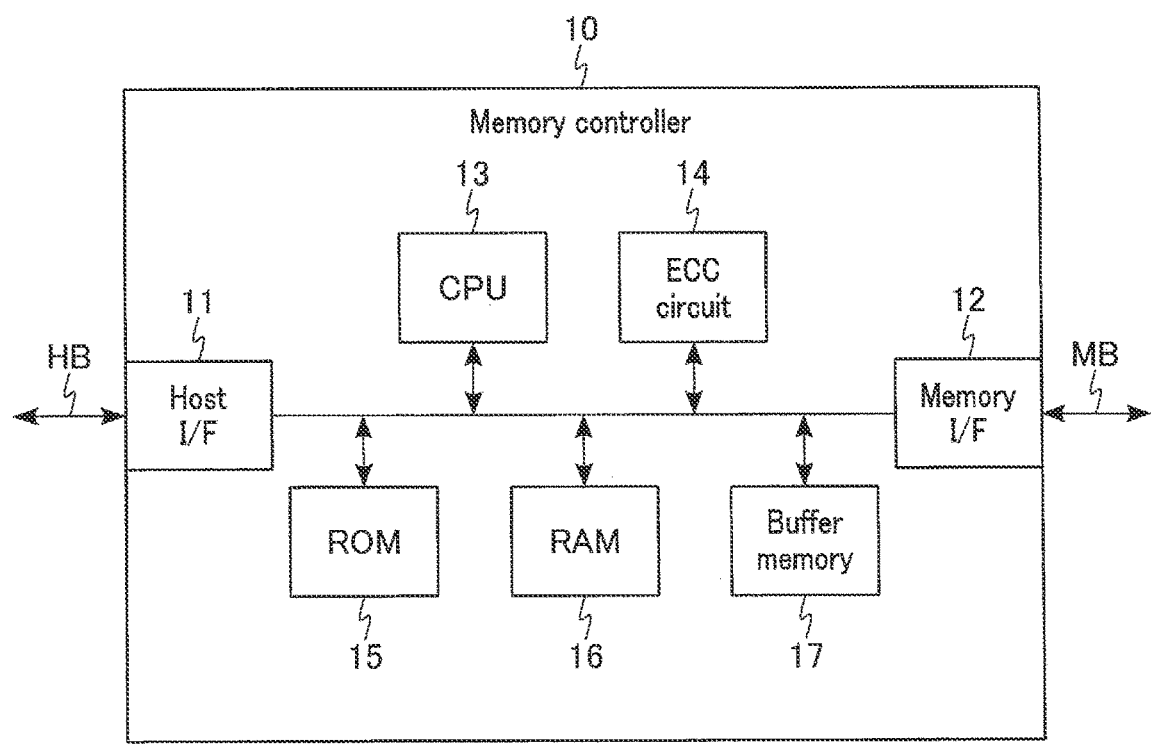
FIG. 2 is a block diagram illustrating an example of a hardware configuration of a memory controller of the first embodiment.

FIG. 2 is a block diagram illustrating an example of a hardware configuration of the memory controller 10 of the first embodiment. As illustrated in FIG. 2, the memory controller 10 includes, for example, a host interface (host I/F) 11, a memory interface (memory I/F) 12, a central processing unit (CPU) 13, an error correction code (ECC) circuit 14, a read-only memory (ROM) 15, a random access memory (RAM) 16, and a buffer memory 17.

The host I/F 11 is a hardware interface conforming to interface specifications between the host device HD and the memory controller 10. The host I/F 11 is coupled to the host device HD via the host bus HB. The host I/F 11 supports interface specifications, such as Serial Advanced Technology Attachment (SATA), PCI Express (PCIe™), and the like.

The memory I/F 12 is a hardware interface conforming to interface specifications between the memory controller 10 and the memory device 20. The memory I/F 12 is coupled to the memory device 20 via the memory bus MB. The memory I/F 12 supports, for example, a NAND interface specification.

The CPU 13 is a processor that controls the overall operation of the memory controller 10. The CPU 13 instructs the memory device 20 to write data via the memory I/F 12 in accordance with a write request received via the host I/F 11. The CPU 13 instructs the memory device 20 to read data via the memory I/F 12 in accordance with a read request received via the host I/F 11.

The ECC circuit 14 is a circuit that executes ECC processing. The ECC processing includes data coding and decoding. The ECC processing circuit 14 encodes data to be written in the memory device 20, and decodes data read out from the memory device 20.

The ROM 15 is a non-volatile memory. The ROM 15 stores programs such as firmware. The ROM 15 is, for example, an electrically erasable programmable read-only memory (EEPROM™). Operations of the memory controller 10 are realized by executing the firmware stored in the ROM 15 or the like by the CPU 13.

The RAM 16 is a volatile memory. The RAM 16 is used as a work area of the CPU 13. The RAM 16 is a dynamic random access memory (DRAM), a static random access memory (SRAM), or the like.

The buffer memory 17 is, for example, a volatile memory. The buffer memory 17 temporarily stores data received via the host I/F 11, data received via the memory I/F 12, or the like. The buffer memory 17 is a dynamic random access memory (DRAM), a static random access memory (SRAM), or the like.

[1-1-3] Hardware Configuration of Memory Device 20

Figure 3:
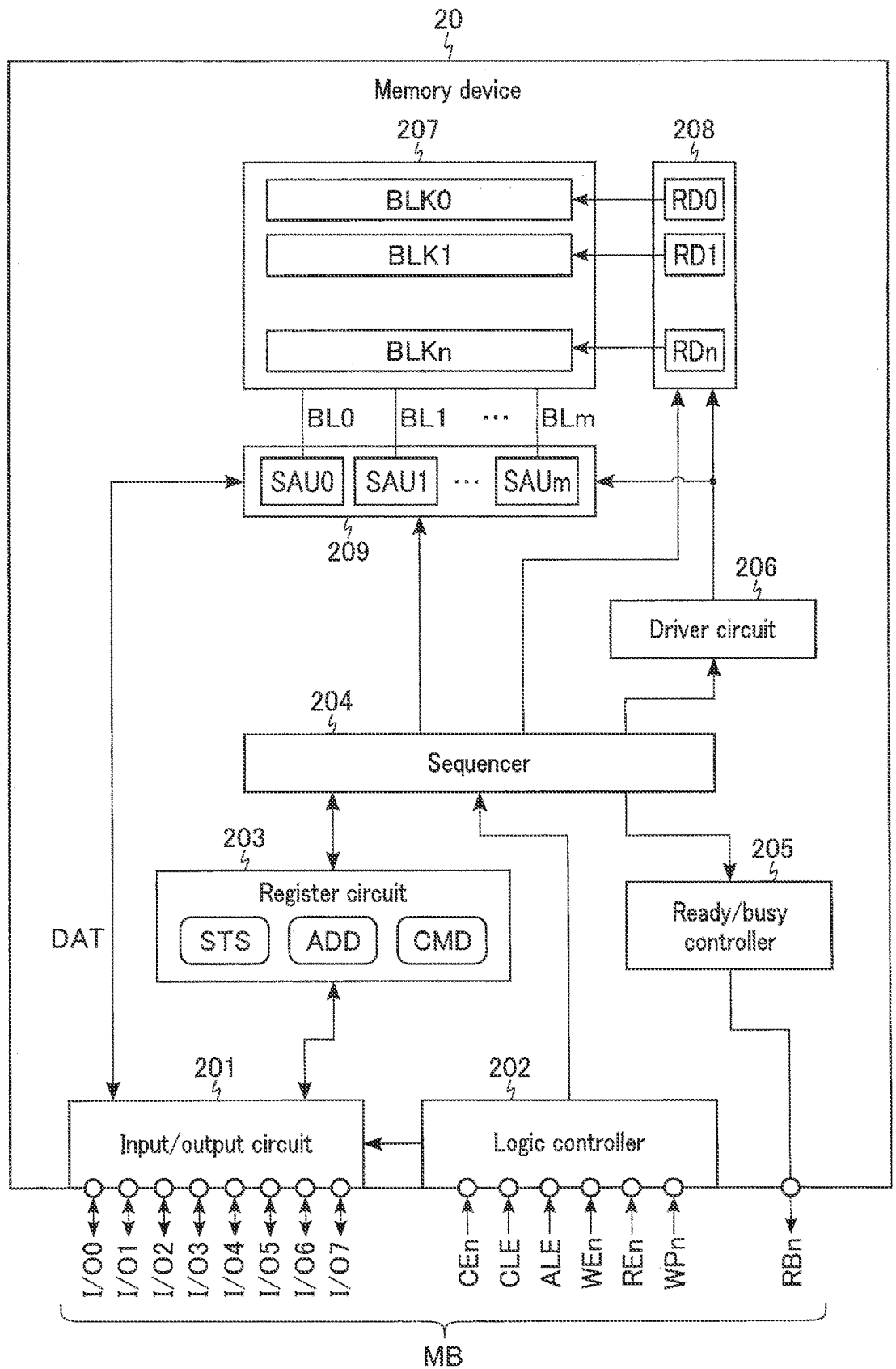
FIG. 3 is a block diagram illustrating an example of a hardware configuration of a memory device of the first embodiment.

FIG. 3 is a block diagram illustrating an example of a hardware configuration of the memory device 20 of the first embodiment. As illustrated in FIG. 3, the memory device 20 includes, for example, an input/output circuit 201, a logic controller 202, a register circuit 203, a sequencer 204, a ready/busy controller 205, a driver circuit 206, a memory cell array 207, a row decoder module 208, and a sense amplifier module 209. Signals transmitted or received via the memory bus MB include, for example, input/output signals I/O0 to I/O7, control signals CEn, CLE, ALE, WEn, REn, and WPn, and a ready/busy signal RBn.

The input/output circuit 201 is an interface circuit that serves to transmit and receive the input/output signals I/O0 to I/O7. The input/output signal I/O includes data DAT, status information STS, address information ADD, and a command CMD. The input/output circuit 201 can transfer (input or output) the data DAT between itself and the sense amplifier module 209. The input/output circuit 201 can transfer (output) to the memory controller 10 the status information STS transferred from the register circuit 203. The input/output circuit 201 can transfer, to the register circuit 203, each of the address information ADD and the command CMD transferred from the memory controller 10.

The logic controller 202 is a controller for controlling each of the input/output circuit 201 and the sequencer 204 based on the control signals CEn, CLE, ALE, WEn, REn, and WPn received from the memory controller 10. The logic controller 202 enables the memory device 20 based on the control signal CEn. The logic controller 202 notifies the input/output circuit 201 that the input/output signals I/O received by the memory device 20 are the command CMD and the address information ADD, respectively, based on the control signals CLE and ALE. The logic controller 202 instructs the input/output circuit 201 to receive an input/output signal I/O based on the control signal WEn, and instructs the input/output circuit 201 to output an input/output signal I/O based on the control signal REn. The logic controller 202 brings the memory device 20 into a protection state based on the control signal WPn, when the power supply is turned on and off.

The register circuit 203 is a circuit to temporarily store the status information STS, the address information ADD, and the command CMD. The status information STS stored in the register circuit 203 is updated under the control of the sequencer 204, and transferred to the input/output circuit 201. The address information ADD includes a block address, a page address, a column address, etc. The command CMD includes instructions relating to various operations of the memory device 20.

The sequencer 204 is a controller to control the overall operation of the memory device 20. The sequencer 204 executes a read operation, a write operation, an erase operation, etc. based on the command CMD and the address information ADD stored in the register circuit 203.

The ready/busy controller 205 is a controller to generate a ready/busy signal RBn under the control of the sequencer 204. The ready/busy signal RBn is a signal to notify the memory controller 10 of whether the memory device 20 is in a ready state or in a busy state. The "ready state" is a state in which the memory device 20 accepts an instruction from the memory controller 10, and notified by a ready/busy signal RBn at "H" level. The "busy state" is a state in which the memory device 20 does not accept an instruction from the memory controller 10, and notified by the ready/busy signal RBn at "L" level.

The driver circuit 206 is a circuit to generate voltages for use in a read operation, a write operation, an erase operation, etc. The driver circuit 206 supplies the generated voltages to the row decoder module 208, the sense amplifier module 209, etc.

The memory cell array 207 is a set of the memory cell transistors MT. The memory cell array 207 includes a plurality of blocks BLK0 to BLKn (n is an integer of 1 or more). A block address is assigned to each of the blocks BLK. The block BLK includes a plurality of pages. The block BLK is used, for example, as a data erase unit. The memory cell array 207 is provided with a plurality of bit lines BL0 to BLm (m is an integer of 1 or more) and a plurality of word lines WL.

The row decoder module 208 is a circuit for use in selecting a block BLK to be operated, and transferring a voltage to interconnects, such as the word lines WL. The row decoder module 208 includes a plurality of row decoders RD0 to RDn. The row decoders RD0 to RDn are associated with the blocks BLK0 to BLKn, respectively.

The sense amplifier module 209 is a circuit for use in transferring a voltage to each bit line BL and reading data. The sense amplifier module 209 includes a plurality of sense amplifier units SAU0 to SAUm. The sense amplifier units SAU0 to SAUm are associated with the bit lines BL0 to BLm, respectively.

[1-1-4] Circuit Configuration of Memory Device 20
(Circuit Configuration of Memory Cell Array 207)

Figure 4:
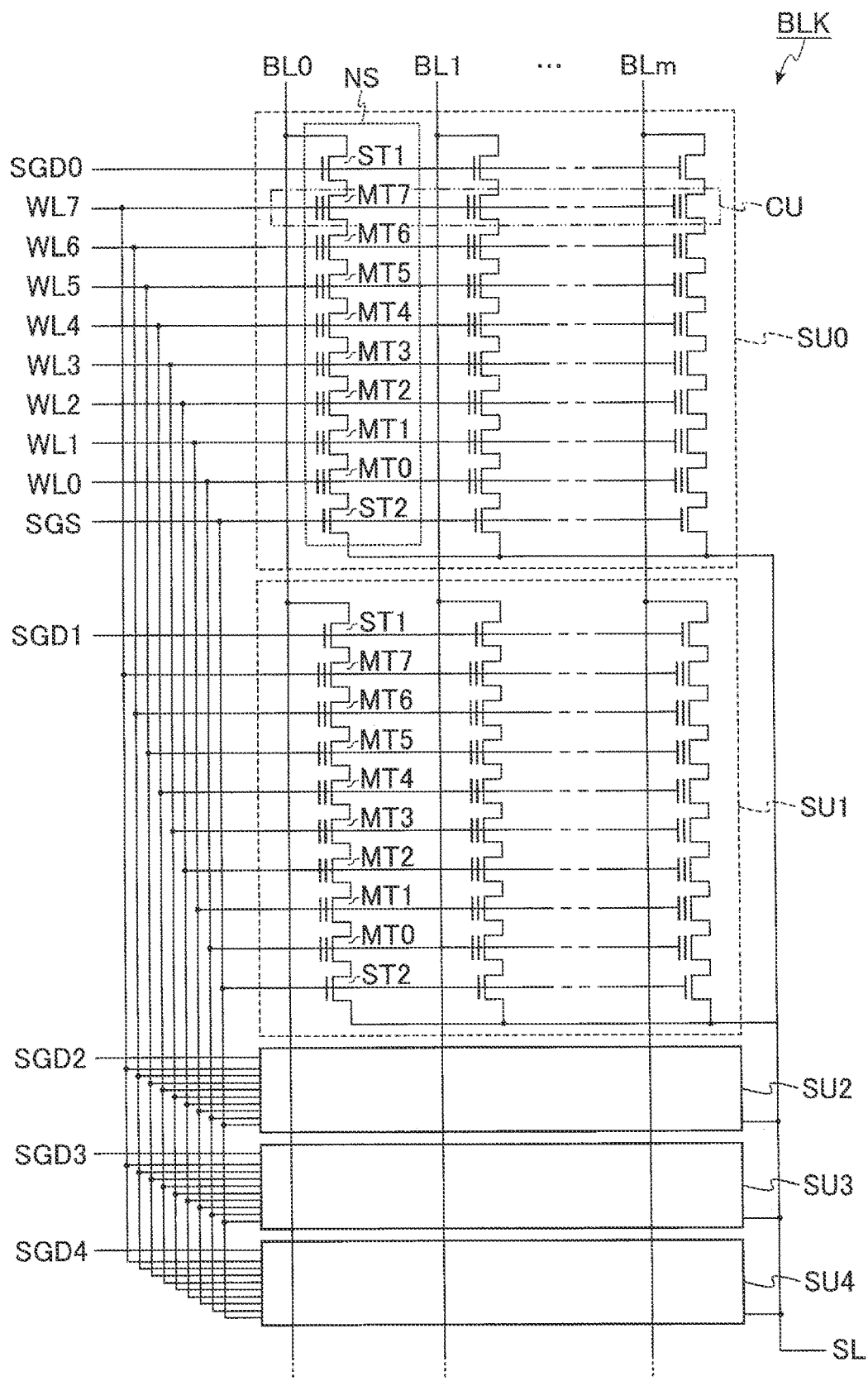
FIG. 4 is a circuit diagram illustrating an example of a circuit configuration of a memory cell array provided in the memory device of the first embodiment.

FIG. 4 is a circuit diagram illustrating an example of a circuit configuration of the memory cell array 207 provided in the memory device 20 of the first embodiment. FIG. 4 shows a circuit configuration of one of the blocks BLK. As illustrated in FIG. 4, the block BLK includes, for example, string units SU0 to SU4, word lines WL0 to WL7, select gate lines SGD0 to SGD4, a select gate line SGS, and a source line SL.

Each string unit SU includes a plurality of NAND strings NS. The plurality of NAND strings NS in each string unit SU are coupled to bit lines BL0 to BLm, respectively. Each NAND string NS includes memory cell transistors MT0 to MT7 and select transistors ST1 and ST2. Each memory cell transistor MT includes a control gate and a charge storage layer, and stores data in a non-volatile manner. Each of the select transistors ST1 and ST2 is used to select a string unit SU.

The drain of the select transistor ST1 is coupled to the associated bit line BL. The source of the select transistor ST1 is coupled to the drain of the memory cell transistor MT7. The memory cell transistors MT0 to MT7 are coupled in series. The source of the memory cell transistor MT0 is coupled to the drain of the select transistor ST2. The source of the select transistor ST2 is coupled to the source line SL. The source line SL is shared by, for example, a plurality of blocks BLK. The word lines WL0 to WL7 are respectively coupled to the memory cell transistors MT0 to MT7 of each NAND string NS. The select gate lines SGD0 to SGD4 are respectively coupled to the gates of the transistors ST1 included in the respective string units SU0 to SU4. The select gate line SGS is coupled to the select transistor ST2 in each NAND string NS.

In this specification, a set of memory cell transistors MT coupled to the same word line WL and included in the same string unit SU will be referred to as a "cell unit CU". In the memory device 20, each memory cell transistor MT stores 5-bit data. In other words, each cell unit CU can store 5-page data. The memory cell array 207 may have other circuit configurations. The number of string units SU included in each block BLK and the numbers of memory cell transistors MT and select transistors ST1 and ST2 included in each NAND string NS may be set freely.

(Circuit Configuration of Row Decoder Module 208)

FIG. 5 is a circuit diagram illustrating an example of a circuit configuration of the row decoder module 208 in the memory device 20 of the first embodiment. FIG. 5 illustrates the connectivity relationship between the row decoder module 208 and each of the driver circuit 206 and the memory cell array 207, and a detailed circuit configuration of the row decoder RD0 of the row decoders RD0 to RDn. As illustrated in FIG. 5, each row decoder RD is coupled to the driver circuit 206 via signal lines CG0 to CG11, SGDD0 to SGDD4, SGSD, USGD, and USGS. Each row decoder RD is coupled to an associated block BLK via the word lines WL0 to WL7, and the select gate lines SGS and SGD0 to SGD4.

The connectivity relationship between each element of the row decoder RD (a row decoder RD0 as a representative) and each of the driver circuit 206 and the block BLK0 will be explained below. The row decoder RD0 includes transistors TR0 to TR19, transfer gate lines TG and bTG, and a block decoder BD. Each of the transistors TR0 to TR19 is a high-breakdown-voltage N-type MOS transistor.

The drain and source of the transistor TR0 are coupled to the signal line SGSD and the select gate line SGS, respectively. The drains of the transistors TR1 to TR8 are coupled to the signal lines CG0 to CG7, respectively. The sources of the transistors TR1 to TR8 are coupled to the word lines WL0 to WL7, respectively. The drains of the transistors TR9 to TR13 are coupled to the signal lines SGDD0 to SGDD4, respectively. The sources of the transistors TR9 to TR13 are coupled to the select gate lines SGD0 to SGD4, respectively. The drain and source of the transistor TR14 are coupled to the signal line USGS and the select gate line SGS, respectively. The drains of the transistors TR15 to TR19 are coupled to the signal line USGD. The sources of the transistors TR15 to TR19 are coupled to the select gate lines SGD0 to SGD4, respectively. The gates of the transistors TR0 to TR13 are coupled to the transfer gate line TG. The gates of the transistors TR14 to TR19 are coupled to the transfer gate line bTG.

The block decoder BD is a decoder to decode a block address. The block decoder BD applies predetermined voltages to the transfer gate lines TG and bTG based on the block address decoding result. Specifically, the block decoder BD associated with a selected block BLK applies "H" and "L" level voltages to the transfer gate lines TG and bTG, respectively. The block decoders BD associated with unselected blocks ELK apply "L" and "H" level voltages to the transfer gate lines TG and bTG, respectively. As a result, the voltages of the signal lines CG0 to CG7 are respectively transferred to the word lines WL0 to WL7 of the selected block BLK, the voltages of the signal lines SGDD0 to SGDD4 and SGSD are respectively transferred to the select gate lines SGD0 to SGD4 and SGS of the selected block ELK, and the voltages of the signal lines USGD and USGS are respectively transferred to the select gate lines SGD and SGS of the unselected blocks BLK.

The row decoder module 208 may have other circuit configurations. For example, the number of transistors TR included in the row decoder module 208 may be changed in accordance with the number of interconnects provided in each block BLK. Since the signal line CG is shared by a plurality of blocks ELK, it may be referred to as a "global word line". Since the word line WL is provided for each block, it may be referred to as a "local word line". Since each of the signal lines SGDD and SGSD is shared by a plurality of blocks BLK, it may be referred to as a "global transfer gate line". Since each of the select gate lines SGD and SGS is provided for each block, it may be referred to as a "local transfer gate line".

(Circuit Configuration of Sense Amplifier Module 209)

Figure 6:
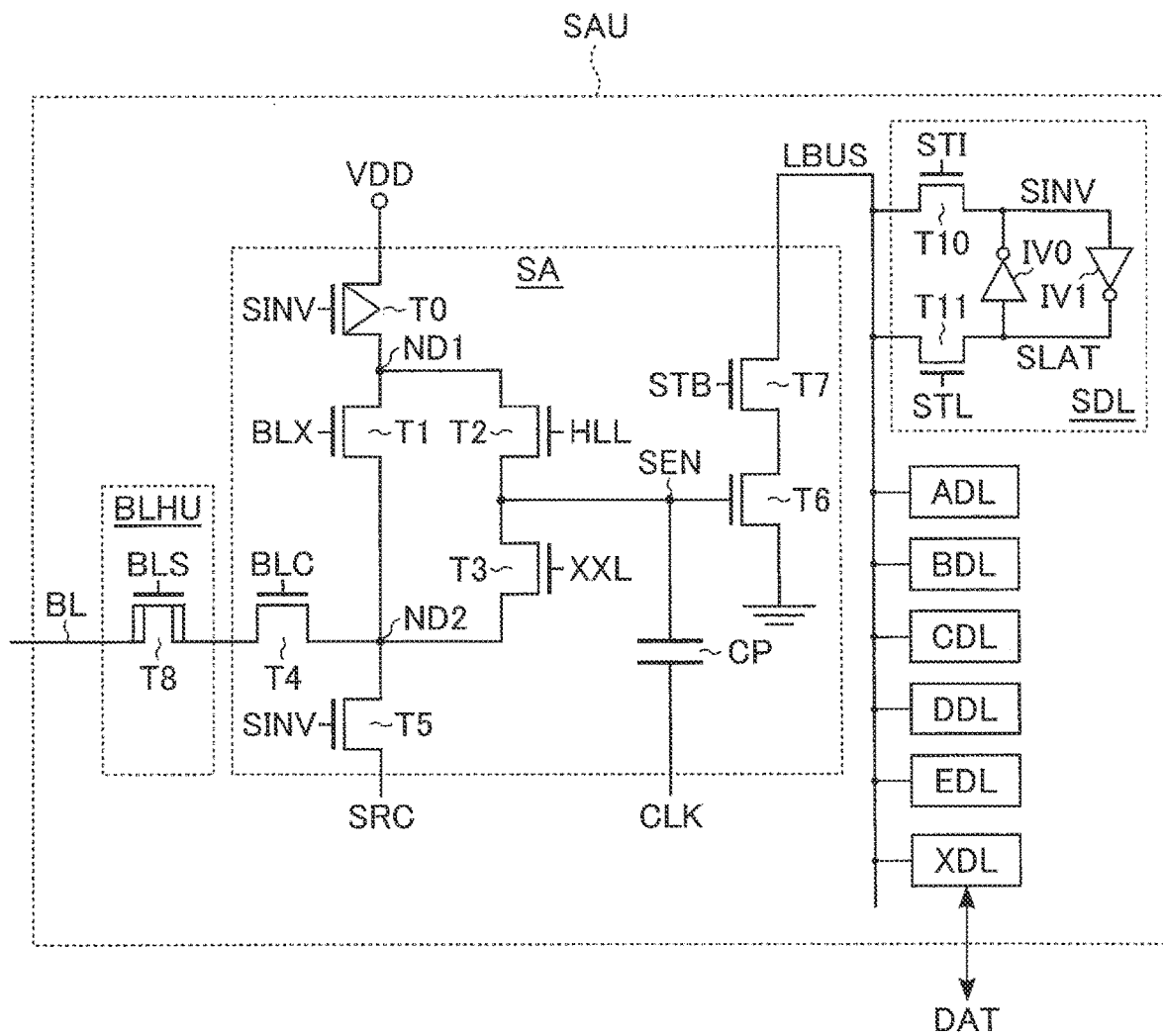
FIG. 6 is a circuit diagram illustrating an example of a circuit configuration of a sense amplifier module provided in the memory device of the first embodiment.

FIG. 6 is a circuit diagram illustrating an example of a circuit configuration of the sense amplifier module 209 provided in the memory device 20 of the first embodiment. FIG. 6 shows a circuit configuration of one of the sense amplifier units SAU. As illustrated in FIG. 6, the sense amplifier unit SAU includes a sense amplifier section SA, a bit line connection section BLHU, latch circuits SDL, ADL, BDL, CDL, DDL, EDL, and XDL, and a bus LBUS. The sense amplifier section SA is coupled to the latch circuits SDL, ADL, BDL, CDL, DDL, EDL, and XDL via the bus LBUS in such a manner that data can be transmitted and received.

The sense amplifier section SA is a circuit for use in determining data based on a voltage of the bit line BL and the application of a voltage to the bit line BL. When the control signal STB is asserted in a read operation, the sense amplifier section SA determines whether the data read from the selected memory cell transistor MT is "0" or "1", based on the voltage of the associated bit line BL. Each of the latch circuits SDL, ADL, BDL, CDL, DDL, EDL, and XDL is a circuit capable of temporarily storing data. The latch circuit XDL is used for the input/output of data DAT between the sense amplifier unit SAU and the input/output circuit 201. The latch circuit XDL can also be used as a cache memory. The memory device 20 can be in the ready state at least when the latch circuit XDL is vacant.

The sense amplifier section SA includes transistors T0 to T7, a capacitor CP, and nodes ND1, ND2, SEN, and SRC. The bit line connection unit BLHU includes a transistor T8. The latch circuit SDL includes inverters IV0 and IV1, transistors T10 and T11, and nodes SINV and SLAT. The transistor T0 is a P-type MOS transistor. Each of the transistors T1 to T8, T10 and T11 is an N-type MOS transistor. The transistor T8 is an N-type MOS transistor having a higher breakdown voltage than each of the N-type transistors in the sense amplifier section SA.

The gate of the transistor T0 is coupled to the node SINV. The source of the transistor T0 is coupled to a power supply line. The drain of the transistor T0 is coupled to the node ND1. The node ND1 is coupled to the drains of the transistors T1 and T2. The sources of the transistors T1 and T2 are coupled to the nodes ND2 and SEN, respectively. The nodes ND2 and SEN are respectively coupled to the source and drain of the transistor T3. The node ND2 is coupled to the drains of the transistors T4 and T5. The source of the transistor T5 is coupled to the node SRC. The gate of the transistor T5 is coupled to the node SINV. The node SEN is coupled to the gate of the transistor T6 and one electrode of the capacitor CP. The source of the transistor T6 is grounded. The drain and source of the transistor T7 is coupled to the bus LBUS and the drain of the transistor T6, respectively. The drain of the transistor T8 is coupled to the source of the transistor T4. The source of the transistor T8 is coupled to the associated bit line BL.

For example, a power supply voltage VDD is applied to the source of the transistor T0. For example, a ground voltage VSS is applied to the node SRC. Control signals BLX, HLL, XXL, BLC, and STB are input to the gates of the transistors T1, T2, T3, T4, and T7, respectively. A control signal BLS is input to the gate of the transistor T8. A clock signal CLK is input to the other electrode of the capacitor CP.

The input node of the inverter IV0 is coupled to the node SLAT. The output node of the inverter IV0 is coupled to the node SINV. The input node of the inverter IV1 is coupled to the node SINV. The output node of the inverter IV1 is coupled to the node SLAT. One end of the transistor T10 is coupled to the node SINV. The other end of the transistor T10 is coupled to the bus LBUS. A control signal STI is input to the gate of the transistor T10. One end of the transistor T11 is coupled to the node SLAT. The other end of the transistor T11 is coupled to the bus LBUS. A control signal STL is input to the gate of the transistor T11. The latch circuit SDL stores data at the node SLAT, and stores, at the node SINV, inverted data of the data stored at the node SLAT.

The circuit configurations of the latch circuits ADL, BDL, CDL, DDL, EDL, and XDL are similar to that of the latch circuit SDL. For example, the latch circuit ADL stores data at the node ALAT, and stores, at the node AINV, inverted data of the data stored at the node ALAT. A control signal ATI is input to the gate of the transistor T10 of the latch circuit ADL, and a control signal ATL is input to the gate of the transistor T11 of the latch circuit ADL. The latch circuit BDL stores data at the node BLAT, and stores, at the node BINV, inverted data of the data stored at the node BLAT. A control signal BTI is input to the gate of the transistor T10 of the latch circuit BDL, and a control signal BTL is input to the gate of the transistor T11 of the latch circuit BDL. The same applies to the latch circuits CDL, DDL, and EDL, and descriptions will be omitted.

The control signals BLX, HLL, XXL, BLC, STB, BLS, STI, and STL, and the clock signal CLK are generated by, for example, the sequencer 204. The sense amplifier module 209 may have other circuit configurations. For example, the number of latch circuits provided in each sense amplifier unit SAU may be eight or more. The sense amplifier unit SAU may have a computing circuit capable of executing a simple logic operation. In this specification, asserting a control signal corresponds to temporarily changing a voltage at the "L" level to a voltage at the "H" level. When the transistor T6 is a P-type transistor, asserting the control signal STB corresponds to temporarily changing a voltage at the "H" level to a voltage at the "L" level. In an operation of reading each page, the sense amplifier module 209 executes the logic operation using the latch circuit as needed, so that it can confirm (determine) the data stored in the memory cell transistor MT.

[1-1-5] Threshold Voltage Distribution of Memory Cell Transistor MT

Figure 7:
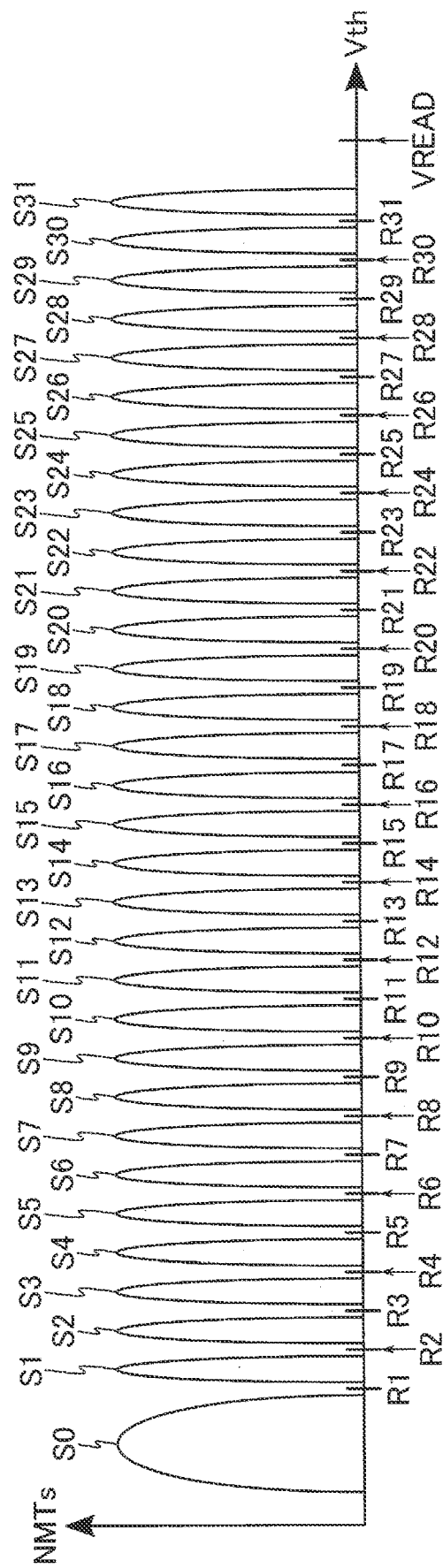
FIG. 7 is a schematic diagram illustrating an example of a threshold voltage distribution of memory cell transistors of the memory device of the first embodiment.

FIG. 7 is a schematic diagram illustrating an example of the threshold voltage distribution of the memory cell transistors MT of the memory device 20 of the first embodiment. "NMTs" on the vertical axis indicates the number of memory cell transistors MT. "Vth" on the horizontal axis indicates the threshold voltages of the memory cell transistors MT. As illustrated in FIG. 7, the threshold voltage distribution of the memory cell transistors MT in the memory device 20 can form states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31 in the order from the lowest threshold voltage.

In the memory device 20, read voltages R1 to R31 and read pass voltage VREAD are set to states S0 to S31. Specifically, the read voltage R1 is set between states S0 and S1, the read voltage R2 is set between states S1 and S2, the read voltage R3 is set between states S2 and S3, the read voltage R4 is set between states S3 and S4, . . . the read voltage R30 is set between states S29 and S30, and the read voltage R31 is set between states S30 and 31. The read pass voltage VREAD is set to a voltage higher than the voltage of state S31, which is the highest threshold voltage among all states S0 to S31. The memory cell transistor MT whose gate is applied with the read pass voltage VREAD is turned on regardless of the data it stores. Further, verify voltages are respectively set to adjacent states. Specifically, in a write operation, verify voltages V1 to V31 are respectively used for verify operations (verify reads) of states S1 to S31.

The set of the read voltages R1 to R31 illustrated in FIG. 7 may include negative voltages. The set of the read voltages R1 to R31 may be a combination of negative voltages, 0 V, and positive voltages. In other words, of the set of the read voltages R1 to R31, some may be negative voltages while others may be either 0 V or positive. For example, the read voltages R1 to R4 may be negative, the read voltage R5 may be 0 V, and the read voltages R6 to R31 may be positive. The set of the read voltages R1 to R31 may include negative and positive voltages without the inclusion of 0 V.

Each of data sets D0 to D31 is assigned to any one of states S0 to S31. The data sets D0 to D31 correspond to 32 sets of 5-bit data that differ from one another. Each of the data sets D0 to D31 includes first to fifth bit data. In the following, specific data of each of the data sets DO to D31 are listed.

(Explanatory note) Data set: "first bit data/second bit data/third bit data/fourth bit data/fifth bit data"

D0: "00000"
D1: "00001"
D2: "00010"
D3: "00011"
D4: "00100"
D5: "00101"
D6: "00110"
D7: "00111"
D8: "01000"
D9: "01001"
D10: "01010"
D11: "01011"
D12: "01100"
D13: "01101"
D14: "01110"
D15: "01111"
D16: "10000"
D17: "10001"
D18: "10010"
D19: "10011"
D20: "10100"
D21: "10101"
D22: "10110"
D23: "10111"
D24: "11000"
D25: "11001"
D26: "11010"
D27: "11011"
D28: "11100"
D29: "11101"
D30: "11110"
D31: "11111"

[1-1-6] Data Allocation

Figure 8:
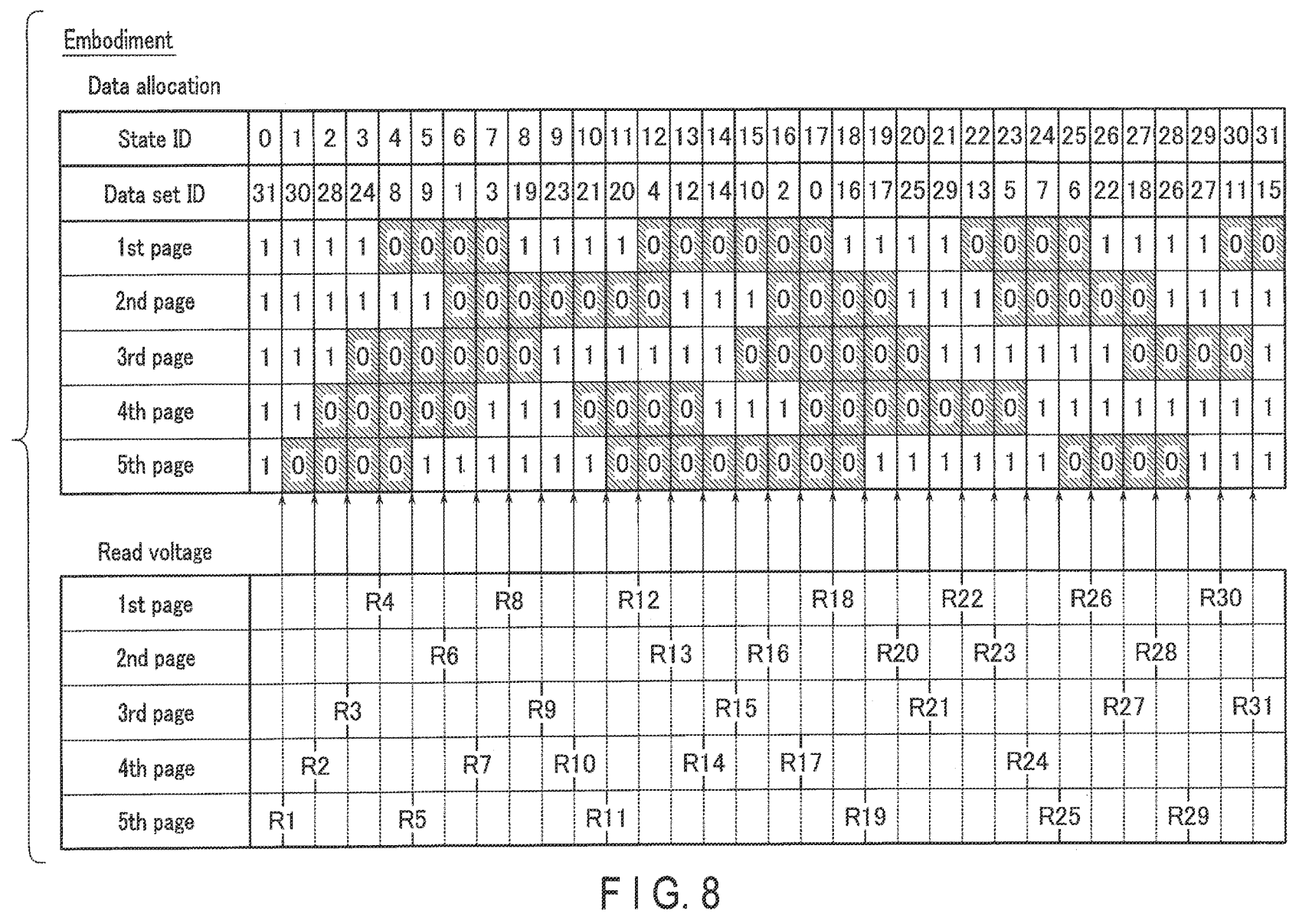

FIG. 8 is a table illustrating a setting of a data allocation and a read voltage for use in the memory device 20 of the first embodiment. The memory device 20 of the first embodiment uses a data allocation of storing 5-page data in one cell unit CU, namely, 5 bits/cell coding. The data allocation and the setting of read voltages in the first embodiment will be explained with reference to FIG. 8.

The "state ID" indicated in the drawings referred to by the specification corresponds to the numeral appended to the reference symbol "S" representing the state. The "data set ID" indicated in the drawings referred to by the specification corresponds to the numeral appended to the reference symbol "D" representing the data set. "First page (first page data PG1)" corresponds to a first bit data group stored in the cell unit CU. "Second page (second page data PG2)" corresponds to a second bit data group stored in the cell unit CU. "Third page (third page data PG3)" corresponds to a third bit data group stored in the cell unit CU. "Fourth page (fourth page data PG4)" corresponds to a fourth bit data group stored in the cell unit CU. "Fifth page (fifth page data PG5)" corresponds to a fifth bit data group stored in the cell unit CU. In the following descriptions, read operations for the first to fifth pages are referred to as "first to fifth page reads".

In the data allocation of the first embodiment, the data sets D31, D30, D28, D24, D8, D9, D1, D3, D19, D23, D21, D20, D4, D12, D14, D10, D2, D0, D16, D17, D25, D29, D13, D5, D7, D6, D22, D18, D26, D27, D11, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the first embodiment, the read voltages for use in first page read are R4, R8, R12, R18, R22, R26, and R30. In the data allocation of the first embodiment, the read voltages for use in second page read are R6, R13, R16, R20, R23, and R28. In the data allocation of the first embodiment, the read voltages for use in third page read are R3, R9, R15, R21, R27, and R31. In the data allocation of the first embodiment, the read voltages for use in fourth page read are R2, R7, R10, R14, R17, and R24.

In the data allocation of the first embodiment, the read voltages for use in fifth page read are R1, R5, R11, R19, R25, and R29.

In the first page read, data is confirmed through read in seven times. In each of the second page read, the third page read, the fourth page read, and the fifth page read, data is confirmed through read in six times. Such a data allocation is referred to as, for example, "7-6-6-6-6 coding". In the data allocation of the first embodiment, the difference between a maximum value and a minimum value of the number of times of read that varies among pages and is set to confirm the data is "1". In the data allocation of the first embodiment, the interval between read voltages in each page is "3" at minimum and "8" at maximum.

In this specification, "the number of times of read" in a read in each page corresponds to the number of times the control signal STB is asserted. In other words, "the number of times of read" corresponds to the number of times a determination of a threshold voltage is executed at a read voltage. Executing the determination of data corresponding to a read voltage while the read voltage is being applied may be simply referred to as a "read". The "interval between read voltages" corresponds to the number of read voltages not used as a read voltage in one page of adjacent read voltages among a plurality of read voltages for use in the read operation of the page. In other words, the "interval between read voltages" corresponds to the number of states provided between the adjacent read voltages in the read operation of each page. For example, the interval between the read voltages R4 and R8 in the read operation of the first page is "4 (4 states)", since four states S4 to S7 are provided between the read voltages R4 and R8. The interval between the read voltages R12 and R18 in the read operation of the first page is "6 (6 states)", since six states S12 to S17 are provided between the read voltages R12 and R18.

[1-2] Operation

An operation of the memory system MS according to the first embodiment will be described below. In the following, a word line WL that is selected will be referred to as a "selected word line WLsel". Application of a voltage to the selected word line WLsel by the sequencer 204 corresponds to the application of a voltage by the driver circuit 206 via the row decoder module 208 under the control of the sequencer 204. The address information ADD and the command CMD received by the memory device 20 are transferred to the register circuit 203. "tR" in the drawings represents a period (time) in which the memory device 20 is busy according to the instructions of the memory controller 10.

In the following, details of first to fifth reads in the first embodiment will be explained in sequence. The specification exemplifies a case in which the voltage of the source line SL is constant in each of the first to fifth reads. The drawings referred to by the following description exemplify a case in which the voltage of the selected word line WLsel at each of the start and the end of a read operation is the ground voltage VSS. The embodiment is not limited to this case, and the voltage of the selected word line WLsel at the start and the end of a read operation may be a negative voltage.

[1-2-1] First Page Read

Figure 9:
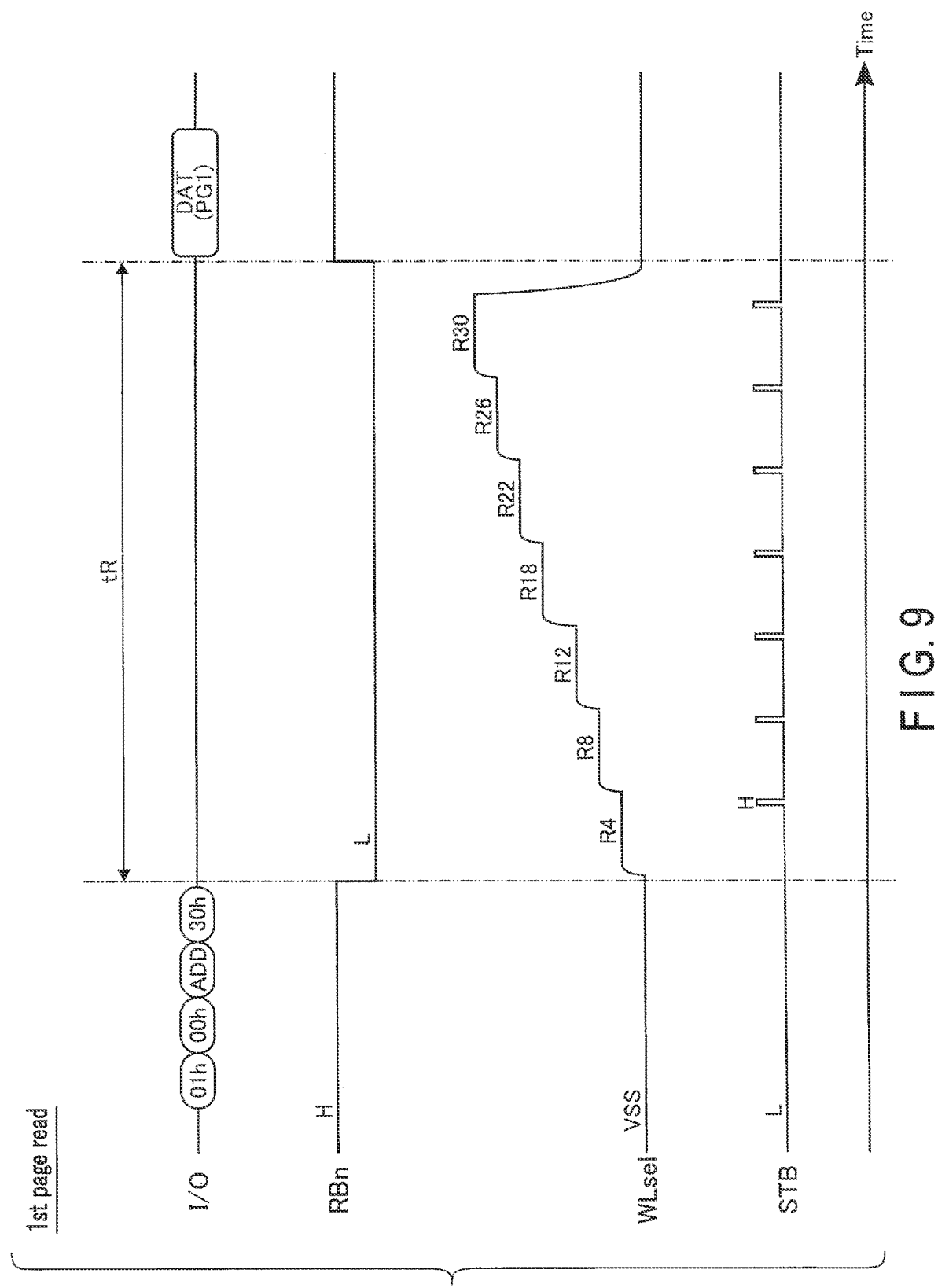
FIG. 9 is a timing chart illustrating an example of first page read in the memory system of the first embodiment.

FIG. 9 is a timing chart illustrating an example of the first page read in the memory system MS of the first embodiment. FIG. 9 shows transitions of the input/output signal I/O, the ready/busy signal RBn, the selected word line WLsel, and the control signal STB in the first page read of the first embodiment. Hereinafter, the first page read of the first embodiment will be described with reference to FIG. 9.

When executing the first page read, the memory controller 10 transmits, for example, a command "01h", a command "00h", an address "ADD", and a command "30h" to the memory device 20 in this order. The command "01h" designates an operation that selects the first page. The command "00h" designates a read operation. The address "ADD" includes an address of the word line WL which is a target of read. The command "30h" instructs starting of the read operation.

When the memory device 20 receives the command "30h", the sequencer 204 causes the memory device 20 to transition from the ready state to the busy state based on the command and the address stored in the register circuit 203. Then, the sequencer 204 applies the read voltages R4, R8, R12, R18, R22, R26, and R30 to the selected word line WLsel in this order. The sequencer 204 also asserts the control signal STB while applying each of the read voltages R4, R8, R12, R18, R22, R26, and R30. Each sense amplifier unit SAU confirms (determines) first bit data read from the memory cell transistor MT coupled to the selected word line WLsel, and causes the latch circuit XDL to store the determination result, under the control of the sequencer 204.

When the determination result of the first bit data is stored in the latch circuit XDL, the sequencer 204 causes the memory device 20 to transition from the busy state to the ready state. Then, based on the transition of the memory device 20 from the busy state to the ready state, the memory controller 10 instructs the memory device 20 to output the data DAT (first page data PG1) stored in each of the latch circuits XDL in the sense amplifier module 209. For example, the memory controller 10 can cause the memory device 20 to sequentially output the data DAT by toggling the control signal REn. Upon receipt of the first page data PG1, the memory controller 10 transfers the first page data PG1 to, for example, the host device HD, and ends the first page read.

[1-2-2] Second Page Read

Figure 10:
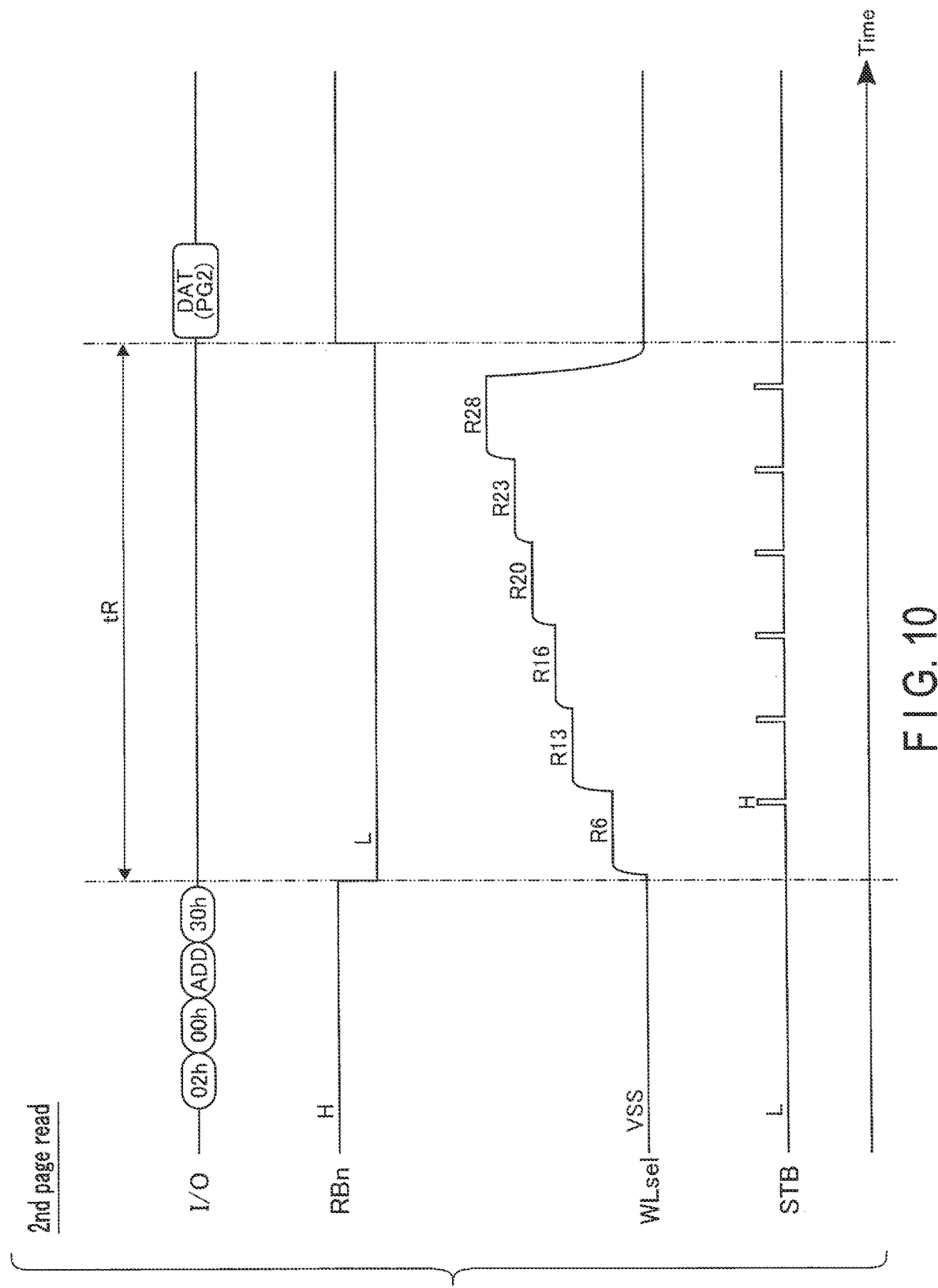
FIG. 10 is a timing chart illustrating an example of second page read in the memory system of the first embodiment.

FIG. 10 is a timing chart illustrating an example of second page read in the memory system MS of the first embodiment. FIG. 10 shows transitions of the input/output signal I/O, the ready/busy signal RBn, the selected word line WLsel, and the control signal STB in the second page read of the first embodiment. Hereinafter, the second page read of the first embodiment will be described with reference to FIG. 10.

When executing the second page read, the memory controller 10 transmits, for example, a command "02h", the command "00h", the address "ADD", and the command "30h" to the memory device 20 in this order. The command "02h" designates an operation that selects the second page.

When the memory device 20 receives the command "30h", the sequencer 204 causes the memory device 20 to transition from the ready state to the busy state based on the command and the address stored in the register circuit 203. Then, the sequencer 204 applies the read voltages R6, R13, R16, R20, R23, and R28 to the selected word line WLsel in this order. The sequencer 204 also asserts the control signal STB while applying each of the read voltages R6, R13, R16, R20, R23, and R28. Each sense amplifier unit SAU confirms (determines) second bit data read from the memory cell transistor MT coupled to the selected word line WLsel, and causes the latch circuit XDL to store the determination result, under the control of the sequencer 204.

When the determination result of the second bit data is stored in the latch circuit XDL, the sequencer 204 causes the memory device 20 to transition from the busy state to the ready state. Then, based on the transition of the memory device 20 from the busy state to the ready state, the memory controller 10 instructs the memory device 20 to output the data DAT (second page data PG2) stored in each of the latch circuits XDL in the sense amplifier module 209. Upon receipt of the second page data PG2, the memory controller 10 transfers the second page data PG2 to, for example, the host device HD, and ends the second page read.

[1-2-3] Third Page Read

Figure 11:
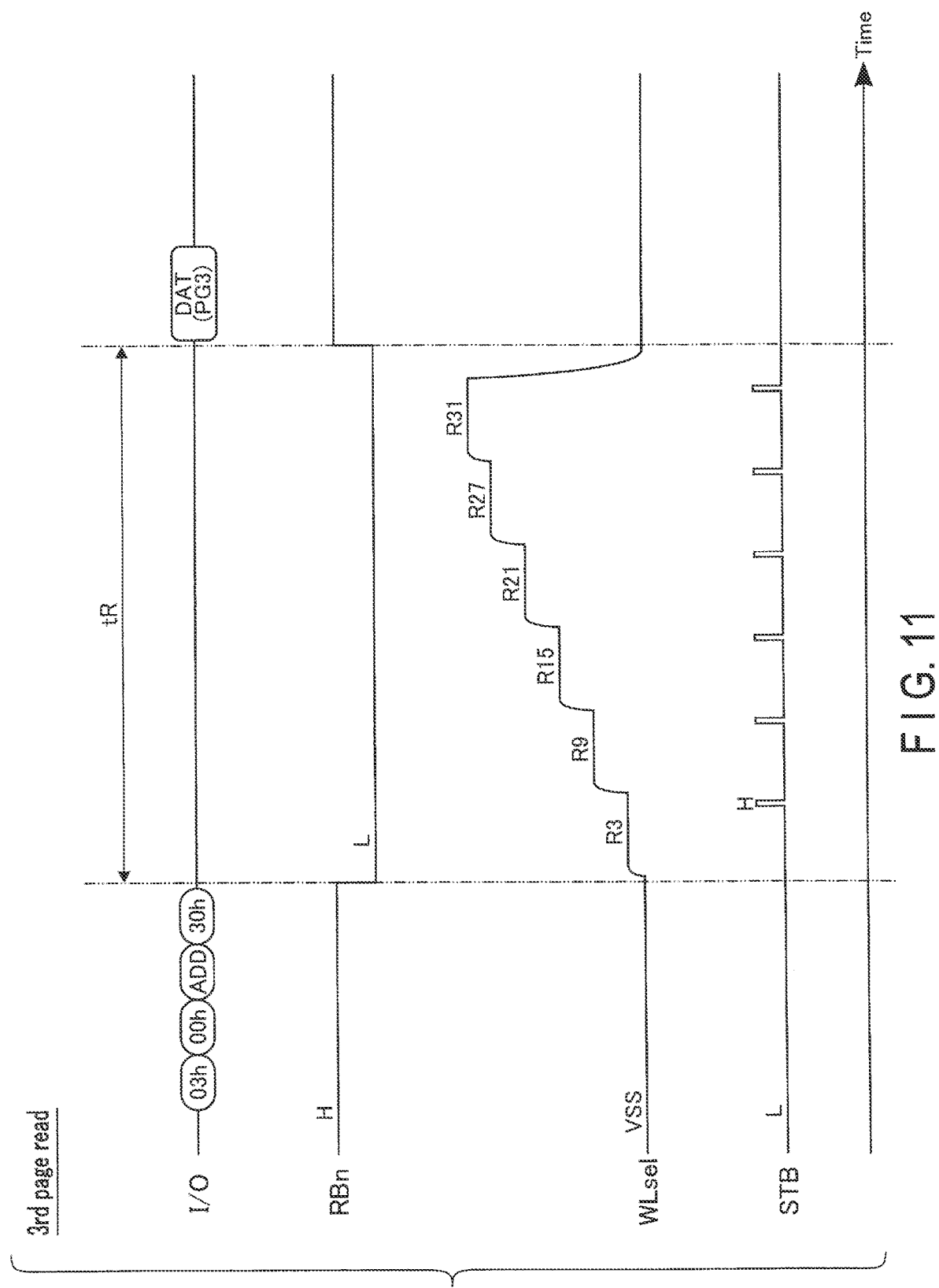
FIG. 11 is a timing chart illustrating an example of third page read in the memory system of the first embodiment.

FIG. 11 is a timing chart illustrating an example of third page read in the memory system MS of the first embodiment. FIG. 11 shows transitions of the input/output signal I/O, the ready/busy signal RBn, the selected word line WLsel, and the control signal STB in the third page read of the first embodiment. Hereinafter, the third page read of the first embodiment will be described with reference to FIG. 11.

When executing the third page read, the memory controller 10 transmits, for example, a command "03h", the command "00h", the address "ADD", and the command "30h" to the memory device 20 in this order. The command "03h" designates an operation that selects the third page.

When the memory device 20 receives the command "30h", the sequencer 204 causes the memory device 20 to transition from the ready state to the busy state based on the command and the address stored in the register circuit 203. Then, the sequencer 204 applies the read voltages R3, R9, R15, R21, R27, and R31 to the selected word line WLsel in this order. The sequencer 204 also asserts the control signal STB while applying each of the read voltages R3, R9, R15, R21, R27, and R31. Each sense amplifier unit SAU confirms (determines) third bit data read from the memory cell transistor MT coupled to the selected word line WLsel, and causes the latch circuit XDL to store the determination result, under the control of the sequencer 204.

When the determination result of the third bit data is stored in the latch circuit XDL, the sequencer 204 causes the memory device 20 to transition from the busy state to the ready state. Then, based on the transition of the memory device 20 from the busy state to the ready state, the memory controller 10 instructs the memory device 20 to output the data DAT (third page data PG3) stored in each of the latch circuits XDL in the sense amplifier module 209. Upon receipt of the third page data PG3, the memory controller 10 transfers the third page data PG3 to, for example, the host device HD, and ends the third page read.

[1-2-4] Fourth Page Read

FIG. 12 is a timing chart illustrating an example of fourth page read in the memory device of the first embodiment. FIG. 12 shows transitions of the input/output signal I/O, the ready/busy signal RBn, the selected word line WLsel, and the control signal STB in the fourth page read of the first embodiment. Hereinafter, the fourth page read of the first embodiment will be described with reference to FIG. 12.

When executing the fourth page read, the memory controller 10 transmits, for example, a command "04h", the command "00h", the address "ADD", and the command "30h" to the memory device 20 in this order. The command "04h" designates an operation that selects the fourth page.

When the memory device 20 receives the command "30h", the sequencer 204 causes the memory device 20 to transition from the ready state to the busy state based on the command and the address stored in the register circuit 203. Then, the sequencer 204 applies the read voltages R2, R7, R10, R14, R17, and R24 to the selected word line WLsel in this order. The sequencer 204 also asserts the control signal STB while applying each of the read voltages R2, R7, R10, R14, R17, and R24. Each sense amplifier unit SAU confirms (determines) fourth bit data read from the memory cell transistor MT coupled to the selected word line WLsel, and causes the latch circuit XDL to store the determination result, under the control of the sequencer 204.

When the determination result of the fourth bit data is stored in the latch circuit XDL, the sequencer 204 causes the memory device 20 to transition from the busy state to the ready state. Then, based on the transition of the memory device 20 from the busy state to the ready state, the memory controller 10 instructs the memory device 20 to output the data DAT (fourth page data PG4) stored in each of the latch circuits XDL in the sense amplifier module 209. Upon receipt of the fourth page data PG4, the memory controller 10 transfers the fourth page data PG4 to, for example, the host device HD, and ends the fourth page read.

[1-2-5] Fifth Page Read

FIG. 13 is a timing chart illustrating an example of fifth page read in the memory device of the first embodiment. FIG. 13 shows transitions of the input/output signal I/O, the ready/busy signal RBn, the selected word line WLsel, and the control signal STB in the fifth page read of the first embodiment. Hereinafter, the fifth page read of the first embodiment will be described with reference to FIG. 13.

When executing the fifth page read, the memory controller 10 transmits, for example, a command "05h", the command "00h", the address "ADD", and the command "30h" to the memory device 20 in this order. The command "05h" designates an operation that selects the fifth page.

When the memory device 20 receives the command "30h", the sequencer 204 causes the memory device 20 to transition from the ready state to the busy state based on the command and the address stored in the register circuit 203. Then, the sequencer 204 applies the read voltages R1, R5, R11, R19, R25, and R29 to the selected word line WLsel in this order. The sequencer 204 also asserts the control signal STB while applying each of the read voltages R1, R5, R11, R19, R25, and R29. Each sense amplifier unit SAU confirms (determines) fifth bit data read from the memory cell transistor MT coupled to the selected word line WLsel, and causes the latch circuit XDL to store the determination result, under the control of the sequencer 204.

When the determination result of the fifth bit data is stored in the latch circuit XDL, the sequencer 204 causes the memory device 20 to transition from the busy state to the ready state. Then, based on the transition of the memory device 20 from the busy state to the ready state, the memory controller 10 instructs the memory device 20 to output the data DAT (fifth page data PG5) stored in each of the latch circuits XDL in the sense amplifier module 209. Upon receipt of the fifth page data PG5, the memory controller 10 transfers the fifth page data PG5 to, for example, the host device HD, and ends the fifth page read.

[1-3] Advantages of First Embodiment

According to the memory device 20 of the first embodiment explained above, an efficient read operation can be performed. Details of advantages of the first embodiment will be described below.

In data allocation specialized in memory devices, 5-bit data allocated to one state is set to be different only in the aspect of one bit from 5-bit data allocated to adjacent states. Coding specialized in memory devices of 5 bits/cell can be performed in 10 million or more ways if allocation of pages is not taken into consideration. If allocation of pages is taken into consideration, 5 bits/cell coding can be performed in about one hundred thousand ways.

For efficient allocation of read voltages, it is preferable that the number of reads in each page be a mean value, as well as the interval between read voltages in each page. A mean value for the number of reads in each page can average the probability of the occurrence of a defect in each page. A mean interval between read voltages in each page can reduce read noise and average the read voltage setup times. Since the time for a read operation in each page can be reduced by averaging the setup times, the latency of the read operation of the memory device 20 can be improved.

In the case of 5 bits/cell, it is ideal that the number of reads is as follows: (PG1, PG2, PG3, PG4, PG5)=(7, 6, 6, 6, 6), that the interval between read voltages in each page be "4" at minimum, and that the interval at maximum be as small as possible. The number "4" as the optimum interval between read voltages at minimum is based on the fact that there are 31 types of read voltage in 5 bits/cell coding and that the result of dividing "31" by the number of reads "7" is close to "4". However, there is no data allocation that satisfies the number of reads being (PG1, PG2, PG3, PG4, PG5)=(7, 6, 6, 6, 6) and the interval between read voltages in each page being "4" at minimum.

In the determination of data using the lowest read voltage R1, the probability of the occurrence of a defect tends to be high due to a wide upper skirt of distribution of the lowest state S0. In the determination of data using the highest read voltage R31, the probability of the occurrence of a defect tends to be high due to a wide lower skirt of distribution of the highest state S31. In a page which is read seven times, the probability of the occurrence of a defect tends to be higher than that in a page which is read just six times. Therefore, in the memory, it is preferable that the interval between read voltages in a page read seven times be set as a mean value, and that the lowest or highest read voltage of the 31 types of read voltages be unused.

The data allocation in the memory device 20 of the first embodiment is set to nearly ideal conditions. Specifically, in the data allocation of the first embodiment, the number of reads satisfies (PG1, PG2, PG3, PG4, PG5)=(7, 6, 6, 6, 6) and the interval between read voltages in each page is "3" at minimum and "8" at maximum. Furthermore, in the first page, which is read seven times, the lowest read voltage is R4 and the highest read voltage is R30. In other words, in the first page read of the first embodiment, the lowest read voltage R4 is set apart from R1 by three states, and the highest read voltage R30 is set apart from R31 by one state.

As a result, in the memory device 20 of the first embodiment, the number of reads in each page is a mean value, and the probability of the occurrence of a defect can be averaged. Due to the averaging of the probability of the occurrence of a defect, the memory device 20 can suppress the occurrence of a read operation retry, and thus improve the latency. Due to the interval between the read voltages being "3" at minimum and "8" at maximum, the memory device 20 can substantially average the setup times of the read voltage in each page. Therefore, the memory device 20 can reduce the time of a read operation. Accordingly, the memory device 20 of the first embodiment can perform an efficient read operation.

[1-4] Modifications of First Embodiment

There are other data allocations that enable an efficient read operation in the same manner as in the first embodiment. As modifications of the first embodiment for a data allocation, first to 17th modifications will be explained below.

(First Modification)

FIG. 14 is a table illustrating a setting of a data allocation and a read voltage for a first modification. The data allocation and the setting of read voltages in the first modification will be explained with reference to FIG. 14.

In the data allocation of the first modification, the data sets D31, D30, D28, D24, D16, D17, D19, D3, D11, D15, D13, D12, D8, D0, D2, D18, D22, D23, D7, D5, D1, D9, D25, D27, D26, D10, D14, D6, D4, D20, D21, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the first modification, the read voltages for use in first page read are R7, R15, R18, R22, R25, and R29. In the data allocation of the first modification, the read voltages for use in second page read are R4, R8, R13, R21, R27, and R31. In the data allocation of the first modification, the read voltages for use in third page read are R3, R9, R12, R16, R20, and R26. In the data allocation of the first modification, the read voltages for use in fourth page read are R2, R6, R10, R14, R19, R23, and R28. In the data allocation of the first modification, the read voltages for use in fifth page read are R1, R5, R11, R17, R24, and R30.

Figure 15:
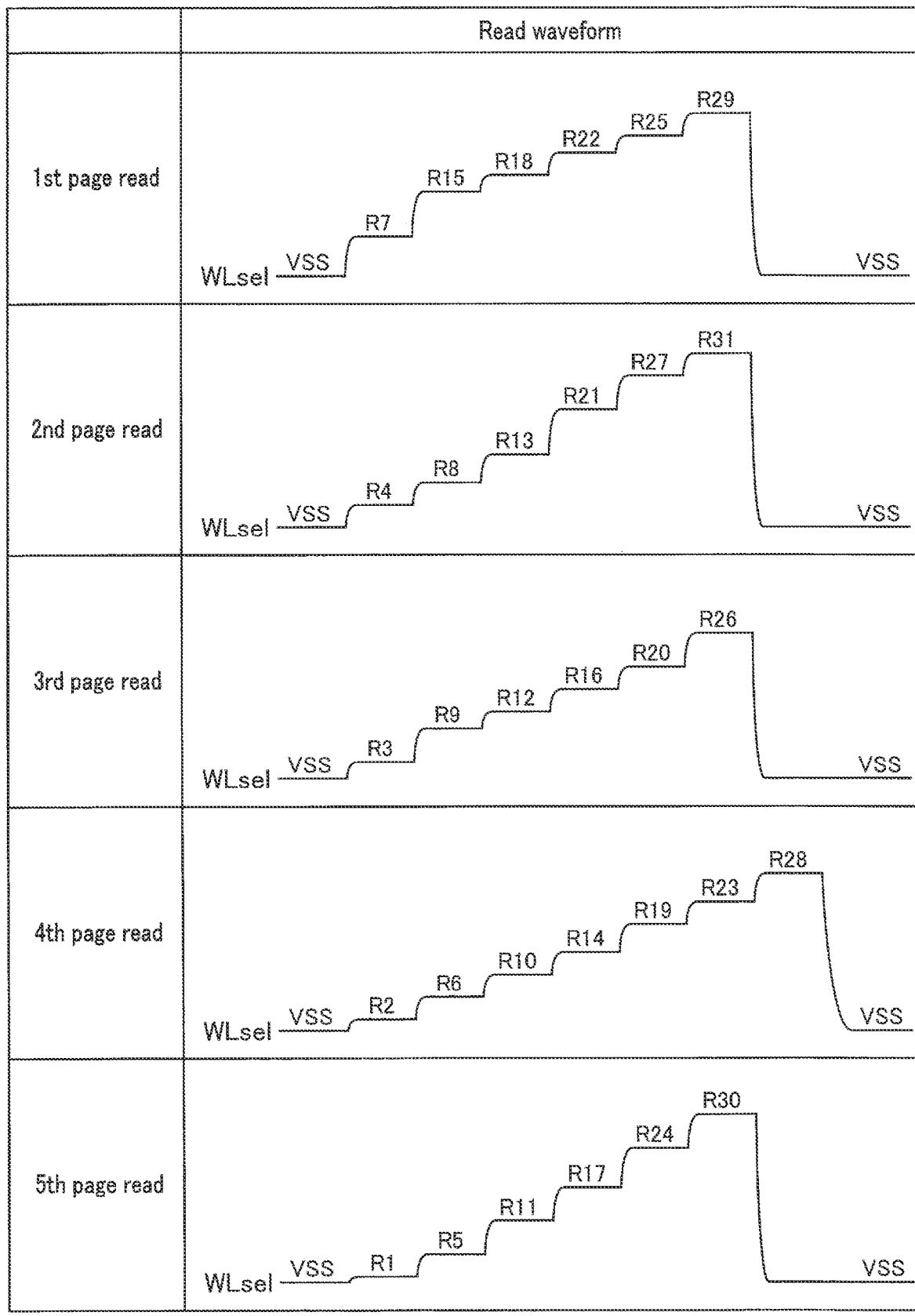
FIG. 15 is a waveform chart illustrating an example of a voltage applied to a selected word line in a read operation of the first modification.

FIG. 15 is a waveform chart illustrating an example of a voltage (read waveform) applied to a selected word line WLsel in a read operation of the first modification. In each of the first to fifth page reads of the first modification, the sequencer 204 can read desired page data from the cell unit CU by applying a read voltage to the selected word line WLsel, as illustrated in FIG. 15. The first modification is the same as the first embodiment in operation except that the types of read voltage applied to the selected word line WLsel in each page read are different.

(Second Modification)

FIG. 16 is a table illustrating a setting of a data allocation and a read voltage for a second modification. The data allocation and the setting of read voltages in the second modification will be explained with reference to FIG. 16.

In the data allocation of the second modification, the data sets D31, D30, D28, D24, D8, D9, D1, D5, D7, D23, D19, D18, D26, D10, D14, D12, D4, D0, D16, D17, D25, D27, D11, D3, D2, D6, D22, D20, D21, D29, D13, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the second modification, the read voltages for use in first page read are R4, R9, R13, R18, R22, R26, and R30. In the data allocation of the second modification, the read voltages for use in second page read are R6, R12, R16, R20, R23, and R29. In the data allocation of the second modification, the read voltages for use in third page read are R3, R7, R10, R14, R17, and R25. In the data allocation of the second modification, the read voltages for use in fourth page read are R2, R8, R15, R21, R27, and R31.

In the data allocation of the second modification, the read voltages for use in fifth page read are R1, R5, R11, R19, R24, and R28.

Figure 17:
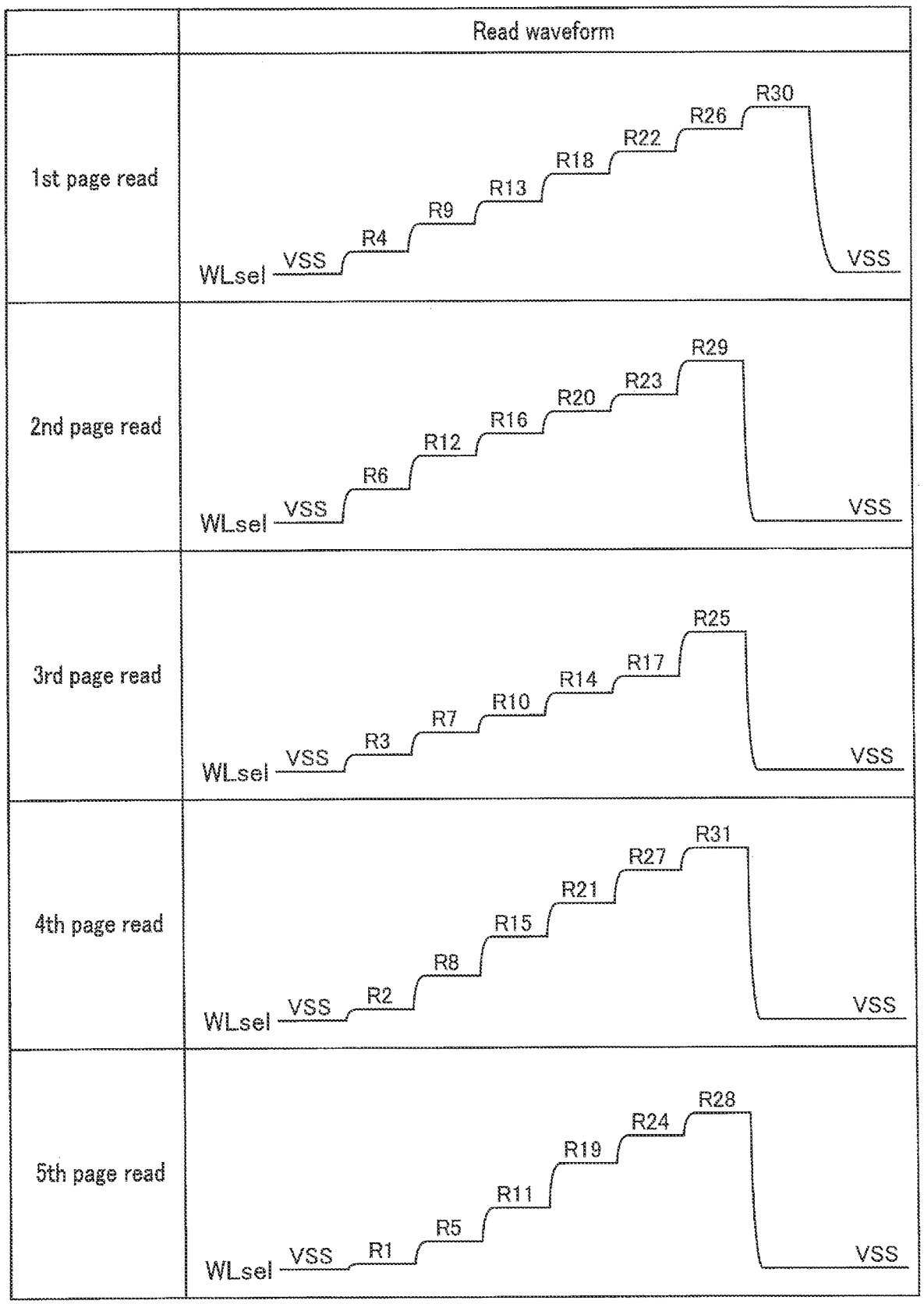
FIG. 17 is a waveform chart illustrating an example of a voltage applied to a selected word line in a read operation of the second modification.

FIG. 17 is a waveform chart illustrating an example of a voltage (read waveform) applied to a selected word line WLsel in a read operation of the second modification. In each of the first to fifth page reads of the second modification, the sequencer 204 can read desired page data from the cell unit CU by applying a read voltage to the selected word line WLsel, as illustrated in FIG. 17. The second modification is the same as the first embodiment in operation except that the types of read voltage applied to the selected word line WLsel in each page read are different.

(Third Modification)

Figure 18:
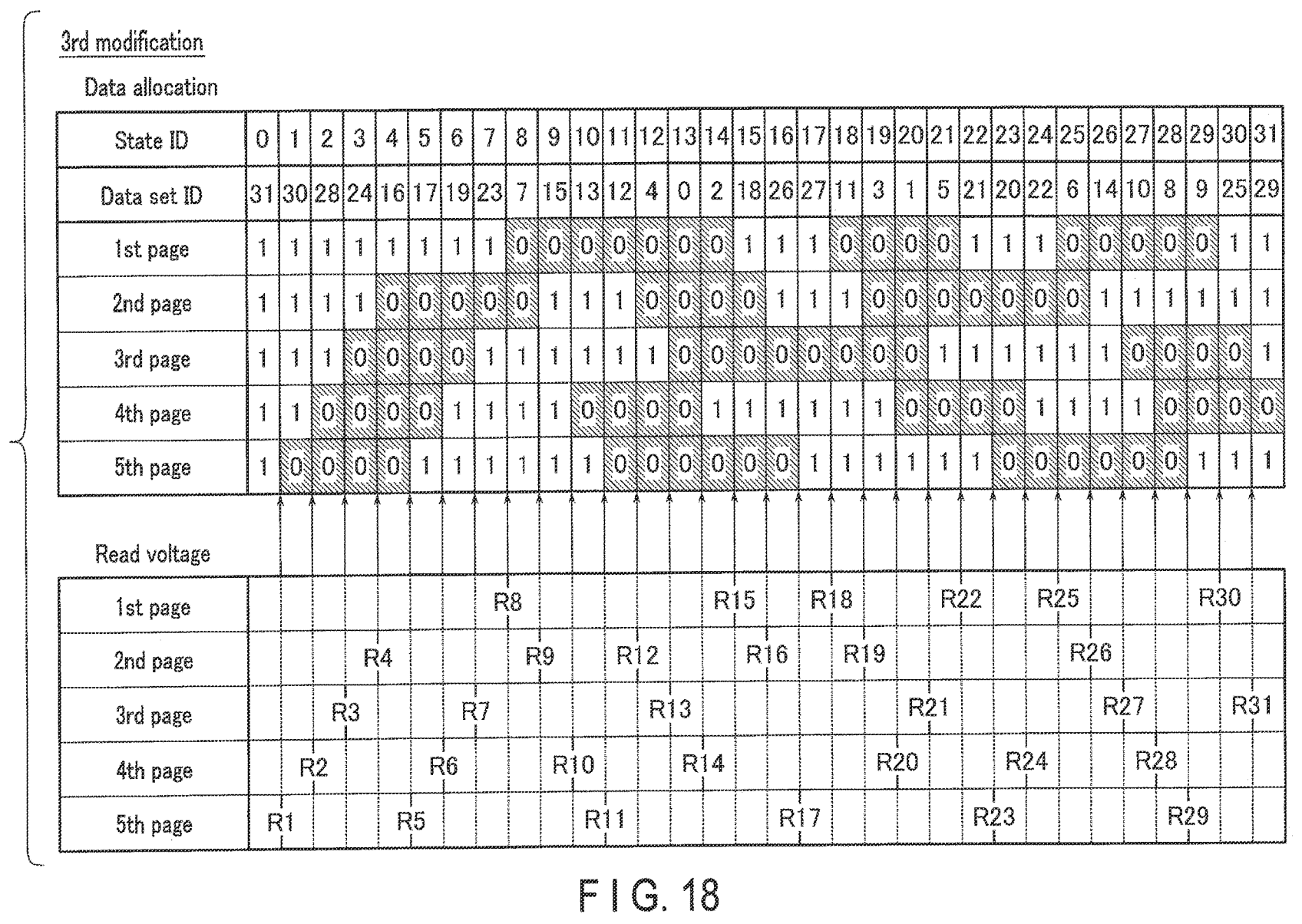

FIG. 18 is a table illustrating a setting of a data allocation and a read voltage for a third modification. The data allocation and the setting of read voltages in the third modification will be explained with reference to FIG. 18.

In the data allocation of the third modification, the data sets D31, D30, D28, D24, D16, D17, D19, D23, D7, D15, D13, D12, D4, D0, D2, D18, D26, D27, D11, D3, D1, D5, D21, D20, D22, D6, D14, D10, D8, D9, D25, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the third modification, the read voltages for use in first page read are R8, R15, R18, R22, R25, and R30. In the data allocation of the third modification, the read voltages for use in second page read are R4, R9, R12, R16, R19, and R26. In the data allocation of the third modification, the read voltages for use in third page read are R3, R7, R13, R21, R27, and R31. In the data allocation of the third modification, the read voltages for use in fourth page read are R2, R6, R10, R14, R20, R24, and R28. In the data allocation of the third modification, the read voltages for use in fifth page read are R1, R5, R11, R17, R23, and R29.

Figure 19:
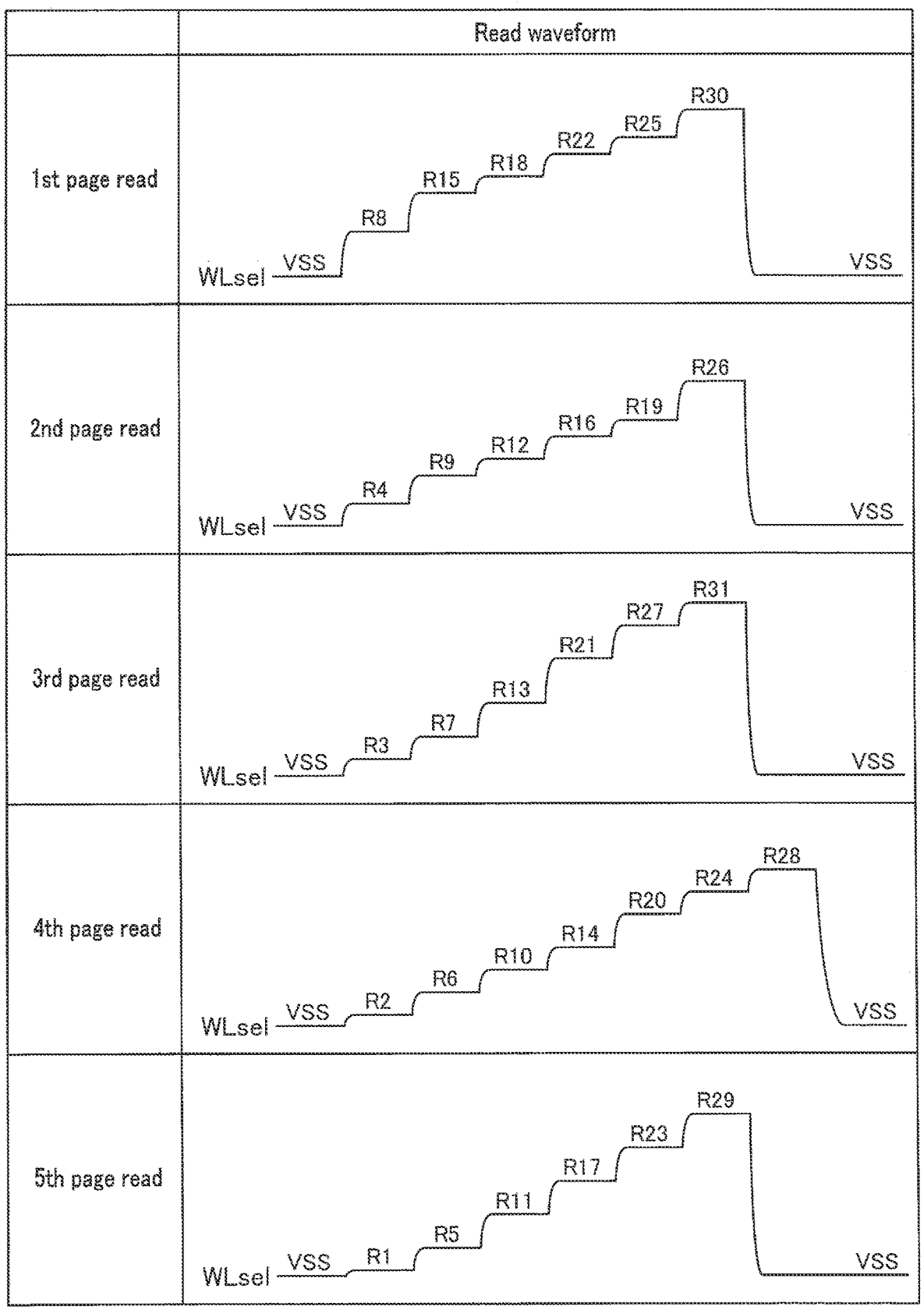
FIG. 19 is a waveform chart illustrating an example of a voltage applied to a selected word line in a read operation of the third modification.

FIG. 19 is a waveform chart illustrating an example of a voltage (read waveform) applied to a selected word line WLsel in a read operation of the third modification. In each of the first to fifth page reads of the third modification, the sequencer 204 can read desired page data from the cell unit CU by applying a read voltage to the selected word line WLsel, as illustrated in FIG. 19. The third modification is the same as the first embodiment in operation except that the types of read voltage applied to the selected word line WLsel in each page read are different.

(Fourth Modification)

FIG. 20 is a table illustrating a setting of a data allocation and a read voltage for a fourth modification. The data allocation and the setting of read voltages in the fourth modification will be explained with reference to FIG. 20.

In the data allocation of the fourth modification, the data sets D31, D30, D28, D24, D25, D17, D19, D23, D7, D15, D14, D12, D4, D0, D16, D18, D26, D27, D11, D3, D1, D5, D21, D20, D22, D6, D2, D10, D8, D9, D13, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the fourth modification, the read voltages for use in first page read are R8, R14, R18, R22, R25, and R31. In the data allocation of the fourth modification, the read voltages for use in second page read are R5, R9, R12, R16, R19, and R27. In the data allocation of the fourth modification, the read voltages for use in third page read are R3, R7, R13, R21, R26, and R30. In the data allocation of the fourth modification, the read voltage for use in fourth page read are R2, R6, R11, R15, R20, R24, and R28. In the data allocation of the fourth modification, the read voltages for use in fifth page read are R1, R4, R10, R17, R23, and R29.

Figure 21:
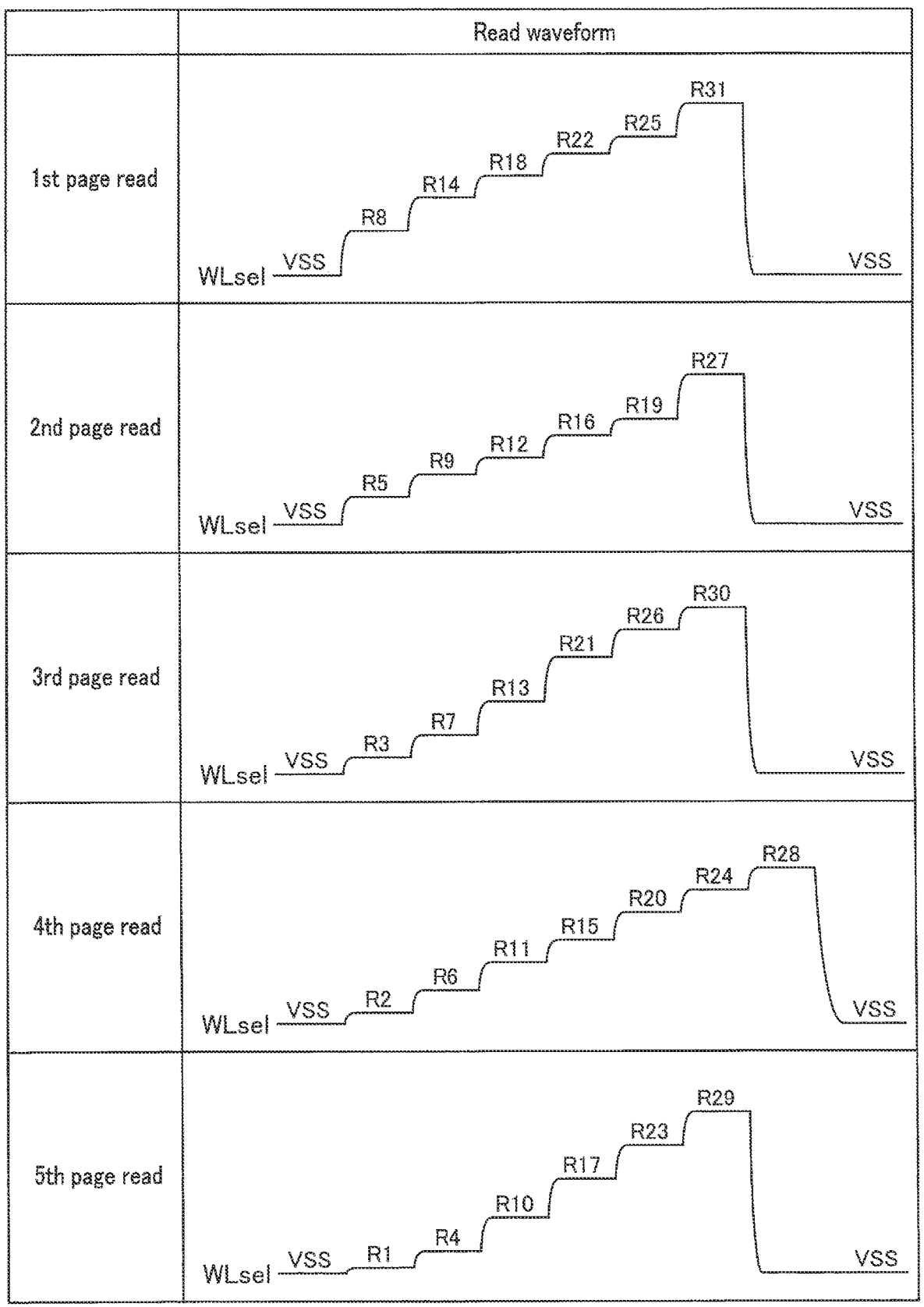
FIG. 21 is a waveform chart illustrating an example of a voltage applied to a selected word line in a read operation of the fourth modification.

FIG. 21 is a waveform chart illustrating an example of a voltage (read waveform) applied to a selected word line WLsel in a read operation of the fourth modification. In each of the first to fifth page reads of the fourth modification, the sequencer 204 can read desired page data from the cell unit CU by applying a read voltage to the selected word line WLsel, as illustrated in FIG. 21. The fourth modification is the same as the first embodiment in operation except that the types of read voltage applied to the selected word line WLsel in each page read are different.

(Fifth Modification)

FIG. 22 is a table illustrating a setting of a data allocation and a read voltage for a fifth modification. The data allocation and the setting of read voltages in the fifth modification will be explained with reference to FIG. 22.

In the data allocation of the fifth modification, the data sets D31, D30, D28, D24, D8, D0, D2, D3, D19, D23, D22, D20, D4, D12, D13, D9, D1, D17, D16, D18, D26, D10, D14, D6, D7, D5, D21, D29, D25, D27, D11, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the fifth modification, the read voltages for use in first page read are R4, R8, R12, R17, R21, R26, and R30. In the data allocation of the fifth modification, the read voltages for use in second page read are R5, R13, R16, R20, R23, and R27. In the data allocation of the fifth modification, the read voltages for use in third page read are R3, R9, R15, R22, R28, and R31. In the data allocation of the fifth modification, the read voltages for use in fourth page read are R2, R6, R11, R19, R25, and R29. In the data allocation of the fifth modification, the read voltages for use in fifth page read are R1, R7, R10, R14, R18, and R24.

Figure 23:
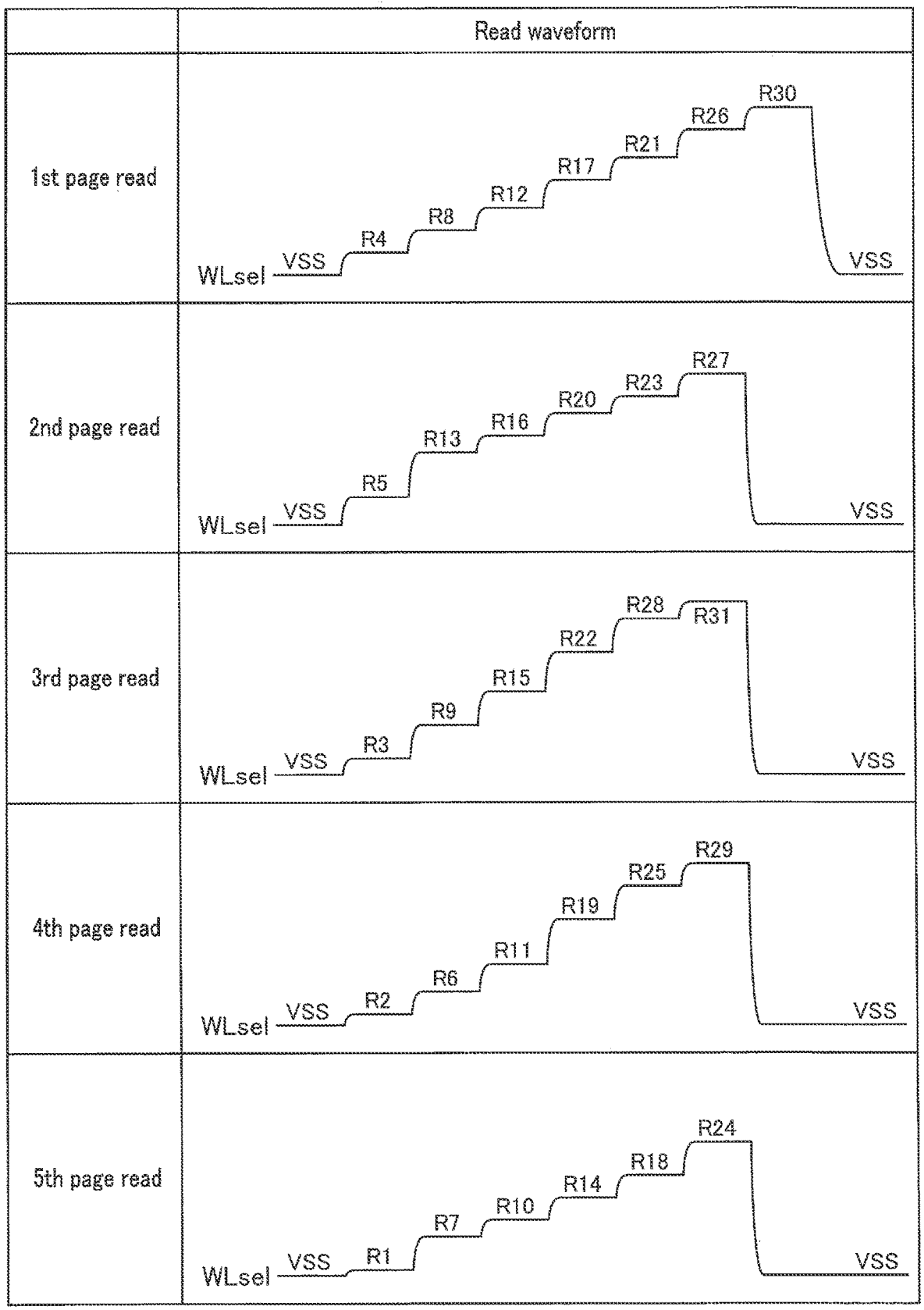
FIG. 23 is a waveform chart illustrating an example of a voltage applied to a selected word line in a read operation of the fifth modification.

FIG. 23 is a waveform chart illustrating an example of a voltage (read waveform) applied to a selected word line WLsel in a read operation of the fifth modification. In each of the first to fifth page reads of the fifth modification, the sequencer 204 can read desired page data from the cell unit CU by applying a read voltage to the selected word line WLsel, as illustrated in FIG. 23. The fifth modification is the same as the first embodiment in operation except that the types of read voltage applied to the selected word line WLsel in each page read are different.

(Sixth Modification)

FIG. 24 is a table illustrating a setting of a data allocation and a read voltage for a sixth modification. The data allocation and the setting of read voltages in the sixth modification will be explained with reference to FIG. 24.

In the data allocation of the sixth modification, the data sets D31, D30, D28, D24, D16, D17, D19, D3, D11, D15, D13, D12, D8, D0, D2, D18, D22, D20, D4, D5, D1, D9, D25, D27, D26, D10, D14, D6, D7, D23, D21, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the sixth modification, the read voltages for use in first page read are R7, R15, R18, R22, R25, and R29. In the data allocation of the sixth modification, the read voltages for use in second page read are R4, R8, R13, R21, R27, and R31. In the data allocation of the sixth modification, the read voltages for use in third page read are R3, R9, R12, R16, R20, and R26. In the data allocation of the sixth modification, the read voltages for use in fourth page read are R2, R6, R10, R14, R17, R23, and R30. In the data allocation of the sixth modification, the read voltages for use in fifth page read are R1, R5, R11, R19, R24, and R28.

(Seventh Modification)

Figure 25:
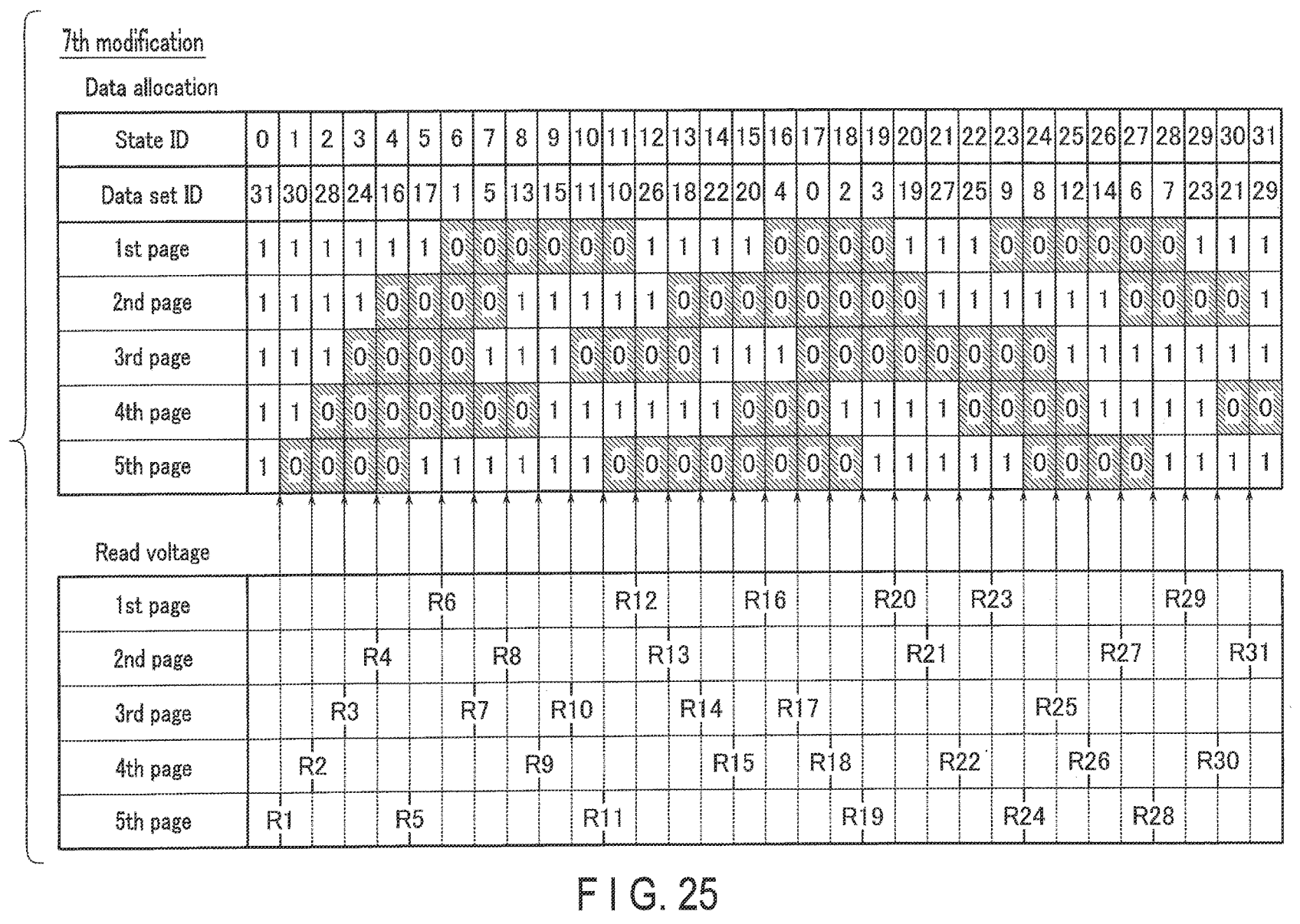

FIG. 25 is a table illustrating a setting of a data allocation and a read voltage for a seventh modification. The data allocation and the setting of read voltages in the seventh modification will be explained with reference to FIG. 25.

In the data allocation of the seventh modification, the data sets D31, D30, D28, D24, D16, D17, D1, D5, D13, D15, D11, D10, D26, D18, D22, D20, D4, D0, D2, D3, D19, D27, D25, D9, D8, D12, D14, D6, D7, D23, D21, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the seventh modification, the read voltages for use in first page read are R6, R12, R16, R20, R23, and R29. In the data allocation of the seventh modification, the read voltages for-use in second page read are R4, R8, R13, R21, R27, and R31. In the data allocation of the seventh modification, the read voltages for use in third page read are R3, R7, R10, R14, R17, and R25. In the data allocation of the seventh modification, the read voltages for use in fourth page read are R2, R9, R15, R18, R22, R26, and R30. In the data allocation of the seventh modification, the read voltages for use in fifth page read are R1, R5, R11, R19, R24, and R28.

(Eighth Modification)

FIG. 26 is a table illustrating a setting of a data allocation and a read voltage for an eighth modification. The data allocation and the setting of read voltages in the eighth modification will be explained with reference to FIG. 26.

In the data allocation of the eighth modification, the data sets D31, D30, D28, D24, D16, D17, D1, D5, D13, D15, D11, D3, D19, D18, D22, D20, D4, D12, D14, D10, D26, D27, D25, D9, D8, D0, D2, D6, D7, D23, D21, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the eighth modification, the read voltages for use in first page read are R6, R12, R16, R20, R23, and R29. In the data allocation of the eighth modification, the read voltages for use in second page read are R4, R8, R11, R17, R25, and R31. In the data allocation of the eighth modification, the read voltages for use in third page read are R3, R7, R10, R14, R19, and R27. In the data allocation of the eighth modification, the read voltages for use in fourth page read are R2, R9, R15, R18, R22, R26, and R30. In the data allocation of the eighth modification, the read voltages for use in fifth page read are R1, R5, R13, R21, R24, and R28.

(Ninth Modification)

Figure 27:
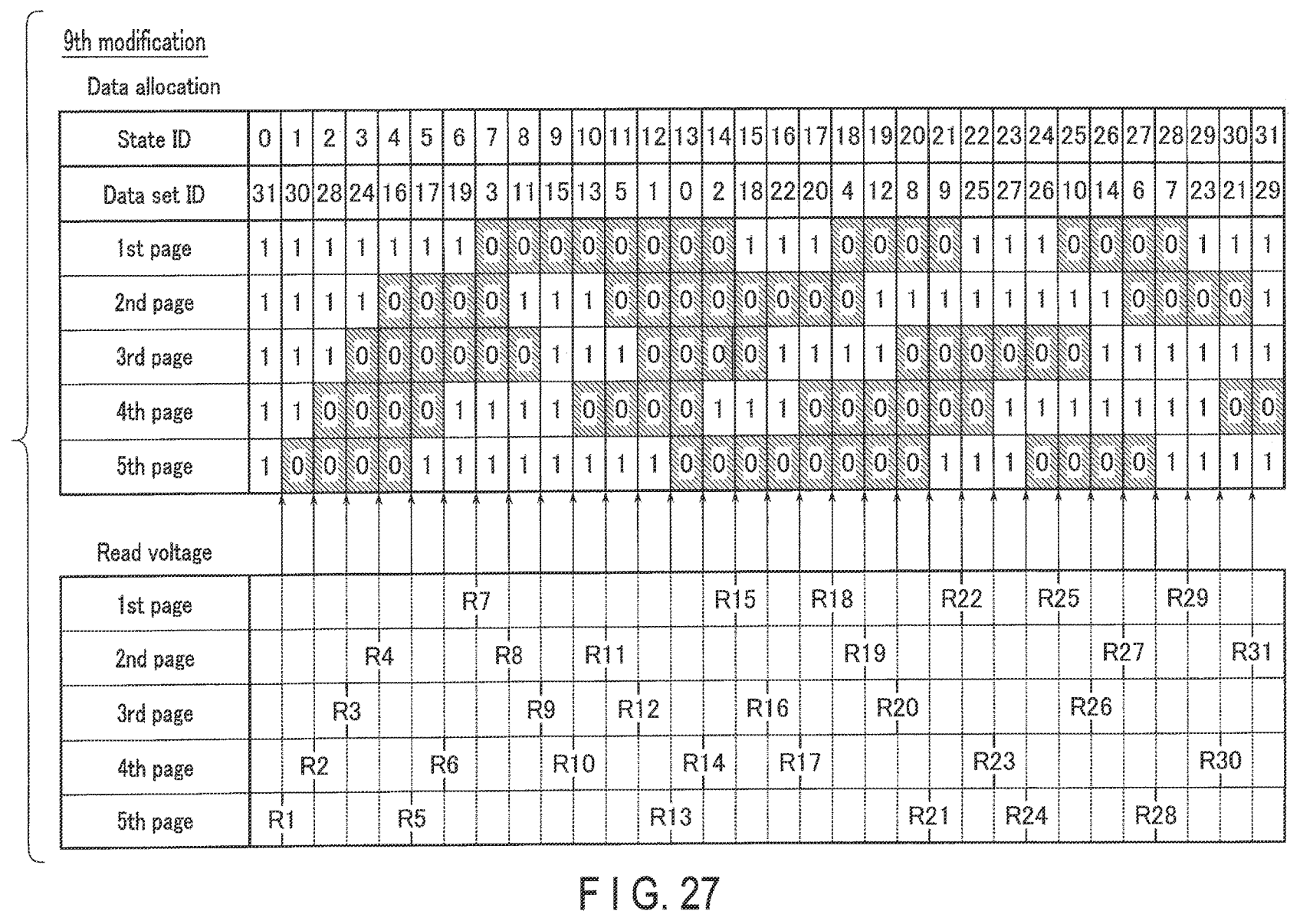

FIG. 27 is a table illustrating a setting of a data allocation and a read voltage for a ninth modification. The data allocation and the setting of read voltages in the ninth modification will be explained with reference to FIG. 27.

In the data allocation of the ninth modification, the data sets D31, D30, D28, D24, D16, D17, D19, D3, D11, D15, D13, D5, D1, D0, D2, D18, D22, D20, D4, D12, D8, D9, D25, D27, D26, D10, D14, D6, D7, D23, D21, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the ninth modification, the read voltages for use in first page read are R7, R15, R18, R22, R25, and R29. In the data allocation of the ninth modification, the read voltages for use in second page read are R4, R8, R11, R19, R27, and R31. In the data allocation of the ninth modification, the read voltages for use in third page read are R3, R9, R12, R16, R20, and R26. In the data allocation of the ninth modification, the read voltages for use in fourth page read are R2, R6, R10, R14, R17, R23, and R30. In the data allocation of the ninth modification, the read voltages for use in fifth page read are R1, R5, R13, R21, R24, and R28.

(Tenth Modification)

Figure 28:
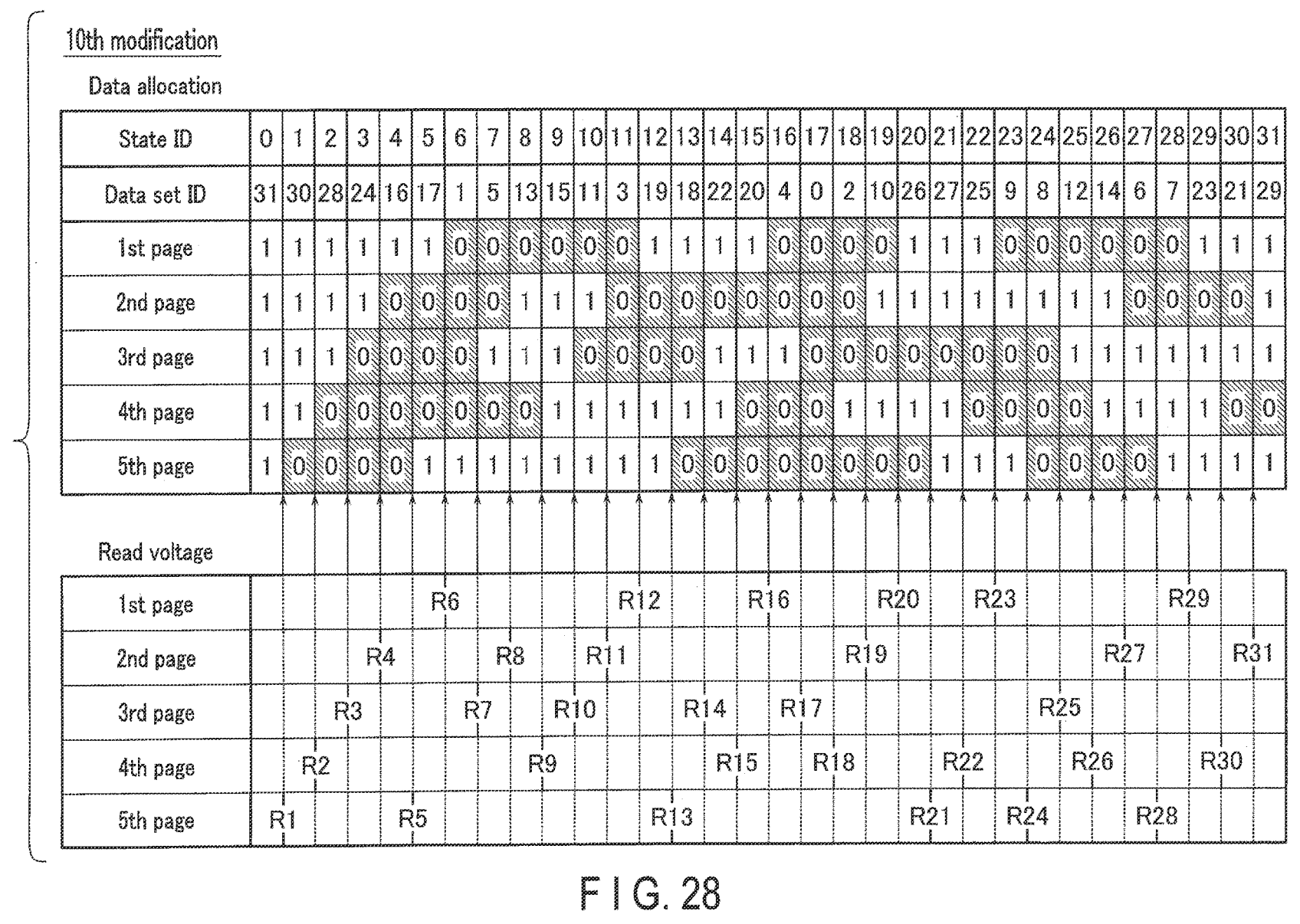

FIG. 28 is a table illustrating a setting of a data allocation and a read voltage for a tenth modification. The data allocation and the setting of read voltages in the tenth modification will be explained with reference to FIG. 28.

In the data allocation of the tenth modification, the data sets D31, D30, D28, D24, D16, D17, D1, D5, D13, D15, D11, D3, D19, D18, D22, D20, D4, D0, D2, D10, D26, D27, D25, D9, D8, D12, D14, D6, D7, D23, D21, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the tenth modification, the read voltages for use in first page read are R6, R12, R16, R20, R23, and R29. In the data allocation of the tenth modification, the read voltages for use in second page read are R4, R8, R11, R19, R27, and R31. In the data allocation of the tenth modification, the read voltages for use in third page read are R3, R7, R10, R14, R17, and R25. In the data allocation of the tenth modification, the read voltages for use in fourth page read are R2, R9, R15, R18, R22, R26, and R30. In the data allocation of the tenth modification, the read voltages for use in fifth page read are R1, R5, R13, R21, R24, and R28.

(11th Modification)

Figure 29:
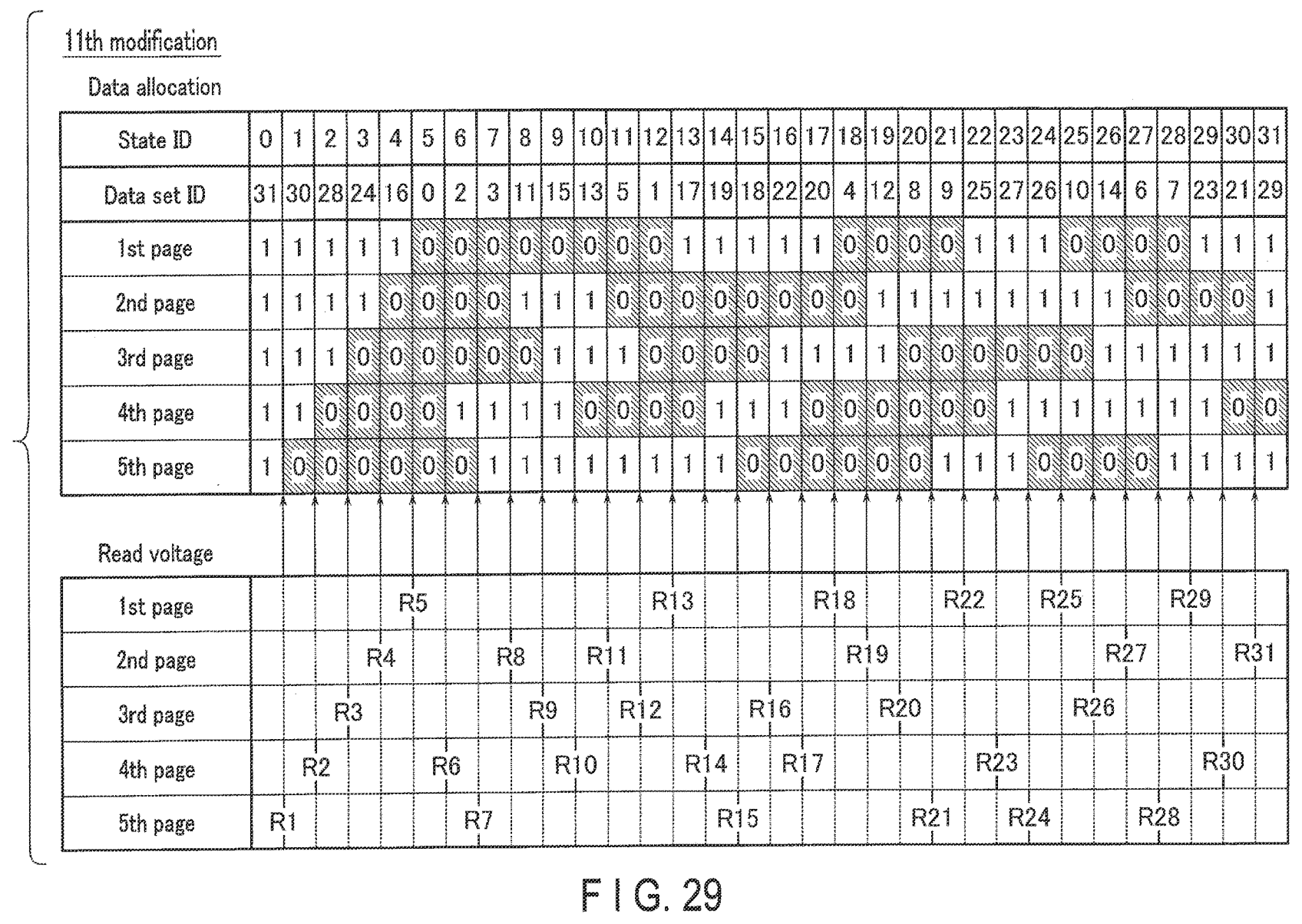

FIG. 29 is a table illustrating a setting of a data allocation and a read voltage for an 11th modification. The data allocation and the setting of read voltages in the 11th modification will be explained with reference to FIG. 29.

In the data allocation of the 11th modification, the data sets D31, D30, D28, D24, D16, D0, D2, D3, D11, D15, D13, D5, D1, D17, D19, D18, D22, D20, D4, D12, D8, D9, D25, D27, D26, D10, D14, D6, D7, D23, D21, and D29 are respectively allocated to states S0, S1, S2, S3, S4, S5, S6, S7, S8, 59, S10, S11, S12, S13, S14, S15, S16, S17, S18, S19, S20, S21, S22, S23, S24, S25, S26, S27, S28, S29, S30, and S31.

In the data allocation of the 11th modification, the read voltages for use in first page read are R5, R13, R18, R22, R25, and R29. In the data allocation of the 11th modification, the read voltages for use in second page read are R4, R8, R11, R19, R27, and R31. In the data allocation of the 11th modification, the read voltages for use in third page read are R3, R9, R12, R16, R20, and R26. In the data allocation of the 11th modification, the read voltages for use in fourth page read are R2, R6, R10, R14, R17, R23, and R30. In the data allocation of the 11th modification, the read voltages for use in fifth page read are R1, R7, R15, R21, R24, and R28.

(12th Modification)

FIG. 30 is a table illustrating a setting of a data allocation and a read voltage for a 12th modification. The data allocation and the setting of read voltages in the 12th modification will be explained with reference to FIG. 30.

In the data allocation of the 12th modification, the data sets D31, D30, D28, D24, D16, D17, D19, D3, D11, D15, D13, D12, D8, D0, D2, D18, D22, D23, D7, D5, D1, D9, D25, D29, D21, D20, D4, D6, D14, D10, D26, and D27 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 12th modification, the read voltages for use in first page read are R7, R15, R18, R22, R26, and R30. In the data allocation of the 12th modification, the read voltages for use in second page read are R4, R8, R13, R21, R24, and R28. In the data allocation of the 12th modification, the read voltages for use in third page read are R3, R9, R12, R16, R20, R23, and R29. In the data allocation of the 12th modification, the read voltages for use in fourth page read are R2, R6, R10, R14, R19, and R27. In the data allocation of the 12th modification, the read voltages for use in fifth page read are R1, R5, R11, R17, R25, and R31.

(13th Modification)

Figure 31:
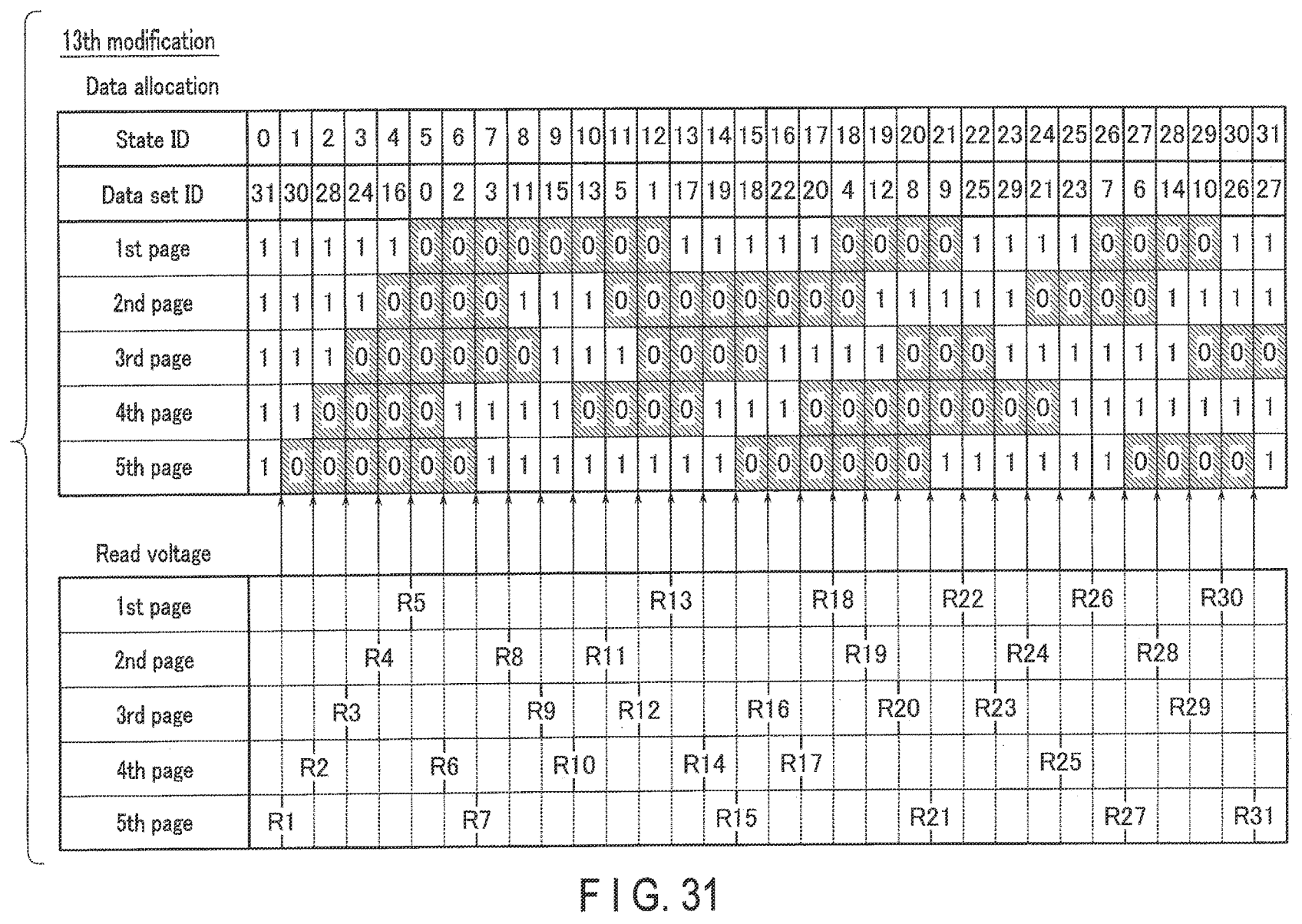

FIG. 31 is a table illustrating a setting of a data allocation and a read voltage for a 13th modification. The data allocation and the setting of read voltages in the 13th modification will be explained with reference to FIG. 31.

In the data allocation of the 13th modification, the data sets D31, D30, D28, D24, D16, D0, D2, D3, D11, D15, D13, D5, D1, D17, D19, D18, D22, D20, D4, D12, D8, D9, D25, D29, D21, D23, D7, D6, D14, D10, D26, and D27 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 13th modification, the read voltages for use in first page read are R5, R13, R18, R22, R26, and R30. In the data allocation of the 13th modification, the read voltages for use in second page read are R4, R8, R11, R19, R24, and R28. In the data allocation of the 13th modification, the read voltages for use in third page read are R3, R9, R12, R16, R20, R23, and R29. In the data allocation of the 13th modification, the read voltages for use in fourth page read are R2, R6, R10, R14, R17, and R25. In the data allocation of the 13th modification, the read voltages for use in fifth page read are R1, R7, R15, R21, R27, and R31.

(14th Modification)

FIG. 32 is a table illustrating a setting of a data allocation and a read voltage for a 14th modification. The data allocation and the setting of read voltages in the 14th modification will be explained with reference to FIG. 32.

In the data allocation of the 14th modification, the data sets D31, D30, D28, D24, D16, D17, D19, D3, D11, D15, D13, D12, D8, D0, D2, D18, D22, D20, D4, D5, D1, D9, D25, D29, D21, D23, D7, D6, D14, D10, D26, and D27 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 14th modification, the read voltages for use in first page read are R7, R15, R18, R22, R26, and R30. In the data allocation of the 14th modification, the read voltages for use in second page read are R4, R8, R13, R21, R24, and R28. In the data allocation of the 14th modification, the read voltages for use in third page read are R3, R9, R12, R16, R20, R23, and R29. In the data allocation of the 14th modification, the read voltages for use in fourth page read are R2, R6, R10, R14, R17, and R25. In the data allocation of the 14th modification, the read voltages for use in fifth page read are R1, R5, R11, R19, R27, and R31.

(15th Modification)

FIG. 33 is a table illustrating a setting of a data allocation and a read voltage for a 15th modification. The data allocation and the setting of read voltages in the 15th modification will be explained with reference to FIG. 33.

In the data allocation of the 15th modification, the data sets D31, D30, D28, D24, D16, D17, D19, D3, D11, D15, D13, D5, D1, D0, D2, D18, D22, D20, D4, D12, D8, D9, D25, D29, D21, D23, D7, D6, D14, D10, D26, and D27 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 15th modification, the read voltages for use in first page read are R7, R15, R18, R22, R26, and R30. In the data allocation of the 15th modification, the read voltages for use in second page read are R4, R8, R11, R19, R24, and R28. In the data allocation of the 15th modification, the read voltages for use in third page read are R3, R9, R12, R16, R20, R23, and R29. In the data allocation of the 15th modification, the read voltages for use in fourth page read are R2, R6, R10, R14, R17, and R25. In the data allocation of the 15th modification, the read voltages for use in fifth page read are R1, R5, R13, R21, R27, and R31.

(16th Modification)

FIG. 34 is a table illustrating a setting of a data allocation and a read voltage for a 16th modification. The data allocation and the setting of read voltages in the 16th modification will be explained with reference to FIG. 34.

In the data allocation of the 16th modification, the data sets D31, D30, D28, D24, D8, D10, D14, D6, D22, D20, D21, D29, D13, D12, D4, D0, D16, D17, D19, D23, D7, D5, D1, D9, D25, D27, D26, D18, D2, D3, D11, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 16th modification, the read voltages for use in first page read are R4, R8, R12, R16, R20, R24, and R28. In the data allocation of the 16th modification, the read voltages for use in second page read are R7, R11, R14, R23, R27, and R30. In the data allocation of the 16th modification, the read voltages for use in third page read are R3, R6, R15, R19, R22, and R31. In the data allocation of the 16th modification, the read voltages for use in fourth page read are R2, R5, R9, R18, R21, and R25. In the data allocation of the 16th modification, the read voltages for use in fifth page read are R1, R10, R13, R17, R26, and R29.

(17th Modification)

Figure 35:
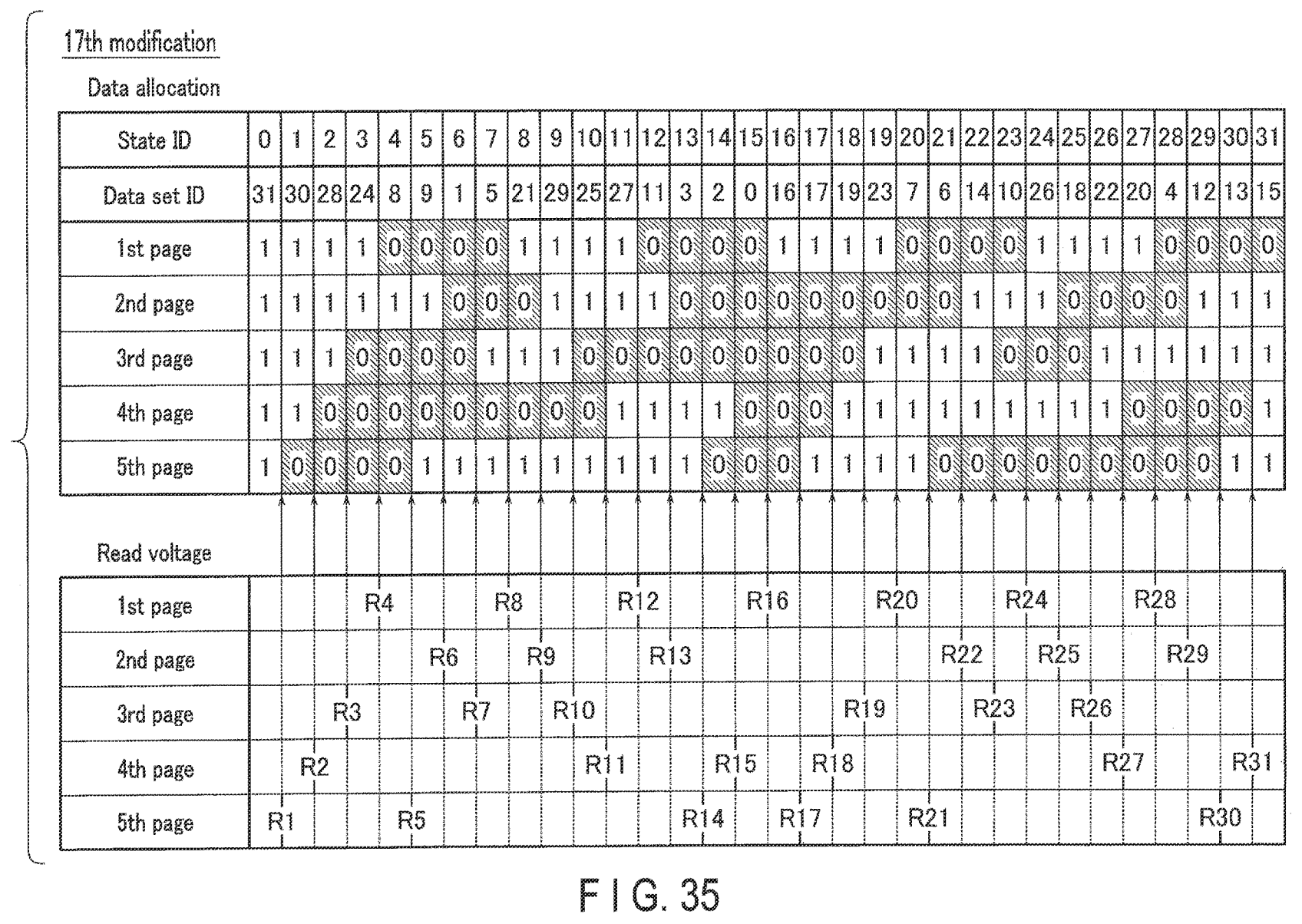

FIG. 35 is a table illustrating a setting of a data allocation and a read voltage for a 17th modification. The data allocation and the setting of read voltages in the 17th modification will be explained with reference to FIG. 35.

In the data allocation of the 17th modification, the data sets D31, D30, D28, D24, D8, D9, D1, D5, D21, D29, D25, D27, D11, D3, D2, D0, D16, D17, D19, D23, D7, D6, D14, D10, D26, D18, D22, D20, D4, D12, D13, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 17th modification, the read voltages for use in first page read are R4, R8, R12, R16, R20, R24, and R28. In the data allocation of the 17th modification, the read voltages for use in second page read are R6, R9, R13, R22, R25, and R29. In the data allocation of the 17th modification, the read voltages for use in third page read are R3, R7, R10, R19, R23, and R26. In the data allocation of the 17th modification, the read voltages for use in fourth page read are R2, R11, R15, R18, R27, and R31. In the data allocation of the 17th modification, the read voltages for use in fifth page read are R1, R5, R15, R17, R21, and R30.

(18th Modification)

Figure 36:
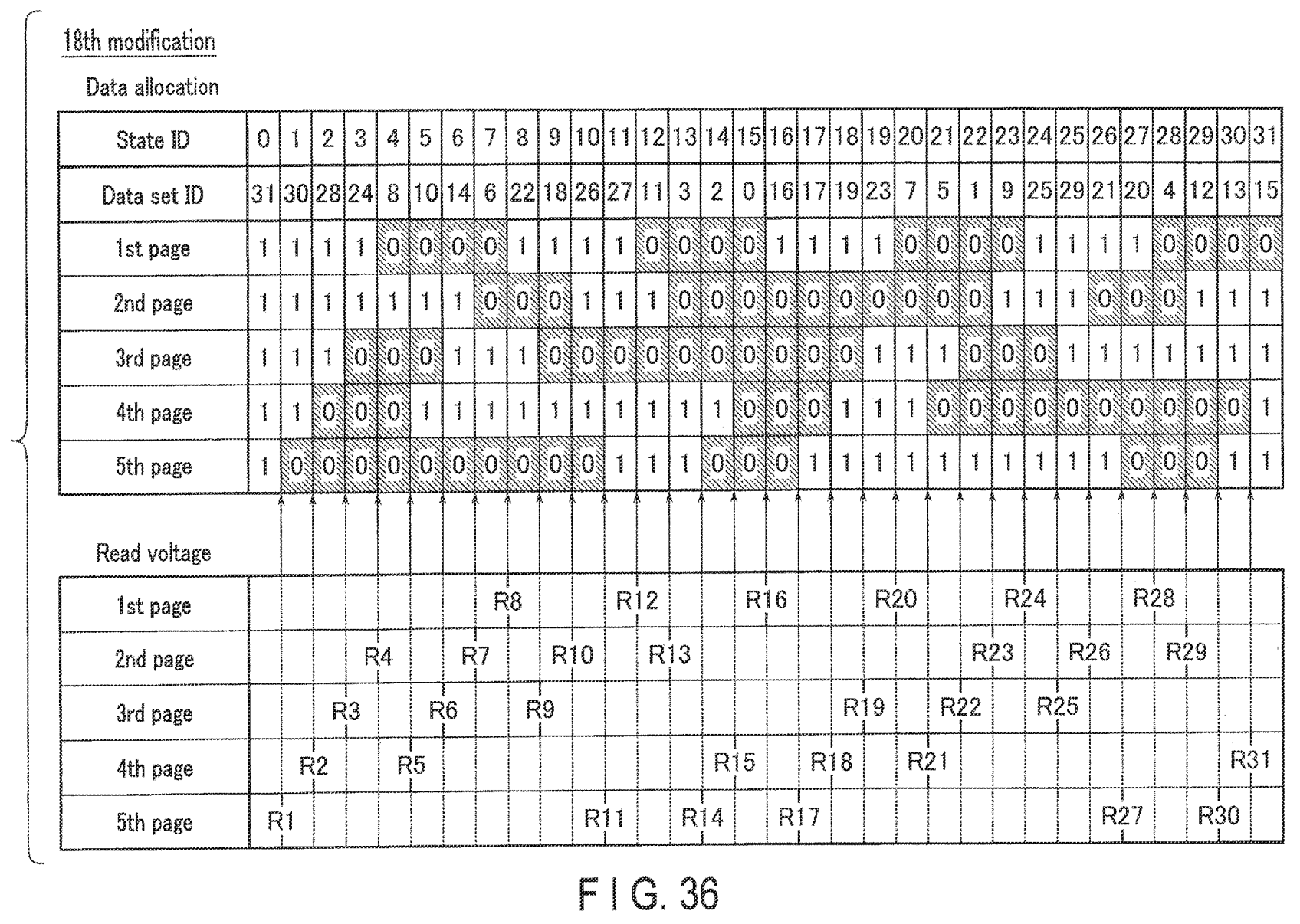

FIG. 36 is a table illustrating a setting of a data allocation and a read voltage for an 18th modification. The data allocation and the setting of read voltages in the 18th modification will be explained with reference to FIG. 36.

In the data allocation of the 18th modification, the data sets D31, D30, D28, D24, D8, D10, D14, D6, D22, D18, D26, D27, D11, D3, D2, D0, D16, D17, D19, D23, D7, D5, D1, D9, D25, D29, D21, D20, D4, D12, D13, and D15 are respectively allocated to states S0, S1, S2, S3, S4, 55, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 18th modification, the read voltages for use in first page read are R8, R12, R16, R20, R24, and R28. In the data allocation of the 18th modification, the read voltages for use in second page read are R4, R7, R10, R13, R23, R26, and R29. In the data allocation of the 18 modification, the read voltages for use in third page read are R3, R6, R9, R19, R22, and R25. In the data allocation of the 18th modification, the read voltages for use in fourth page read are R2, R5, R15, R18, R21, and R31. In the data allocation of the 18th modification, the read voltages for use in fifth page read are R1, R11, R14, R17, R27, and R30.

(19th Modification)

Figure 37:
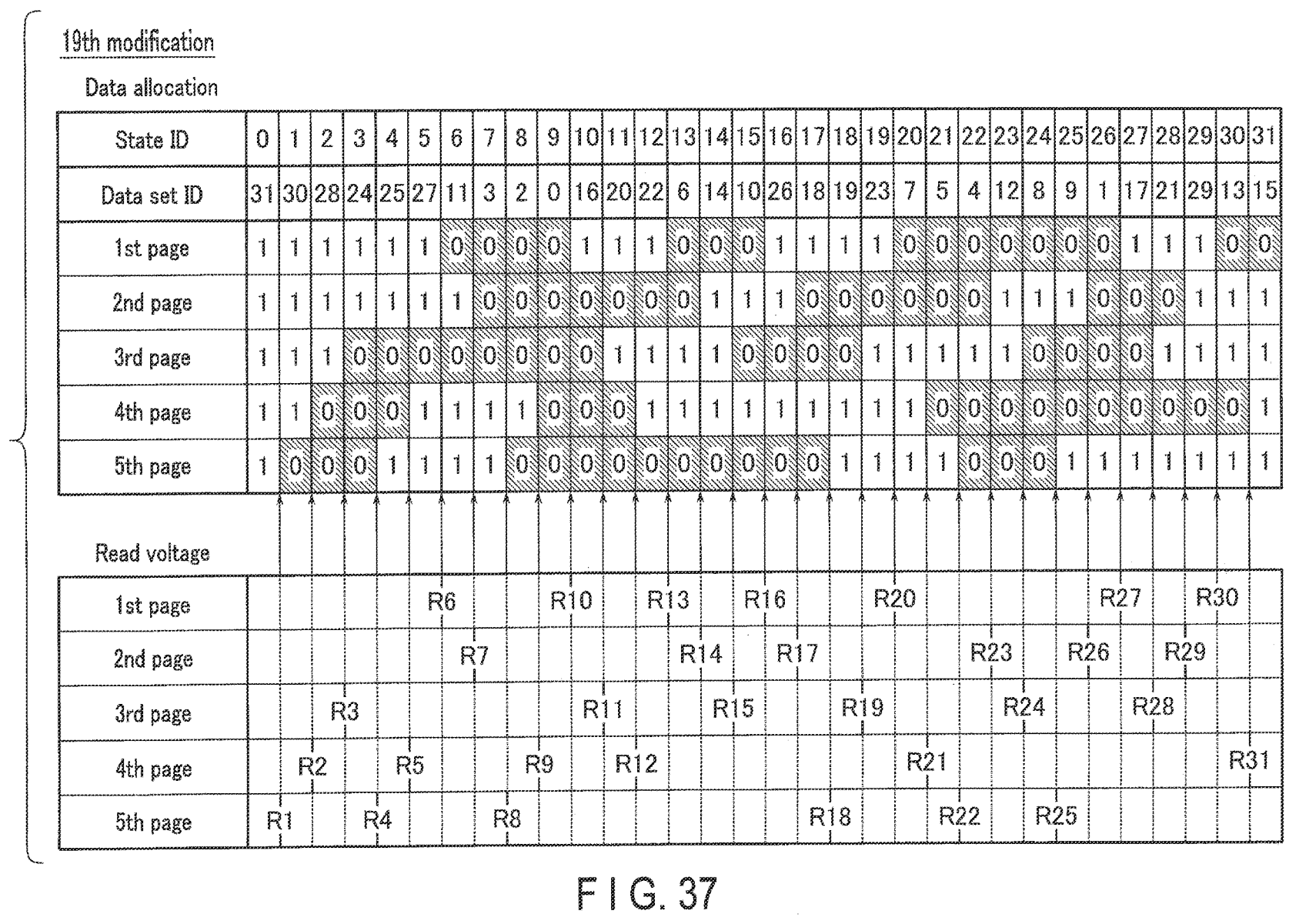

FIG. 37 is a table illustrating a setting of a data allocation and a read voltage for a 19th modification. The data allocation and the setting of read voltages in the 19th modification will be explained with reference to FIG. 37.

In the data allocation of the 19th modification, the data sets D31, D30, D28, D24, D25, D27, D11, D3, D2, D0, D16, D20, D22, D6, D14, D10, D26, D18, D19, D23, D7, D5, D4, D12, D8, D9, D1, D17, D21, D29, D13, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 19th modification, the read voltages for use in first page read are R6, R10, R13, R16, R20, R27, and R30. In the data allocation of the 19th modification, the read voltages for use in second page read are R7, R14, R17, R23, R26, and R29. In the data allocation of the 19th modification, the read voltages for use in third page read are R3, R11, R15, R19, R24, and R28. In the data allocation of the 19th modification, the read voltages for use in fourth page read are R2, R5, R9, R12, R21, and R31. In the data allocation of the 19th modification, the read voltages for use in fifth page read are R1, R4, R8, R18, R22, and R25.

(20th Modification)

Figure 38:
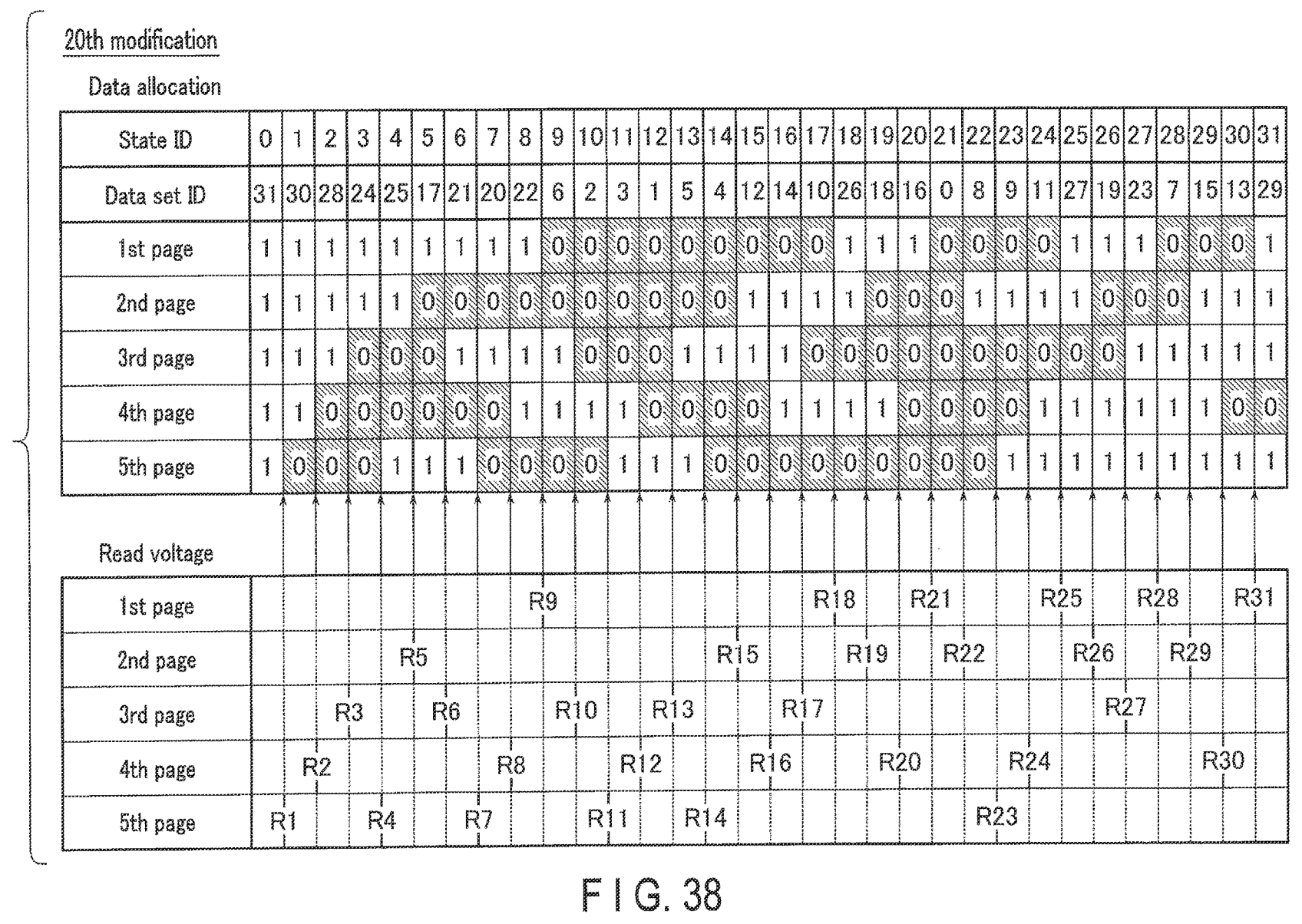

FIG. 38 is a table illustrating a setting of a data allocation and a read voltage for a 20th modification. The data allocation and the setting of read voltages in the 20th modification will be explained with reference to FIG. 38.

In the data allocation of the 20th modification, the data sets D31, D30, D28, D24, D25, D17, D21, D20, D22, D6, D2, D3, D1, D5, D4, D12, D14, D10, D26, D18, D16, D0, DB, D9, D11, D27, D19, D23, D7, D15, D13, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 20th modification, the read voltages for use in first page read are R9, R18, R21, R25, R28, and R31. In the data allocation of the 20th modification, the read voltages for use in second page read are R5, R15, R19, R22, R26, and R29. In the data allocation of the 20th modification, the read voltages for use in third page read are R3, R6, R10, R13, R17, and R27. In the data allocation of the 20th modification, the read voltages for use in fourth page read are R2, R8, R12, R16, R20, R24, and R30. In the data allocation of the 20th modification, the read voltages for use in fifth page read are R1, R4, R7, R11, R14, and R23.

(21st Modification)

FIG. 39 is a table illustrating a setting of a data allocation and a read voltage for a 21st modification. The data allocation and the setting of read voltages in the 21st modification will be explained with reference to FIG. 39.

In the data allocation of the 21st modification, the data sets D31, D30, D28, D24, D8, D10, D14, D6, D22, D18, D26, D27, D25, D9, D1, D5, D7, D23, D19, D17, D16, D0, D2, D3, D11, D15, D13, D12, D4, D20, D21, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 21st modification, the read voltages for use in first page read are R4, R8, R13, R17, R21, and R29. In the data allocation of the 21st modification, the read voltages for use in second page read are R7, R10, R14, R24, R28, and R31. In the data allocation of the 21st modification, the read voltages for use in third page read are R3, R6, R9, R15, R18, and R25. In the data allocation of the 21st modification, the read voltages for use in fourth page read are R2, R5, R12, R16, R19, R22, and R26. In the data allocation of the 21st modification, the read voltages for use in fifth page read are R1, R11, R20, R23, R27, and R30.

(22nd Modification)

Figure 40:
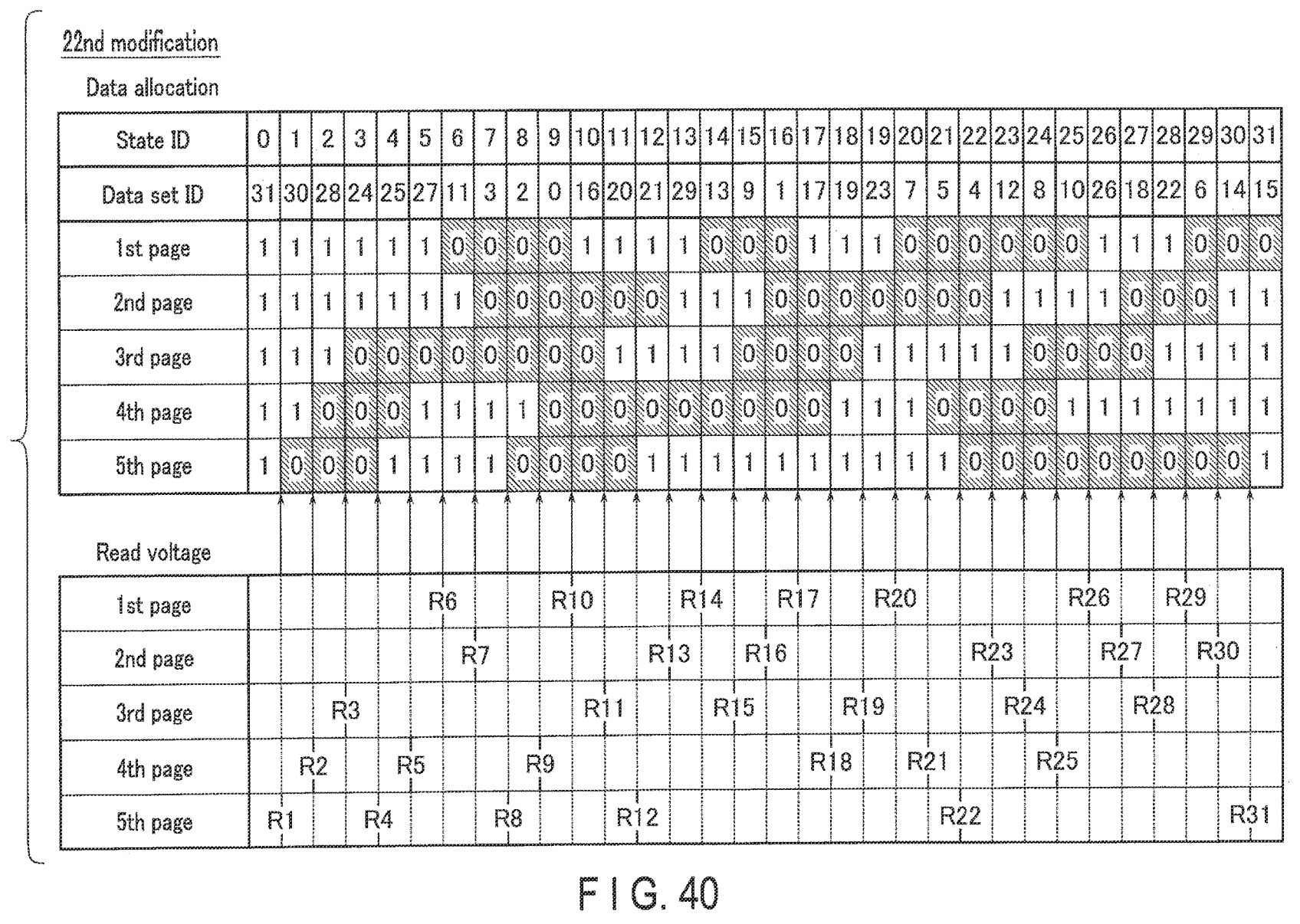

FIG. 40 is a table illustrating a setting of a data allocation and a read voltage for a 22nd modification. The data allocation and the setting of read voltages in the 22nd modification will be explained with reference to FIG. 40.

In the data allocation of the 22nd modification, the data sets D31, D30, D28, D24, D25, D27, D11, D3, D2, D0, D16, D20, D21, D29, D13, D9, D1, D17, D19, D23, D7, D5, D4, D12, D8, D10, D26, D18, D22, D6, D14, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 22nd modification, the read voltages for use in first page read are R6, R10, R14, R17, R20, R26, and R29. In the data allocation of the 22nd modification, the read voltages for use in second page read are R7, R13, R16, R23, R27, and R30. In the data allocation of the 22nd modification, the read voltages for use in third page read are R3, R11, R15, R19, R24, and R28. In the data allocation of the 22nd modification, the read voltages for use in fourth page read are R2, R5, R9, R18, R21, and R25. In the data allocation of the 22nd modification, the read voltages for use in fifth page read are R1, R4, R8, R12, R22, and R31.

(23rd Modification)

FIG. 41 is a table illustrating a setting of a data allocation and a read voltage for a 23rd modification. The data allocation and the setting of read voltages in the 23rd modification will be explained with reference to FIG. 41.

In the data allocation of the 23rd modification, the data sets D31, D30, D28, D24, D25, D17, D19, D18, D26, D10, D14, D12, D4, D5, D1, D3, D2, D6, D22, D20, D16, D0, D8, D9, D13, D29, D21, D23, D7, D15, D11, and D27 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 23rd modification, the read voltages for use in first page read are R9, R18, R21, R25, R28, and R31. In the data allocation of the 23rd modification, the read voltages for use in second page read are R5, R8, R12, R22, R26, and R29. In the data allocation of the 23rd modification, the read voltages for use in third page read are R3, R10, R14, R17, R20, R24, and R30. In the data allocation of the 23rd modification, the read voltages for use in fourth page read are R2, R6, R11, R15, R19, and R27. In the data allocation of the 23rd modification, the read voltages for use in fifth page read are R1, R4, R7, R13, R16, and R23.

(24th Modification)

Figure 42:
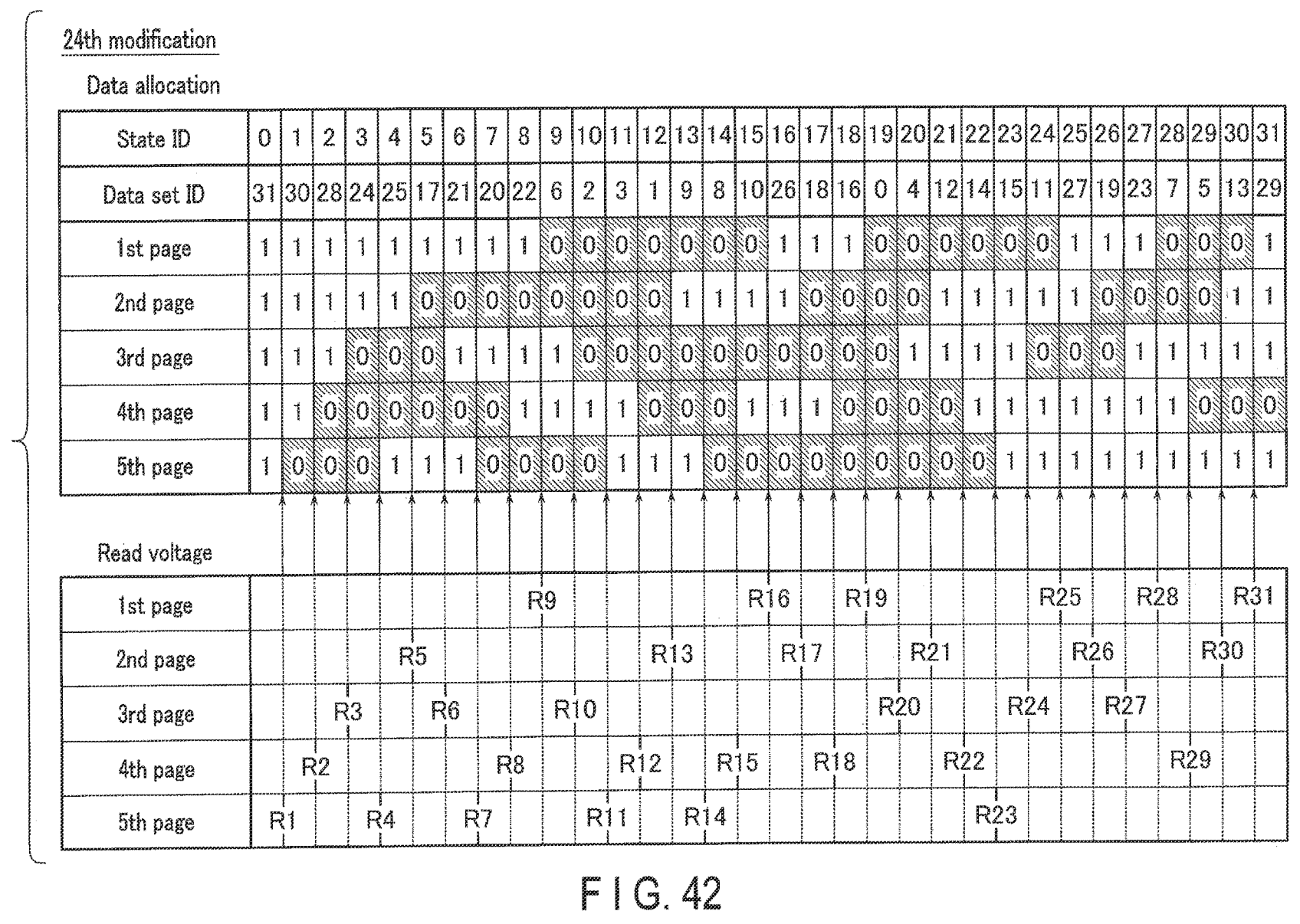

FIG. 42 is a table illustrating a setting of a data allocation and a read voltage for a 24th modification. The data allocation and the setting of read voltages in the 24th modification will be explained with reference to FIG. 42.

In the data allocation of the 24th modification, the data sets D31, D30, D28, D24, D25, D17, D21, D20, D22, D6, D2, D3, D1, D9, D8, D10, D26, D18, D16, D0, D4, D12, D14, D15, D11, D27, D19, D23, D7, D5, D13, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 24th modification, the read voltages for use in first page read are R9, R16, R19, R25, R28, and R31. In the data allocation of the 24th modification, the read voltages for use in second page read are R5, R13, R17, R21, R26, and R30. In the data allocation of the 24th modification, the read voltages for use in third page read are R3, R6, R10, R20, R24, and R27. In the data allocation of the 24th modification, the read voltages for use in fourth page read are R2, R8, R12, R15, R18, R22, and R29. In the data allocation of the 24th modification, the read voltages for use in fifth page read are R1, R4, R7, R11, R14, and R23.

(25th Modification)

Figure 43:
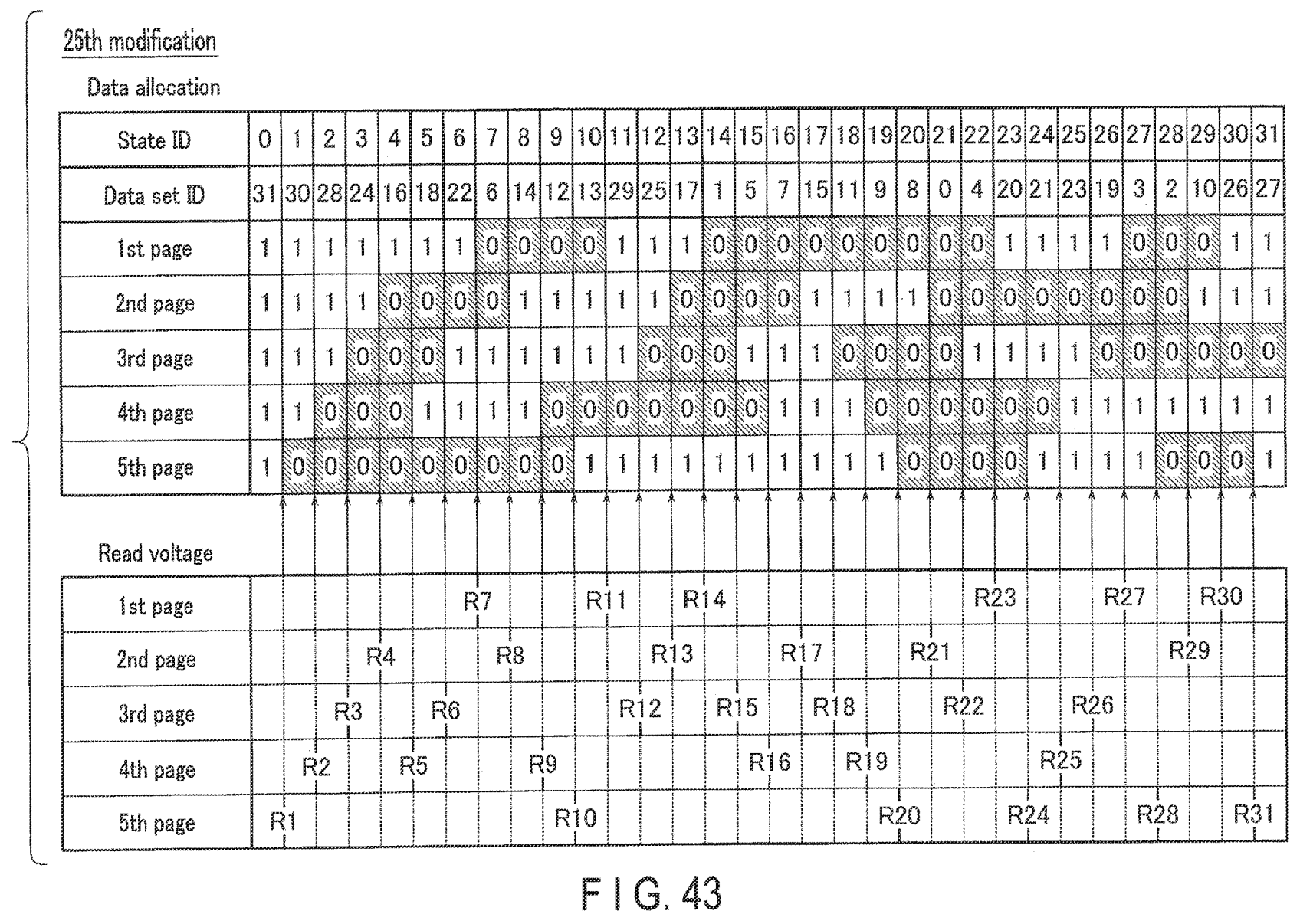

FIG. 43 is a table illustrating a setting of a data allocation and a read voltage for a 25th modification. The data allocation and the setting of read voltages in the 25th modification will be explained with reference to FIG. 43.

In the data allocation of the 25th modification, the data sets D31, D30, D28, D24, D16, D18, D22, D6, D14, D12, D13, D29, D25, D17, D1, D5, D7, D15, D11, D9, D8, D0, D4, D20, D21, D23, D19, D3, D2, D10, D26, and D27 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 25th modification, the read voltages for use in first page read are R7, R11, R14, R23, R27, and R30. In the data allocation of the 25th modification, the read voltages for use in second page read are R4, R8, R13, R17, R21, and R29. In the data allocation of the 25th modification, the read voltages for use in third page read are R3, R6, R12, R15, R18, R22, and R26. In the data allocation of the 25th modification, the read voltages for use in fourth page read are R2, R5, R9, R16, R19, and R25. In the data allocation of the 25th modification, the read voltages for use in fifth page read are R1, R10, R20, R24, R28, and R31.

(26th Modification)

FIG. 44 is a table illustrating a setting of a data allocation and a read voltage for a 26th modification. The data allocation and the setting of read voltages in the 26th modification will be explained with reference to FIG. 44.

In the data allocation of the 26th modification, the data sets D31, D30, D28, D24, D16, D0, D2, D3, D11, D15, D13, D29, D21, D20, D22, D18, D26, D10, D14, D6, D7, D23, D19, D17, D1, D5, D4, D12, D8, D9, D25, and D27 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 26th modification, the read voltages for use in first page read are R5, R11, R17, R24, and R30. In the data allocation of the 26th modification, the read voltages for use in second page read are R4, R8, R12, R16, R19, and R27. In the data allocation of the 26th modification, the read voltages for use in third page read are R3, R9, R15, R18, R22, R25, and R28. In the data allocation of the 26th modification, the read voltages for use in fourth page read are R2, R6, R10, R14, R23, and R31. In the data allocation of the 26th modification, the read voltages for use in fifth page read are R1, R7, R13, R20, R26, and R29.

(27th Modification)

FIG. 45 is a table illustrating a setting of a data allocation and a read voltage for a 27th modification. The data allocation and the setting of read voltages in the 27th modification will be explained with reference to FIG. 45.

In the data allocation of the 27th modification, the data sets D31, D30, D28, D24, D8, D0, D4, D20, D22, D23, D7, D5, D1, D9, D25, D27, D19, D3, D2, D6, D14, D12, D13, D29, D21, D17, D16, D18, D26, D10, D11, and D15 are respectively allocated to states S0, S1, S2, S3, S4, S5, 56, S7, S8, S9, S10, S11, S12, S13, S14, S15, S16, S17, S18, S19, S20, S21, S22, S23, S24, S25, S26, S27, S28, S29, S30, and S31.

In the data allocation of the 27th modification, the read voltages for use in first page read are R4, R7, R10, R14, R17, R23, and R29. In the data allocation of the 27th modification, the read voltages for use in second page read are R5, R13, R16, R20, R24, and R28. In the data allocation of the 27th modification, the read voltages for use in third page read are R3, R6, R12, R19, R25, and R31. In the data allocation of the 27th modification, the read voltages for use in fourth page read are R2, R8, R11, R15, R21, and R27. In the data allocation of the 27th modification, the read voltages for use in fifth page read are R1, R9, R18, R22, R26, and R30.

(28th Modification)

Figure 46:
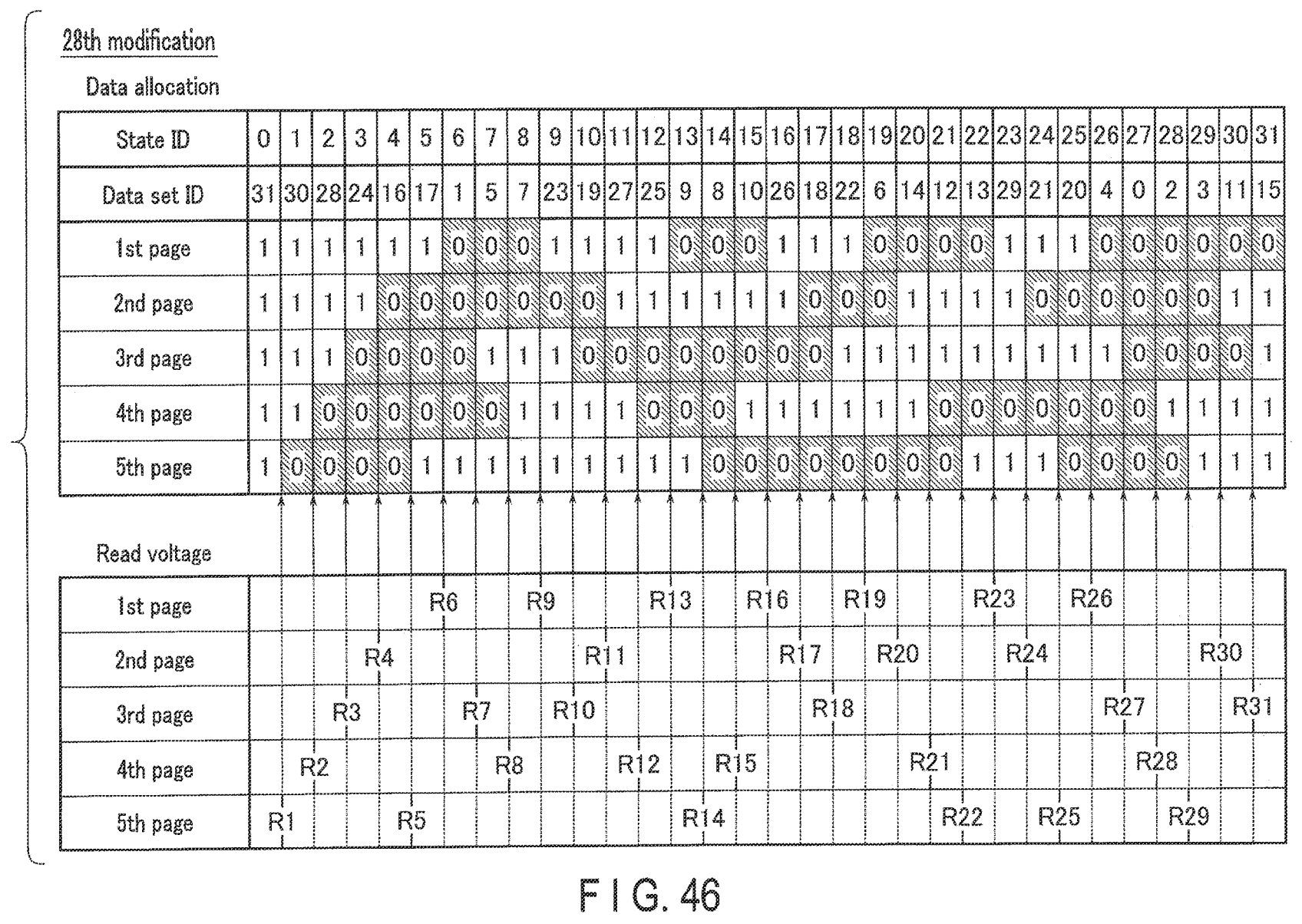

FIG. 46 is a table illustrating a setting of a data allocation and a read voltage for a 28th modification. The data allocation and the setting of read voltages in the 28th modification will be explained with reference to FIG. 46.

In the data allocation of the 28th modification, the data sets D31, D30, D28, D24, D16, D17, D1, D5, D7, D23, D19, D27, D25, D9, D8, D10, D26, D18, D22, D6, D14, D12, D13, D29, D21, D20, D4, D0, D2, D3, D11, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 28th modification, the read voltages for use in first page read are R6, R9, R13, R1, R19, R23, and R26. In the data allocation of the 28th modification, the read voltages for use in second page read are R4, R11, R17, R20, R24, and R30. In the data allocation of the 28th modification, the read voltages for use in third page read are R3, R7, R10, R18, R27, and R31. In the data allocation of the 28th modification, the read voltages for use in fourth page read are R2, R8, R12, R15, R21, and R28. In the data allocation of the 28th modification, the read voltages for use in fifth page read are R1, R5, R14, R22, R25, and R29.

(29th Modification)

FIG. 47 is a table illustrating a setting of a data allocation and a read voltage for a 29th modification. The data allocation and the setting of read voltages in the 29th modification will be explained with reference to FIG. 47.

In the data allocation of the 29th modification, the data sets D31, D30, D28, D24, D16, D0, D4, D12, D14, D15, D11, D3, D2, D6, D22, D20, D21, D29, D13, D9, D8, D10, D26, D18, D19, D23, D7, D5, D1, D17, D25, and D27 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 29th modification, the read voltages for use in first page read are R5, R14, R18, R22, R26, and R29. In the data allocation of the 29th modification, the read voltages for use in second page read are R4, R7, R11, R17, R23, and R30. In the data allocation of the 29th modification, the read voltages for use in third page read are R3, R6, R10, R13, R19, R25, and R28. In the data allocation of the 29th modification, the read voltages for use in fourth page read are R2, R8, R15, R21, R27, and R31. In the data allocation of the 29th modification, the read voltages for use in fifth page read are R1, R9, R12, R16, R20, and R24.

(30th Modification)

Figure 48:
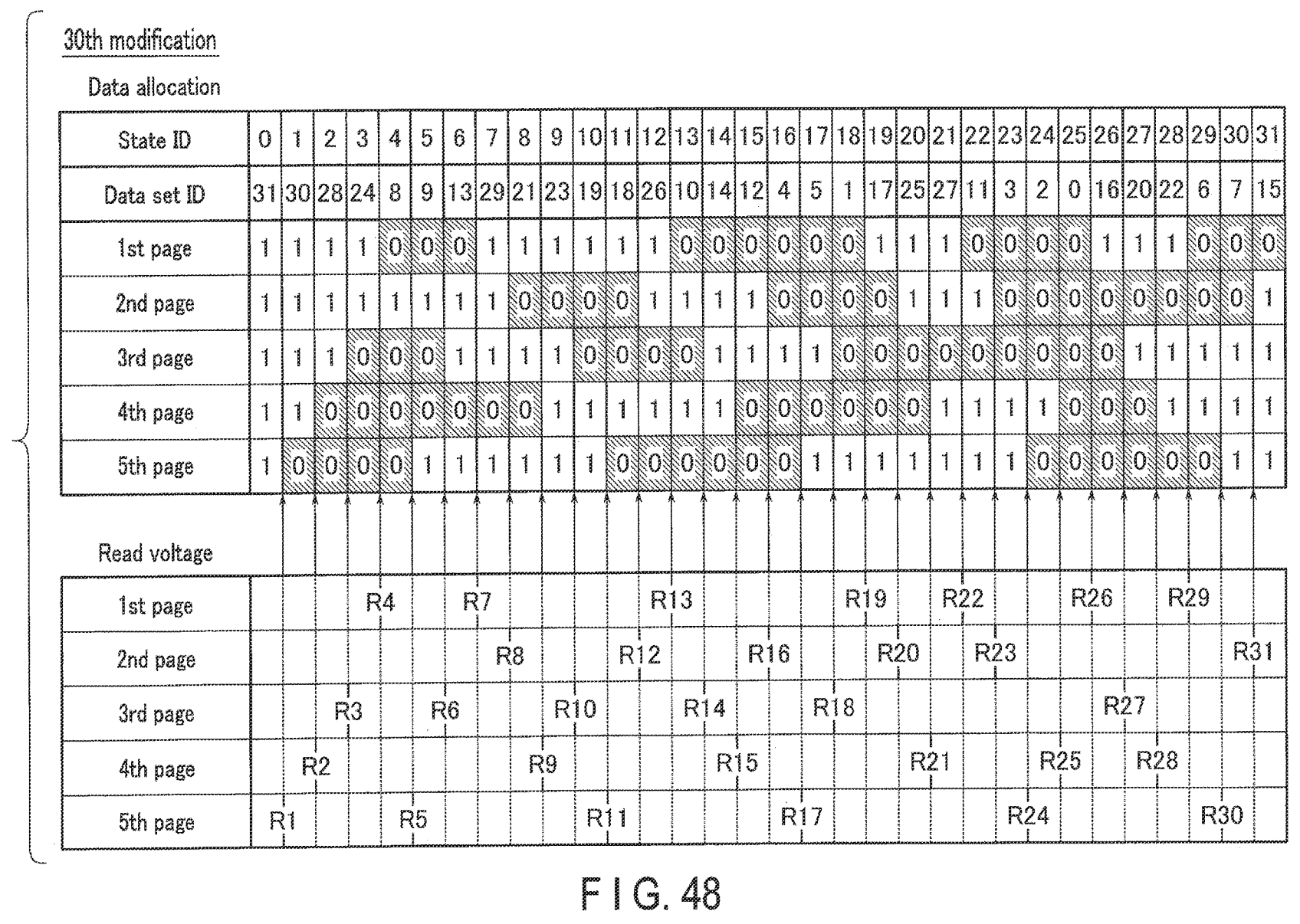

FIG. 48 is a table illustrating a setting of a data allocation and a read voltage for a 30th modification. The data allocation and the setting of read voltages in the 30th modification will be explained with reference to FIG. 48.

In the data allocation of the 30th modification, the data sets D31, D30, D28, D24, D8, D9, D13, D29, D21, D23, D19, D18, D26, D10, D14, D12, D4, D5, D1, D17, D25, D27, D11, D3, D2, D0, D16, D20, D22, D6, D7, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 30th modification, the read voltages for use in first page read are R4, R7, R13, R19, R22, R26, and R29. In the data allocation of the 30th modification, the read voltages for use in second page read are R8, R12, R16, R20, R23, and R31. In the data allocation of the 30th modification, the read voltages for use in third page read are R3, R6, R10, R14, R18, and R27. In the data allocation of the 30th modification, the read voltages for use in fourth page read are R2, R9, R15, R21, R25, and R28. In the data allocation of the 30th modification, the read voltages for use in fifth page read are R1, R5, R11, R17, R24, and R30.

(31st Modification)

FIG. 49 is a table illustrating a setting of a data allocation and a read voltage for a 31st modification. The data allocation and the setting of read voltages in the 31st modification will be explained with reference to FIG. 49.

In the data allocation of the 31st modification, the data sets D31, D30, D28, D24, D25, D17, D19, D23, D7, D5, D1, D9, D8, D12, D4, D6, D22, D18, D26, D10, D14, D15, D13, D29, D21, D20, D16, D0, D2, D3, D11, and D27 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 31st modification, the read voltages for use in first page read are R8, R16, R19, R23, R27, and R31. In the data allocation of the 31st modification, the read voltages for use in second page read are R5, R11, R14, R18, R24, and R30. In the data allocation of the 31st modification, the read voltages for use in third page read are R3, R7, R10, R13, R17, R20, and R26. In the data allocation of the 31st modification, the read voltages for use in fourth page read are R2, R6, R9, R15, R22, and R28. In the data allocation of the 31st modification, the read voltages for use in fifth page read are R1, R4, R12, R21, R25, and R29.

(32nd Modification)

FIG. 50 is a table illustrating a setting of a data allocation and a read voltage for a 32nd modification. The data allocation and the setting of read voltages in the 32nd modification will be explained with reference to FIG. 50.

In the data allocation of the 32nd modification, the data sets D31, D30, D28, D24, D16, D17, D1, D5, D7, D6, D14, D10, D26, D27, D25, D9, D8, D0, D2, D18, D22, D20, D4, D12, D13, D29, D21, D23, D19, D3, D11, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 32nd modification, the read voltages for use in first page read are R6, R12, R15, R19, R22, R25, and R29. In the data allocation of the 32nd modification, the read voltages for use in second page read are R4, R10, R17, R23, R26, and R30. In the data allocation of the 32nd modification, the read voltages for use in third page read are R3, R7, R11, R20, R28, and R31. In the data allocation of the 32nd modification, the read voltages for use in fourth page read are R2, R8, R14, R18, R21, and R27. In the data allocation of the 32nd modification, the read voltages for use in fifth page read are R1, R5, R9, R13, R16, and R24.

(33rd Modification)

Figure 51:
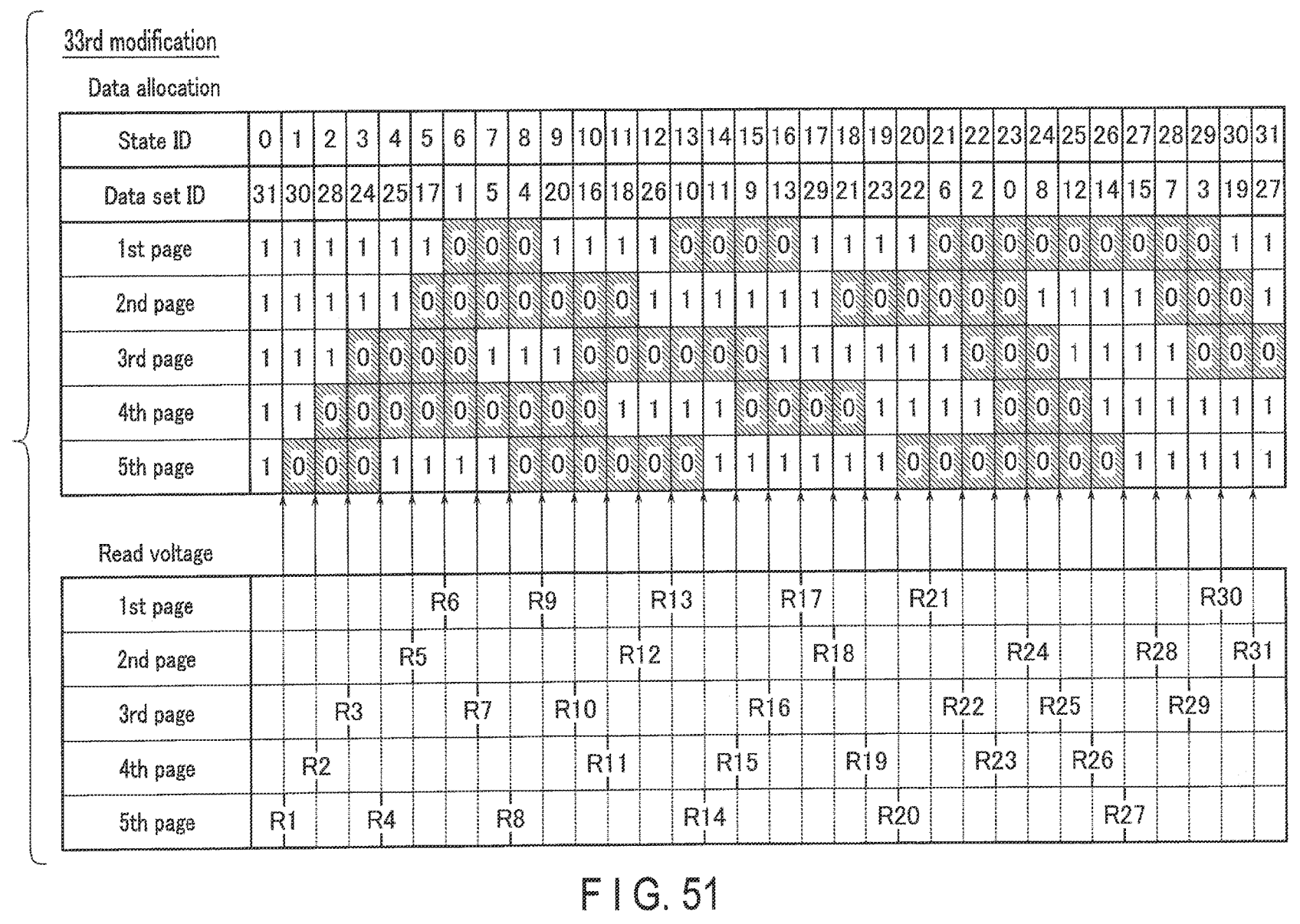

FIG. 51 is a table illustrating a setting of a data allocation and a read voltage for a 33rd modification. The data allocation and the setting of read voltages in the 33rd modification will be explained with reference to FIG. 51.

In the data allocation of the 33rd modification, the data sets D31, D30, D28, D24, D25, D17, D1, D5, D4, D20, D16, D18, D26, D10, D11, D9, D13, D29, D21, D23, D22, D6, D2, D0, D8, D12, D14, D15, D7, D3, D19, and D27 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 33rd modification, the read voltages for use in first page read are R6, R9, R13, R17, R21, and R30. In the data allocation of the 33rd modification, the read voltages for use in second page read are R5, R12, R18, R24, R28, and R31. In the data allocation of the 33rd modification, the read voltages for use in third page read are R3, R7, R10, R16, R22, R25, and R29. In the data allocation of the 33rd modification, the read voltages for use in fourth page read are R2, R11, R15, R19, R23, and R26. In the data allocation of the 33rd modification, the read voltages for use in fifth page read are R1, R4, R8, R14, R20, and R27.

(34th Modification)

FIG. 52 is a table illustrating a setting of a data allocation and a read voltage for a 34th modification. The data allocation and the setting of read voltages in the 34th modification will be explained with reference to FIG. 52.

In the data allocation of the 34th modification, the data sets D31, D30, D28, D24, D25, D27, D19, D3, D1, D9, D8, D12, D14, D6, D2, D0, D16, D17, D21, D23, D7, D15, D11, D10, D26, D18, D22, D20, D4, D5, D13, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 34th modification, the read voltages for use in first page read are R7, R16, R20, R24, R28, and R31. In the data allocation of the 34th modification, the read voltages for use in second page read are R6, R9, R13, R21, R25, and R30. In the data allocation of the 34th modification, the read voltages for use in third page read are R3, R11, R14, R18, R22, and R26. In the data allocation of the 34th modification, the read voltages for use in fourth page read are R2, R5, R8, R12, R15, R19, and R27. In the data allocation of the 34th modification, the read voltages for use in fifth page read are R1, R4, R10, R17, R23, and R29.

(35th Modification)

Figure 53:
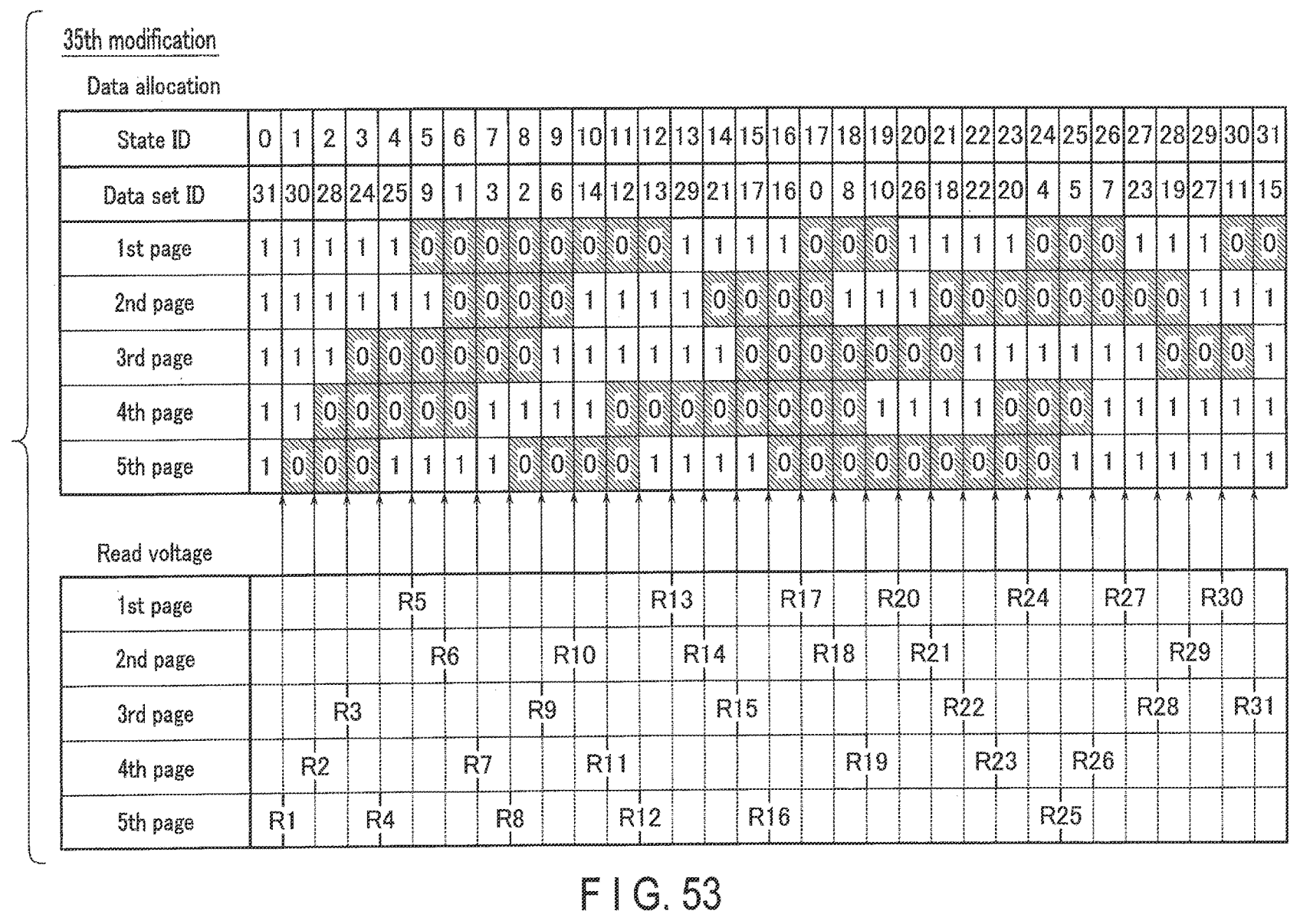

FIG. 53 is a table illustrating a setting of a data allocation and a read voltage for a 35th modification. The data allocation and the setting of read voltages in the 35th modification will be explained with reference to FIG. 53.

In the data allocation of the 35th modification, the data sets D31, D30, D28, D24, D25, D9, D1, D3, D2, D6, D14, D12, D13, D29, D21, D17, D16, D0, D8, D10, D26, D18, D22, D20, D4, D5, D7, D23, D19, D27, D11, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 35th modification, the read voltages for use in first page read are R5, R13, R17, R20, R24, R27, and R30. In the data allocation of the 35th modification, the read voltages for use in second page read are R6, R10, R14, R18, R21, and R29. In the data allocation of the 35th modification, the read voltages for use in third page read are R3, R9, R15, R22, R28, and R31. In the data allocation of the 35th modification, the read voltages for use in fourth page read are R2, R7, R11, R19, R23, and R26. In the data allocation of the 35th modification, the read voltages for use in fifth page read are R1, R4, R8, R12, R16, and R25.

(36th Modification)

FIG. 54 is a table illustrating a setting of a data allocation and a read voltage for a 36th modification. The data allocation and the setting of read voltages in the 36th modification will be explained with reference to FIG. 54.

In the data allocation of the 36th modification, the data sets D31, D30, D28, D24, D25, D27, D11, D3, D2, D6, D22, D20, D21, D29, D13, D9, D8, D0, D16, D18, D26, D10, D14, D12, D4, D5, D1, D17, D19, D23, D7, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 36th modification, the read voltages for use in first page read are R6, R10, R14, R18, R21, R27, and R30. In the data allocation of the 36th modification, the read voltages for use in second page read are R7, R13, R17, R20, R24, and R31. In the data allocation of the 36th modification, the read voltages for use in third page read are R3, R9, R15, R22, R26, and R29. In the data allocation of the 36th modification, the read voltages for use in fourth page read are R2, R5, R11, R19, R23, and R28. In the data allocation of the 36th modification, the read voltages for use in fifth page read are R1, R4, R8, R12, R16, and R25.

(37th Modification)

Figure 55:
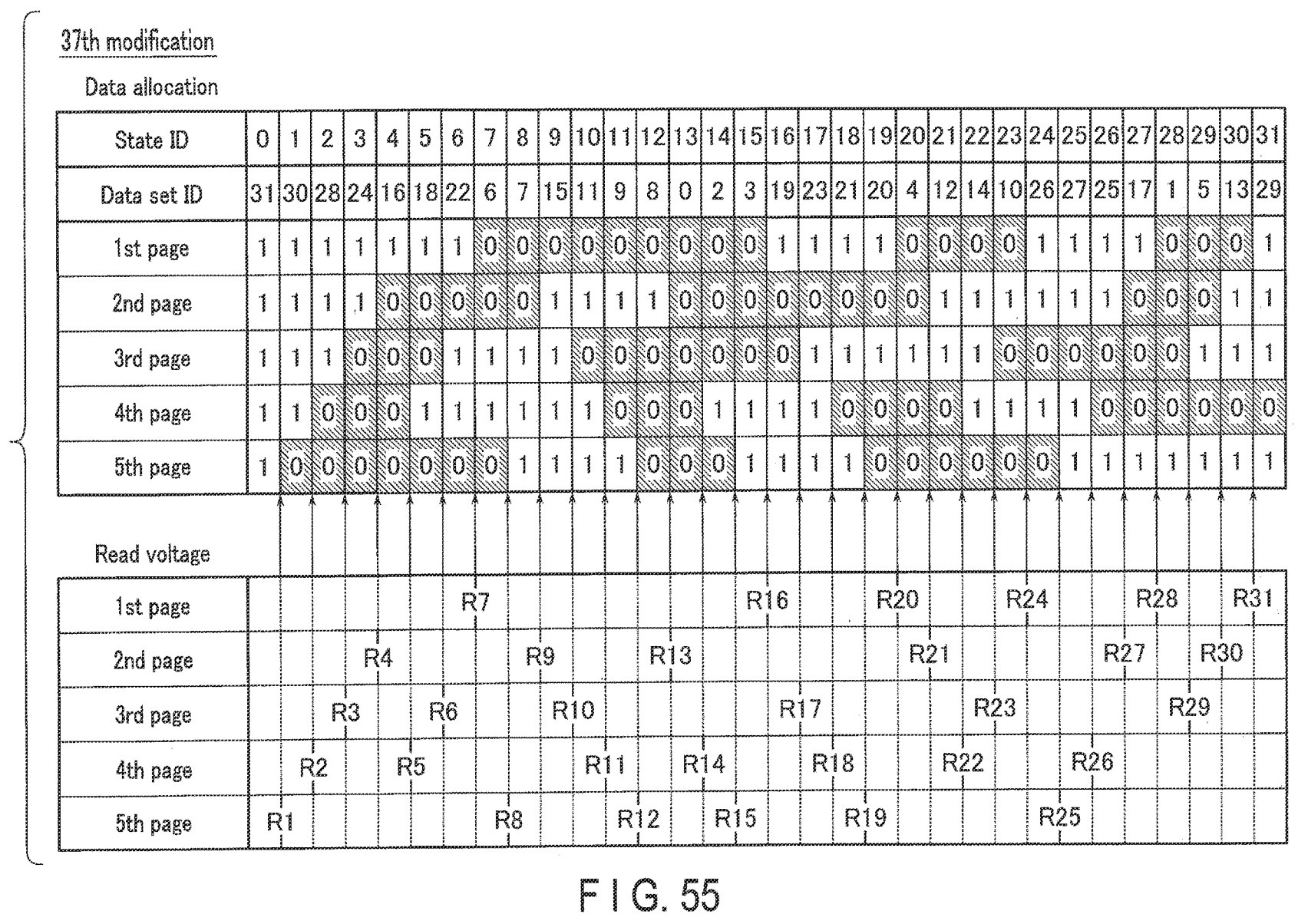

FIG. 55 is a table illustrating a setting of a data allocation and a read voltage for a 37th modification. The data allocation and the setting of read voltages in the 37th modification will be explained with reference to FIG. 55.

In the data allocation of the 37th modification, the data sets D31, D30, D28, D24, D16, D18, D22, D6, D7, D15, D11, D9, D8, D0, D2, D3, D19, D23, D21, D20, D4, D12, D14, D10, D26, D27, D25, D17, D1, D5, D13, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 37th modification, the read voltages for use in first page read are R7, R16, R20, R24, R28, and R31. In the data allocation of the 37th modification, the read voltages for use in second page read are R4, R9, R13, R21, R27, and R30. In the data allocation of the 37th modification, the read voltages for use in third page read are R3, R6, R10, R17, R23, and R29. In the data allocation of the 37th modification, the read voltages for use in fourth page read are R2, R5, R11, R14, R18, R22, and R26. In the data allocation of the 37th modification, the read voltages for use in fifth page read are R1, R8, R12, R15, R19, and R25.

(38th Modification)

Figure 56:
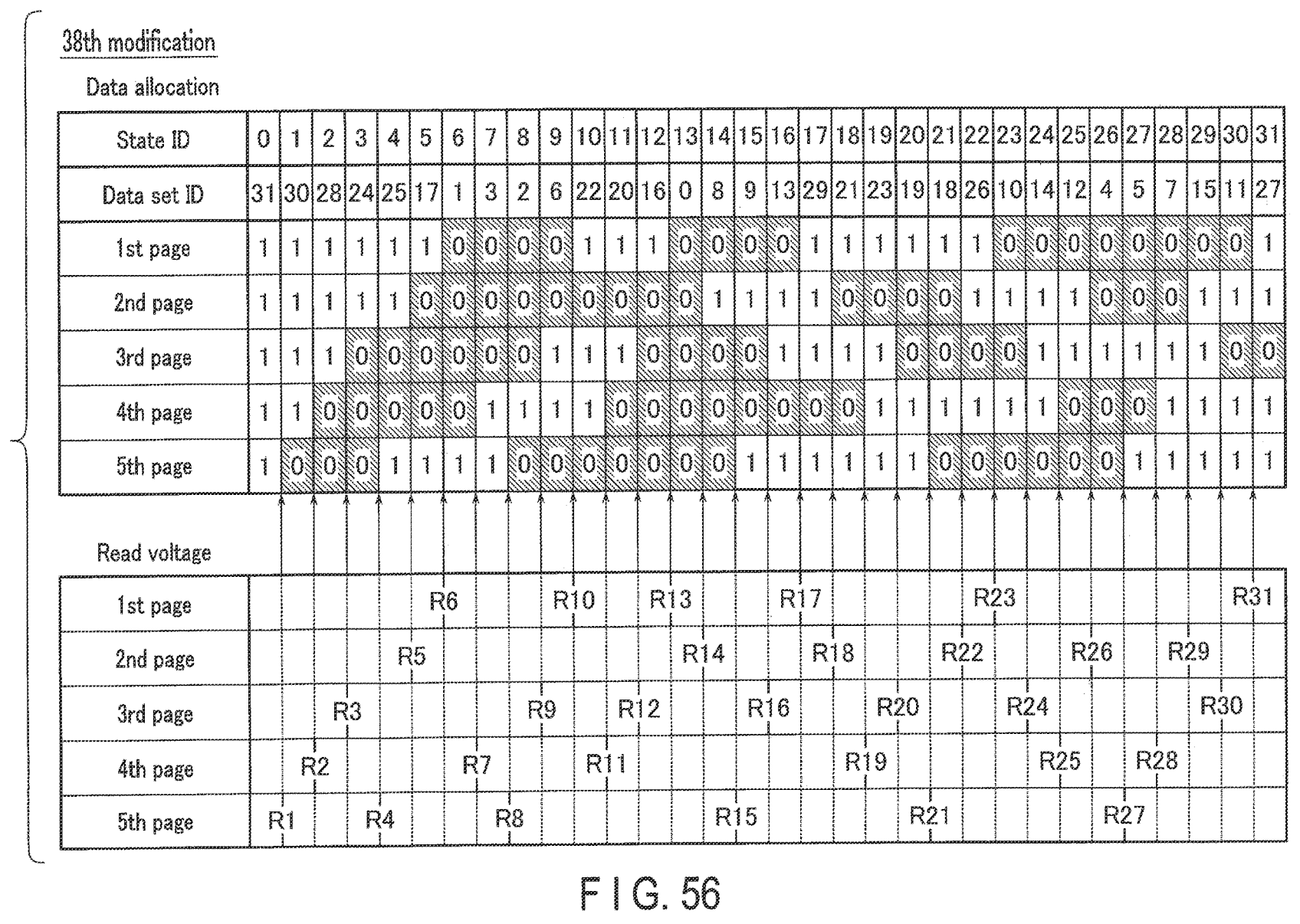

FIG. 56 is a table illustrating a setting of a data allocation and a read voltage for a 38th modification. The data allocation and the setting of read voltages in the 38th modification will be explained with reference to FIG. 56.

In the data allocation of the 38th modification, the data sets D31, D30, D28, D24, D25, D17, D1, D3, D2, D6, D22, D20, D16, D0, D8, D9, D13, D29, D21, D23, D19, D18, D26, D10, D14, D12, D4, D5, D7, D15, D1, and D27 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 38th modification, the read voltages for use in first page read are R6, R10, R13, R17, R23, and R31. In the data allocation of the 38th modification, the read voltages for use in second page read are R5, R14, R18, R22, R26, and R29. In the data allocation of the 38th modification, the read voltages for use in third page read are R3, R9, R12, R16, R20, R24, and R30. In the data allocation of the 38th modification, the read voltages for use in fourth page read are R2, R7, R11, R19, R25, and R28. In the data allocation of the 38th modification, the read voltages for use in fifth page read are R1, R4, R8, R15, R21, and R27.

(39th Modification)

FIG. 57 is a table illustrating a setting of a data allocation and a read voltage for a 39th modification. The data allocation and the setting of read voltages in the 39th modification will be explained with reference to FIG. 57.

In the data allocation of the 39th modification, the data sets D31, D30, D28, D24, D16, D0, D4, D12, D14, D15, D11, D27, D25, D17, D21, D20, D22, D6, D2, D3, D1, D9, D8, D10, D26, D18, D19, D23, D7, D5, D13, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 39th modification, the read voltages for use in first page read are R5, R11, R17, R24, R28, and R31. In the data allocation of the 39th modification, the read voltages for use in second page read are R4, R7, R13, R21, R25, and R30. In the data allocation of the 39th modification, the read voltages for use in third page read are R3, R6, R10, R14, R18, and R27. In the data allocation of the 39th modification, the read voltages for use in fourth page read are R2, R8, R12, R16, R20, R23, and R29. In the data allocation of the 39th modification, the read voltages for use in fifth page read are R1, R9, R15, R19, R22, and R26.

(40th Modification)

FIG. 58 is a table illustrating a setting of a data allocation and a read voltage for a 40th modification. The data allocation and the setting of read voltages in the 40th modification will be explained with reference to FIG. 58.

In the data allocation of the 40th modification, the data sets D31, D30, D28, D24, D16, D17, D21, D23, D7, D6, D14, D12, D8, D0, D2, D3, D19, D27, D25, D9, D1, D5, D4, D20, D22, D18, D26, D10, D11, D15, D13, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 40th modification, the read voltages for use in first page read are R8, R16, R19, R23, R27, and R31. In the data allocation of the 40th modification, the read voltages for use in second page read are R4, R10, R13, R17, R20, and R26. In the data allocation of the 40th modification, the read voltages for use in third page read are R3, R6, R12, R21, R25, and R29. In the data allocation of the 40th modification, the read voltages for use in fourth page read are R2, R7, R11, R14, R18, R24, and R30. In the data allocation of the 40th modification, the read voltages for use in fifth page read are R1, R5, R9, R15, R22, and R28.

(41st Modification)

Figure 59:
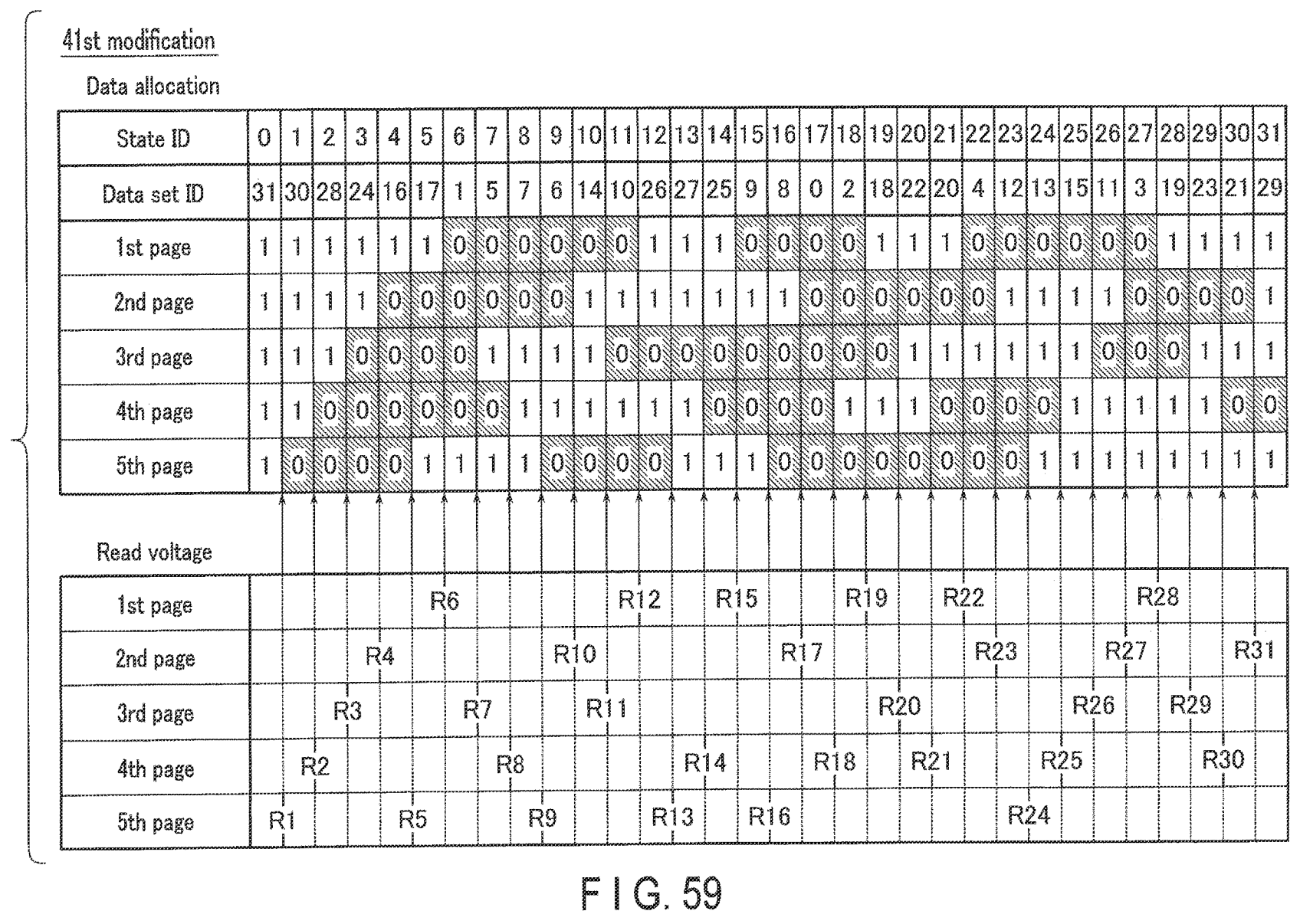

FIG. 59 is a table illustrating a setting of a data allocation and a read voltage for a 41st modification. The data allocation and the setting of read voltages in the 41st modification will be explained with reference to FIG. 59.

In the data allocation of the 41st modification, the data sets D31, D30, D28, D24, D16, D17, D1, D5, D7, D6, D14, D10, D26, D27, D25, D9, D8, D0, D2, D18, D22, D20, D4, D12, D13, D15, D11, D3, D19, D23, D21, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 41st modification, the read voltages for use in first page read are R6, R12, R15, R19, R22, and R28. In the data allocation of the 41st modification, the read voltages for use in second page read are R4, R10, R17, R23, R27, and R31. In the data allocation of the 41st modification, the read voltages for use in third page read are R3, R7, R11, R20, R26, and R29. In the data allocation of the 41st modification, the read voltages for use in fourth page read are R2, R8, R14, R18, R21, R25, and R30. In the data allocation of the 41st modification, the read voltages for use in fifth page read are R1, R5, R9, R13, R16, and R24.

(42nd Modification)

Figure 60:
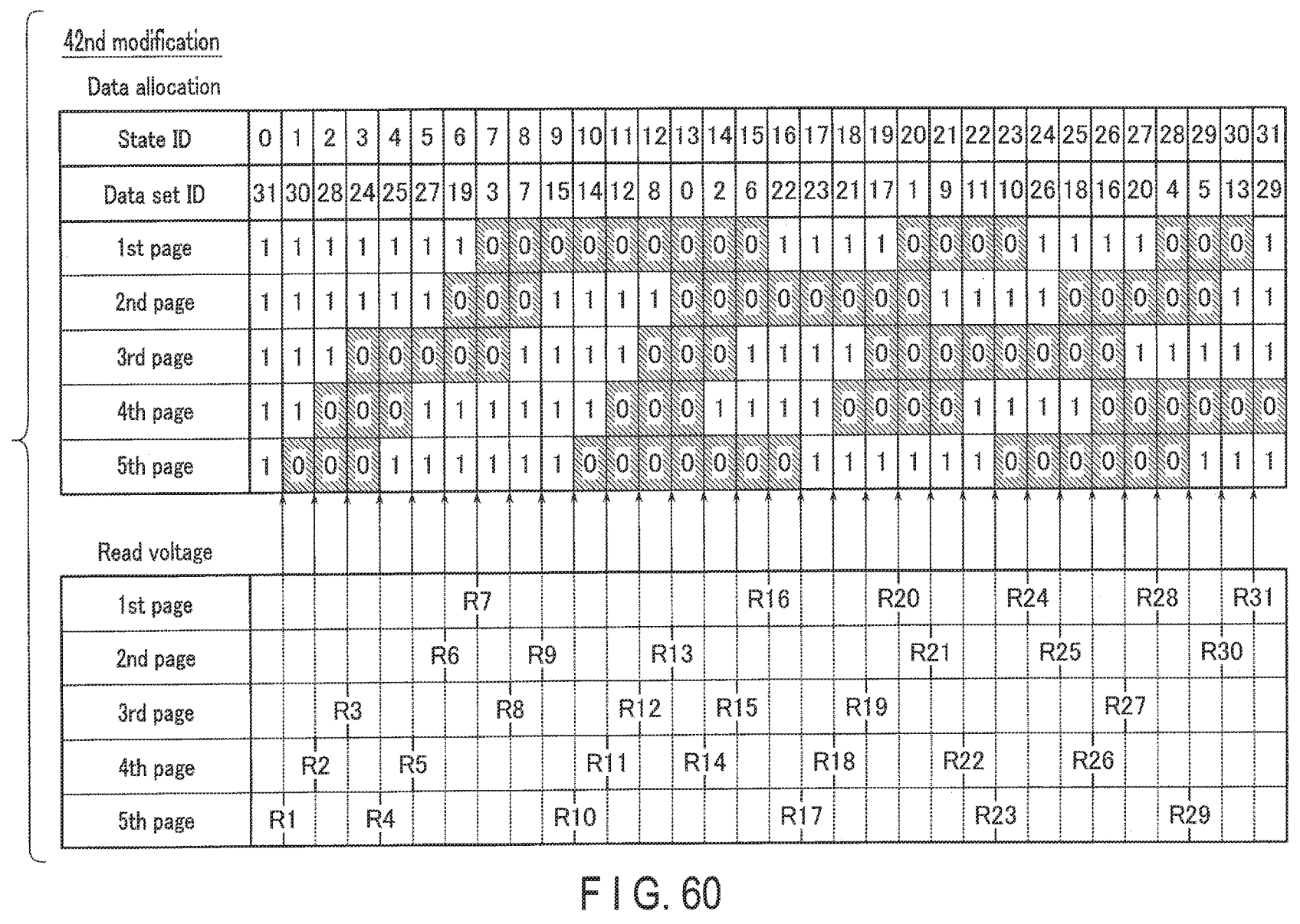

FIG. 60 is a table illustrating a setting of a data allocation and a read voltage for a 42nd modification. The data allocation and the setting of read voltages in the 42nd modification will be explained with reference to FIG. 60.

In the data allocation of the 42nd modification, the data sets D31, D30, D28, D24, D25, D27, D19, D3, D7, D15, D14, D12, D8, D0, D2, D6, D22, D23, D21, D17, D1, D9, D11, D10, D26, D18, D16, D20, D4, D5, D13, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 42nd modification, the read voltages for use in first page read are R7, R16, R20, R24, R28, and R31. In the data allocation of the 42nd modification, the read voltages for use in second page read are R6, R9, R13, R21, R25, and R30. In the data allocation of the 42nd modification, the read voltages for use in third page read are R3, R8, R12, R15, R19, and R27. In the data allocation of the 42nd modification, the read voltages for use in fourth page read are R2, R5, R11, R14, R18, R22, and R26. In the data allocation of the 42nd modification, the read voltages for use in fifth page read are R1, R4, R10, R17, R23, and R29.

(43rd Modification)

Figure 61:
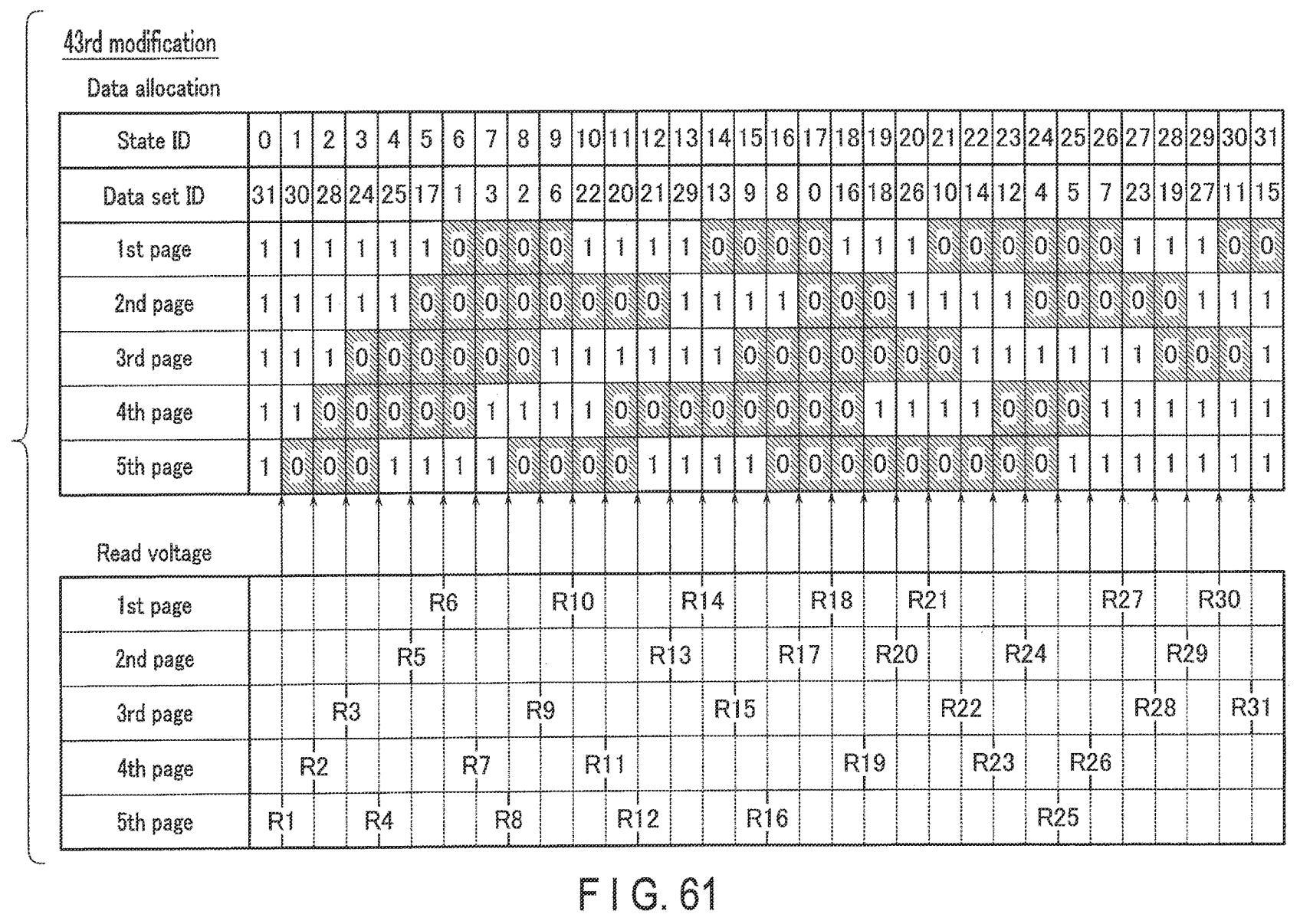

FIG. 61 is a table illustrating a setting of a data allocation and a read voltage for a 43rd modification. The data allocation and the setting of read voltages in the 43rd modification will be explained with reference to FIG. 61.

In the data allocation of the 43rd modification, the data sets D31, D30, D28, D24, D25, D17, D1, D3, D2, D6, D22, D20, D21, D29, D13, D9, D8, D0, D16, D18, D26, D10, D14, D12, D4, D5, D7, D23, D19, D27, D11, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 43rd modification, the read voltages for use in first page read are R6, R10, R14, R18, R21, R27, and R30. In the data allocation of the 43rd modification, the read voltages for use in second page read are R5, R13, R17, R20, R24, and R29. In the data allocation of the 43rd modification, the read voltages for use in third page read are R3, R9, R15, R22, R28, and R31. In the data allocation of the 43rd modification, the read voltages for use in fourth page read are R2, R7, R11, R19, R23, and R26. In the data allocation of the 43rd modification, the read voltages for use in fifth page read are R1, R4, R8, R12, R16, and R25.

(44th Modification)

FIG. 62 is a table illustrating a setting of a data allocation and a read voltage for a 44th modification. The data allocation and the setting of read voltages in the 44th modification will be explained with reference to FIG. 62.

In the data allocation of the 44th modification, the data sets D31, D30, D28, D24, D16, D17, D21, D5, D7, D15, D11, D10, D8, D0, D4, D20, D22, D23, D19, D3, D1, D9, D25, D27, D26, D18, D2, D6, D14, D12, D13, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 44th modification, the read voltages for use in first page read are R7, R15, R19, R22, R26, and R31. In the data allocation of the 44th modification, the read voltages for use in second page read are R4, R9, R13, R21, R25, and R28. In the data allocation of the 44th modification, the read voltages for use in third page read are R3, R6, R10, R14, R18, and R27. In the data allocation of the 44th modification, the read voltages for use in fourth page read are R2, R8, R12, R16, R20, R23, and R29. In the data allocation of the 44th modification, the read voltages for use in fifth page read are R1, R5, R11, R17, R24, and R30.

(45th Modification)

FIG. 63 is a table illustrating a setting of a data allocation and a read voltage for a 45th modification. The data allocation and the setting of read voltages in the 45th modification will be explained with reference to FIG. 63.

In the data allocation of the 45th modification, the data sets D31, D30, D28, D24, D16, D0, D1, D9, D11, D15, D14, D6, D2, D3, D19, D17, D21, D20, D4, D12, D8, D10, D26, D18, D22, D23, D7, D5, D13, D29, D25, and D27 are respectively allocated to states S0, S1, S2, S3, S4, 55, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 45th modification, the read voltages for use in first page read are R5, R14, R18, R22, R26, and R29. In the data allocation of the 45th modification, the read voltages for use in second page read are R4, R7, R11, R19, R23, and R28. In the data allocation of the 45th modification, the read voltages for use in third page read are R3, R9, R12, R16, R20, R24, and R30. In the data allocation of the 45th modification, the read voltages for use in fourth page read are R2, R8, R15, R21, R27, and R31. In the data allocation of the 45th modification, the read voltages for use in fifth page read are R1, R6, R10, R13, R17, and R25.

(46th Modification)

Figure 64:
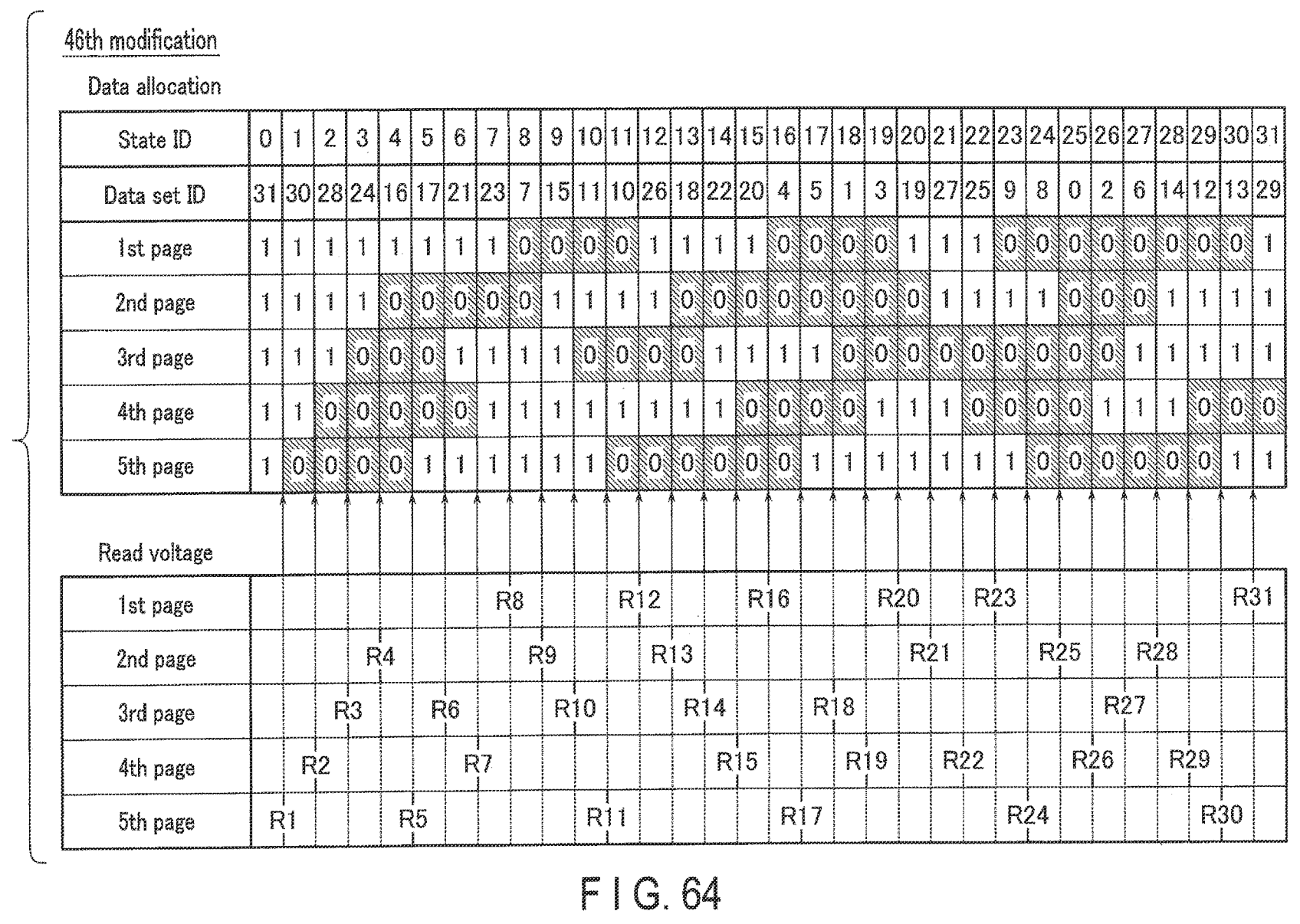

FIG. 64 is a table illustrating a setting of a data allocation and a read voltage for a 46th modification. The data allocation and the setting of read voltages in the 46th modification will be explained with reference to FIG. 64.

In the data allocation of the 46th modification, the data sets D31, D30, D28, D24, D16, D17, D21, D23, D7, D15, D11, D10, D26, D18, D22, D20, D4, D5, D1, D3, D19, D27, D25, D9, D8, D0, D2, D6, D14, D12, D13, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 46th modification, the read voltages for use in first page read are R8, R12, R16, R20, R23, and R31. In the data allocation of the 46th modification, the read voltages for use in second page read are R4, R9, R13, R21, R25, and R28. In the data allocation of the 46th modification, the read voltages for use in third page read are R3, R6, R10, R14, R18, and R27. In the data allocation of the 46th modification, the read voltages for use in fourth page read are R2, R7, R15, R19, R22, R26, and R29. In the data allocation of the 46th modification, the read voltages for use in fifth page read are R1, R5, R11, R17, R24, and R30.

(47th Modification)

FIG. 65 is a table illustrating a setting of a data allocation and a read voltage for a 47th modification. The data allocation and the setting of read voltages in the 47th modification will be explained with reference to FIG. 65.

In the data allocation of the 47th modification, the data sets D31, D30, D28, D24, D16, D0, D4, D12, D14, D15, D11, D3, D2, D6, D22, D20, D21, D17, D1, D9, D8, D10, D26, D18, D19, D23, D7, D5, D13, D29, D25, and D27 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 47th modification, the read voltages for use in first page read are R5, R14, R18, R22, R26, and R29. In the data allocation of the 47th modification, the read voltages for use in second page read are R4, R7, R11, R19, R23, and R28. In the data allocation of the 47th modification, the read voltages for use in third page read are R3, R6, R10, R13, R17, R25, and R30. In the data allocation of the 47th modification, the read voltages for use in fourth page read are R2, R8, R15, R21, R27, and R31. In the data allocation of the 47th modification, the read voltages for use in fifth page read are R1, R9, R12, R16, R20, and R24.

(48th Modification)

Figure 66:
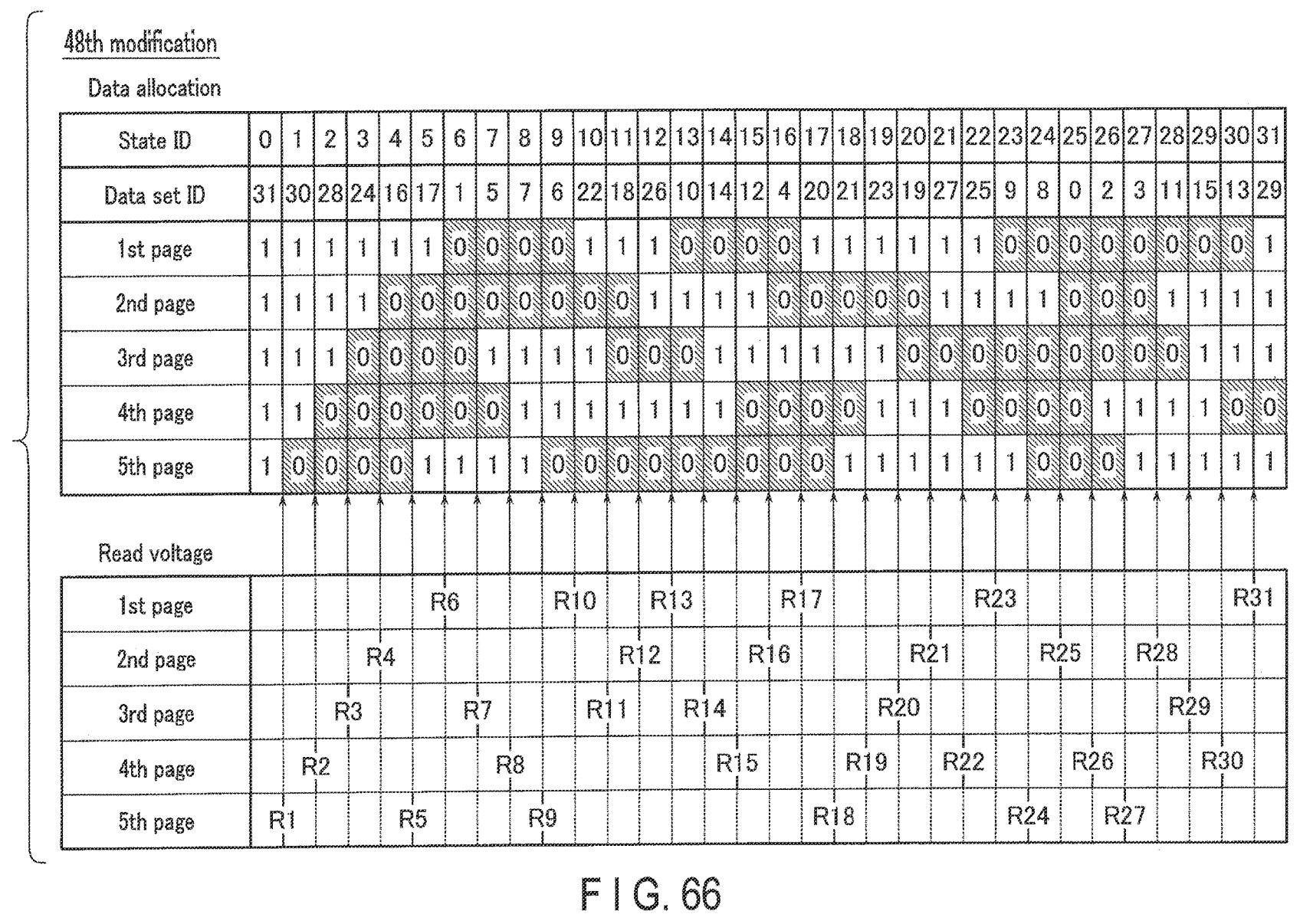

FIG. 66 is a table illustrating a setting of a data allocation and a read voltage for a 48th modification. The data allocation and the setting of read voltages in the 48th modification will be explained with reference to FIG. 66.

In the data allocation of the 48th modification, the data sets D31, D30, D28, D24, D16, D17, D1, D5, D7, D6, D22, D18, D26, D10, D14, D12, D4, D20, D21, D23, D19, D27, D25, D9, D8, D0, D2, D3, D11, D15, D13, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 48th modification, the read voltages for use in first page read are R6, R10, R13, R17, R23, and R31. In the data allocation of the 48th modification, the read voltages for use in second page read are R4, R12, R16, R21, R25, and R28. In the data allocation of the 48th modification, the read voltages for use in third page read are R3, R7, R11, R14, R20, and R29. In the data allocation of the 48th modification, the read voltages for use in fourth page read are R2, R8, R15, R19, R22, R26, and R30. In the data allocation of the 48th modification, the read voltages for use in fifth page read are R1, R5, R9, R18, R24, and R27.

(49th Modification)

FIG. 67 is a table illustrating a setting of a data allocation and a read voltage for a 49th modification. The data allocation and the setting of read voltages in the 49th modification will be explained with reference to FIG. 67.

In the data allocation of the 49th modification, the data sets D31, D30, D28, D24, D16, D0, D2, D10, D26, D27, D25, D17, D21, D23, D7, D6, D14, D12, D8, D9, D1, D5, D4, D20, D22, D18, D19, D3, D11, D15, D13, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 49th modification, the read voltages for use in first page read are R5, R8, R14, R23, R27, and R31. In the data allocation of the 49th modification, the read voltages for use in second page read are R4, R7, R11, R16, R20, and R28. In the data allocation of the 49th modification, the read voltages for use in third page read are R3, R12, R18, R21, R25, and R29. In the data allocation of the 49th modification, the read voltages for use in fourth page read are R2, R6, R10, R13, R17, R24, and R30. In the data allocation of the 49th modification, the read voltages for use in fifth page read are R1, R9, R15, R19, R22, and R26.

(50th Modification)

Figure 68:
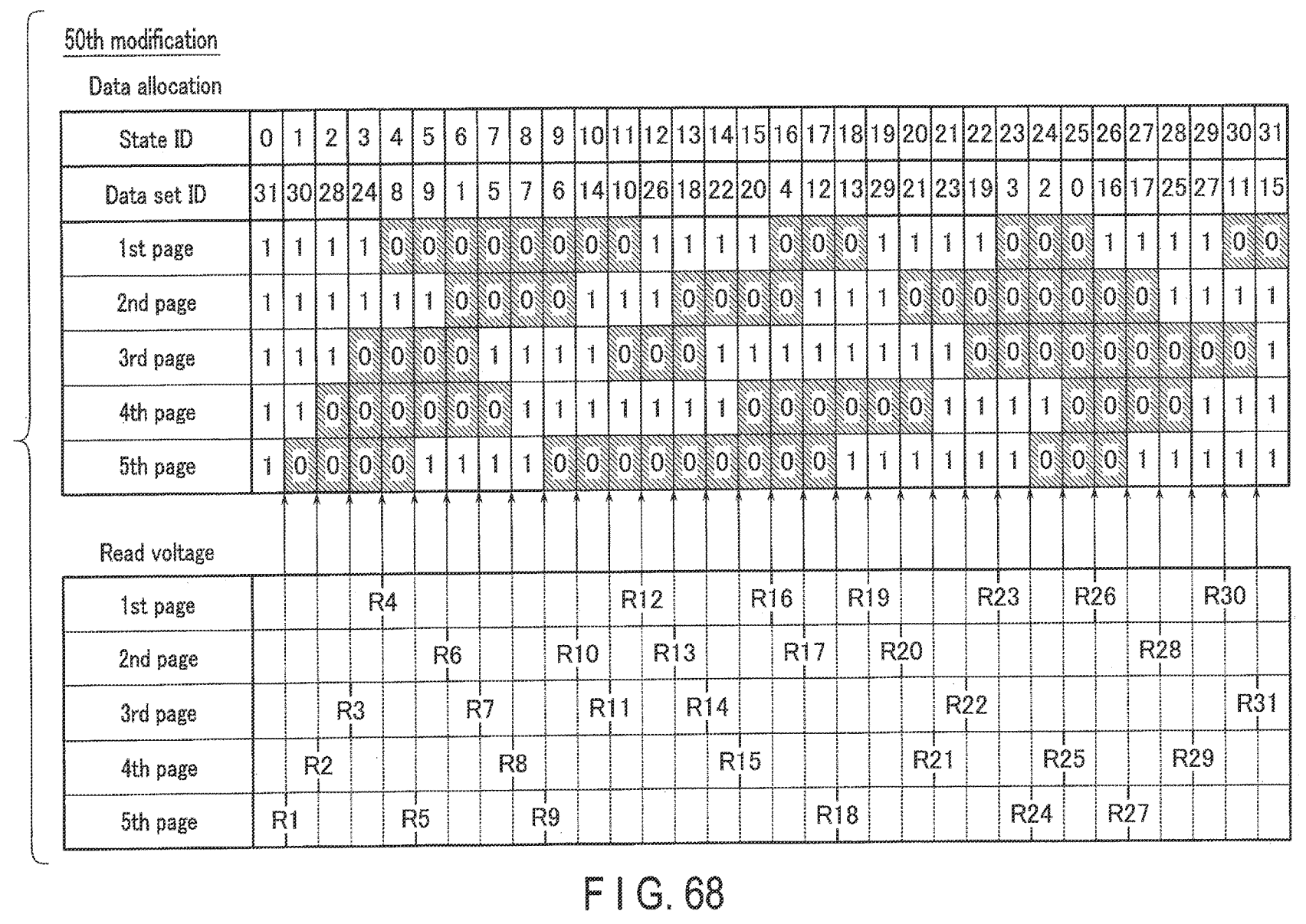

FIG. 68 is a table illustrating a setting of a data allocation and a read voltage for a 50th modification. The data allocation and the setting of read voltages in the 50th modification will be explained with reference to FIG. 68.

In the data allocation of the 50th modification, the data sets D31, D30, D28, D24, D8, D9, D1, D5, D7, D6, D14, D10, D26, D18, D22, D20, D4, D12, D13, D29, D21, D23, D19, D3, D2, D0, D16, D17, D25, D27, D11, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 50th modification, the read voltages for use in first page read are R4, R12, R16, R19, R23, R26, and R30. In the data allocation of the 50th modification, the read voltages for use in second page read are R6, R10, R13, R17, R20, and R28. In the data allocation of the 50th modification, the read voltages for use in third page read are R3, R7, R11, R14, R22, and R31. In the data allocation of the 50th modification, the read voltages for use in fourth page read are R2, R8, R15, R21, R25, and R29. In the data allocation of the 50th modification, the read voltages for use in fifth page read are R1, R5, R9, R18, R24, and R27.

(51st Modification)

FIG. 69 is a table illustrating a setting of a data allocation and a read voltage for a 51st modification. The data allocation and the setting of read voltages in the 51st modification will be explained with reference to FIG. 69.

In the data allocation of the 51st modification, the data sets D31, D30, D28, D24, D8, D0, D2, D6, D14, D12, D13, D9, D25, D27, D19, D3, D1, D5, D4, D20, D22, D23, D7, D15, D11, D10, D26, D18, D16, D17, D21, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 51st modification, the read voltages for use in first page read are R4, R12, R15, R19, R22, and R26. In the data allocation of the 51st modification, the read voltages for use in second page read are R5, R8, R14, R23, R27, and R31. In the data allocation of the 51st modification, the read voltages for use in third page read are R3, R7, R11, R17, R24, and R30. In the data allocation of the 51st modification, the read voltages for use in fourth page read are R2, R6, R9, R13, R16, R20, and R28. In the data allocation of the 51st modification, the read voltages for use in fifth page read are R1, R10, R18, R21, R25, and R29.

(52nd Modification)

FIG. 70 is a table illustrating a setting of a data allocation and a read voltage for a 52nd modification. The data allocation and the setting of read voltages in the 52nd modification will be explained with reference to FIG. 70.

In the data allocation of the 52nd modification, the data sets D31, D30, D28, D24, D16, D17, D19, D23, D7, D6, D14, D10, D26, D27, D25, D9, D8, D0, D2, D18, D22, D20, D4, D12, D13, D15, D11, D3, D1, D5, D21, and D29 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 52nd modification, the read voltages for use in first page read are R8, R12, R15, R19, R22, and R30. In the data allocation of the 52nd modification, the read voltages for use in second page read are R4, R10, R17, R23, R27, and R31. In the data allocation of the 52nd modification, the read voltages for use in third page read are R3, R7, R11, R20, R26, and R29. In the data allocation of the 52nd modification, the read voltages for use in fourth page read are R2, R6, R14, R18, R21, R25, and R28. In the data allocation of the 52nd modification, the read voltages for use in fifth page read are R1, R5, R9, R13, R16, and R24.

(53rd Modification)

FIG. 71 is a table illustrating a setting of a data allocation and a read voltage for a 53rd modification. The data allocation and the setting of read voltages in the 53rd modification will be explained with reference to FIG. 71.

In the data allocation of the 53rd modification, the data sets D31, D30, D28, D24, D8, D9, D13, D29, D21, D20, D22, D6, D2, D0, D16, D17, D25, D27, D11, D3, D1, D5, D4, D12, D14, D10, D26, D18, D19, D23, D7, and D15 are respectively allocated to states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31.

In the data allocation of the 53rd modification, the read voltages for use in first page read are R4, R7, R11, R14, R18, R26, and R30. In the data allocation of the 53rd modification, the read voltages for use in second page read are R8, R16, R19, R23, R27, and R31. In the data allocation of the 53rd modification, the read voltages for use in third page read are R3, R6, R12, R21, R25, and R29. In the data allocation of the 53rd modification, the read voltages for use in fourth page read are R2, R10, R13, R17, R20, and R24. In the data allocation of the 53rd modification, the read voltages for use in fifth page read are R1, R5, R9, R15, R22, and R28.

[1-5] Characteristic of Each Data Allocation

In each of the first to 53rd modifications, data allocation is "7-6-6-6-6 coding". In the data allocation in each of the first to 53rd modifications, the difference between a maximum value and a minimum value of the number of times of read that varies among pages and that is set to confirm the data is "1", as in the first embodiment. In the data allocation of each of the first to 15th modifications, the interval between read voltages in each page is "3" at minimum and "8" at maximum, as in the first embodiment. In the data allocation of each of the 16th and 17th modifications, the interval between read voltages in each page is "3" at minimum and "9" at maximum. Furthermore, in the data allocation of each of the 16th and 17th modifications, the interval between read voltages in a page which is read seven times is set to only "4". In the data allocation of each of the 18th to 25th modifications, the interval between read voltages in each page is "3" at minimum and "10" at maximum. In the data allocation of each of the 26th to 53rd modifications, the interval between read voltages in each page is "3" at minimum and "9" at maximum.

When considering data allocation, the following conditions (1) to (5) are those that should preferably be avoided as far as possible, in addition to the conditions described above in the explanations of advantages of the embodiment.

(1) The lowest read voltage for use in a read operation of a page which is read seven times is set apart by one state from the lowest read voltage R1 among all the read voltages R1 to R31.

(2) The highest read voltage for use in a read operation of a page which is read seven times is set apart by one state from the highest read voltage R31 among all the read voltages R1 to R31.

(3) The interval between a plurality of read voltages for use in a read operation of a page which is read seven times is "3 (which corresponds to three states)" at minimum.

(4) The interval between a plurality of read voltages for use in a read operation of a page using the lowest read voltage R1 or the highest read voltage R31 is "3 (which corresponds to three states)" at minimum or "9 (which corresponds to nine states)" at maximum.

(5) There is a page in which both the lowest read voltage R1 and the highest read voltage R31 of all the read voltages R1 to R31 are used for a read operation. In other words, the first page to the fifth page includes a page in which both the read voltages R1 and R31 are used for a read operation.

(6) The interval between read voltages for use in a read operation of each page is "3 (which corresponds to three states)" at minimum and "9 (which corresponds to nine states)" or more at maximum.

The priorities pertaining to avoidance of the respective conditions are as follows: (1), (2)<(3), (4)<(5)<(6). The fewer of the conditions (1) to (6) the data allocation satisfies, the nearer to the ideal data allocation. When the case of one condition of a lower priority being satisfied is compared with the case of one condition of a higher priority being satisfied, the former case is nearer to the ideal data allocation. When the conditions (1) to (6) are taken into consideration, the embodiment and the first to 17th modifications are classified into, for example, first to seventh groups.

The first group includes the embodiment and the first to fourth modifications. The data allocation of the first group satisfies one of the conditions (1) and (2) of the conditions (1) to (6). In other words, the data allocation of the first group does not satisfy the other of the conditions (1) and (2), and the conditions (3), (4), (5), and (6).

The second group includes the fifth modification. The data allocation of the second group satisfies the conditions (2) and (4). In other words, the data allocation of the second group does not satisfy the conditions (1), (3), (5), and (6).

The third group includes the sixth and seventh modifications. The data allocation of the third group satisfies the conditions (1), (2), and (3). In other words, the data allocation of the third group does not satisfy the conditions (4), (5), and (6).

The fourth group includes the eighth modification. The data allocation of the fourth group satisfies the conditions (2), (3), and (4). In other words, the data allocation of the fourth group does not satisfy the conditions (1), (5), and (6).

The fifth group includes the ninth to 11th modifications. The data allocation of the fifth group satisfies the conditions (1), (2), (3), and (4). In other words, the data allocation of the fifth group does not satisfy the conditions (5) and (6).

The sixth group includes the 12th to 15th modifications. The data allocation of the sixth group satisfies the conditions (3) and (5). In other words, the data allocation of the sixth group does not satisfy the conditions (1), (2), (4), and (6).

The seventh group includes the 16th and 17th modifications. The data allocation of the seventh group satisfies the conditions (4) and (6). In other words, the data allocation of the seventh group does not satisfy the conditions (1), (2), (3), and (5).

Using the conditions (1) to (6), the groups are scored in order of read efficiency from highest to lowest as follows: the first group, the second group, the third group, the fourth group, the fifth group, the six group, and the seventh group. The data allocation in each of the 26th to 53rd modifications has a read efficiency, for example, similar to that of the seventh group. The read efficiency in the data allocation of each of the 18th to 25th modifications is slightly lower than that of the seventh group, since the interval between read voltages in each page is "10" at maximum. Each of the 18th, 19th, 20th, 21st, 23rd, and 24th modifications has no page in which both the lowest read voltage R1 and the highest read voltage R31 are used. Therefore, the read efficiency in the data allocation of each of the 18th, 19th, 20th, 21st, 23rd, and 24th modifications is higher than that in the data allocation in each of the 22nd and 25th modifications that has a page in which both the lowest read voltage R1 and the highest read voltage 31 are used. When the data allocation is used in the memory device 20, regardless of the group to which the data allocation belongs, the memory device 20 can perform an efficient read operation.

The conditions (1) to (6) can be respectively reworded as the following conditions (1a) to (6a). The conditions (1a) to (6a) are those that should be preferably applied as much as possible, in addition to the conditions described above in the explanations of advantages of the embodiment.

(1a) The lowest read voltage for use in a read operation of a page read seven times is set apart by two or more states from the lowest read voltage R1 among all the read voltages R1 to R31.

(2a) The highest read voltage for use in a read operation of a page which is read seven times is set apart by two or more states from the highest read voltage R31 among all the read voltages R1 to R31.

(3a) The interval between a plurality of read voltages for use in a read operation of a page which is read seven times is "4 (which corresponds to four states)" at minimum.

(4a) The interval between a plurality of read voltages for use in a read operation of a page using the lowest read voltage R1 or the highest read voltage R31 is "4 (which corresponds to four states)" at minimum or "8 (which corresponds to eight states)" at maximum.

(5a) There is a page in which a voltage different from the lowest read voltage R1 and the highest read voltage R31 of all the read voltages R1 to R31 is used for a read operation. In other words, the first page to the fifth page do not include a page in which both the read voltages R1 and R31 are used for a read operation.

(6a) The interval between read voltages for use in a read operation of each page is "4 (which corresponds to four states)" at minimum and "8 (which corresponds to eight states)" or maximum.

The priorities of applying the respective conditions are as follows: (1a), (2a)>(3a), (4a)>(5a)>(6a) The more of the conditions (1a) to (6a) the data allocation satisfies, the nearer to the ideal data allocation. When the case of one condition of a lower priority being satisfied is compared with the case of one condition of a higher priority being satisfied, the latter case is nearer to the ideal data allocation.

[2] Second Embodiment

An information processing system 1 of the second embodiment is similar in configuration to that of the first embodiment. In the second embodiment, the memory device 20 executes a read operation in units of page by applying read voltages in the order of a higher voltage to a lower voltage. A description will be given of the points in which the second embodiment differs from the first embodiment.

[2-1] Operation

FIG. 72 is a timing chart illustrating an example of first page read in the memory system MS of the second embodiment. FIG. 72 shows transitions of the input/output signal I/O, the ready/busy signal RBn, the selected word line WLsel, and the control signal STB in the first page read of the second embodiment. Hereinafter, the first page read of the second embodiment will be described with reference to FIG. 72.

When executing the first page read, the memory controller 10 transmits, for example, a command "01h", a command "00h", an address "ADD", and a command "30h" to the memory device 20 in this order. When the memory device 20 receives the command "30h", the sequencer 204 causes the memory device 20 to transition from the ready state to the busy state based on the command and the address stored in the register circuit 203.

Then, the sequencer 204 applies the read voltages R30, R26, R22, R18, R12, R8, and R4 to the selected word line WLsel in this order. The sequencer 204 also asserts the control signal STB while applying each of the read voltages R30, R26, R22, R18, R12, R8, and R4. Each sense amplifier unit SAU confirms (determines) first bit data read from the memory cell transistor MT coupled to the selected word line WLsel, and causes the latch circuit XDL to store the determination result, under the control of the sequencer 204.

Other operations of the first page read of the second embodiment are similar to those of the first embodiment. Such a read operation of applying read voltages in order of higher voltages is referred to as, for example, a "reverse read". The memory device 20 of the second embodiment can perform each of second read to fifth read in the reverse read in the same manner as in the first read.

FIG. 72 shows an example in which a read voltage is applied to the selected word line WLsel subsequent to the application of the ground voltage VSS to the selected word line WLsel. However, the embodiment is not limited to this example. For example, a predetermined voltage higher than the read voltage may be applied to the selected word line WLsel before the read voltage is applied to the selected word line WLsel. The predetermined voltage may be of a value equivalent to the voltage applied to an unselected word line WL at read time, or of a value higher than the highest read voltage R31.

[2-2] Advantages of Second Embodiment

As described above, the memory device 20 of the second embodiment performs a read operation by applying read voltages in the reverse order of the first embodiment. Thus, the data allocation of the first embodiment can be used regardless of the order of applying the read voltages. The reverse read of the second embodiment described above may be applied to the data allocation of any of the first to 53rd modifications.

[3] Third Embodiment

An information processing system 1 of the third embodiment is similar in configuration to that of the first embodiment. In the third embodiment, the memory device 20 performs a sequential read operation (hereinafter referred to as "sequential read") for 5-page data stored in a cell unit CU.

A description will be given of the points in which the third embodiment differs from the first embodiment.

[3-1] Operation

Figure 73:
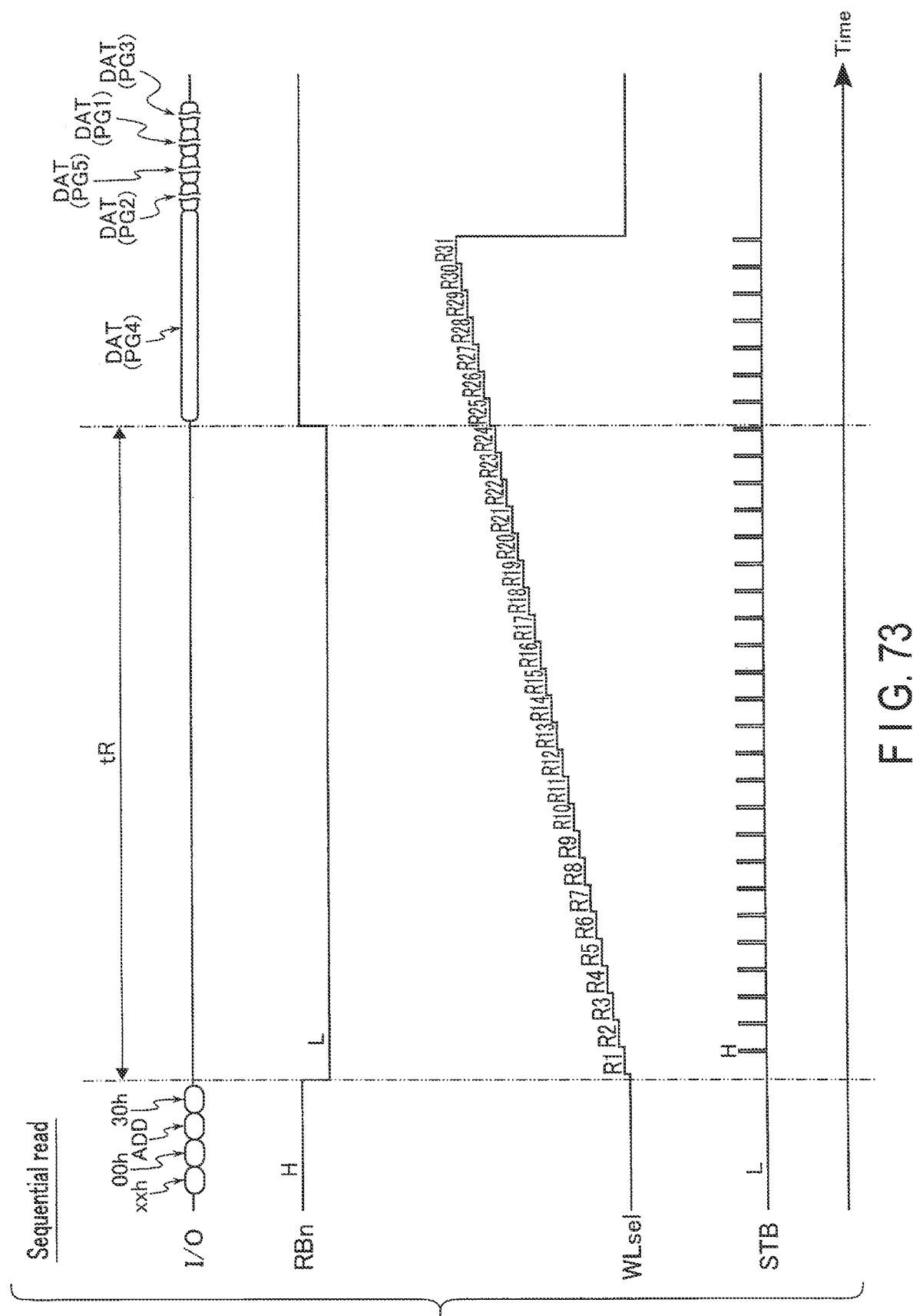
FIG. 73 is a timing chart illustrating an example of sequential read in a memory system of a third embodiment.

FIG. 73 is a timing chart illustrating an example of sequential read in a memory system MS of the third embodiment. FIG. 73 shows transitions of the input/output signal I/O, the ready/busy signal RBn, the selected word line WLsel, and the control signal STB in the sequential page read of the third embodiment. Hereinafter, the sequential read of the third embodiment will be described with reference to FIG. 73.

When executing the sequential read, the memory controller 10 transmits, for example, a command "xxh", the command "00h", the address "ADD", and the command "30h" to the memory device 20 in this order. The command "xxh" designates the sequential read.

When the memory device 20 receives the command "30h", the sequencer 204 causes the memory device 20 to transition from the ready state to the busy state based on the command and the address stored in the register circuit 203. Then, the sequencer 204 applies the read voltages R1 to R31 to the selected word line WLsel in this order. The sequencer 204 also asserts the control signal STB while applying each of the read voltages R1 to R31. Each sense amplifier unit SAU confirms (determines) first to fifth bit data read from the memory cell transistor MT coupled to the selected word line WLsel, and causes the respective latch circuits ADL, BDL, CDL, DDL, and EDL to store the determination results, under the control of the sequencer 204.

When, for example, the read using the read voltage R24 is completed and the fourth bit data is confirmed, the sequencer 204 causes the memory device 20 to transition from the busy state to the ready state. Then, based on the transition of the memory device 20 from the busy state to the ready state, the memory controller 10 instructs the memory device 20 to output the data DAT (fourth page data PG4) stored in each of the latch circuits DDL in the sense amplifier module 209, and the fourth page data PG4 is output to the memory controller 10.

While the fourth page data PG4 is being output to the memory controller 10, the read using the read voltages R25 to R31 is completed, and each of the first, second, third and fifth page data is confirmed. Upon completion of the reception of the fourth page data PG4, the memory controller 10 instructs the memory device 20 to output data, for example, in the order of the data confirmed (in the order of PG2, PG5, PG1, and PG3). Upon receipt of the data of 5 pages, the memory controller 10 ends the sequential read.

Although the case in which the data is output in the order of data confirmed is described as an example, the embodiment is not limited to this case. If there are a plurality of pages in which data is confirmed, the order of pages to be output from the memory device 20 to the memory controller 10 may be set freely. In the third embodiment, the case in which the read voltages are applied in ascending order of read voltage in the sequential read is described. However, the embodiment is not limited to this case. The sequential read may be performed by the reverse read as in the second embodiment.

[3-2] Advantages of Third Embodiment

As described above, the memory device 20 of the third embodiment can read 5-page data stored in the cell unit CU in batch reading. The data allocation of the first embodiment is applicable in a case in which sequential read is executed. The sequential read may be applied to the data allocation of any of the first to 53rd modifications. The memory system MS of the third embodiment can improve the latency in the sequential read by outputting data from the memory device 20 to the memory controller 10 sequentially from a page in which the data is confirmed.

[3-3] Modification of Third Embodiment

The memory device 20 can accelerate data output timing in the sequential read by changing page allocation or by utilizing the reverse read. For example, in the data allocation of the embodiment illustrated in FIG. 8, the first page and the second page may be exchanged to execute a sequential read utilizing the reverse read (namely, a read operation of sequentially applying read voltages in descending order). In this case, the memory device 20 can output first page data after read using the read voltage R6, and can output second page data after read using the read voltage R3. As a result, the latency of the memory system MS can be improved.

[4] Fourth Embodiment

The fourth embodiment relates to a circuit placement of the memory device 20 in the first to third embodiments described above. A memory device 20a of the fourth embodiment will be described also with reference to a comparative example. In the following description, an X direction, a Y direction, and a Z direction intersect with one another. For example, the Z direction is a direction vertical to an XY plane defined by the X direction and the Y direction. The XY plane corresponds to, for example, a plane parallel to a surface of a semiconductor substrate to form the memory device 20a.

[4-1] Configuration of Comparative Example

Figure 74:
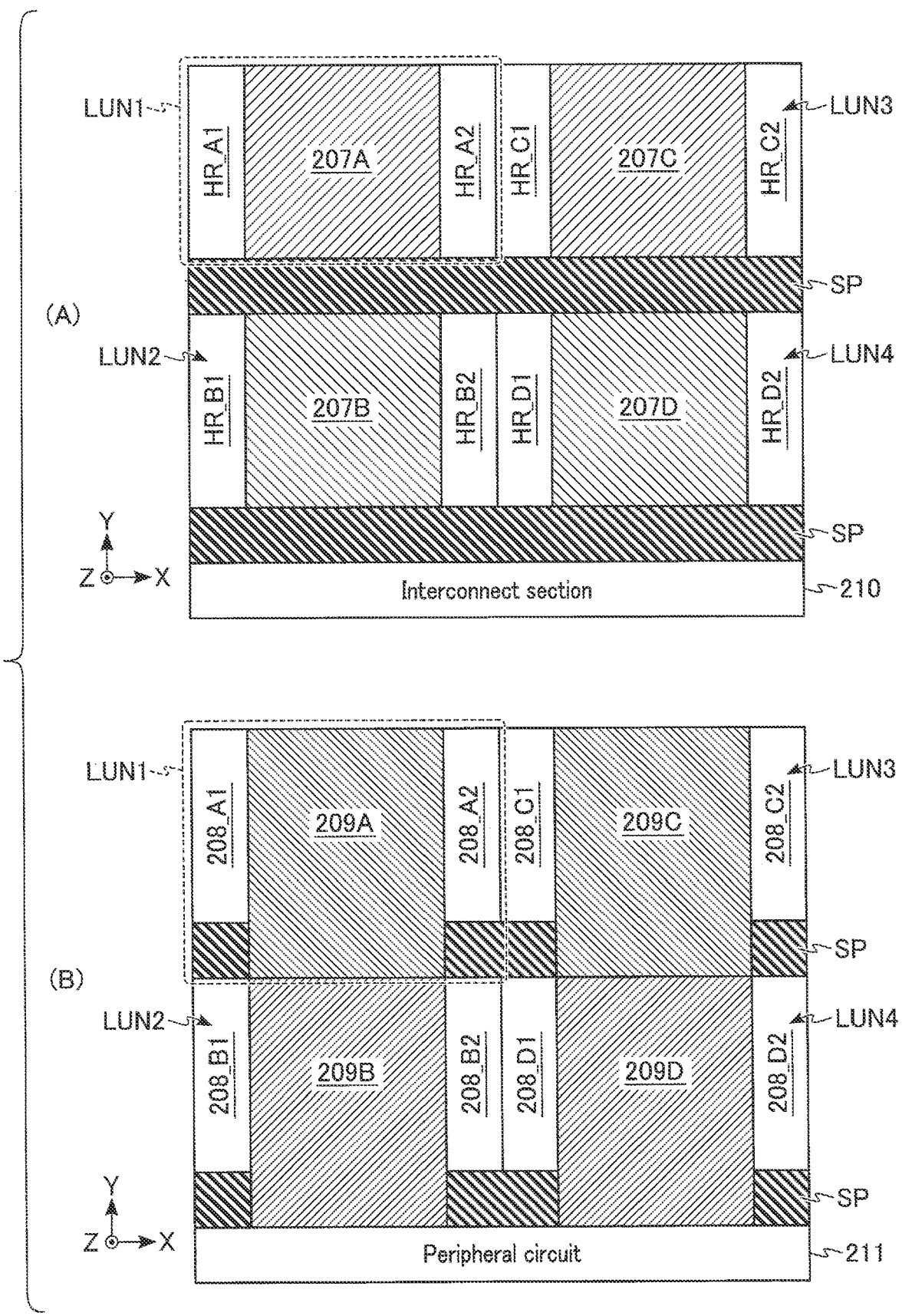
FIG. 74 is a plan view illustrating an example of a circuit placement of a memory device of a comparative example.

FIG. 74 is a plan view illustrating an example of a circuit placement of a memory device 20b of a comparative example. The memory device 20b has a structure in which the memory cell array 207 and the sense amplifier module 209 are adjacent to each other in the Z direction. FIG. 74 (A) shows a circuit placement in a layer including the memory cell array 207 of the memory device 20b. FIG. 74 (B) shows a circuit placement in a layer including the sense amplifier module 209 of the memory device 20b.

The memory device 20b includes, for example, four planes LUN1 to LUN4, an interconnect section 210, and a peripheral circuit 211. The planes LUN1 and LUN2 are adjacent to each other in the Y direction. The planes LUN3 and LUN4 are adjacent to each other in the Y direction. The planes LUN1 and LUN3 are adjacent to each other in the X direction. The planes LUN2 and LUN4 are adjacent to each other in the X direction. The planes LUN share the interconnect section 210 and the peripheral circuit 211. The interconnect section 210 is provided in the layer including the memory cell array 207. The interconnect section 210 is overlaid on the peripheral circuit 211 in the Z direction. The interconnect section 210 is used to couple the peripheral circuit 211 to a plurality of pads provided in the memory device 20b (namely, pads utilized to couple the memory controller 10 to the input/output circuit 201 or the like). The peripheral circuit 211 is provided in a layer including the sense amplifier module 209. The peripheral circuit 211 may include the input/output circuit 201, the logic controller 202, the register circuit 203, the sequencer 204, or the like. Each of the interconnect section 210 and the peripheral circuit 211 is adjacent to sets of the planes LUN1 to LUN4 in the Y direction.

Each plane LUN includes the memory cell array 207, a hookup region HR, the row decoder module 208, and the sense amplifier module 209. Specifically, the plane LUN1 includes a memory cell array 207A, hookup regions HR_A1 and HR_A2, row decoder modules 208_A1 and 208_A2, and a sense amplifier module 209A. The plane LUN2 includes a memory cell array 207B, hookup regions HR_B1 and HR_B2, row decoder modules 208_B1 and 208_B2, and the sense amplifier module 209B. The plane LUN3 includes a memory cell array 207C, hookup regions HR_C1 and HR_C2, row decoder modules 208_C1 and 208_C2, and the sense amplifier module 209C. The plane LUN4 includes a memory cell array 207D, hookup regions HR_D1 and HR_D2, row decoder modules 208_D1 and 208_D2, and the sense amplifier module 209D.

Focusing on the plane LUN1, a specific circuit placement in the plane LUN1 will be explained. As illustrated in FIG. 74 (A), the memory cell array 207A is interposed between the hookup regions HR_A1 and HR_A2 in the X direction. As illustrated in FIG. 74 (B), the sense amplifier module 209A is interposed between the row decoder modules 208_A1 and 208_A2 in the X direction. As illustrated in FIGS. 74 (A) and (B), the memory cell array 207A is overlaid on the sense amplifier module 209A in the Z direction. The hookup regions HR_A1 and HR_A2 are respectively overlaid on the row decoder modules 208_A1 and 208_A2 in the Z direction. The memory cell array 207A is coupled to the row decoder module 208_A1 via a plurality of interconnects provided in the hookup region HR_A1, and coupled to the row decoder module 208_A2 via a plurality of interconnects provided in the hookup region HR_A2. The set of the row decoder modules 208_A1 and 208_A2 form the row decoder module 208 explained with reference to, for example, FIG. 5.

The width of each of the hookup regions HR_A1 and HR_A2 in the Y direction is substantially equal to the width of the memory cell array 207A in the Y direction. The width of each of the row decoder modules 208_A1 and 208_A2 in the Y direction is substantially equal to the width of the hookup regions HR_A1 and HR_A2 in the Y direction. When the 5 bits/cell coding as in the first embodiment described above is applied to the memory cell array 207A, for example, the width of the sense amplifier module 209A in the Y direction is greater than the width of the memory cell array 207A in the Y direction. This is because in the case of treating super-multiple-value data, such as 5 bits/cell, the sense amplifier module 209 requires a number of latch circuits. As described above, when the memory cell array 207A and the sense amplifier module 209A differ in width in the Y direction, surplus regions SP may be formed in each layer in which the memory cell array 207A is provided along with the sense amplifier module 209A. Each of the planes LUN2 to LUN4 has a configuration similar to that of the plane LUN1.

In the memory device 20b of the comparative example described above, since the area of the sense amplifier module 209 is larger than that of the memory cell array 207, the chip area of the memory device 20b can increase in tandem with the area of the sense amplifier module 209. In particular, in the 5 bits/cell memory cell array 207 of the first embodiment as described above or a 4 bits/cell memory cell array 207, since the sense amplifier module 209 contains a number of latch circuits, the circuit area of the sense amplifier module 209 may be large.

[4-2] Configuration of Fourth Embodiment

In contrast, the memory device 20a of the fourth embodiment has a circuit placement utilizing at least two types of memory cell arrays 207 in which the number of bits stored in the memory cell transistors MT are different. For example, the memory device 20a of the fourth embodiment utilizes a memory cell array 207 of a k-value (for example, four values (2 bits/cell); "k" is an integer of 1 or more) and a memory cell array 207 of an l-value (for example, 32 values (5 bits/cell); "1" is an integer greater than "k"). In the following description, a memory cell array 207 formed of memory cell transistors MT that can store the k-value is referred to as the "memory cell array 207 for a multiple value or less", and a memory cell array 207 formed of memory cell transistors MT that can store the 1-value is referred to as the "memory cell array 207 for a super-multiple value".

[4-2-1] Circuit Placement

Figure 75:
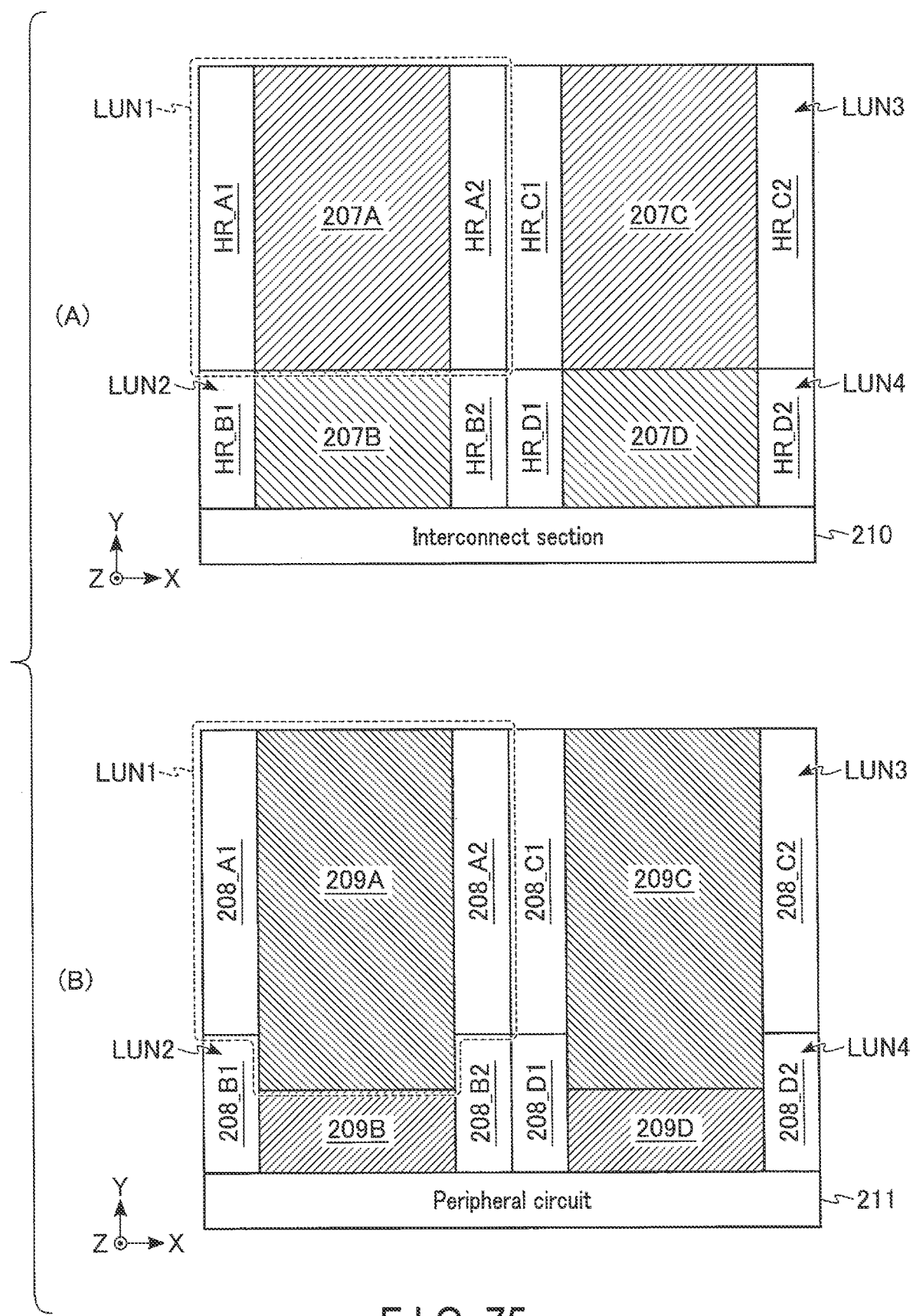
FIG. 75 is a plan view illustrating an example of a circuit placement of a memory device of a fourth embodiment.

FIG. 75 is a plan view illustrating an example of a circuit placement of the memory device 20a of the fourth embodiment. FIG. 75 (A) shows a circuit placement in a layer including the memory cell array 207 of the memory device 20a. FIG. 75 (B) shows a circuit placement in a layer including the sense amplifier module 209 of the memory device 20a. The circuit placement of the memory device 20a of the fourth embodiment differs from the circuit placement of the memory device 20b of the comparative example in that the surplus regions SP are omitted.

Specifically, in the memory device 20a, each of the memory cell arrays 207A and 207C is a memory cell array 207 for a super-multiple value. In the memory device 20a, each of the memory cell arrays 207B and 207D is a memory cell array 207 for a multiple value or less. In other words, a set of the memory cell arrays 207A and 207B adjacent to each other in the Y direction is a combination of the memory cell array 207 for a super-multiple value and the memory cell array 207 for a multiple value or less. Similarly, a set of the memory cell arrays 207C and 207D adjacent to each other in the Y direction is a combination of the memory cell array 207 for a super-multiple value and the memory cell array 207 for a multiple value or less. The circuit placement will be explained below, focusing on a set of the planes LUN1 and LUN 2.

The width in the Y direction of the sense amplifier module 209A, which is overlaid in the Z direction on the memory cell array 207A for a super-multiple value, is greater than that of the memory cell array 207A. On the other hand, the width in the Y direction of the sense amplifier module 209B, which is overlaid in the Z direction on the memory cell array 207B for a multiple value or less, is smaller than that of the memory cell array 207B. This is because the number of latch circuits necessary for operating the memory cell array 207 for a multiple value or less is smaller than the number of latch circuits necessary for operating the memory cell array 207 for a super-multiple value. In the memory device 20a, the width in the Y direction of the memory cell array 207A for a super-multiple value is set to be greater than the width in the Y direction of the memory cell array 207B for a multiple value or less.

Accordingly, the sum of the widths in the Y direction of the memory cell arrays 207A and 207B can be set to be substantially the same as the sum of the widths in the Y direction of the sense amplifier modules 209A and 209B. In other words, the set of the memory cell arrays 207A and 207B and the set of the sense amplifier modules 209A and 209B can have substantially the same area and can be overlaid in the Z direction. Similarly, the set of the hookup regions HR_A1 and HR_B1 and the set of the row decoder modules 208_A1 and 208_B1 can have substantially the same area and can be overlaid in the Z direction. The set of the hookup regions HR_A2 and HR_B2 and the set of the row decoder modules 208_A2 and 208_B2 can have substantially the same area and can be overlaid in the Z direction. As a result, in the fourth embodiment, the surplus regions SP can be omitted. The circuit placement of the set of the planes LUN3 and LUN4 is the same as that in the set of the planes LUN1 and LUN2.

In the region of the sense amplifier module 209, a part of the peripheral circuit or the like can be located. In other words, in the region of the sense amplifier module 209 illustrated in each FIGS. 74 and 75, a part of the peripheral circuit or the like can be located. Therefore, the relationship between the area of the memory cell array 207 and the area of the sense amplifier module 209 associated with each other is not limited merely to the example illustrated in FIG. 75.

Figure 76:
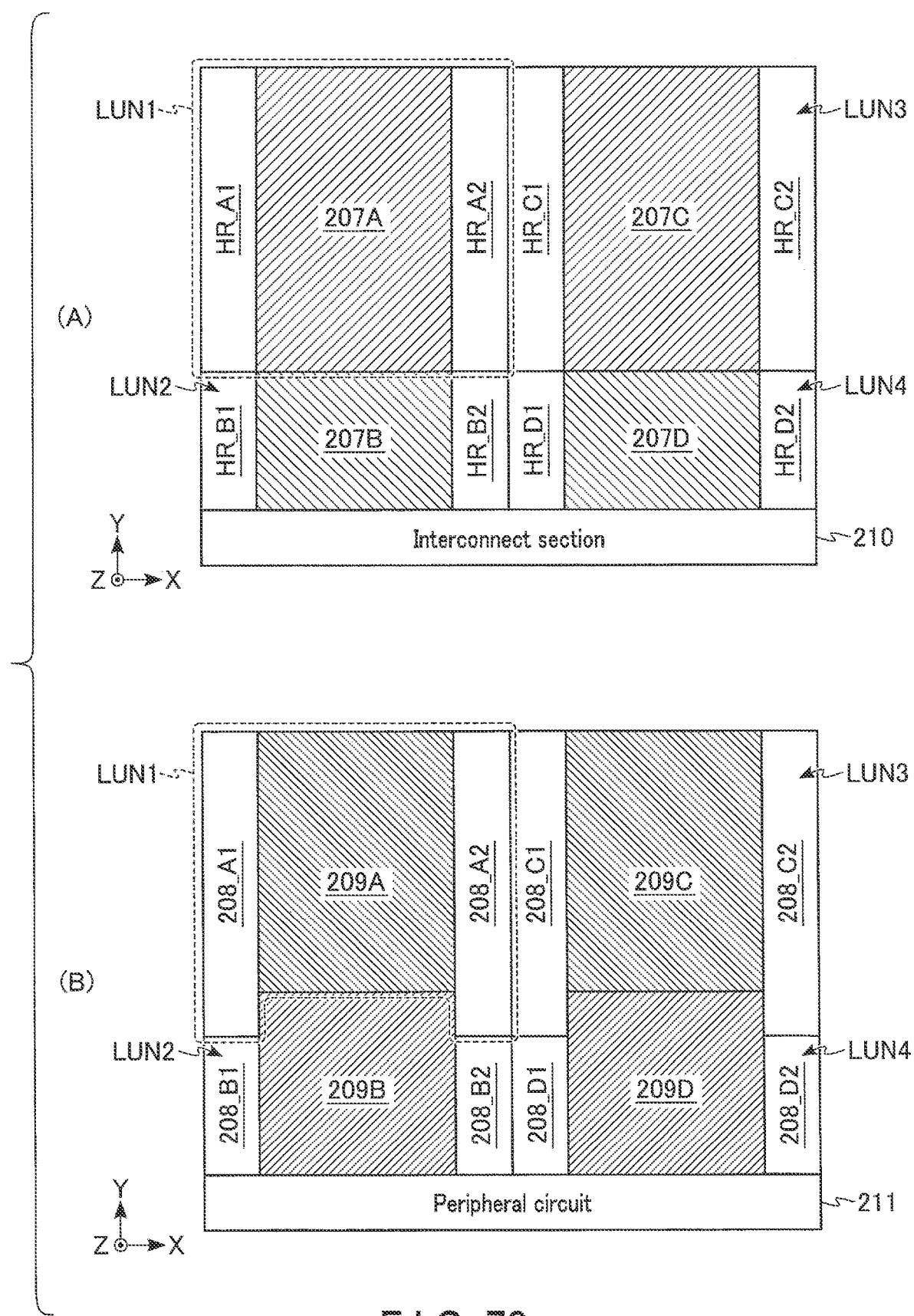
FIG. 76 is a plan view illustrating an example of a circuit placement of a memory device of a modification of the fourth embodiment.

FIG. 76 is a plan view illustrating another example of a circuit placement of the memory device 20a of the fourth embodiment. FIG. 76 (A) shows a circuit placement in a layer including the memory cell array 207 of the memory device 20a. FIG. 76 (B) shows a circuit placement in a layer including the sense amplifier module 209 of the memory device 20a. The circuit placement of the memory device 20a illustrated in FIG. 76 differs from the circuit placement of the memory device 20a illustrated in FIG. 75 in the area (size) of the sense amplifier module 209.

Specifically, in the example illustrated in FIG. 76, the area of the sense amplifier module 209 associated with the memory cell array 207 of a multiple value is larger than the area of the memory cell array 207 for a multiple value. Furthermore, the area of the sense amplifier module 209 associated with the memory cell array 207 for a super multiple value is smaller than the area of the memory cell array 207 for a super-multiple value. Even in this case, the sum of the widths in the Y direction of the memory cell arrays 207A and 207B can be set to be substantially the same as the sum of the widths in the Y direction of the sense amplifier modules 209A and 209B. In other words, also in the case of the example illustrated in FIG. 76, the set of the memory cell arrays 207A and 207B and the set of the sense amplifier modules 209A and 209B can have substantially the same area and can be overlaid in the Z direction.

[4-2-2] Configuration Example of Sense Amplifier Module 209

The following is an explanation of a configuration example of the fourth embodiment, in which a circuit configuration of one sense amplifier unit SAU, included in a sense amplifier module 209 coupled to a memory cell array 207 for a super-multiple value, is combined with a circuit configuration of one sense amplifier unit SAU, included in a sense amplifier module 209 coupled to a memory cell array 207 for a multiple value or less.

First Configuration Example

Figure 77:
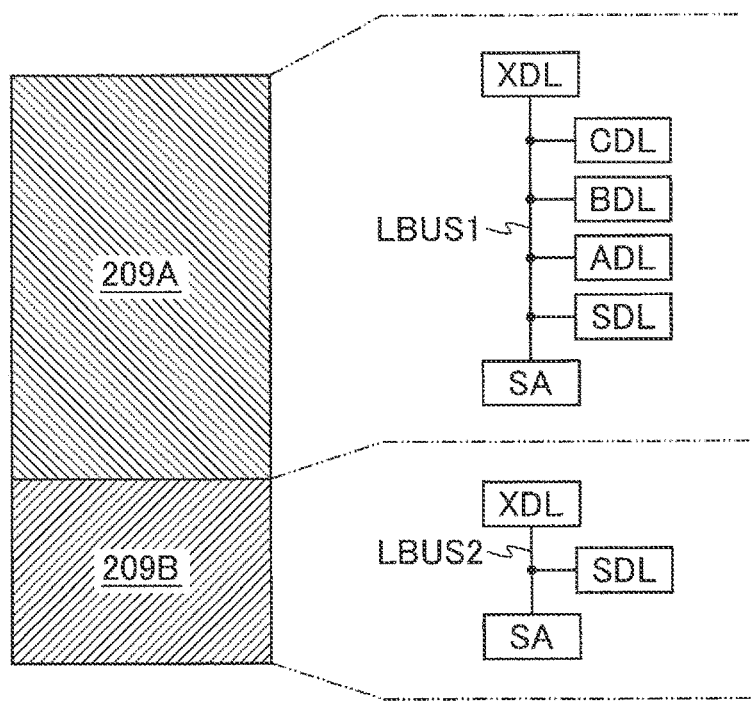
FIG. 77 is a schematic diagram illustrating a first configuration example of a sense amplifier module in the memory device of the fourth embodiment.

FIG. 77 is a schematic diagram illustrating a first configuration example of the sense amplifier module 209 in the memory device 20a of the fourth embodiment. As illustrated in FIG. 77, in the first configuration example of the fourth embodiment, the sense amplifier unit SAU of the sense amplifier module 209A includes the sense amplifier section SA, latch circuits SDL, ADL, BDL, CDL, and XDL, which are configured to allow transmission and reception of data via a bus LBUS1. In the first configuration example of the fourth embodiment, the sense amplifier unit SAU of the sense amplifier module 209B includes the sense amplifier section SA, latch circuits SDL and XDL, which are configured to allow transmission and reception of data via a bus LBUS2. In this example, the number of latch circuits coupled to each of the bus LBUS1 and LBUS2 can be changed, as appropriate, in accordance with the number of bits stored in the memory cell transistors MT of the associated memory cell array 207.

Second Configuration Example

Figure 78:
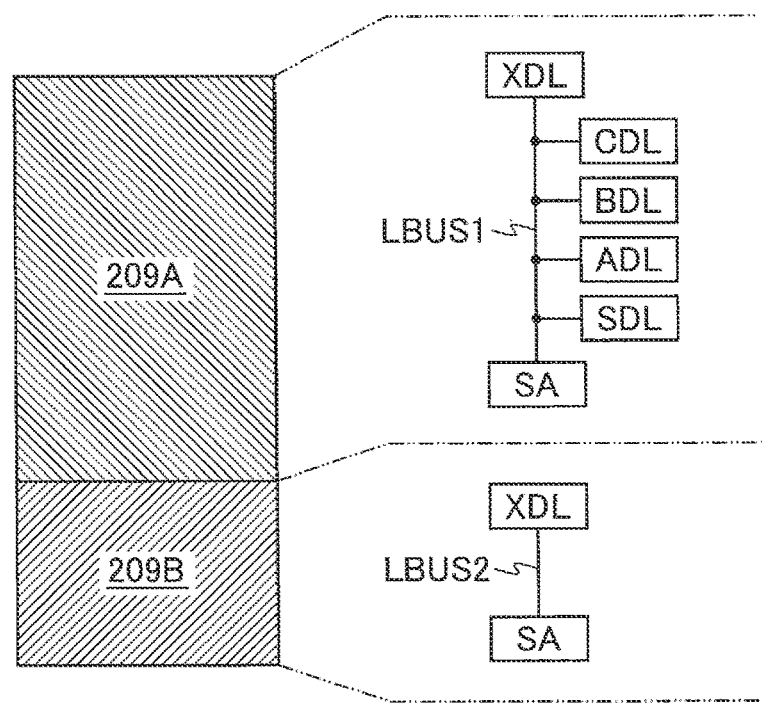
FIG. 78 is a schematic diagram illustrating a second configuration example of a sense amplifier module in the memory device of the fourth embodiment.

FIG. 78 is a schematic diagram illustrating a second configuration example of the sense amplifier module 209 in the memory device 20a of the fourth embodiment. As illustrated in FIG. 78, the second configuration example of the fourth embodiment differs from the first configuration example of the fourth embodiment in that the latch circuit SDL of the sense amplifier unit SAU of the sense amplifier module 209B is omitted. Depending on the number of bits stored in the memory cell transistors MT in the memory cell array 207B for a multiple value or less (for example, in the case of 1 bit), a latch circuit other than the latch circuit XDL may be omitted from the sense amplifier unit SAU of the sense amplifier module 209B as in the second configuration example of the fourth embodiment.

[4-3] Advantages of Fourth Embodiment

As described above, in the memory device 20a of the fourth embodiment, a plane LUN including a memory cell array 207 for a super-multiple value and a plane LUN including a memory cell array 207 for a multiple value or less are combined. Accordingly, the memory device 20a of the fourth embodiment can suppress the formation of surplus regions SP resulting from a difference in area between the memory cell array 207 and the sense amplifier module 209 in one plane LUN. As a result, in the memory device 20a of the fourth embodiment, the chip area can be smaller than that in the comparative example. Thus, the memory device 20a of the fourth embodiment can help suppress the manufacturing cost of the memory device 20a.

When the memory device 20a of the fourth embodiment utilizes the memory cell arrays 207A and 207C as memory cell arrays 207 for a super-multiple value, and the memory cell arrays 207B and 207D as memory cell arrays 207 for a multiple value or less, the memory device 20a can operate the four planes LUN1 to LUN4 in parallel (namely, a four-plane operation). When the memory device 20a of the fourth embodiment utilizes all of the memory cell arrays 207A, 207B, 207C, and 207D as memory cell arrays 207 for a multiple value or less, the memory device 20a can operate the four planes LUN1 to LUN4 in parallel. On the other hand, when the memory device 20a of the fourth embodiment utilizes the memory cell arrays 207A and 207C as memory cell arrays 207 of a super-multiple value, it cannot utilize the memory cell arrays 207B and 207D as memory cell arrays 207 for a super-multiple value.

Furthermore, in the memory device 20a of the fourth embodiment, a combination of the number of planes LUN to which a super-multiple value is allocated and the number of planes LUN to which a multiple value or less is allocated can be set freely. For example, in the fourth embodiment, a memory cell array 207 storing a super-multiple value may be allocated to 1 LUN, and a memory cell array 207 storing a multiple value or less may be allocated to 2 LUN; a memory cell array 207 storing a super-multiple value may be allocated to 3 LUN, and a memory cell array 207 storing a multiple value or less may be allocated to 6 LUN; a memory cell array 207 storing a super-multiple value may be allocated to 4 LUN, and a memory cell array 207 storing a multiple value or less may be allocated to 8 LUN; a memory cell array 207 storing a super-multiple value may be allocated to 1 LUN, and a memory cell array 207 storing a multiple value or less may be allocated to 3 LUN; a memory cell array 207 storing a super-multiple value may be allocated to 2 LUN, and a memory cell array 207 storing a multiple value or less may be allocated to 3 LUN; a memory cell array 207 storing a super-multiple value may be allocated to 3 LUN, and a memory cell array 207 storing a multiple value or less may be allocated to 4 LUN; a memory cell array 207 storing a super-multiple value may be allocated to 2 LUN, and a memory cell array 207 storing a multiple value or less may be allocated to 6 LUN; a memory cell array 207 storing a super-multiple value may be allocated to 4 LUN, and a memory cell array 207 storing a multiple value or less may be allocated to 6 LUN; a memory cell array 207 storing a super-multiple value may be allocated to 2 LUN, and a memory cell array 207 storing a multiple value or less may be allocated to 8 LUN; or a memory cell array 207 storing a super-multiple value may be allocated to 6 LUN, and a memory cell array 207 storing a multiple value or less may be allocated to 8 LUN.

[5] Fifth Embodiment

A memory device 20c of a fifth embodiment differs in circuit placement from the memory systems MS of the first to third embodiments in that latch circuits are shared by a plurality of memory cell arrays 207. The memory device 20c of the fifth embodiment will be described below.

[5-1] Configuration of Fifth Embodiment

In the memory device 20c of the fifth embodiment, latch circuits are shared by a plurality of planes LUN, to utilize memory cell arrays 207 for a super-multiple value and suppress the area of latch circuits.

[5-1-1] Circuit Placement

Figure 79:
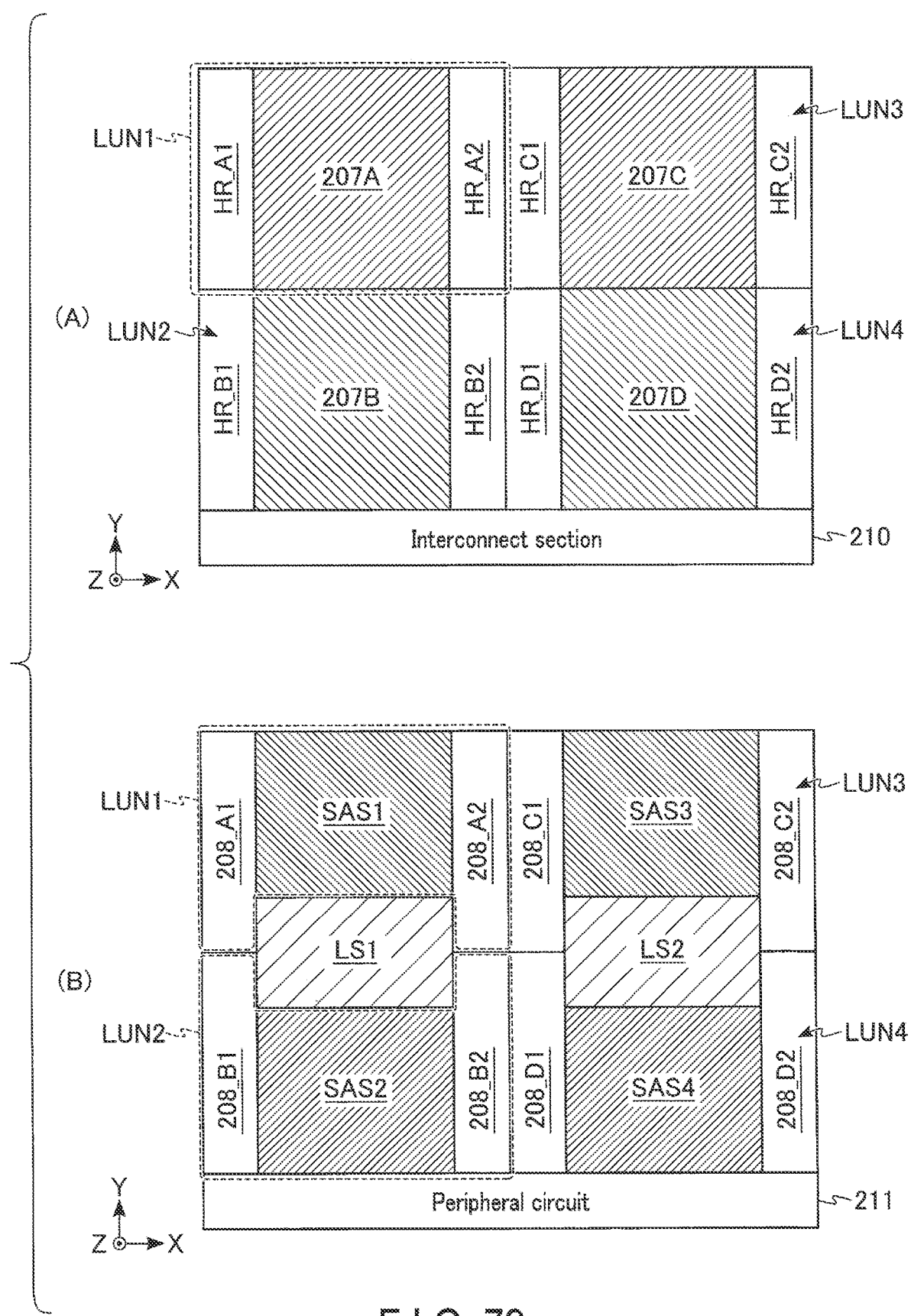
FIG. 79 is a plan view illustrating an example of a circuit placement of a memory device of a fifth embodiment.

FIG. 79 is a plan view illustrating an example of a circuit placement of the memory device 20c of the fifth embodiment. The memory device 20c has a structure in which the memory cell array 207 and the sense amplifier module 209 are adjacent to each other in the Z direction. FIG. 79 (A) shows a circuit placement in a layer including the memory cell array 207 of the memory device 20c. FIG. 79 (B) shows a circuit placement in a layer including the sense amplifier module 209 of the memory device 20c.

The memory device 20c includes, for example, four planes LUN1 to LUN4, an interconnect section 210, and a peripheral circuit 211. The placement of the planes LUN1 to LUN4 in the fifth embodiment is the same as that of the planes LUN1 to LUN4 in the fourth embodiment described above. Each plane LUN includes the memory cell array 207, a hookup region HR, a row decoder module 208, and a sense amplifier set SAS. The sense amplifier set SAS includes at least a sense amplifier section SA. Two planes LUN adjacent to each other in, for example, the Y direction share a latch set LS. The latch set LS includes at least one latch circuit shared by a plurality of sense amplifier sets SAS at each row address. A set of a sense amplifier set SAS and a latch set LS can be used in the same manner as the sense amplifier module 209 of the first embodiments.

Specifically, the plane LUN1 includes a memory cell array 207A, hookup regions HR_A1 and HR_A2, row decoder modules 208_A1 and 208_A2, and a sense amplifier set SAS1. The plane LUN2 includes a memory cell array 207B, hookup regions HR_B1 and HR_B2, row decoder modules 208_B1 and 208_B2, and a sense amplifier set SAS2. The plane LUN3 includes a memory cell array 207C, hookup regions HR_C1 and HR_C2, row decoder modules 208_C1 and 208_C2, and a sense amplifier set SAS3. The plane LUN4 includes a memory cell array 207D, hookup regions HR_D1 and HR_D2, row decoder modules 208_D1 and 208_D2, and a sense amplifier set SAS4. The sense amplifier sets SAS1 and SAS2 share the latch set LS1. The sense amplifier sets SAS3 and SAS4 share the latch set LS2.

A specific circuit placement in the plane LUN1 will be explained below. As illustrated in FIG. 79 (A), the memory cell array 207A is interposed between the hookup regions HR_A1 and HR_A2 in the X direction. As illustrated in FIG. 79 (B), the sense amplifier module 209A is interposed between the row decoder modules 208_A1 and 208_A2 in the X direction. As illustrated in FIGS. 79 (A) and (B), the memory cell array 207A is overlaid on the sense amplifier set SAS1 in the Z direction. The hookup regions HR_A1 and HR_A2 are respectively overlaid on the row decoder modules 208_A1 and 208_A2 in the Z direction. The width of each of the hookup regions HR_A1 and HR_A2 in the Y direction is substantially equal to the width of the memory cell array 207A in the Y direction. The width of each of the row decoder modules 208_A1 and 208_A2 in the Y direction is substantially equal to the width of the hookup regions HR_A1 and HR_A2 in the Y direction. The width of each of the row decoder modules 208_A1 and 208_A2 in the Y direction is greater than the width of the sense amplifier set SAS1 in the Y direction.

The plane LUN2 has a circuit placement similar to that of the plane LUN1 except that the sense amplifier set SAS2 is placed in a portion separated from the plane LUN1. The sense amplifier sets SAS1 and SAS2 interpose the latch set LS1 therebetween in the Y direction. As a result, the sum of the widths in the Y direction of the memory cell arrays 207A and 207B can be set to be substantially equal to the sum of the widths in the Y direction of the sense amplifier sets SAS1 and SAS2 and the latch set LS1. In other words, the set of the memory cell arrays 207A and 207B can be substantially the same in area as, and can be overlaid in the Z direction on, the set of the sense amplifier sets SAS1 and SAS2 and the latch set LS1. The circuit placement of the set of the planes LUN3 and LUN4 is the same as that in the set of the planes LUN1 and LUN2. In the region of the sense amplifier sets SAS in FIG. 79, a part of the peripheral circuit may be located.

[5-1-2] Configuration Examples of Sense Amplifier Sets SAS and Latch Set LS

First to fourth configuration examples of the circuit configuration of the sense amplifier sets SAS and the latch set LS1 of the fifth embodiment will be described below. In the following description, a circuit configuration included in the sense amplifier sets SAS1 and SAS2 and the latch set LS1 corresponding to the planes LUN1 and LUN2 will be described as an example.

First Configuration Example

Figure 80:
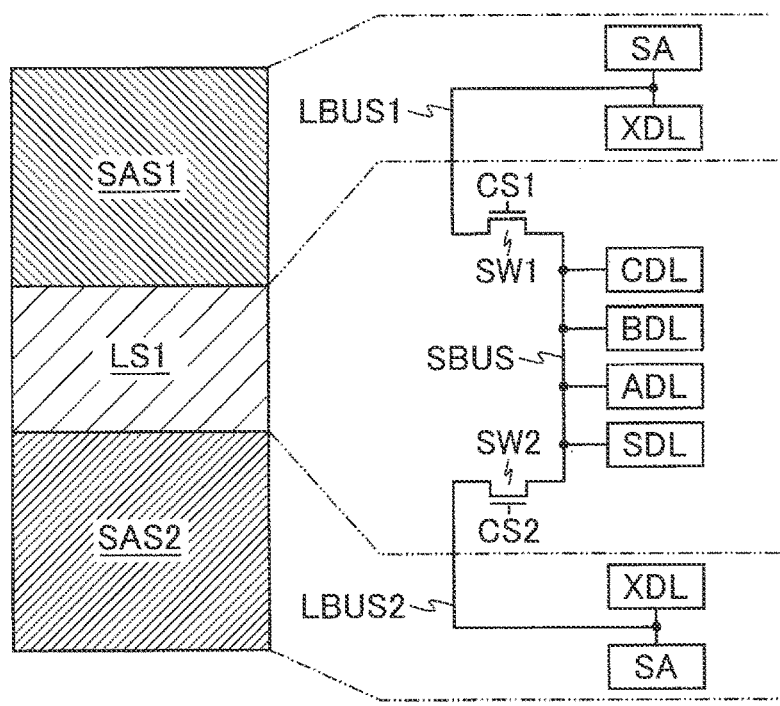
FIG. 80 is a schematic diagram illustrating a first configuration example of a sense amplifier set and a latch set in the memory device of the fifth embodiment.

FIG. 80 is a schematic diagram illustrating a first configuration example of the sense amplifier sets SAS and the latch set LS in the memory device 20c of the fifth embodiment. As illustrated in FIG. 80, in the first configuration example of the fifth embodiment, the sense amplifier set SAS1 includes a sense amplifier section SA and a latch circuit XDL, which are configured to allow transmission and reception of data via a bus LBUS1. The sense amplifier set SAS2 includes a sense amplifier section SA and a latch circuit XDL, which are configured to allow transmission and reception of data via a bus LBUS2. In the first configuration example of the fifth embodiment, the latch set LS1 includes latch circuits SDL, ADL, BDL, and CDL, and switches SW1 and SW2, which are configured to allow transmission and reception of data via a bus SBUS. The switches SW1 and SW2 are, for example, MOS transistors. The switch SW1 is coupled between the buses LBUS1 and SBUS. The switch SW2 is coupled between the buses LBUS2 and SBUS. Control signals CS1 and CS2 are input to the gates of the switches SW1 and SW2, respectively. The switch SW1 operates based on the control signal CS1. The switch SW2 operates based on the control signal CS2. The control signals CS1 and CS2 are generated by, for example, the sequencer 204.

In the first configuration example of the fifth embodiment, in the case of treating a super-multiple value, the memory device 20c uses the set of the sense amplifier set SAS1 and the latch set LS1. Specifically, when a super-multiple value is allocated to the memory cell array 207A and a multiple value is allocated to the memory cell array 207B, the sequencer 204 electrically couples the buses LBUS1 and SBUS and executes a super-multiple-value operation (for example, an operation in the first to third embodiments described above) for the memory cell array 207A by controlling the switch SW1 to an ON state. On the other hand, in the case of treating a multiple value, the memory device 20c uses only the sense amplifier set SAS2. Specifically, the sequencer 204 electrically decouples the buses LBUS2 and SBUS and executes a multiple-value operation by controlling the switch SW2 to an OFF state.

Second Configuration Example

Figure 81:
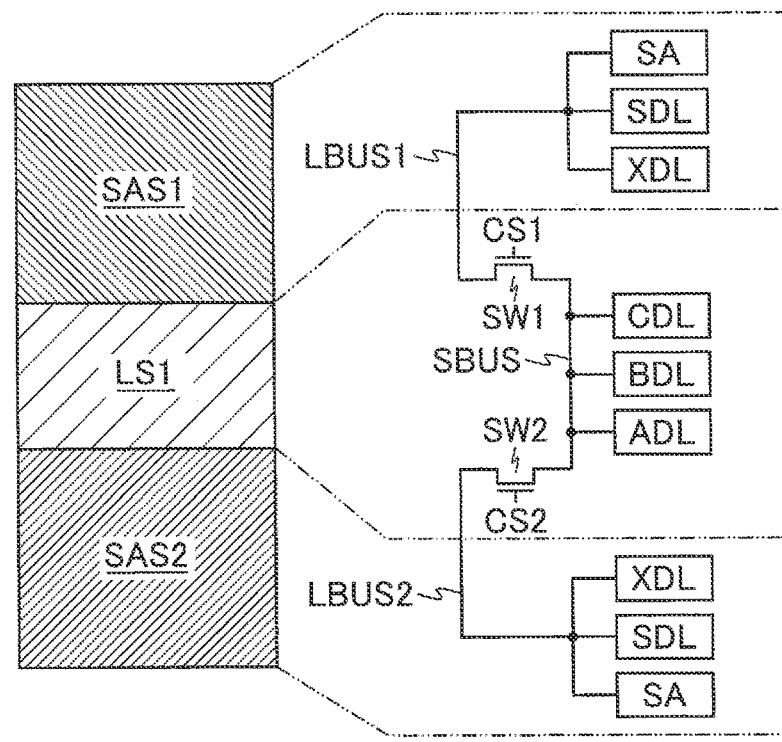
FIG. 81 is a schematic diagram illustrating a second configuration example of a sense amplifier set and a latch set in the memory device of the fifth embodiment.

FIG. 81 is a schematic diagram illustrating a second configuration example of the sense amplifier sets SAS and the latch set LS in the memory device 20c of the fifth embodiment. As illustrated in FIG. 81, the second configuration example of the fifth embodiment differs from the first configuration example of the fifth embodiment in that the latch circuit SDL is omitted from the latch set LS1, and one latch circuit SDL is coupled to each of the buses LBUS1 and LBUS2. In the second configuration example of the fifth embodiment, for example, in the case of using 1 bit/cell coding that allows a read operation or a write operation to be executed by one latch circuit, the read operation or the write operation can be executed with only the sense amplifier sets SAS. Specifically, in the second configuration example of the fifth embodiment, the memory device 20c can execute a read operation or a write operation in the planes LUN1 and LUN2 in parallel, respectively using, for example, the set of the sense amplifier set SAS1 and the latch set LS1 for use in a super-multiple-value operation and the sense amplifier set SAS2 for use in a multiple-value operation.

Third Configuration Example

Figure 82:
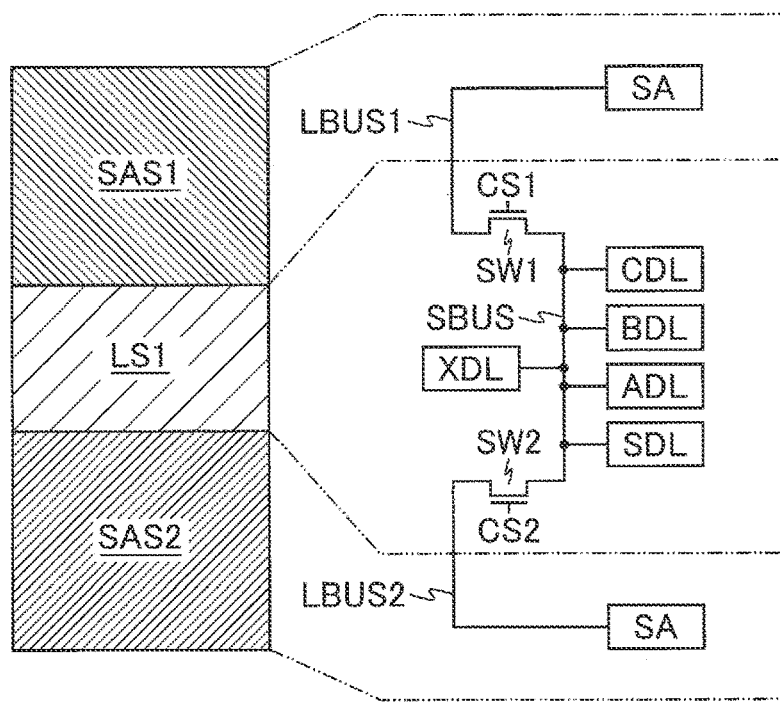
FIG. 82 is a schematic diagram illustrating a third configuration example of a sense amplifier set and a latch set in the memory device of the fifth embodiment.

FIG. 82 is a schematic diagram illustrating a third configuration example of the sense amplifier sets SAS and the latch set LS in the memory device 20c of the fifth embodiment. As illustrated in FIG. 82, the third configuration example of the fifth embodiment differs from the first configuration example of the fifth embodiment in that the latch circuit XDL is omitted from each of the latch sets LS1 and LS2, and one latch circuit XDL is coupled to the bus SBUS. Thus, the sense amplifier set SAS may include only the sense amplifier section SA, and the latch circuits for use in a read operation or a write operation may be collectively provided in the latch set LS1. In this case, the memory device 20c can selectively execute either an operation targeted for the plane LUN1 or an operation targeted for the plane LUN2 with regard to the combination of the planes LUN1 and LUN2.

Fourth Configuration Example

Figure 83:
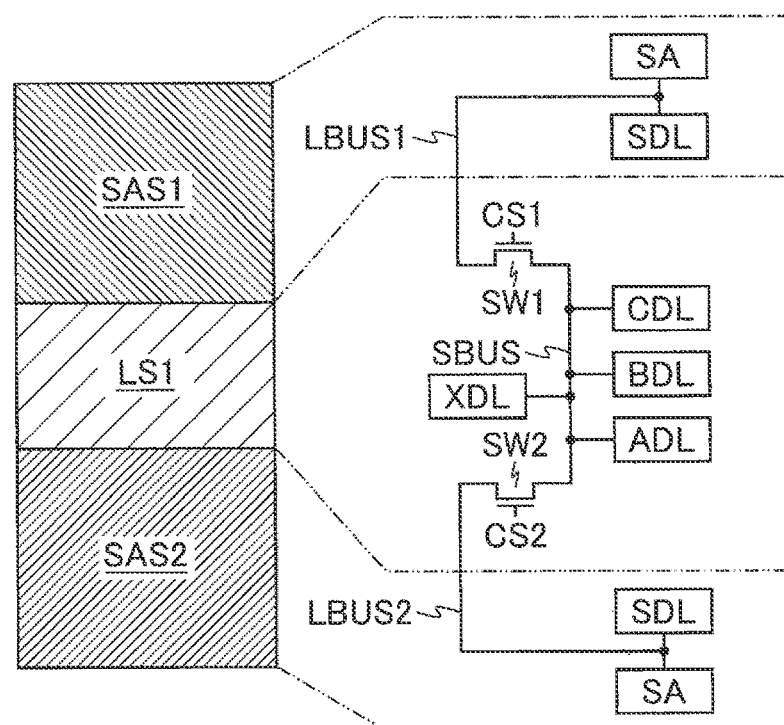
FIG. 83 is a schematic diagram illustrating a fourth configuration example of a sense amplifier set and a latch set in the memory device of the fifth embodiment.

FIG. 83 is a schematic diagram illustrating a fourth configuration example of the sense amplifier sets SAS and the latch set LS in the memory device 20c of the fifth embodiment. As illustrated in FIG. 83, the fourth configuration example of the fifth embodiment differs from the third configuration example of the fifth embodiment in that the latch circuit SDL is omitted from the latch set LS1, and one latch circuit SDL is coupled to each of the buses LBUS1 and LBUS2. The fourth configuration example of the fifth embodiment can execute, for example, a 1 bit/cell operation and a super-multiple-value or multiple-value operation in parallel by providing each sense amplifier set SAS with the latch circuit SDL.

[5-2] Advantages of Fifth Embodiment

In the memory device 20c of the fifth embodiment, the memory cell arrays 207 (the sense amplifier sets SAS) share the latch set LS. When treating a super-multiple value, the two planes LUN sharing the latch set LS operate independently of each other. For example, in the two planes LUN sharing the latch set LS, while a write operation is executed for one plane LUN, the other plane LUN cannot be used and is in a standby state. When treating a multiple value (or 1 bit/cell), the two planes LUN sharing the latch set LS can operate in parallel.

The memory device 20c may use one of the two planes LUN sharing the latch set LS in a super-multiple-value operation, and the other in a multiple-value operation. Because of the memory cell array 207 that can be used in a multiple-value operation, the area where latch circuits are placed can be suppressed. In the fifth embodiment, when the memory cell array 207 includes the memory cell transistors MT storing only 1-bit data (the 1-bit/cell memory cell array 207), and includes the sense amplifier sets SAS and the latch set LS, for example, as in the first configuration example, the 1-bit/cell memory cell array 207 can execute a read operation or a write operation by using the sense amplifier sets SAS without using the latch set LS.

As described above, in the memory device 20c of the fifth embodiment, the area of the circuit that functions as the sense amplifier module 209 can be suppressed by sharing the latch set LS. As a result, the chip area of the memory device 20c of the fifth embodiment can be reduced, and the manufacturing cost of the memory device 20c can be suppressed.

The memory device 20c of the fifth embodiment can utilize all of the memory cell arrays 207A, 207B, 207C, and 207D as memory cell arrays 207 for a super-multiple value. When each of the two planes LUN sharing the latch set LS has a memory cell array 207 for a super-multiple value, the memory device 20c executes a write operation by one plane LUN at a time. Furthermore, when the memory device 20c of the fifth embodiment utilizes the memory cell arrays 207A and 207C as memory cell arrays 207 for a super-multiple value, and the memory cell arrays 207B and 207D as memory cell arrays 207 for a multiple value or less, the memory device 20c can operate the four planes LUN1 to LUN4 in parallel. When the memory device 20c of the fifth embodiment utilizes all of the memory cell arrays 207A, 207B, 207C, and 207D as memory cell arrays 207 for a multiple value or less, the memory device 20c can operate the four planes LUN1 to LUN4 in parallel.

Furthermore, in the memory device 20c of the fifth embodiment, a combination of the number of planes LUN to which a super-multiple value is allocated and the number of planes LUN to which a multiple value or less is allocated can be set freely. For example, in the fifth embodiment, a memory cell array 207 storing a super-multiple value may be allocated to 1 LUN, and a memory cell array 207 storing a multiple value or less may be allocated to 2 LUN; a memory cell array 207 storing a super-multiple value may be allocated to 3 LUN, and a memory cell array 207 storing a multiple value or less may be allocated to 6 LUN; a memory cell array 207 storing a super-multiple value may be allocated to 4 LUN, and a memory cell array 207 storing a multiple value or less may be allocated to 8 LUN; a memory cell array 207 storing a super-multiple value may be allocated to 1 LUN, and a memory cell array 207 storing a multiple value or less may be allocated to 3 LUN; a memory cell array 207 storing a super-multiple value may be allocated to 2 LUN, and a memory cell array 207 storing a multiple value or less may be allocated to 3 LUN; a memory cell array 207 storing a super-multiple value may be allocated to 3 LUN, and a memory cell array 207 storing a multiple value or less may be allocated to 4 LUN; a memory cell array 207 storing a super-multiple value may be allocated to 2 LUN, and a memory cell array 207 storing a multiple value or less may be allocated to 6 LUN; a memory cell array 207 storing a super-multiple value may be allocated to 4 LUN, and a memory cell array 207 storing a multiple value or less may be allocated to 6 LUN; a memory cell array 207 storing a super-multiple value may be allocated to 2 LUN, and a memory cell array 207 storing a multiple value or less may be allocated to 8 LUN; or a memory cell array 207 storing a super-multiple value may be allocated to 6 LUN, and a memory cell array 207 storing a multiple value or less may be allocated to 8 LUN.

[6] Sixth Embodiment

An information processing system 1 of the sixth embodiment is similar in configuration to that of the fourth or fifth embodiment. The sixth embodiment relates to a method for writing super-multiple value data in a memory system MS. A description will be given of the points in which the sixth embodiment differs from the first to fifth embodiments with respect to the memory system MS.

[6-1] Operation

The memory system MS of the sixth embodiment temporarily stores data input from outside along with a write instruction in a memory cell array 207 for a multiple value (k-value: "k" is an integer of 1 or more) or less in a memory cell array 207. Thereafter, the memory system MS reads data stored in the memory cell array 207 for a multiple value or less, and causes a memory cell array 207 for a super-multiple value (l-value: "l" is an integer greater than "k") to store the read data. In other words, the memory controller 10 can copy the data written in the memory cell array 207 for a multiple value or less into the memory cell array 207 for a super-multiple value. Regarding the write operation of the sixth embodiment, a case in which the memory cell array 207 for a multiple value or less stores data with two values will be described below as an example.

[6-1-1] Outline of Write Operation

Figure 84:
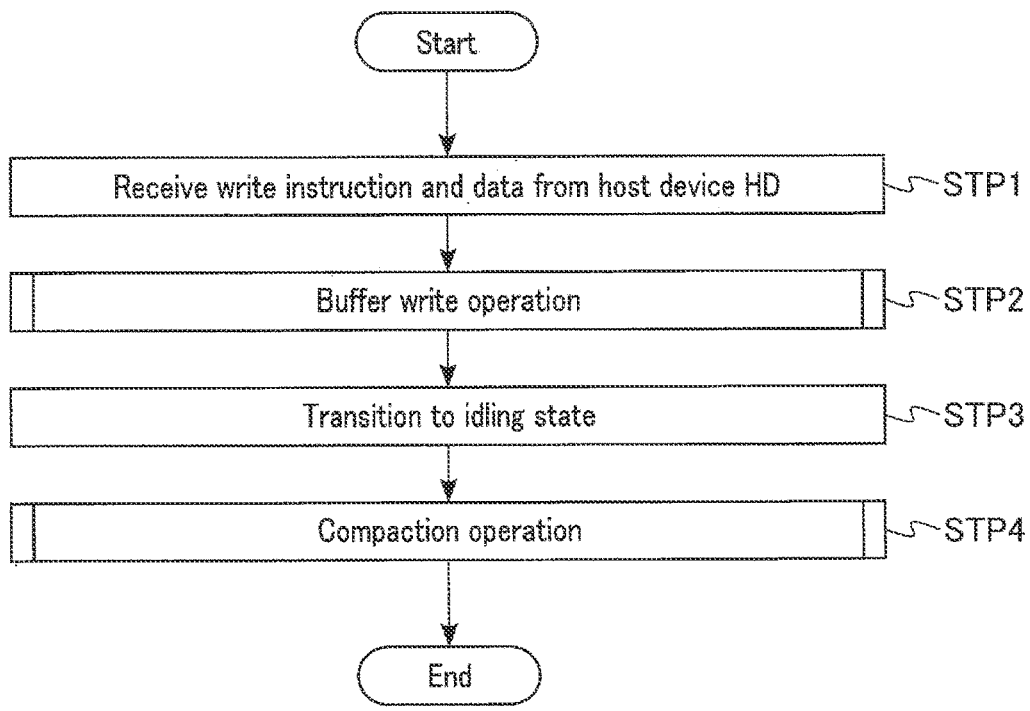
FIG. 84 is a flowchart illustrating an example of a read operation of a memory system of a sixth embodiment.

FIG. 84 is a flowchart illustrating an example of a read operation of the memory system MS of the sixth embodiment. As illustrated in FIG. 84, first, the memory controller 10 receives a write instruction and data from the host device HD (STP1). The data received from the host device HD is stored in, for example, the buffer memory 17.

The memory controller 10 executes a buffer write operation using the received data (STP2). The buffer write operation is a high-speed write operation for storing data in a buffer region of the memory device 20. The buffer region is a storage region allocated to the memory cell array 207 for a multiple value or less. In other words, in the buffer write operation, the memory controller 10 instructs the memory device 20 to write data in the memory cell array 207 for a multiple value or less. The buffer write operation may be referred to as the "multiple-value write operation". Thereafter, the memory controller 10 discards, from the buffer memory 17, the data which has been written in the buffer region.

After completion of the processing of STP2, when a task based on an instruction from the host device HD ends, the memory system MS transitions to an idling state (STP3).

When the memory system MS transitions to the idling state after the buffer write operation, the memory system MS executes a compaction operation without an instruction from the host device HD (STP4). The compaction operation includes a buffer read operation and a compaction write operation. The buffer read operation is an operation for reading data written by the buffer write operation. The compaction write operation is a write operation for writing data read by the buffer read operation in the memory cell array 207 for a super-multiple value. In other words, in the compaction operation, the memory controller 10 instructs the memory device 20 to write data in the memory cell array 207 for a super-multiple value. The timing to start the compaction operation may be any timing which occurs after the buffer write operation. The compaction operation may be referred to as the "super-multiple-value write operation".

Furthermore, when data has been written in all pages in one block BLK of the memory cell array 207 for a multiple value or less, the memory controller 10 can copy the data written in one block BLK into the memory cell array 207 for a super-multiple value, and can delete the data written in the one block BLK.

[6-1-2] Buffer Write Operation

Figure 85:
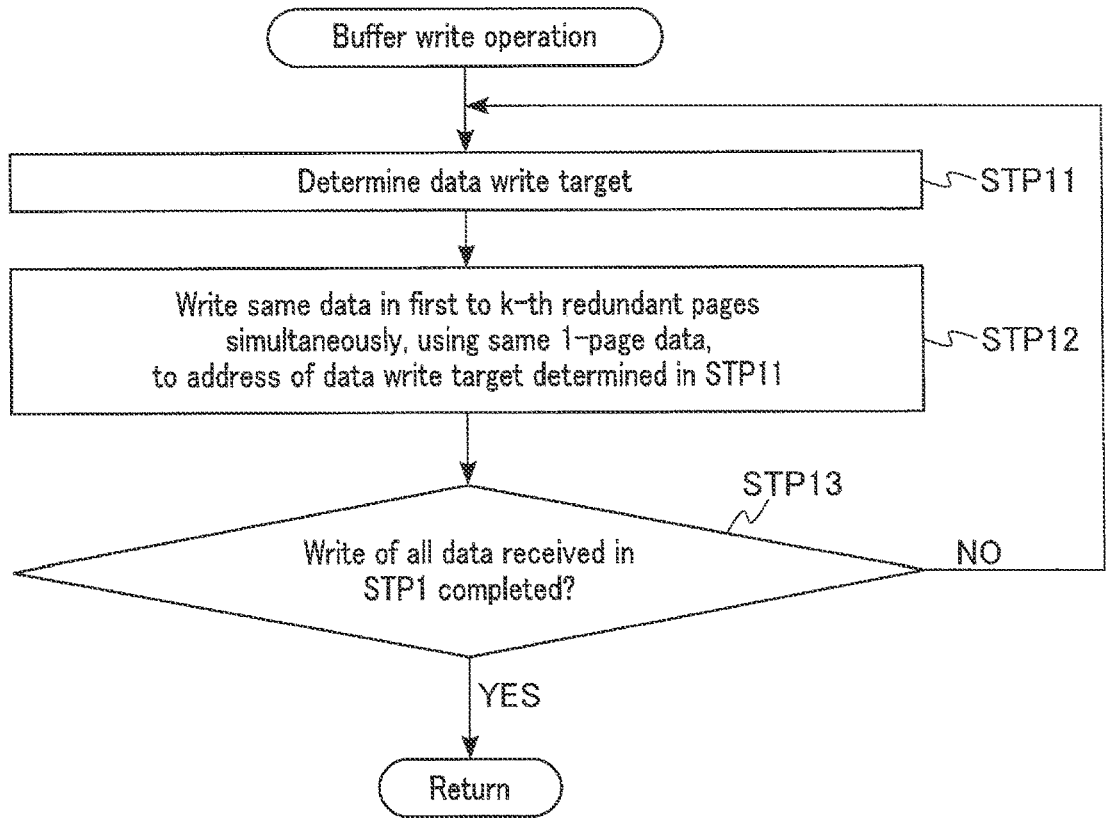
FIG. 85 is a flowchart illustrating an example of a buffer write operation of the memory system of the sixth embodiment.

FIG. 85 is a flowchart illustrating an example of the buffer write operation of the memory system MS of the sixth embodiment. As illustrated in FIG. 85, when the buffer write operation is started, the memory controller 10 determines a data write target (STP11). In the processing of STP11, a redundant page set is allocated to each 1-page data of the target of the buffer write operation. The "redundant page set" corresponds to a set of a plurality of pages in which the 1-page data is written in the buffer write operation. In the specification of the present application, a page included in the redundant page set is referred to as a "redundant page". The "redundant page" corresponds to a cell unit CU included in the block BLK in the buffer region. In the following, a case in which a redundant page set includes M redundant pages ("M" is an integer of 2 or more) will be described. The M redundant pages are respectively referred to as "the first redundant page", "the second redundant page", . . . "the M-th redundant page".

The memory controller 10 writes the same data to the first to k-th redundant pages simultaneously, using the same 1-page data, to an address of the data write target determined in STP11 (STP12). In the processing of STP12, for example, the write operation is executed on, for example, the M redundant pages. In the write operation, to increase the processing speed, a verify operation may be omitted and the number of times of applying a program voltage VPGM (program pulse) may be set to 1. In this case, to improve the reliability, the memory system MS causes the first to k-th redundant pages to store the same 1-page data.

Upon completion of the processing of STP12, the memory controller 10 confirms whether all data received in STP1 have been written (STP13).

If all data received in STP1 has not been written (STP13, NO), the memory controller 10 proceeds to the processing of STP11. In other words, the memory controller 10 executes a write operation of data, to which a multiple-value write operation has not been completed, of all data received in STP1.

If all data received in STP1 has been written (STP13, YES), the memory controller 10 ends a series of buffer write operation processing (return).

A plurality of redundant pages in which the same 1-page data is written are allocated to, for example, cell units CU that are located in different blocks BLK and have the same word line WL and the same address of the string unit SU. The embodiment is not limited to this example, and a plurality of redundant pages in which the same 1-page data is written may be allocated to cell units CU that are located in the same block BLK, that share the same word line WL, and that are located in different string units SU, or may be allocated to cell units CU that are located in different blocks BLK and that share the same bit line BL.

Furthermore, in a multiple-value write operation for a plurality of redundant pages, to increase the processing speed, a verify operation may be omitted and data may be simultaneously written in a plurality of redundant pages by one program pulse.

(Specific Example of Multiple-Value Write Operation)

Figure 86:
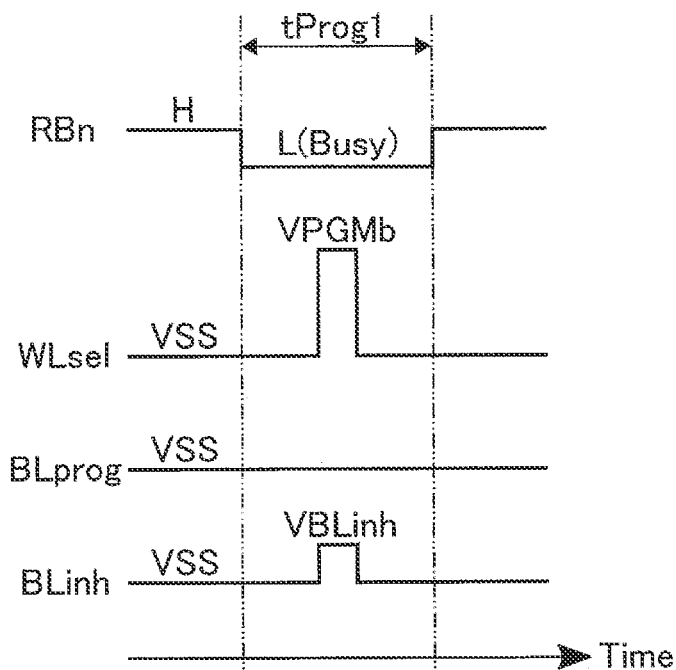
FIG. 86 is a timing chart illustrating an example of a multiple-value write operation of a memory device of the sixth embodiment.

FIG. 86 is a timing chart illustrating an example of a multiple-value write operation of the memory device 20 of the sixth embodiment. FIG. 86 shows a ready/busy signal RBn, a voltage applied to a selected word line WLsel, a voltage applied to a bit line BLprog set as a program target, and a voltage applied to a bit line BLinh set as program-inhibit. The bit line BLprog as the program target corresponds to a bit line BL coupled to a memory cell transistor MT as a program target, namely, a memory cell transistor MT in which an increase in threshold voltage is desired. The bit line BLinh as the program-inhibit corresponds to a bit line BL coupled to a memory cell transistor MT as program-inhibit, namely, a memory cell transistor MT in which an increase in threshold voltage is desirably suppressed. In a state before the multiple-value write operation is started, each of the voltage of the selected word line WLsel, the voltage applied to the bit line BLprog, and the voltage applied to the bit line BLinh, is, for example, the ground voltage VSS.

As illustrated in FIG. 86, when the multiple-value write operation is started, the memory device 20 transitions from the ready state to the busy state. Then, the sequencer 204 applies a program voltage VPGMb to the selected word line WLsel, the ground voltage VSS to the bit line BLprog, and a voltage VBLinh to the bit line BLinh. The program voltage VPGMb is a high voltage that can increase the threshold voltage of the memory cell transistor MT. The voltage VBLinh is a voltage higher than the ground voltage VSS.

When the program voltage VPGM is applied to the selected word line WLsel, the threshold voltage of the memory cell transistor MT coupled to the bit line BLprog, included in the selected string unit SU, and coupled to the selected word line WLsel increases. On the other hand, a rise in the threshold voltage of the memory cell transistor MT as program-inhibit is suppressed by a boost of a channel voltage based on, for example, application of the voltage VBLinh to the bit line BLinh.

When the program voltage VPGMb (program pulse) is applied once to the selected word line WLsel, the sequencer 204 ends the multiple-value write operation and transitions the memory device 20 from the busy state to the ready state.

"tProg1" in FIG. 86 represents a time during which the multiple-value write operation is being executed.

In the same block BLK, since degrees of deterioration in write and erase operations are similar across all pages, the program voltages VPGMb which are optimum for the multiple-value write operation in all pages are presumed to be almost the same. Therefore, the sequencer 204 may determine the program voltage VPGMb based on a result of a normal write sequence for the first page of the block BLK. The normal write sequence is similar to a sequence of a super-multiple-value write operation which is described later, and includes a program loop. In this case, the sequencer 204 can use the program voltage VPGM presumed to be optimum by the normal write sequence as the program voltage VPGMb for use in a multiple-value write operation for another page of the same block BLK.

(Threshold Voltage Distribution of Redundant Pages after Multiple-Value Write Operation)

Figure 87:
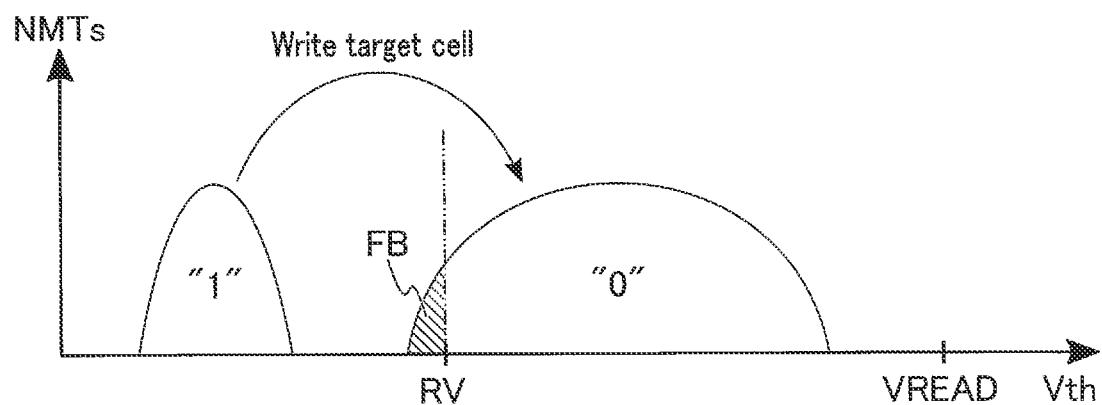
FIG. 87 is a threshold voltage distribution chart illustrating an example of a threshold voltage portion of redundant pages after a multiple-value write operation of the memory device of the sixth embodiment.

FIG. 87 is a threshold voltage distribution chart illustrating an example of a threshold voltage portion of redundant pages after a multiple-value write operation of the memory device 20 of the sixth embodiment. As illustrated in FIG. 87, when the multiple-value write operation is executed, the threshold voltage of the memory cell transistor MT as the program target, namely, the memory cell transistor MT in which "0" data is written (program target cell) increases. On the other hand, the threshold voltage of the memory cell transistor MT as program-inhibit, namely, the memory cell transistor MT in which "1" data is written, maintains a low level of an erase state.

A read voltage RV is a voltage for use in reading data written in redundant pages by a multiple-value write operation of this example. The program voltage VPGMb is set to a level such that the threshold voltage of the memory cell transistor MT in which "0" data is written in the multiple-value write operation does not exceed a read pass voltage VREAD. However, when the program voltage VPGMb that does not cause an over-program is used and the threshold voltage is increased by one program pulse with the result that a verify read is not executed, a memory cell transistor MT that does not reach the read voltage RV may occur. Such a memory cell transistor MT is detected as a fail bit FB.

[6-1-3] Compaction Operation

Figure 88:
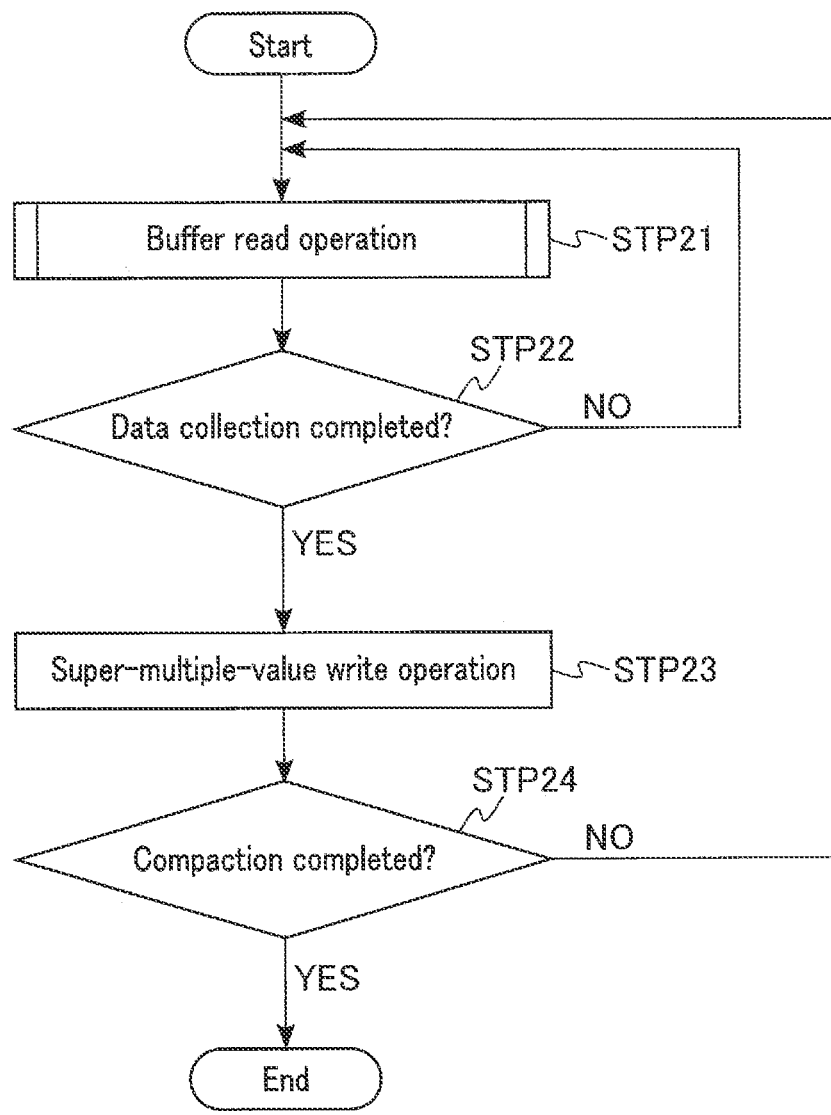
FIG. 88 is a flowchart illustrating an example of a compaction operation of the memory system of the sixth embodiment.

FIG. 88 is a flowchart illustrating an example of a compaction operation of the memory system MS f the sixth embodiment. As illustrated in FIG. 88, the memory controller 10 first executes a buffer read operation (STP21). In the buffer read operation, the memory controller 10 reads the data written by the buffer write operation from the memory device 20, and stores it in the buffer memory 17.

Subsequently, the memory controller 10 confirms whether data collection from the buffer region has been completed (STP21). In the processing of STP21, whether or not the data collection has been completed is determined based on whether or not at least one super-multiple-value write operation has become enabled.

If the data collection has not been completed (STP21, NO), the memory controller 10 returns to the processing of STP21. On the other hand, if the data collection has been completed (STP21, YES), the memory controller 10 proceeds to the processing of STP23.

In the processing of STP23, the memory controller 10 instructs the memory device 20 to execute a super-multiple-value write operation using the collected data. The memory device 20 executes the super-multiple-value write operation based on the instruction of the memory controller 10. Specifically, the memory device 20 writes the data of a plurality of pages collected by the processing of STP23 in the memory cell array 207 for a super-multiple value. Then, the memory controller 10 discards the data of the plurality of pages written in the memory cell array 207 for a super-multiple value from the buffer memory 17.

Thereafter, the memory controller 10 confirms whether the compaction operation has completed or not (STP24). Specifically, the memory controller 10 confirms whether all data stored in the buffer region has been written in the memory cell array 207 for a super-multiple value. If the compaction operation has not completed (STP24, NO), the memory controller 10 returns to the processing of STP21. On the other hand, if all data stored in the buffer region has been written in the memory cell array 207 for a super-multiple value (STP24, YES), the memory controller 10 ends the compaction operation (return).

(Specific Example of Super-Multiple-Value Write Operation)

Figure 89:
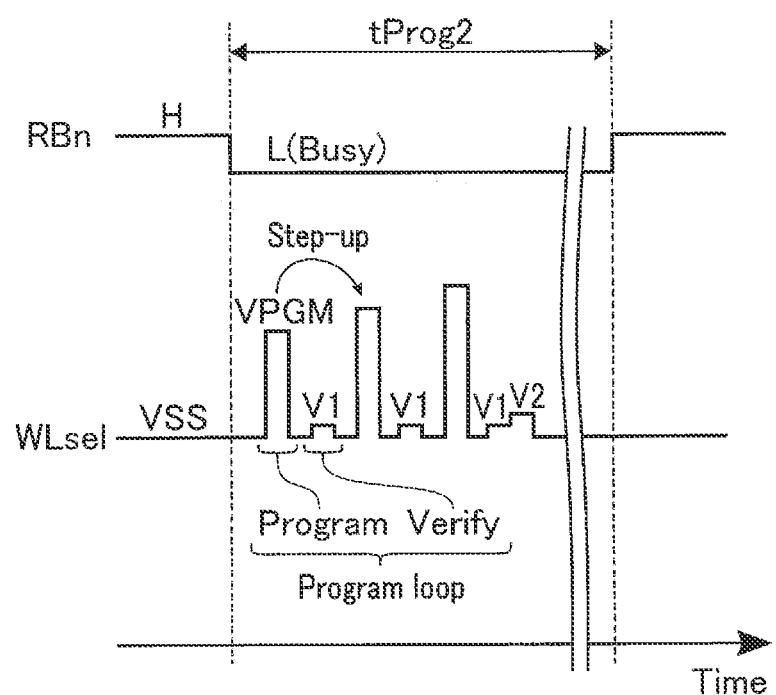
FIG. 89 is a timing chart illustrating an example of a super-multiple-value write operation of the memory device of the sixth embodiment.

FIG. 89 is a timing chart illustrating an example of a super-multiple-value write operation of the memory device 20 of the sixth embodiment. FIG. 89 illustrates a ready/busy signal RBn and a voltage applied to a selected word line WLsel. In a state before the super-multiple-value write operation is started, the voltage of the selected word line WLsel is, for example, the ground voltage VSS.

As illustrated in FIG. 89, when the super-multiple-value write operation is started, the memory device 20 transitions from the ready state to the busy state. Then, the sequencer 204 executes a program loop including a program operation and a verify operation.

In the program operation, a program voltage VPGM is applied to the selected word line WLsel. The program voltage VPGM is a high voltage that can increase the threshold voltage of the memory cell transistor MT. When the program voltage VPGM is applied to the selected word line WLsel, the threshold voltage of the memory cell transistor MT as a program target increases. On the other hand, a rise in the threshold voltage of the memory cell transistor MT as program-inhibit is suppressed by, for example, a self-boost technique.

In the verify operation, a read operation using verify voltages is executed. In the verify operation, the type and number of verify voltages applied to the selected word line WLsel can be changed appropriately in accordance with the progress of the program loop. For example, in a program loop for the first time, a read operation using a verify voltage V1 is executed. In each sense amplifier unit SAU, a verify voltage for use in determination of a "verify pass" is set in accordance with write data to be stored. The memory cell transistor MT that exceeds the set verify voltage is determined as a "verify pass".

The operation described above corresponds to the program loop of one time. Each time the program loop is repeated, the program voltage VPGM is stepped up, and becomes higher in accordance with the number of times of executing the program loop. The amount of step-up of the program voltage VPGM can be set to any value. The sequencer 204 repeatedly executes the program loop. When detecting the program pass of all states or detecting that the number of times of program loop execution exceeds a predetermined number, the sequencer 204 ends the write operation and transitions the memory device 20 from the busy state to the ready state. tProg2 in FIG. 89 represents a time during which the super-multiple-value write operation is being executed. tProg2 is longer than tProg1.

[6-1-4] First Example of Buffer Read Operation

FIG. 90 is a flowchart illustrating a first example of a buffer read operation of the memory system MS of the sixth embodiment. "k" used in the first example of the buffer read operation is a variable number treated by the memory controller 10. As illustrated in FIG. 90, when starting the buffer read operation of the first example, the memory controller 10 first executes processing of "k=1" (STP100).

Next, the memory controller 10 executes a k-th redundant page read (STP101). In this example, the k-th redundant page read is executed on a k-th redundant page as a target out of a set of redundant pages storing the same 1-page data, and corresponds to a read operation using the read voltage RV. The data read by the redundant page read is stored in any of the latch circuits in, for example, the sense amplifier unit SAU.

Next, the memory controller 10 confirms whether "k=M" is satisfied (STP102). Specifically, the memory controller 10 confirms whether data of all redundant pages included in a set of redundant pages has been read or not.

If "k=M" is not satisfied in the processing of STP102, the memory controller 10 increments "k" (STP103). In other words, in the processing of STP103, the memory controller 10 adds "1" to the value of "k". Then, the memory controller 10 proceeds to the processing of STP101. Thus, the memory controller 10 executes a read operation, in which a next redundant page included in the set of redundant pages is selected.

If "k=M" is satisfied in the processing of STP102, the memory controller 10 instructs the memory device 20 to execute majority processing (STP104). In the majority processing, for example, the sense amplifier unit SAU determines the most frequent read result ("1" data or "0" data) as the data associated with the sense amplifier unit SAU based on the results of reading the redundant pages stored in the latch circuits. The determined data is output to the memory controller 10.

After the processing of STP104, the memory controller 10 causes, for example, the buffer memory 17 to store the result of STP104 as data associated with that page (STP105). Then, the memory controller 10 ends a series of buffer read operation processing in the page (return).

In the same block BLK, degrees of deterioration in write and erase operations are similar across all pages. Accordingly, in the multiple-value read operation, the read voltages of optimum word lines WL are presumed to be almost the same across all pages. Therefore, the sequencer 204 may obtain a read voltage of an optimum word line WL through a normal read operation for the first page in the block BLK, and determine read voltages of other word lines WL based on the obtained result.

Furthermore, in the first example of the buffer read operation, a result of a redundant page read may be output to the memory controller 10. In this case, the memory controller 10 executes majority processing based on the results of a redundant page read of a plurality of times to determine read data. A series of operations of the buffer read operation may be executed based on one instruction from the memory controller 10. The order of executing redundant page reads executed by STP100 to STP103 may be of any other order.

(Specific Example of Redundant Page Read)

FIG. 91 is a timing chart illustrating an example of a redundant page read of the memory device 20 of the sixth embodiment. FIG. 91 illustrates an example of voltages in a selected word line WLsel, an unselected word line WLusel, nodes BLX, BLC, HHL, and XXL, a bit line BL, a sense node SEN, and a control signal STB, respectively, in the redundant page read. The unselected word line WLuse1 refers to a word line WL that has not been selected. In the following description, a memory cell transistor MT that is included in the selected block BL, included in the selected string unit SU, and coupled to the selected word line WLsel is also referred to as "MTse1".

As illustrated in FIG. 91, before the start of the redundant page read, the voltages of the word lines WLsel and WLuse1, the nodes BLX, BLC, HHL and XXL, the bit line BL, and the sense node SEN are VSS, for example. At this time, in each sense amplifier unit SAU, the transistors T1 to T4 whose gates are applied with VSS are in the OFF state. When the sequencer 204 starts the redundant page read, the sequencer 204 sequentially executes the processes at times t1 to t6.

At time t1, the sequencer 204 applies a read voltage RV to the selected word line WLsel, and applies VREAD to the unselected word line WLuse1. By application of the read voltage RV to the selected word line WLsel, the selected memory cell transistor MTse1 is turned on or off, and by application of VREAD to the unselected word line WLuse1, the unselected memory cell transistor MT is turned on. Since the number of times of reading with two values is small, VREAD is set to be high.

Further, at time t1, VBLX is applied to the node BLX, VBLC is applied to the node BLC, and VHHL is applied to the node HHL. Each of VBLX, VBLC and VHLL is a voltage higher than VSS. The transistor T1 whose gate is applied with VBLX, the transistor T4 whose gate is applied with VBLC, and the transistor T2 whose gate is applied with VHLL are turned on. Thus, the bit line BL is charged by the current flowing through the transistors T0, T1, T4, and T8, and the voltage of the bit line BL rises from VSS to VPCH. The sense nodes SEN is charged by the current flowing through the transistors T0 and T2, and the voltage of the sense nodes SEN rises from VSS to VSEN.

At time t2, the sequencer 204 applies VSS to the node HHL. Thus, the transistor T2 whose gate is applied with VSS is turned off, and the current path between the node ND1 and the sense node SEN is shut off. At this time, the sense node SEN is in the floating state and maintains the charged voltage from times t1 to t2.

At time t3, the sequencer 204 applies VXXL to the node XXL. VXXL is a voltage higher than VSS. The transistor T3 whose gate is applied with VXXL is turned on. Thus, the voltage of the sense node SEN is lowered from or maintained at VSEN in accordance with the state of the associated memory cell transistor MTse1. Specifically, the voltage of the sense node SEN is lowered where the memory cell transistor MTse1 to which the read voltage RV is applied is in the ON state (MTse1(ON) in FIG. 91), and is maintained where the memory cell transistor MTse1 to which the read voltage RV is applied is in the OFF state (MTse1(OFF) in FIG. 91). Where the memory cell transistor MTse1 is in the ON state, the voltage lowering rate of the sense node SEN may change, depending on the relationship between the threshold voltage of the memory cell transistor MTse1 and the magnitude of the applied read voltage RV.

At time t4, the sequencer 204 applies VSS to the node XXL. Thus, the transistor T3 whose gate is applied with VSS is turned off, and the current path between the sense node SEN and the node ND2 is shut off. At this time, the sense node SEN is in the floating state and maintains the voltage after the discharge performed from times t3 to t4.

At time t5, the sequencer 204 asserts a control signal STB. In other words, the sequencer 204 temporarily changes the control signal STB from the "L" level to the "H" level, and causes the sense amplifier units SAU to determine the threshold voltage of the memory cell transistor MTse1. Specifically, the transistor T7 whose gate is applied with the "H" level voltage is turned on, and the voltage of the pre-charged bus LBUS is lowered or maintained in accordance with the state of the transistor T6. For example, where the voltage of the sense node SEN is equal to or higher than the threshold voltage of the transistor T6, the transistor T6 is in the ON state and the voltage of the bus LBUS is lowered. On the other hand, where the voltage of the sense node SEN is lower than the threshold voltage of the transistor T6, the transistor T6 is in the OFF state and the voltage of the bus LBUS is maintained. The sequencer 204 causes a predetermined latch circuit to hold data that is based on the voltage of the bus LBUS.

At time t6, the sequencer 204 returns the voltages of the word lines WLsel and WLuse1, the nodes BLX, BLC, HHL, and XXL, and the bit line BLprog respectively to states that are before the start of the verify operation. Thereafter, the sequencer 204 ends the redundant page read.

[6-1-5] Second Example of Buffer Read Operation

Figure 92:
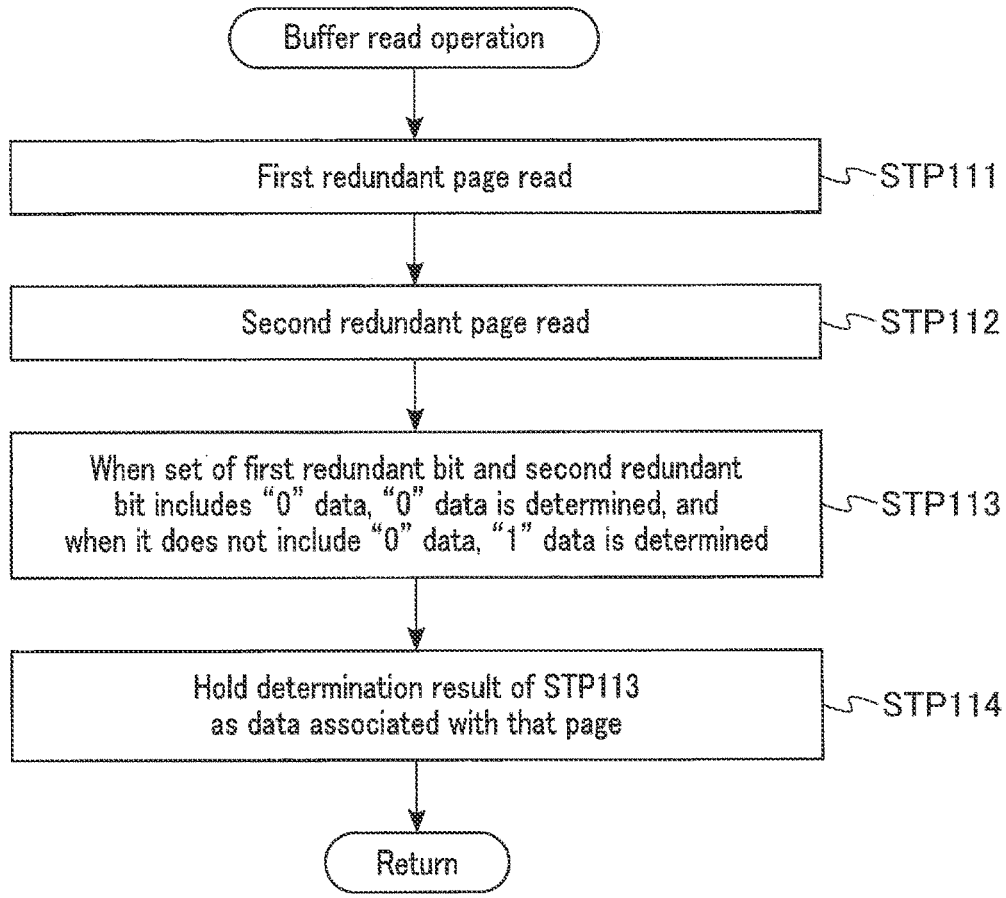
FIG. 92 is a flowchart illustrating a second example of a buffer read operation of the memory system of the sixth embodiment.

FIG. 92 is a flowchart illustrating a second example of a buffer read operation of the memory system MS of the sixth embodiment. FIG. 92 illustrates a case in which two cell units CU are allocated as redundant pages for storing the same one-page data (M=2).

As illustrated in FIG. 92, upon start of the buffer read operation of the second example, the memory controller 10 first executes a first redundant page read (STP111). The result of the first redundant page read is held in any of the latch circuits in each sense amplifier unit SAU. Subsequently, the memory controller 10 executes a second redundant page read (STP112). The result of the second redundant page read is held in any of the latch circuits in each sense amplifier unit SAU.

Then, the memory controller 10 instructs the memory device 20 to execute determination processing (STP113). In the determination processing, for example, when the set of a first redundant bit and a second redundant bit includes "0" data, the sense amplifier unit SAU determines "0" data, and when the set does not include "0" data, the sense amplifier unit SAU determines "1" data. A redundant bit corresponds to a read result that has been read by a redundant page read and stored in a latch circuit of each sense amplifier unit SAU. The first redundant bit corresponds to the result of the first redundant page read. The second redundant bit corresponds to the result of the second redundant page read. The determined data is output to the memory controller 10.

After the processing of STP113, the memory controller 10 causes, for example, the buffer memory 17 to hold the determination result of STP113 as data associated with that page (STP114). Then, the memory controller 10 ends a series of buffer read operation processing in the page (return).

As described above, in the second example of the buffer read operation, after reading data of two memory cell transistors MT associated as redundant pages, if one or more memory cell transistors MT contain "0" data, the data associated with the sense amplifier unit SAU is determined to be "0" data. Specifically, when the memory device 20 reads the first redundant page and the second redundant page, if the same column address is allocated to the first redundant page and the second redundant page and one or more of the read results are "0" data, the memory device 20 treats the data of the same column address as "0" data.

For example, the possibility that the data of a memory cell transistor MT in which "0" data is written is read as a fail bit FB is as low as 0.5% to 1%. If the error probability of one memory cell transistor MT is 1%, when determination is made by two memory cell transistors MT, the error probability is 1%×1%=0.01%. Similarly, if the error probability of one memory cell transistor MT is 0.5%, when determination is made by two memory cell transistors MT, the error probability is 0.5%×0.5%=0.0025%.

Furthermore, when the memory device 20 reads the first to M-th redundant pages, if the same column address is allocated to the first to M-th redundant pages and one or more of the read results are "0" data, the memory device 20 may treat the data of the same column address as "0" data. For example, if the error probability of one memory cell transistor MT is 1% and M=3, when determination is made by three memory cell transistors MT, the error probability is 1%×1%×1%=0.0001%. Similarly, if the error probability of one memory cell transistor MT is 5%, when determination is made by three memory cell transistors MT, the error probability is 5%×5%×5%=0.0125%. Thus, in the second example of the buffer read operation, the error probability can be reduced by determining data with a plurality of memory cell transistors MT.

In the second example of the buffer read operation, the read result of the redundant page read may be output to the memory controller 10. In this case, the memory controller 10 may execute the processing of STP113 based on the read results of a redundant page read of a plurality of times to determine read data. The series of operations of the buffer read operation may be executed based on one instruction of the memory controller 10.

[6-1-6] Third Example of Buffer Read Operation

Figure 93:
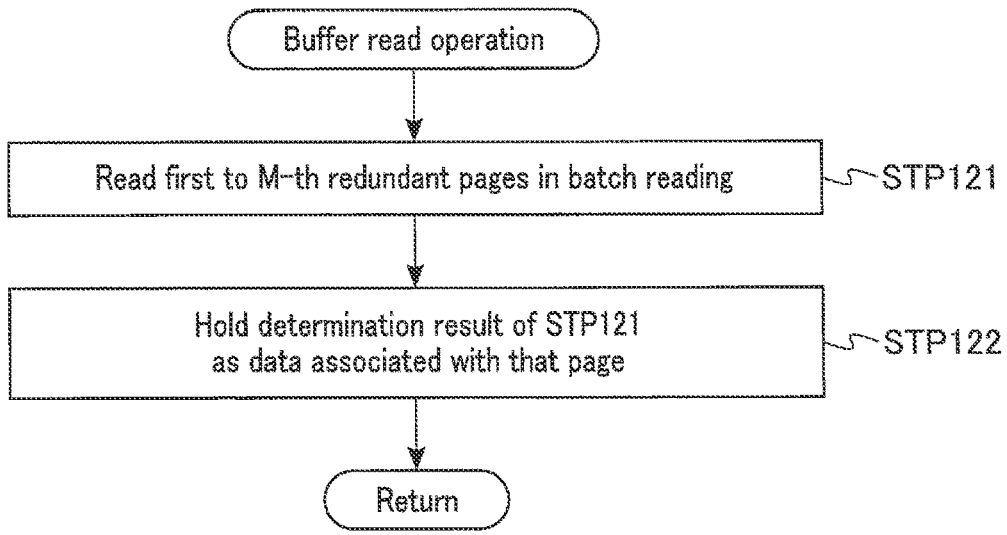
FIG. 93 is a flowchart illustrating a third example of a buffer read operation of the memory system of the sixth embodiment.

FIG. 93 is a flowchart illustrating a third example of a buffer read operation of the memory system MS of the sixth embodiment. As illustrated in FIG. 93, upon start of the buffer read operation of the third example, the memory controller 10 first executes a read operation for the first to M-th redundant pages (STP121). In the processing of STP121, data from the first to M-th redundant pages are read to the sense amplifier module 209 in batch reading. Details of the method for reading data from the first to M-th redundant pages in batch reading (hereinafter referred to as "redundant page batch read") will be described later.

After the processing of STP121, the memory controller 10 causes, for example, the buffer memory 17 to hold the determination result of STP121 as data associated with that page (STP122). Then, the memory controller 10 ends a series of buffer read operation processing in the page (return).

(Specific Example of Redundant Page Batch Read)

FIG. 94 is a timing chart illustrating an example of a redundant page batch read of the memory device 20 of the sixth embodiment. FIG. 94 illustrates an example of voltages in word lines WLsel and WLusel, nodes BLX, BLC, HHL, and XXL, a bit line BL, a sense node SEN, and a control signal STB, respectively, in the redundant page batch read. In this example, a case is illustrated in which two cell units CU are allocated as redundant pages for storing the same 1-page data (M=2). The redundant page batch read differs from the redundant page read explained with reference to FIG. 91 in number of word lines WLsel that can be selected simultaneously and sense level. The "sense level" corresponds to, for example, a threshold voltage of the transistor T6 to be used in determining the voltage of the sense node SEN.

As illustrated in FIG. 94, before the start of the redundant page batch read, the voltages of the word lines WLsel and WLusel, the nodes BLX, BLC, HHL and XXL, the bit lines BL, and the sense node SEN(N) are, for example, VSS. When the redundant page batch read is started, the sequencer 204 sequentially executes the processes at time t1 to time t6.

At time t1, the sequencer 204 simultaneously selects two blocks BLK including redundant pages from a plurality of blocks BLK sharing the bit line BL. Then, the sequencer 204 applies the read voltage RV to the selected word line WLsel and applies VREAD to the unselected word line WLusel in the selected blocks BLK. Further, at time t1, VBLX is applied to the node BLX, VBLC is applied to the node BLC, and VHHL is applied to the node HHL. Thus, the voltage of the bit line BL rises from VSS to VPCH, and the voltage of the sense node SEN rises from VSS to VSEN.

At time t2, the sequencer 204 applies VSS to the node HHL. Thus, the sense node SEN maintains the charged voltage from times t1 to t2.

At time t3, the sequencer 204 applies VXXL to the node XXL. Thus, the voltage of the sense node SEN is lowered from or maintained at VSEN in accordance with the state of the associated memory cell transistors MTsel. Specifically, the voltage of the sense node SEN is lowered to a large degree where the two memory cell transistors MTsel sharing the bit line BL are in the ON state (MTsel(2 cell_ON) in FIG. 94), lowered to a smaller degree where only one of the two memory cell transistors MTsel sharing the bit line BL is in the ON state (MTsel(only 1 cell_ON) in FIG. 94), and maintained where the two memory cell transistors MTsel sharing the bit line BL are in the OFF state (MTsel(2 cell_OFF) in FIG. 94).

At time t4, the sequencer 204 applies VSS to the node XXL. Thus, the transistor T3 whose gate is applied with VSS is turned off, and the current path between the sense node SEN and the node ND2 is shut off. At this time, the sense node SEN is in the floating state and maintains the voltage after the discharge performed from times t3 to t4. As a result, the voltage of the sense node SEN is maintained at different levels in accordance with the number of memory cell transistors MTsel that are in the ON state due to the application of the read voltage RV.

At time t5, the sequencer 204 asserts a control signal STB. In other words, the sequencer 204 temporarily changes the control signal STB from the "L" level to the "H" level, and causes the sense amplifier units SAU to determine the threshold voltage of the memory cell transistor MTsel. The sense level for use in determining the threshold voltage is set to a level between the voltage of the sense node SEN corresponding to MTsel (only 1 cell ON) and the voltage of the sense node SEN corresponding to MTsel (2 cell_OFF). The sequencer 204 causes a predetermined latch circuit to hold data that is based on the voltage of the bus LBUS.

At time t6, the sequencer 204 returns the voltages of the word lines WLsel and WLusel, the nodes BLX, BLC, HHL and XXL, and the bit line BLprog to the states that are before the start of the verify operation. Thereafter, the sequencer 204 ends the redundant page batch read.

As described above, in the third example of the buffer read operation, k memory cell transistors MT are simultaneously read by one read operation. Then, the sense level is adjusted, and if the read result is equal to or higher than the sense level, the result is determined to be "0" data, and if lower than the sense level, the result is determined to be "1" data. In other words, when the memory device 20 reads the first redundant page and the second redundant page in batch reading, if the same column address is allocated to the first redundant page and the second redundant page and one or more of the read results are determined be "0" data based on the sense level, the memory device 20 treats the data as "0"

data. Accordingly, the third example of the buffer read operation can reduce the time involved in a read operation for a plurality of redundant pages.

[6-2] Command Sequence of Redundant Page Batch Read

Figure 95:
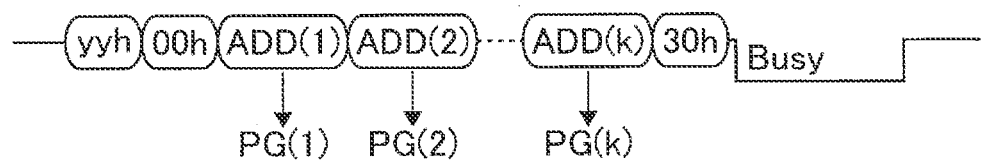
FIG. 95 is a sequence diagram showing a first example of a command sequence of a redundant page batch read of the memory device of the sixth embodiment.

FIG. 95 is a sequence diagram showing a first example of a command sequence of a redundant page batch read of the memory device 20 of the sixth embodiment. As illustrated in FIG. 95, when executing a redundant page batch read, the memory controller 10 transmits, for example "yyh", "00h", "ADD (1)", "ADD (2)", . . . , "ADD (k) (k is an integer of 2 or more)", and "30h" in this order to the memory device 20. "yyh" is a command designating a redundant page batch read. "ADD (1)", "ADD (2)", . . . , "ADD (k) are addresses of a redundant page set selected as a target of redundant page batch read. "ADD(1)", "ADD(2)", . . . , "ADD (k) are respectively associated with redundant pages PG(1), PG(2), . . . , PG(k). When the memory device 20 receives the command "30h", the sequencer 204 causes the memory device 20 to transition from the ready state to the busy state based on the command and the addresses "ADD(1)", "ADD (2)", . . . , "ADD(k) stored in the register circuit 203. Then, the sequencer 204 executes a series of redundant page batch read processing as illustrated in FIG. 94 for the addresses "ADD(1)", . . . , "ADD(k) as a target.

Figure 96:
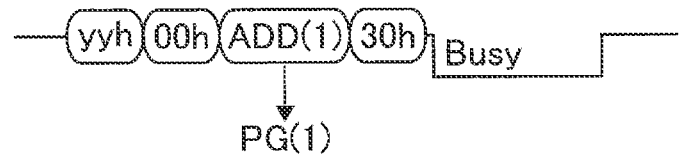
FIG. 96 is a sequence diagram illustrating a second example of a command sequence of a redundant page batch read of the memory device of the sixth embodiment.

The memory controller 10 may instruct the memory device 20 to execute the redundant page batch read using only the address of a representative redundant page of a plurality of redundant pages included in the redundant page set. FIG. 96 is a sequence diagram showing a second example of a command sequence of a redundant page batch read of the memory device 20 of the sixth embodiment. As illustrated in FIG. 96, in this example, the memory controller 10 transmits "yyh", "00h", "ADD(1)", and "30h" in this order to the memory device 20. When the memory device 20 receives the command "30h", the sequencer 204 causes the memory device 20 to transition from the ready state to the busy state based on the command and the address ADD(1) of the redundant page PG(1) stored in the register circuit 203. Then, the sequencer 204 executes a series of redundant page batch read processing for the address ADD(1) and the addresses ADD(2), . . . , ADD(k) associated with the address ADD(1) as a target.

[6-3] Advantages of Sixth Embodiment

One of the performances required for a memory system, such as an SSD, is an operation speed of sequential write. The sequential write corresponds to an operation of sequentially writing write data which the memory system receives from the host device. As a method for increasing the operation write of sequential read, writing the write data which the SSD receives from the host device into a memory cell array 207 for a multiple value or less may be considered. However, a memory cell array 207 for a multiple value or less has a low data recording density.

Therefore, the memory system MS of the sixth embodiment first writes data through a high-speed multiple-value write operation (buffer write operation). Thereafter, the memory system MS reads data written in the buffer region and executes a super-multiple-value write operation of a high recording density (compaction operation). Accordingly, the memory system MS of the sixth embodiment can suppress reduction of the operation speed of the sequential write, and can increase the storage capacity of the memory system MS.

Furthermore, in the memory system MS of the sixth embodiment, one program pulse is applied to the word line WLsel in a write operation for a memory cell array 207 for two values, and a verify operation is omitted. Accordingly, the memory system MS of the sixth embodiment can increase the speed of the buffer write operation. On the other hand, the omission of the verify operation may be a factor for widening the threshold voltage distribution, which may increase the fail bit FB.

To avoid this, in the memory system MS of the sixth embodiment, the same one-page data is written in a plurality of redundant pages in the buffer write operation. Then, the memory system MS determines 1-page data in the buffer read operation based on the result of a read operation for a plurality of redundant pages (the first to third examples of the buffer read operation). As a result, the memory system MS of the sixth embodiment can suppress the error occurrence rate in the buffer read operation and improve the reliability of data.

In a case of the sixth embodiment described above, a multiple-value write operation is executed for a memory cell array 207 with two values; however, the embodiment is not limited to this case. The multiple-value write operation where a verify operation is omitted may be executed for a memory cell array 207 with more than two values. In this case, the number of times of applying a program pulse is determined, for example, in accordance with the type of data written in the memory cell transistor MTse1. In the buffer read operation for the memory cell array 207 with more than two values, the kind and number of read voltages to be used can be set in accordance with the number of states formed by a multiple-value write operation.

In a case of the sixth embodiment described above, after writing the same data simultaneously in the first to k-th redundant pages, the memory system MS omits the verify operation (verify read); however, the embodiment is not limited to this case. After writing the same data simultaneously in the first to k-th redundant pages, the memory system MS may execute a verify read, and may execute an additional write operation if there is a cell that does not reach a predetermined threshold. The verify read in the sixth embodiment is executed simultaneously for, for example, the first to k-th redundant pages. In the verify read, if a write of even one-page data of the data of the first to k-th redundant pages is insufficient, the memory system MS may execute an additional write operation simultaneously for the first to k-th redundant pages. However, the additional write operation is also executed in memory cell transistors MT that have already reached the verify level (the threshold voltage of a target state) of the first to k-th redundant pages. Therefore, these memory cell transistors MT may cause an over-program. If this is disadvantageous, the memory system MS may execute a verify read independently for the first to k-th redundant pages, page by page. Then, the memory system MS may execute an additional write operation independently page by page for cells that have not reached the verify level.

Furthermore, in the sixth embodiment, as illustrated in FIG. 84, a case is described in which, for example, the compaction operation (the write operation in the memory cell array 207 for a super-multiple value) is executed after the buffer write operation (the write operation in the memory cell array 207 for a multiple value or less); however, the embodiment is not limited to this case. For example, when writing data that is frequently used or that needs a high-speed read, the memory device 20 may omit the compaction operation after executing the buffer write operation, and may leave the data in the buffer region (the memory cell array 207 for a multiple value or less). In the read operation for the buffer region, data can be read at a speed higher than in the read operation for the memory cell array 207 for a super-multiple value. Therefore, the memory device 20 can reduce the latency in the case of data reading by leaving in the buffer region the data that is frequently used or that needs a high-speed read.

[7] Seventh Embodiment

An information processing system 1 of the seventh embodiment is similar in configuration to that of the sixth embodiment. The seventh embodiment relates to a specific example of the multiple-value write operation in the sixth embodiment described above. A description will be given of the points in which the seventh embodiment differs from the first to sixth embodiments concerning the memory system MS.

[7-1] Threshold Voltage Distribution of Memory Cell Transistor MT

Figure 97:
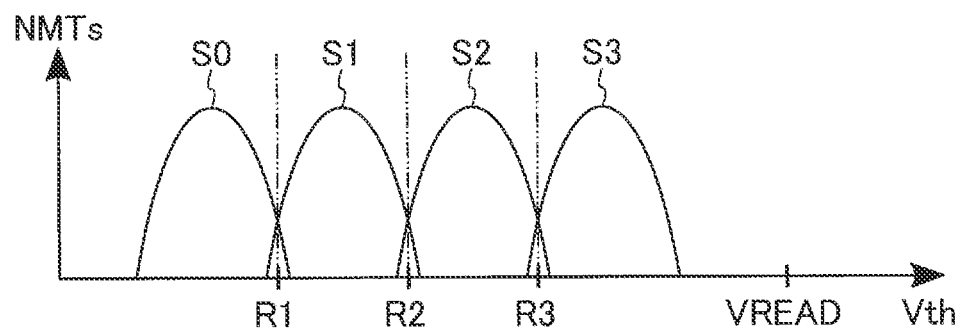
FIG. 97 is a schematic diagram illustrating an example of a threshold voltage distribution of memory cell transistors of a memory device of a seventh embodiment.

FIG. 97 is a schematic diagram illustrating an example of the threshold voltage distribution of the memory cell transistors MT of the memory device 20 of the seventh embodiment. "NMTs" on the vertical axis indicates the number of memory cell transistors MT. "Vth" on the horizontal axis indicates the threshold voltages of the memory cell transistors MT. The example illustrated in FIG. 97 represents a case in which a buffer region is formed of a memory cell array 207 of four values (2 bits/cell). Specifically, the threshold voltage distribution of the memory cell transistors MT in this example can form four states of S0, S1, S2, and S3. In a read operation for such a memory cell array 207, read voltages R1 to R3 and a read pass voltage VREAD are used.

In the following, first to fourth examples of a multiple-value write operation in the case where the buffer region is formed of the memory cell array 207 of the four values (2 bits/cell) will be described in sequence. In this specification, a program voltage set for a write of data corresponding to state S1 is referred to as "VPGM(S1)". A program voltage set for a write of data corresponding to state S2 is referred to as VPGM(S2)". A program voltage set for a write of data corresponding to state S3 is referred to as VPGM(S3)". The levels of the respective program voltages are set to satisfy the relationship "VPGM(S1)<VPGM(S2)<VPGM(S3)". A bit line BL coupled to a sense amplifier unit SAU to which a data write corresponding to state S1 is allocated is referred to as "BLprog(S1)". A bit line BL coupled to a sense amplifier unit SAU to which a data write corresponding to state S2 is allocated is referred to as "BLprog(S2)". A bit line BL coupled to a sense amplifier unit SAU to which a data write corresponding to state S3 is allocated is referred to as "BLprog(S3)".

[7-2] First Example of Multiple-value Write Operation

Figure 98:
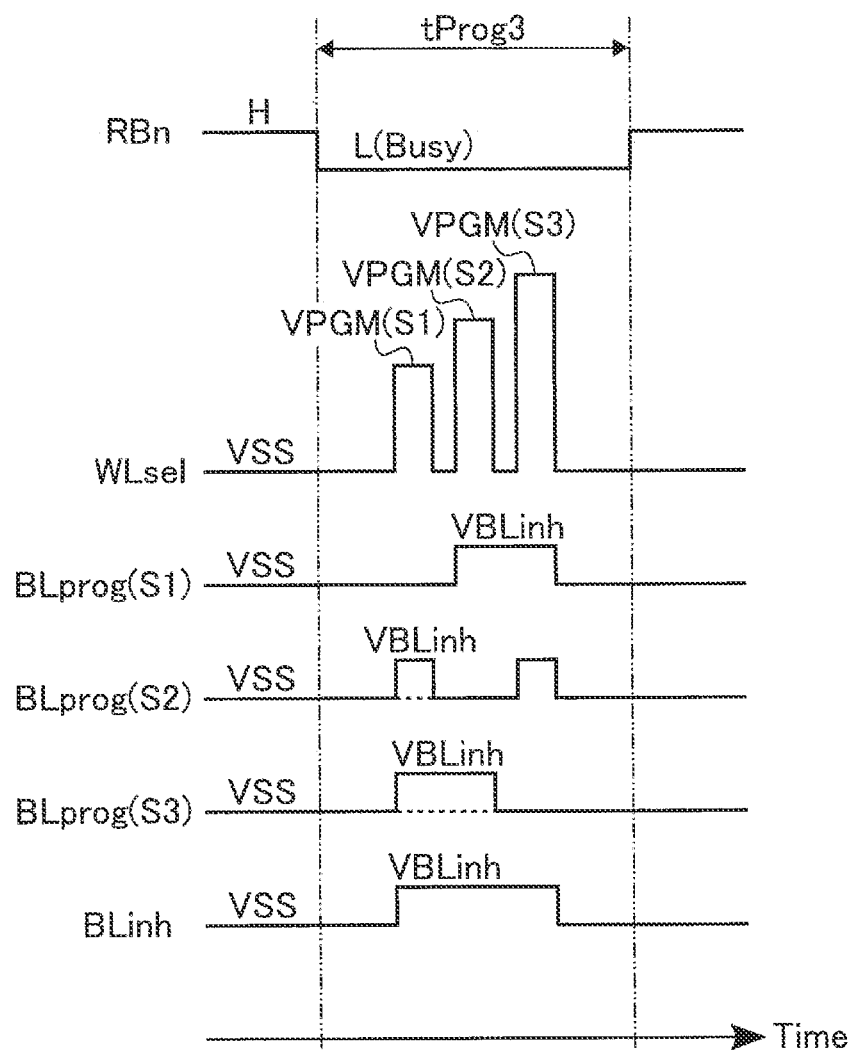
FIG. 98 is a timing chart illustrating a first example of a multiple-value write operation of the memory device of the seventh embodiment.

FIG. 98 is a timing chart illustrating a first example of a multiple-value write operation of the memory device 20 of the seventh embodiment. As illustrated in FIG. 98, when the multiple-value write operation is started, the memory device 20 transitions from the ready state to the busy state. Before the start of the write operation, the voltages of the bit lines BL and the word lines WL are the ground voltage VSS.

The sequencer 204 applies the program voltage VPGM (S1) to the selected word line WLsel, while applying the ground voltage VSS to the bit line BLprog(S1) and applying the voltage VBLinh to the bit lines BLprog(S2), BLprog (S3), and BLinh. Then, the threshold voltage of the memory cell transistor MT coupled to the bit line BLprog (S1) and the selected word line WLsel rises. On the other hand, a rise in the threshold voltage of the memory cell transistor MT coupled to any one of the bit lines BLprog(S2), BLprog(S3), and BLinh, and the selected word line WLsel is suppressed.

Next, the sequencer 204 applies the program voltage VPGM(S2) to the selected word line WLsel, while applying the ground voltage VSS to the bit line BLprog(S2) and applying the voltage VBLinh to the bit lines BLprog(S1), BLprog(S3), and BLinh. Then, the threshold voltage of the memory cell transistor MT coupled to the bit line BLprog (S2) and the selected word line WLsel rises. On the other hand, a rise in the threshold voltage of the memory cell transistor MT, coupled to any one of the bit lines BLprog (S1), BLprog(S3), and BLinh, and the selected word line WLsel, is suppressed.

Next, the sequencer 204 applies the program voltage VPGM(S3) to the selected word line WLsel, while applying the ground voltage VSS to the bit line BLprog(S3) and applying the voltage VBLinh to the bit lines BLprog(S1), BLprog(S2), and BLinh. Then, the threshold voltage of the memory cell transistor MT coupled to the bit line BLprog (S3) and the selected word line WLsel rises. On the other hand, a rise in the threshold voltage of the memory cell transistor MT coupled to any one of the bit lines BLprog (S1), BLprog(S2), and BLinh, and the selected word line WLsel is suppressed.

Based on the application of three types of program voltages VPGM(S1), VPGM(S2), and VPGM(S3) to the selected word line WLsel, the sequencer 204 ends the multiple-value write operation, and transitions the memory device 20 from the busy state to the ready state. Accordingly, in the first example of the multiple-value write operation of the seventh embodiment, the threshold voltage distribution of the four states as illustrated in FIG. 97 can be formed in the cell unit CU as the program target. tProg3 in FIG. 98 represents a time during which the first example of the multiple-value write operation of the seventh embodiment is being executed. tProg3 is longer than tProg1 and shorter than tProg2.

In the first example of the multiple-value write operation of the seventh embodiment, during the write of state S1 (namely, in the period in which the program voltage VPGM (S1) is being applied to the selected word line WLsel), as illustrated by the broken lines in FIG. 98, the ground voltage VSS may be applied to one or both of the bit lines BLprog (S2) and BLprog(S3). In this case, when the program voltage VPGM(S1) is applied to the selected word line WLsel, not only the threshold voltage of the memory cell transistor MT to be written in state S1 but also the threshold voltage of the memory cell transistor MT to be written in state S2 or S3 rises. Similarly, during the write of state S2 (namely, in the period in which the program voltage VPGM (S2) is being applied to the selected word line WLsel), as illustrated by the broken lines in FIG. 98, the ground voltage VSS may be applied to the bit lines BLprog(S3). In this case, when the program voltage VPGM(S2) is applied to the selected word line WLsel, not only the threshold voltage of the memory cell transistor MT to be written in state S2 but also the threshold voltage of the memory cell transistor MT to be written in state S3 rises.

[7-3] Second Example of Multiple-value Write Operation

Figure 99:
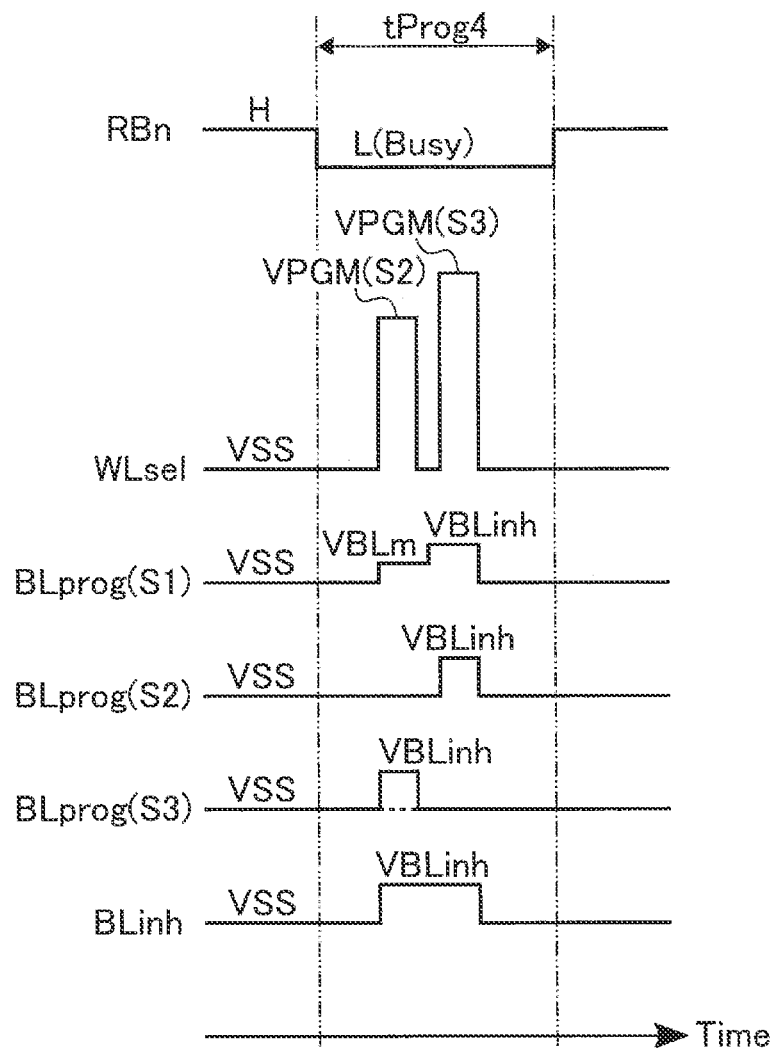
FIG. 99 is a timing chart illustrating a second example of a multiple-value write operation of the memory device of the seventh embodiment.

FIG. 99 is a timing chart illustrating a second example of a multiple-value write operation of the memory device 20 of the seventh embodiment. As illustrated in FIG. 99, when the multiple-value write operation is started, the memory device 20 transitions from the ready state to the busy state.

The sequencer 204 applies the program voltage VPGM (S2) to the selected word line WLsel, while applying the ground voltage VSS to the bit line BLprog(S2), applying an intermediate voltage VBLm to the bit line BLprog(S1), and applying the voltage VBLinh to the bit lines BLprog(S3) and BLinh. Then, the threshold voltage of the memory cell transistor MT coupled to the bit line BLprog(S1) and the selected word line WLsel and the threshold voltage of the memory cell transistor MT coupled to the bit line BLprog(S2) and the selected word line WLsel both rise. The degree of threshold voltage increase is greater in the memory cell transistor MT coupled to the bit line BLprog(S2) than in the memory cell transistor MT coupled to the bit line BLprog(S1).

Next, the sequencer 204 applies the program voltage VPGM(S2) to the selected word line WLsel, while applying the ground voltage VSS to the bit line BLprog(S3) and applying the voltage VBLinh to the bit lines BLprog(S1), BLprog(S2), and BLinh. Then, the threshold voltage of the memory cell transistor MT coupled to the bit line BLprog(S3) and the selected word line WLsel rises.

Details of the other operations are the same as those in the first example of the multiple-value write operation in the seventh embodiment. Based on the application of two types of program voltages VPGM(S2) and VPGM(S3) to the selected word line WLsel, the sequencer 204 ends the multiple-value write operation, and transitions the memory device 20 from the busy state to the ready state. Accordingly, in the second example of the multiple-value write operation of the seventh embodiment, the threshold voltage distribution of the four states as illustrated in FIG. 97 can be formed in the cell unit CU as the program target. tProg4 in FIG. 99 represents a time during which the second example of the multiple-value write operation in the seventh embodiment is being executed. tProg4 is longer than tProg1 and shorter than tProg3.

In the second example of the multiple-value write operation of the seventh embodiment, during the write of states S1 and S2 (namely, in the period in which the program voltage VPGM(S2) is being applied to the selected word line WLsel), as illustrated by the broken lines in FIG. 99, the ground voltage VSS may be applied to the bit line BLprog(S3). In this case, when the program voltage VPGM(S2) is applied to the selected word line WLsel, not only the threshold voltage of the memory cell transistor MT to be written in state S1 or S2 but also the threshold voltage of the memory cell transistor MT to be written in state S3 rises.

[7-4] Third Example of Multiple-value Write Operation

Figure 100:
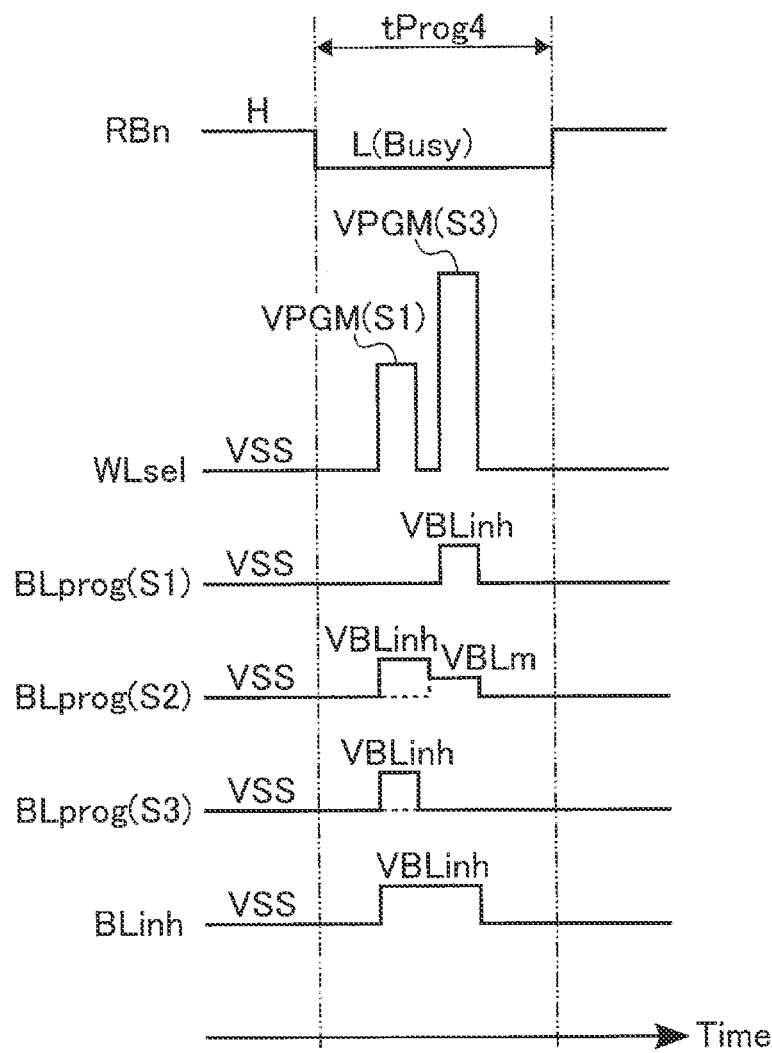
FIG. 100 is a timing chart illustrating a third example of a multiple-value write operation of the memory device of the seventh embodiment.

FIG. 100 is a timing chart illustrating a third example of a multiple-value write operation of the memory device 20 of the seventh embodiment. As illustrated in FIG. 100, when the multiple-value write operation is started, the memory device 20 transitions from the ready state to the busy state.

The sequencer 204 applies the program voltage VPGM(S1) to the selected word line WLsel, while applying the ground voltage VSS to the bit line BLprog(S1) and applying the voltage VBLinh to the bit lines BLprog(S2), BLprog(S3), and BLinh. Then, the threshold voltage of the memory cell transistor MT coupled to the bit line BLprog (S1) and the selected word line WLsel rises.

The sequencer 204 applies the program voltage VPGM(S3) to the selected word line WLsel, while applying the ground voltage VSS to the bit line BLprog(S3), applying an intermediate voltage VBLm to the bit line BLprog(S2), and applying the voltage VBLinh to the bit lines BLprog(S1) and BLinh. Then, the threshold voltage of the memory cell transistor MT coupled to the bit line BLprog(S2) and the selected word line WLsel and the threshold voltage of the memory cell transistor MT coupled to the bit line BLprog(S3) and the selected word line WLsel rise. The degree of increase of the threshold voltage is greater in the memory cell transistor MT coupled to the bit line BLprog(S3) than in the memory cell transistor MT coupled to the bit line BLprog(S2).

Details of the other operations are the same as those in the first example of the multiple-value write operation in the seventh embodiment. Based on the application of two types of program voltages VPGM(S1) and VPGM(S3) to the selected word line WLsel, the sequencer 204 ends the multiple-value write operation, and transitions the memory device 20 from the busy state to the ready state. Accordingly, in the third example of the multiple-value write operation of the seventh embodiment, the threshold voltage distribution of the four states as illustrated in FIG. 97 can be formed in the cell unit CU as the program target. The length of a time during which the third example of the multiple-value write operation in the seventh embodiment is being executed is tProg4.

In the third example of the multiple-value write operation of the seventh embodiment, during the write of state S1 (namely, in the period in which the program voltage VPGM(S1) is being applied to the selected word line WLsel), as illustrated by the broken lines in FIG. 100, the ground voltage VSS may be applied to one or both of the bit lines BLprog(S2) and BLprog(S3). In this case, when the program voltage VPGM(S1) is applied to the selected word line WLsel, not only the threshold voltage of the memory cell transistor MT to be written in state S1 but also the threshold voltage of the memory cell transistor MT to be written in state S2 or S3 rises.

[7-5] Fourth Example of Multiple-value Write Operation

FIG. 101 is a timing chart illustrating a fourth example of a multiple-value write operation of the memory device 20 of the seventh embodiment. As illustrated in FIG. 101, when the multiple-value write operation is started, the memory device 20 transitions from the ready state to the busy state.

The sequencer 204 applies the program voltage VPGM(S3) to the selected word line WLsel, while applying the ground voltage VSS to the bit line BLprog(S3), applying an intermediate voltage VBLm1 to the bit line BLprog(S1), applying an intermediate voltage VBLm2 to the bit line BLprog(S2), and applying the voltage VBLinh to the bit line BLinh. VBLm2 is a voltage higher than VSS. VBLm1 is a voltage between VBLm2 and VBLinh. Then, the threshold voltage of the memory cell transistor MT coupled to one of the bit lines BLprog(S1), BLprog(S2), and BLprog(S3), and the selected word line WLsel rises. The degree of increase of the threshold voltage is greater in the memory cell transistor MT coupled to the bit line BLprog(S2) than in the memory cell transistor MT coupled to the bit line BLprog(S1), and is greater in the memory cell transistor MT coupled to the bit line BLprog(S3) than in the memory cell transistor MT coupled to the bit line BLprog(S2).

Details of the other operations are the same as those in the first example of the multiple-value write operation in the seventh embodiment. Based on the application of a type of program voltages VPGM(S3) to the selected word line WLsel, the sequencer 204 ends the multiple-value write operation, and transitions the memory device 20 from the busy state to the ready state. Accordingly, in the fourth example of the multiple-value write operation of the seventh embodiment, the threshold voltage distribution of the four states as illustrated in FIG. 97 can be formed in the cell unit CU as the program target. The length of a time during which the fourth example of the multiple-value write operation in the seventh embodiment is being executed is tProg1.

[7-6] Fifth Example of Multiple-value Write Operation

Each of FIGS. 99, 100, and 101 illustrates a case in which the amount of threshold voltage rise of the memory cell transistor MT as the program target is adjusted by applying an intermediate voltage to the bit line BL in accordance with the data to be written; however, the embodiment is not limited to this case.

Figure 102:
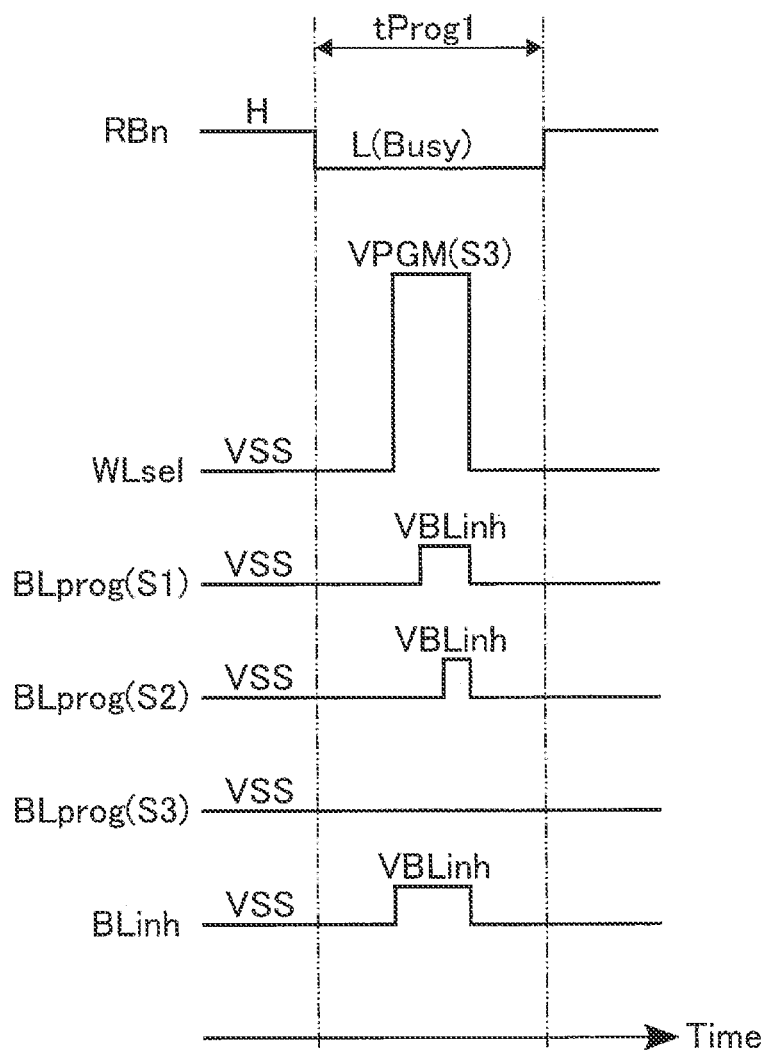
FIG. 102 is a timing chart illustrating a fifth example of a multiple-value write operation of the memory device of the seventh embodiment.

FIG. 102 is a timing chart illustrating a fifth example of a multiple-value write operation of the memory device 20 of the seventh embodiment. As illustrated in FIG. 102, when the multiple-value write operation is started, the memory device 20 transitions from the ready state to the busy state.

The sequencer 204 applies the program voltage VPGM (S3) to the selected word line WLsel, while applying the ground voltage VSS to the bit lines BLprog(S1), BLprog(S2), and BLprog(S3), and applying the voltage VBLinh to the bit line BLinh. Then, the sequencer 204 raises the voltage of the bit line BLprog(S1) from VSS to VBLinh at a timing when a first period of time has elapsed since the application of the program voltage VPGM(S3). Subsequently, the sequencer 204 raises the voltage of the bit line BLprog(S2) from VSS to VBLinh at a timing when a second period of time longer than the first period of time has elapsed since the application of the program voltage VPGM(S3). Thereafter, when a predetermined time has passed since the application of the program voltage VPGM(S3), the sequencer 204 lowers the voltages of the selected word line WLsel and each bit line BL to VSS. Details of the other operations are the same as those in the first example of the multiple-value write operation in the seventh embodiment. The length of a time during which the fifth example of the multiple-value write operation in the seventh embodiment is being executed is, for example, tProg1.

As described above, after once applying the ground voltage VSS to the bit line BL, the memory system MS may change the write time by changing the voltage of the bit line BL to the voltage VBLinh of the bit line BLinh of write-inhibit during the write operation. Also in such a case, the memory system MS can adjust the amount of threshold voltage rise of the memory cell transistor MT as the program target. Thus, according to the fifth example of the multiple-value write operation, the memory system MS of the seventh embodiment can form the threshold voltage distribution of the four states as illustrated in FIG. 97 in the cell unit CU as the program target.

[7-6] Advantages of Seventh Embodiment

As described above, the memory system MS of the seventh embodiment can execute a multiple-value write operation where a verify operation is omitted, also for a case of more than three values. Furthermore, when applying a program voltage VPGM to a plurality of memory cell transistors MT as program target in a write operation, the memory system MS can apply any of the first to K-th voltages (K is a value of the memory cell transistor MT to be used in storing data), which are different from one another, respectively to the bit lines BL in accordance with the data to be written and the level of the program voltage VPGM.

As a result, as in the second, third, or fourth example of the multiple-value write operation, the memory system MS can execute a write of a plurality of states in batch writing by one application of the program voltage VPGM. Thus, when applying the program voltage VPGM, the memory system MS can reduce the number of times of applying the program pulse by suitably using three or more types of voltages to be applied to the bit lines BL in accordance with the data to be written and the level of the program voltage VPGM. Accordingly, the memory system MS of the seventh embodiment can reduce the time for the buffer write operation.

In the case of a multiple-value write operation where the verify operation is omitted, concerns exist that the threshold voltage distributions of adjacent states may overlap, as illustrated in FIG. 97. Even in such a case, the reliability of data in the memory system MS can be improved by combining the sixth embodiment and the seventh embodiment. Specifically, the memory system MS of the seventh embodiment may simultaneously write data in a plurality of memory cell transistors MT and read data from the plurality of memory cell transistors MT as in the sixth embodiment, and may execute majority processing for the read data.

[8] Eighth Embodiment

The memory device 20 of the eighth embodiment stores multiple-bit data based on the threshold voltages of two memory cell transistors MT, respectively. A description will be given of the points in which the eighth embodiment differs from the first to seventh embodiments concerning the memory system MS.

[8-1] Configuration of Memory Device 20

Figure 103:
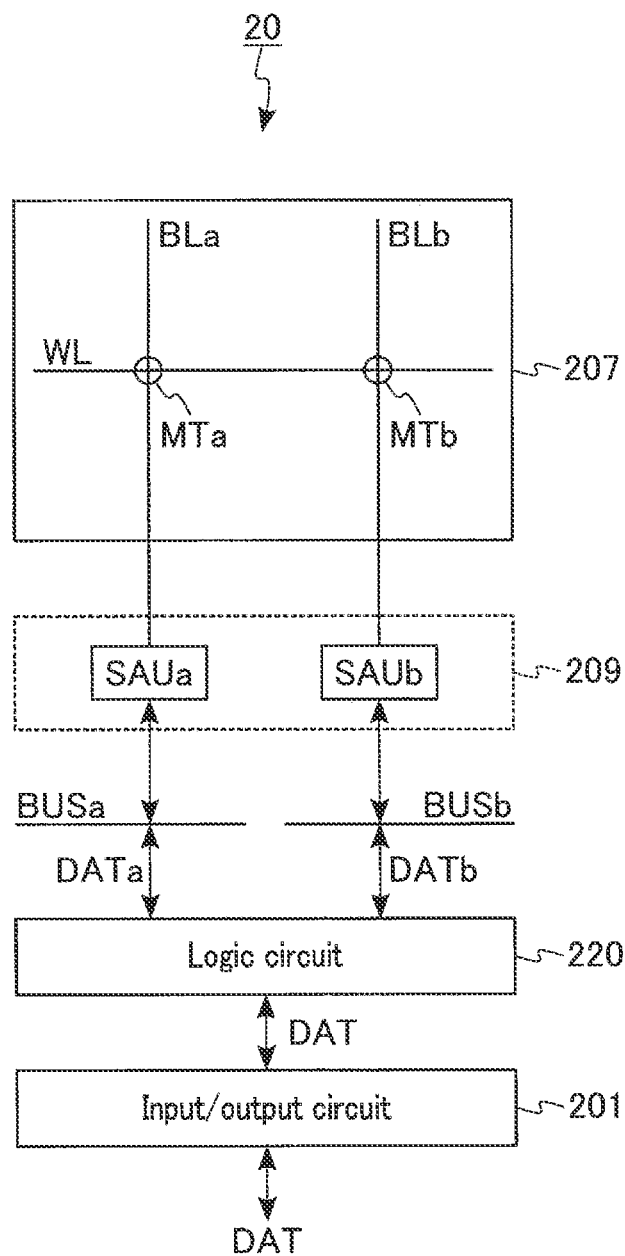
FIG. 103 is a block diagram illustrating an example of a configuration of a memory device of an eighth embodiment.

FIG. 103 is a block diagram illustrating an example of a configuration of the memory device 20 of the eighth embodiment. As illustrated in FIG. 103, the memory device 20 of the eighth embodiment includes a logic circuit 220 in addition to the configuration of the memory device 20 explained with reference to FIG. 3. The memory cell array 207 of the eighth embodiment includes a first memory cell transistor MTa and a second memory cell transistor MTb.

In the eighth embodiment, multiple-bit data is stored by a combination of threshold voltages of the memory cell transistor MTa and the memory cell transistor MTb, respectively. This kind of data storage method is hereinafter referred to as "share coding". The combined memory cell transistors MTa and MTb may be coupled to a common word line WL or different word lines WL. A plurality of bit lines BL in the eighth embodiment include bit lines BLa and BLb respectively coupled to the memory cell transistors MTa and MTb. The sense amplifier module 209 in the eighth embodiment includes sense amplifier units SAUa and SAUb respectively coupled to the bit lines BLa and BLb.

The logic circuit 220 transmits and receives data DAT to and from an input/output circuit 201. The logic circuit 220 also executes predetermined encode processing on write data transferred from the input/output circuit 201, and transmits the encoded write data to at least one of the sense amplifier units SAUa and SAUb. Furthermore, the logic circuit 220 executes predetermined decode processing on a read result transferred from at least one of the sense amplifier units SAUa and SAUb, and transmits the decoded data to the input/output circuit 201 as read data. The logic circuit 220 may omit encode and decode processing in accordance with data that is input and output.

Data DATa stored in the first memory cell transistor MTa is read by the sense amplifier unit SAUa, and transferred to the logic circuit 220 via a data bus BUSa. Data DATb stored in the second memory cell transistor MTb is read by the sense amplifier unit SAUb, and transferred to the logic circuit 220 via a data bus BUSb. The logic circuit 220 can execute decode processing, using the data DATa read from the memory cell transistor MTa and the data DATb read from the memory cell transistor MTb, and can output the decoded data DAT to the memory controller 10 via the input/output circuit 201.

The other configurations in the information processing system 1 according to the eighth embodiment are the same as those of the first embodiment. A case in which the first memory cell transistor MTa and the second memory cell transistor MTb respectively store the data DATa and DATb with three values is described below. In this case, a set of the first memory cell transistor MTa and the second memory cell transistor MTb can store 3-bit data.

[8-2] Share Coding

Figures 104, 105:
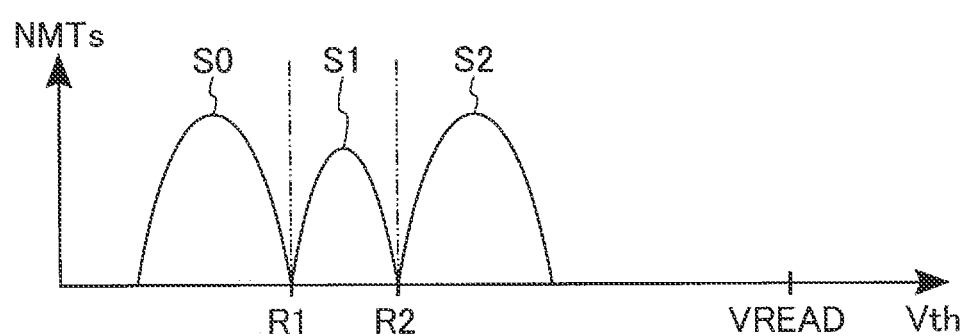
FIG. 104 is a table illustrating an example of a combination of states of memory cell transistors for use in share coding of the memory device of the eighth embodiment.
FIG. 105 is a schematic diagram illustrating an example of a threshold voltage distribution of memory cell transistors of the memory device of the eighth embodiment.

FIG. 104 is a table illustrating an example of a combination of states of memory cell transistors MT for use in share coding of the memory device 20 of the eighth embodiment. As illustrated in FIG. 104, in the memory device 20 of the eighth embodiment, there are nine combinations of three kinds of states S0 to S2 applicable to the first memory device MTa and three kinds of states S0 to S2 applicable to the second memory cell transistor MTb. On the other hand, 3-bit data is expressed by eight combinations (23 combinations). Therefore, data is not allocated to one combination.

In FIG. 104, "o" represents an example of the combination of states of the memory cell transistors MTa and MTb to which data is allocated, and "–" represents an example of the combination of states of the memory cell transistors MTa and MTb to which data is not allocated. Specifically, in this embodiment, data is not allocated to the combination of state S1 of the first memory cell transistor MTa and state S1 of the second memory cell transistor MTb. Pieces of 3-bit data different from one another are allocated to the other combinations. In this case, in a cell unit CU including the combination of the memory cell transistor MTa and the memory cell transistor MTb, the number of the memory cell transistors MT distributed in state 51 is fewer, since the combination of state S1 of the memory cell transistor MTa and state S1 of the memory cell transistor MTb is not used. For example, the number of the memory cell transistors MT distributed in state S1 is two-thirds of the number of the memory cell transistors MT distributed in the other states.

FIG. 105 is a schematic diagram illustrating an example of the threshold voltage distribution of the memory cell transistors MT of the memory device 20 of the eighth embodiment. "NMTs" on the vertical axis indicates the number of the memory cell transistors MTa and MTb. "Vth" on the horizontal axis indicates the threshold voltages of the memory cell transistors MTa and MTb. As illustrated in FIG. 105, the threshold voltage distribution of the memory cell transistors MT of this embodiment can form three states S0, S1, and S2. Since the number of the memory cell transistors MT distributed in state S1 is fewer, as described above, variations in the threshold voltages of the memory cell transistors distributed in state S1 can be small. Specifically, the variations in the threshold voltages of the memory cell transistors MT distributed in state S1 can be smaller than those in the threshold voltages of the memory cell transistors MT distributed in state S2. In this case, the memory system MS can set the interval between the read voltages R1 and R2 to be smaller than in the case in which the numbers of the memory cell transistors in the respective states are substantially equal, as in the threshold voltage distribution illustrated in FIG. 97.

[8-3] First Example of Multiple-value Write Operation

FIG. 106 is a timing chart illustrating a first example of a multiple-value write operation of the memory device 20 of the eighth embodiment. As illustrated in FIG. 106, when the multiple-value write operation is started, the memory device 20 transitions from the ready state to the busy state.

The sequencer 204 applies the program voltage VPGM(S1) to the selected word line WLsel, while applying the ground voltage VSS to the bit line BLprog(S1) and applying the voltage VBLinh to the bit lines BLprog(S2) and BLinh. Then, the threshold voltage of the memory cell transistor MT coupled to the bit line BLprog (S1) and the selected word line WLsel rises. On the other hand, the threshold voltage of the memory cell transistor MT coupled to either the bit line BLprog(S2) or BLinh and a rise in the selected word line WLsel is suppressed.

Next, the sequencer 204 applies the program voltage VPGM(S2) to the selected word line WLsel, while applying the ground voltage VSS to the bit line BLprog(S2) and applying the voltage VBLinh to the bit lines BLprog(S1) and BLinh. Then, the threshold voltage of the memory cell transistor MT coupled to the bit line BLprog(S2) and the selected word line WLsel rises. On the other hand, the threshold voltage of the memory cell transistor MT coupled to either the bit line BLprog(S1) or BLinh and a rise in the selected word line WLsel is suppressed.

Based on the application of two types of program voltages VPGM(S1) and VPGM(S2) to the selected word line WLsel, the sequencer 204 ends the multiple-value write operation, and transitions the memory device 20 from the busy state to the ready state. Accordingly, in the first example of the multiple-value write operation of the eighth embodiment, the threshold voltage distribution of the three states as illustrated in FIG. 105 can be formed in the cell unit CU as the program target. The length of a time during which the first example of the multiple-value write operation in the eighth embodiment is being executed is tProg4.

In the first example of the multiple-value write operation of the eighth embodiment, during the write of state S1 (namely, in the period in which the program voltage VPGM(S1) is being applied to the selected word line WLsel), as illustrated by the broken lines in FIG. 106, the ground voltage VSS may be applied to the bit line BLprog(S2). In this case, when the program voltage VPGM(S1) is applied to the selected word line WLsel, not only the threshold voltage of the memory cell transistor MT to be written in state S1 but also the threshold voltage of the memory cell transistor MT to be written in state S2 rises.

[8-4] Second Example of Multiple-value Write Operation

Figure 107:
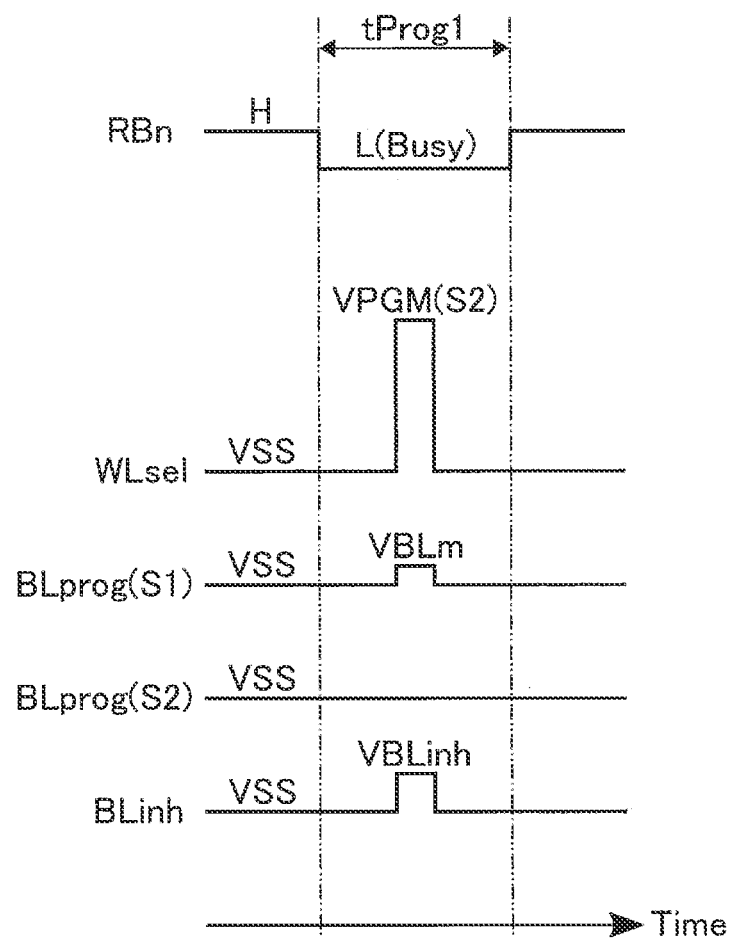
FIG. 107 is a timing chart illustrating a second example of a multiple-value write operation of the memory device of the eighth embodiment.

FIG. 107 is a timing chart illustrating a second example of a multiple-value write operation of the memory device 20 of the eighth embodiment. As illustrated in FIG. 107, when the multiple-value write operation is started, the memory device 20 transitions from the ready state to the busy state.

The sequencer 204 applies the program voltage VPGM(S2) to the selected word line WLsel, while applying the ground voltage VSS to the bit line BLprog(S2), applying an intermediate voltage VBLm to the bit line BLprog(S1), and applying the voltage VBLinh to the bit line BLinh. Then, the threshold voltage of the memory cell transistor MT coupled to the bit line BLprog(S1) and the selected word line WLsel and the threshold voltage of the memory cell transistor MT coupled to the bit line BLprog(S2) and the selected word line WLsel rise. The degree of increase of the threshold voltage is greater in the memory cell transistor MT coupled to the bit line BLprog(S2) than in the memory cell transistor MT coupled to the bit line BLprog(S1). On the other hand, the threshold voltage of the memory cell transistor MT coupled to the bit line BLinh and a rise in the selected word line WLsel is suppressed.

Based on the application of a type of program voltages VPGM(S2) to the selected word line WLsel, the sequencer 204 ends the multiple-value write operation, and transitions the memory device 20 from the busy state to the ready state. Accordingly, in the second example of the multiple-value write operation of the eighth embodiment, the threshold voltage distribution of the three states as illustrated in FIG. 105 can be formed in the cell unit CU as the program target. The length of a time during which the second example of the multiple-value write operation in the eighth embodiment is being executed is tProg1.

[8-5] Third Example of Multiple-value Write Operation

FIG. 107 illustrates a case in which the amount of rise of the threshold voltage of the memory cell transistor MT as the program target is adjusted by applying an intermediate voltage to the bit line BL in accordance with the data to be written; however, the embodiment is not limited to this case.

FIG. 108 is a timing chart illustrating a third example of a multiple-value write operation of the memory device of the eighth embodiment. As illustrated in FIG. 108, when the multiple-value write operation is started, the memory device 20 transitions from the ready state to the busy state.

The sequencer 204 applies the program voltage VPGM (S2) to the selected word line WLsel, while applying the ground voltage VSS to the bit lines BLprog(S1) and BLprog (S2), and applying the voltage VBLinh to the bit line BLinh. Then, the sequencer 204 rises the voltage of the bit line BLprog(S1) from VSS to VBLinh at a timing when a predetermined of time has passed since the application of the program voltage VPGM(S2). Thereafter, when the program voltage VPGM(S2) is further applied for a predetermined time, the sequencer 204 lowers the voltages of the selected word line WLsel and each bit line BL to VSS. Details of the other operations are the same as those in the first example of the multiple-value write operation in the eighth embodiment. The length of a time during which the third example of the multiple-value write operation in the eighth embodiment is being executed is, for example, tProg1.

As described above, after once applying the ground voltage VSS to the bit line BL, the memory system MS may change the write time by changing the voltage of the bit line BL to the voltage VBLinh of the bit line BLinh of write-inhibit during the write operation. Also in such a case, the memory system MS can adjust the amount of rise of the threshold voltage of the memory cell transistor MT as the program target. Thus, according to the third example of the multiple-value write operation, the memory system MS of the eighth embodiment can form the threshold voltage distribution of the three states as illustrated in FIG. 105 in the cell unit CU as the program target.

[8-6] Advantages of Eighth Embodiment

As described above, the write operation for writing data with three values into memory cell transistors MT can be executed without the performance of a verify operation in the same manner as in the seventh embodiment. Accordingly, the memory system MS of the eighth embodiment can reduce the time for the write operation as in the seventh embodiment.

In the case of writing data with three values into the memory cell transistors MT, share coding can be utilized. Since the share coding can reduce the number of times of read per page, the speed of the read operation can be increased. In the share coding, a combination of unused states can exist in a set of the first memory cell transistor MTa and the second memory cell transistor MTb. For example, in the example illustrated in FIG. 105, the number of memory cell transistors MT distributed in state S1 of the three states can be two-thirds of that of the other states. In this case, the width of state S1 in the memory system MS can be set to be smaller than that of each of the other states.

As a result, in the memory device 20, the overlapping of the distribution between adjacent states can be reduced in a range of the threshold voltage of the memory cell transistor MT for use in a write of data. Therefore, the memory device 20 of the eighth embodiment can reduce the probability of error bit occurrence in the read operation.

[8-7] Modifications of Eighth Embodiment

First to third modifications of the eighth embodiment will be described below.

[8-7-1] First Modification of Eighth Embodiment

In the share coding, the combination of unused states may comprise another combination.

FIG. 109 is a table illustrating an example of a combination of states of memory cell transistors MT for use in the share coding of the memory device 20 of the first modification of the eighth embodiment. As illustrated in FIG. 109, in this modification, data is not allocated to the combination of state S2 of the first memory cell transistor MTa and state S2 of the second memory cell transistor MTb. Pieces of 3-bit data different from one another are allocated to the other combinations. In this case, in a cell unit CU including the combination of the memory cell transistor MTa and the memory cell transistor MTb, the number of the memory cell transistors MT distributed in state S2 is fewer, since the combination of state S2 of the memory cell transistor MTa and state S2 of the memory cell transistor MTb is not used.

FIG. 110 is a schematic diagram illustrating an example of a threshold voltage distribution of memory cell transistors MT of the memory device 20 of the first modification of the eighth embodiment. As illustrated in FIG. 110, the threshold voltage distribution of the memory cell transistors MT of this embodiment can form three states S0, S1, and S2. Since the number of the memory cell transistors MT distributed in state S2 is fewer, as described above, variations in the threshold voltages of the memory cell transistors MT distributed in state S2 can be small. Specifically, the variations in the threshold voltages of the memory cell transistors MT distributed in state S2 can be smaller than those in the threshold voltages of the memory cell transistors MT distributed in state S1. The influence of a program disturb or data retention is greater in a state having a higher threshold voltage than in a state having a lower threshold voltage. Therefore, in the memory device 20 according to the first modification of the eighth embodiment, the probability of error bit occurrence in a read operation can be lowered by reducing the number of memory cell transistors MT distributed in a specific state (for example, state S2) in which the influence of a program disturb or data retention is greater.

FIGS. 104 and 105 referred to in the description of the eighth embodiment correspond to a case in which the number of memory cell transistors MT distributed in state S1 is two-thirds of that in the other states. FIGS. 109 and 110 referred to in the description of the first modification of the eighth embodiment correspond to a case in which the number of memory cell transistors MT distributed in state S2 is two-thirds of that in the other states. The embodiment is not limited to the above. The memory system MS can set the number of memory cell transistors in any state to two-thirds of that of the other states, and can set the interval between two states interposing the aforementioned state therebetween to be small.

[8-7-2] Second Modifications of Eighth Embodiment

In the share coding, the number of states allocated to the first memory cell transistor MTa and the second memory cell transistor MTb may be another number. For example, in the share coding, each of the two memory cell transistors MTa and MTb can utilize six values, and 5-bit data can be stored in the two memory cell transistors MTa and MTb.

Figures 111, 112:
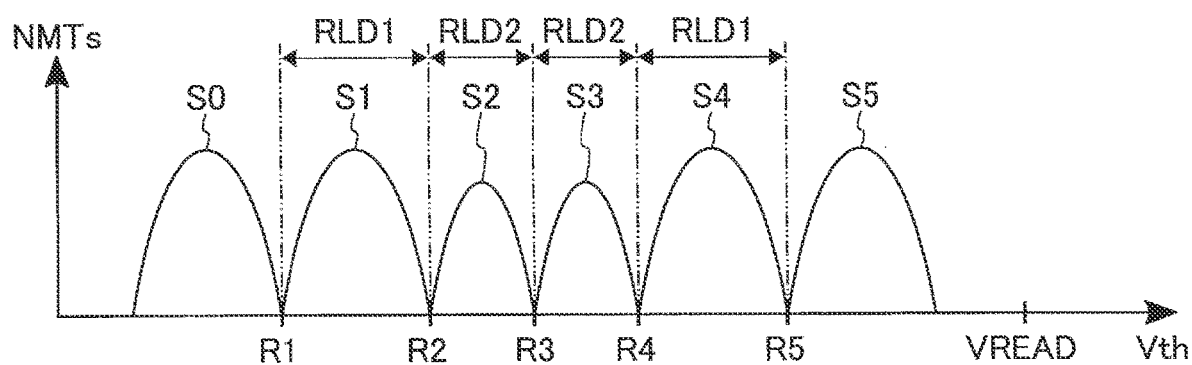
FIG. 111 is a table illustrating an example of a combination of states of memory cell transistors for use in share coding of a memory device of a second modification of the eighth embodiment.
FIG. 112 is a schematic diagram illustrating an example of a threshold voltage distribution of memory cell transistors of the memory device of the second modification of the eighth embodiment.

FIG. 111 is a table illustrating an example of a combination of states of memory cell transistors MT for use in the share coding of the memory device 20 of the second modification of the eighth embodiment. As illustrated in FIG. 111, in the second modification of the eighth embodiment, there are 36 combinations of six kinds of states S0 to S5 applicable to the first memory device MTa and six kinds of states S0 to S5 applicable to the second memory cell transistor MTb. On the other hand, 5-bit data is expressed by 32 combinations (25 combinations). Therefore, in this modification, data is not allocated to four combinations. For example, data is not allocated to the combination of state S2 of the first memory cell transistor MTa and each of states S2 and S3 of the second memory cell transistor MTb, and to the combination of state S3 of the first memory cell transistor MTa and each of states S2 and S3 of the second memory cell transistor MTb. Pieces of 5-bit data different from one another are allocated to the other combinations. In this case, in a cell unit CU including the combination of the memory cell transistor MTa and the memory cell transistor MTb, the number of the memory cell transistors MT distributed in states S2 and S3 is fewer, since the data allocated to states S2 and S3 of the memory cell transistor MTa and the memory cell transistor MTb is less.

FIG. 112 is a schematic diagram illustrating an example of a threshold voltage distribution of memory cell transistors MT of the memory device 20 of the second modification of the eighth embodiment. As illustrated in FIG. 112, the threshold voltage distribution of the memory cell transistors MT of this modification can form six states S0, S1, S2, S3, S4, and S5. Since the number of the memory cell transistors MT distributed in states S2 and S3 is fewer, as described above, variations in the threshold voltages of the memory cell transistors MT distributed in state S2 and variations in the threshold voltages of the memory cell transistors MT distributed in state S3 can be small. Specifically, the variations in the threshold voltages of the memory cell transistors MT distributed in state S2 or S3 can be smaller than those in the threshold voltages of the memory cell transistors MT distributed in state S0, S1, S4, and S5. In the second modification of the eighth embodiment, the width of each of states S2 and S3 can be set to be smaller than that of each of the other states. In other words, in the memory system MS, an interval RLD2 between the read voltages R2 and R3 (or between read voltages R3 and R4) can be set to be smaller than an interval RLD1 between the read voltages R1 and R2 (or between read voltages R4 and R5).

As a result, in the memory device 20 of the second modification of the eighth embodiment, the overlapping of the distribution between adjacent states can be reduced in a range of the threshold voltage of the memory cell transistor MT for use in a write of data. Therefore, the memory device 20 of the second modification of the eighth embodiment can reduce the probability of an error bit occurrence in the read operation.

[8-7-3] Third Modification of Eighth Embodiment

The combination of states for use in the share coding for storage of 5-bit data in the two memory cell transistors MTa and MTb is not limited to the second modification of the eighth embodiment.

FIG. 113 is a table illustrating an example of a combination of states of memory cell transistors MT for use in the share coding of the memory device 20 of the third modification of the eighth embodiment. As illustrated in FIG. 113, in the third modification of the eighth embodiment, data is not allocated to the combination of state S4 of the first memory cell transistor MTa and each of states S4 and S5 of the second memory cell transistor MTb, and to the combination of state S5 of the first memory cell transistor MTa and each of states S4 and S5 of the second memory cell transistor MTb. Pieces of 5-bit data different from one another are allocated to the other combinations. In this case, in a cell unit CU including the combination of the memory cell transistor MTa and the memory cell transistor MTb, the number of the memory cell transistors MT distributed in states S4 and S5 is fewer, since the data allocated to states S4 and S5 of the memory cell transistor MTa and the memory cell transistor MTb is less.

FIG. 114 is a schematic diagram illustrating an example of a threshold voltage distribution of memory cell transistors MT of the memory device 20 of the third modification of the eighth embodiment. As illustrated in FIG. 114, the threshold voltage distribution of the memory cell transistors MT of this embodiment can form six states S0, S1, S2, S3, S4, and S5. Since the number of the memory cell transistors MT distributed in states S4 and S5 is fewer as described above, variations in the threshold voltages of the memory cell transistors MT distributed in state S4 and S5 can be small. Specifically, the variations in the threshold voltages of the memory cell transistors MT distributed in state S4 can be smaller than those in the threshold voltages of the memory cell transistors MT distributed in state S1. In the third modification of the eighth embodiment, the width of state S4 can be set to be smaller than those of the other states. In other words, in the memory system MS, an interval RLD2 between the read voltages R4 and R5 can be set to be smaller than an interval RLD1 between the read voltages R1 and R2, between the read voltages R2 and R3, and between the read voltages R3 and R4.

Therefore, the memory device 20 of the third modification of the eighth embodiment can produce advantages similar to those of the second modification of the eighth embodiment. Furthermore, in the memory device 20 according to the third modification of the eighth embodiment, the probability of an error bit occurrence in a read operation can be lowered by reducing the number of memory cell transistors MT distributed in a specific state (for example, states S4 and S5) in which the influence of a program disturb or data retention is greater.

FIGS. 111 and 112 referred to in the description of the second modification of the eighth embodiment correspond to a case in which the number of memory cell transistors MT distributed in each of states S2 and S3 is two-thirds of that in the other states. FIGS. 113 and 114 referred to in the description of the third modification of the eighth embodiment correspond to a case in which the number of memory cell transistors MT distributed in each of states S4 and S5 is two-thirds of that in the other states. The embodiment is not limited to the above. The memory system MS can set the number of memory cell transistors in any state to two-thirds of that of the other states, and can set the interval between two states interposing the aforementioned state therebetween to be small.

The memory device 20 of the eighth embodiment and each of the modifications of the eighth embodiment can be expressed as follows. The memory device 20 includes a plurality of first memory cells that form a threshold voltage distribution having K kinds of states (K is an integer of 3 or more), and a plurality of second memory cells that form a threshold voltage distribution having the K kinds of states. N-bit data (N is an integer of 1 or more) less than a $K^2$ value is stored based on a combination of the K kinds of states of the first memory cells and the K kinds of states of the second memory cells. In each of the first memory cells and the second memory cells, the width of distribution of a state including a combination that is not used to store the N-bit data can be set to be smaller than the width of distribution of a state that is used to store the N-bit data.

[9] Ninth Embodiment

An information processing system 1 of the ninth embodiment is similar in configuration to that of the sixth embodiment. The ninth embodiment relates to a method for writing a plurality of pieces of page data in batch writing in a multiple-value write operation. A description will be given of the points in which the ninth embodiment differs from the first to eighth embodiments concerning the memory system MS.

[9-1] Circuit Configuration of Memory Cell Array

FIG. 115 is a circuit diagram illustrating an example of a circuit configuration of the memory cell array 207 provided in the memory device 20 of the ninth embodiment. FIG. 115 illustrates a plurality of string units SU included in a buffer region. As illustrated in FIG. 115, the buffer region includes a plurality of string units SU(1) to SU(h) (h is an integer of 2 or more). A set of the string units SU(1) to SU(h) includes at least one redundant page set. In FIG. 115, "(1)" is appended to each of the interconnects (word lines WL and the like) coupled to a NAND string NS of the string unit SU(1), and "(h)" is appended to each of the interconnects coupled to a NAND string NS of the string unit SU(h).

[9-2] Flow of Buffer Write Operation

Figure 116:
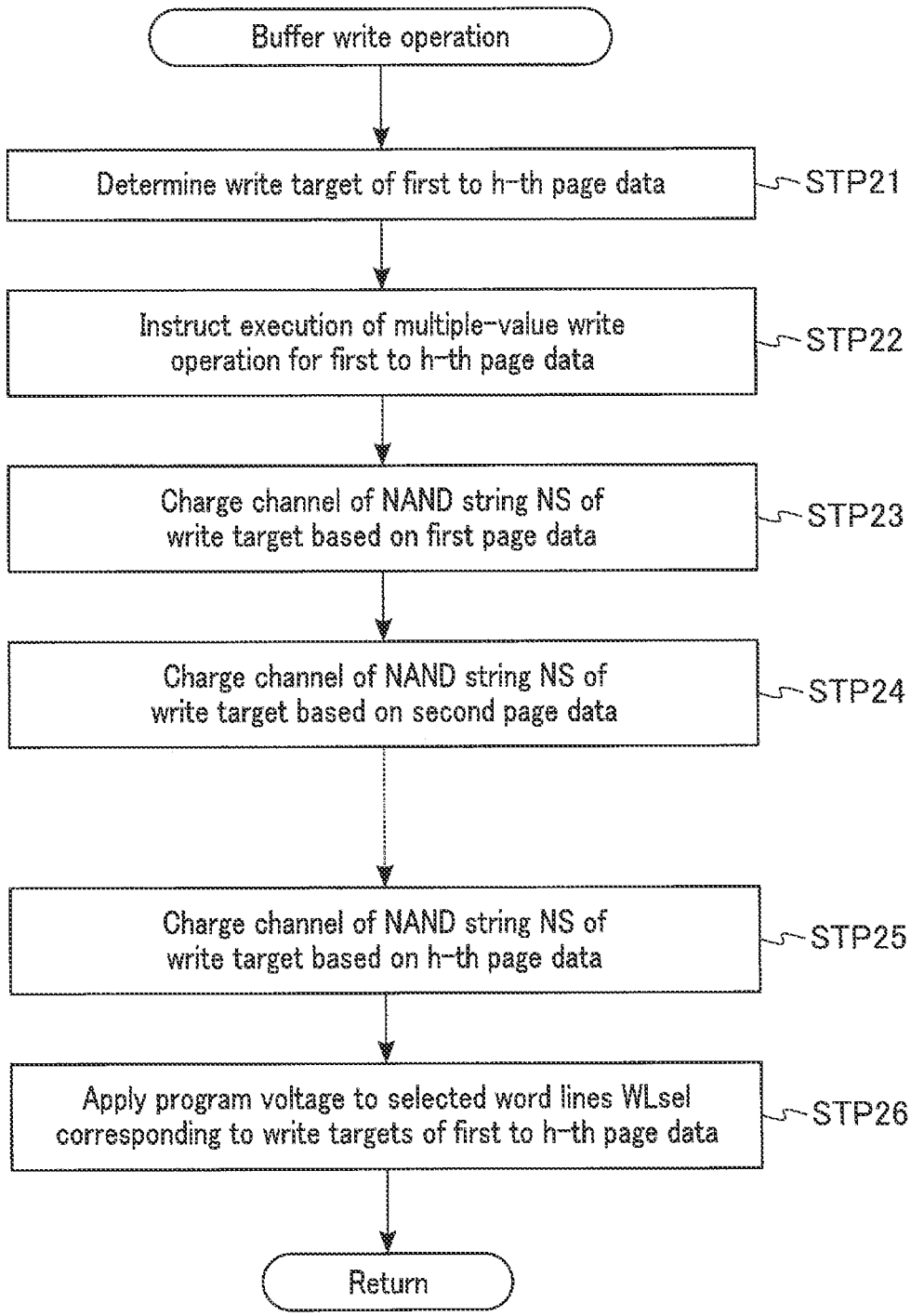
FIG. 116 is a flowchart illustrating an example of a buffer write operation of a memory system of the ninth embodiment.

FIG. 116 is a flowchart illustrating an example of the buffer write operation of the memory system MS of the ninth embodiment. As illustrated in FIG. 116, upon start of the buffer write operation of the first example, the memory controller 10 first determines a write target of first to h-th page data (STP21).

Next, the memory controller 10 instructs the memory device 20 to execute a multiple-value write operation for the first to h-th page data (STP22). Then, the memory device 20 starts a multiple-value write operation based on the received first to h-th page data and command.

Upon start of the multiple-value write operation, the memory device 20 first charges a channel of the NAND string NS of the write target based on the first page data (STP23). That is, the first page data is set to the channel of the associated NAND string NS.

Next, the memory device 20 charges a channel of the NAND string NS of the write target based on a second page data (STP24). That is, the second page data is set to the channel of the associated NAND string NS.

Similarly, the memory device 20 charges a channel of the NAND string NS of the write target of each of the third to (h−1)-th page data in accordance with data to be written. Then, the memory device 20 charges a channel of the NAND string NS of the write target based on the h-th page data (STP25). That is, the third to h-th page data are set to the channels of the associated NAND strings NS.

Next, the memory device 20 applies a program voltage VPGM to selected word lines WLsel corresponding to the write targets of the first to h-th page data (STP26). The number of the selected word lines WLsel to which the program voltage VPGM is applied in the processing of STP26 may vary depending on the number and location of the redundant pages allocated to the redundant page set, and the number and location of pages to which data is simultaneously written.

When the program voltage VPGM is applied to the selected word lines WLsel, the memory device 20 ends a series of the multiple-value write operation processing.

Then, the memory controller 10 detects that the memory device 20 has completed the multiple-value write operation, and completes a series of the buffer write operation (return) processing.

[9-3] First Example of Multiple-value Write Operation

FIG. 117 is a timing chart illustrating a first example of the multiple-value write operation of the memory device 20 of the ninth embodiment. As illustrated in FIG. 117, when the multiple-value write operation is started, the memory device 20 transitions from the ready state to the busy state. Before the start of the write operation, the voltages of the bit lines BL and the word lines WL are, for example, the ground voltage VSS. In the following, a word line WL that is selected in a spring unit SU(i) ("i" is a natural number of h or less) will be referred to as a "selected word line WLsel (i)". The voltage of the bit line BL is controlled as illustrated by a solid line when the bit line BL corresponds to a bit line BL as program target ("Program" in FIG. 117), and controlled as illustrated by a broken line when the bit line BL corresponds to a bit line BL of program-inhibit ("Inhibit" in FIG. 117).

At time t(1), the sequencer 204 applies a voltage VSG to a select gate line SGD(1), and in accordance with the data of a first page PG(1), applies the ground voltage VSS to the bit line BL as the program target, the voltage VBLinh to the bit line BL as the program-inhibit, and the ground voltage VSS to the other select gate lines SGD and selected word lines WLsel. The voltage VSG is a voltage that is higher than the ground voltage VSS and is able to turn on a select transistor ST1. Then, via the select transistor ST1 turned on in the string unit SU(1), the channel of the NAND string NS coupled to the bit line BL as the program-inhibit is charged to the voltage VBLinh. On the other hand, in the string unit SU(1), the channel of the NAND string NS coupled to the bit line BL as the program target is charged to the ground voltage VSS. The NAND strings NS of the string units SU other than the string unit SU(1) are not charged, since the select transistor ST1 is off. Thereafter, the sequencer 204 lowers the voltage of the select gate line SGD(1) from VSG to VSS, and fixes the channel voltage of each of the NAND strings NS of the string unit SU(1). In other words, the sequencer 204 sets the data of the first page PG(1) to the channel of each of the NAND strings NS in the string unit SU(1) through the processing at time t(1).

Next, at time t(2), the sequencer 204 applies the voltage VSG to a select gate line SGD(2), and in accordance with the data of a second page PG(2), applies the ground voltage VSS to the bit line BL as the program target, the voltage VBLinh to the bit line BL as the program-inhibit, and the ground voltage VSS to the other select gate lines SGD and selected word lines WLsel. Then, via the select transistor ST1 turned on in the string unit SU(2), the channel of the NAND string NS coupled to the bit line BL as the program target is charged to the voltage VBLinh. On the other hand, in the string unit SU(2), the channel of the NAND string NS coupled to the bit line BL as the program-inhibit is charged to the ground voltage VSS. The NAND strings NS of the string units SU other than the string unit SU(2) are not charged, since the select transistor ST1 is off. Thereafter, the sequencer 204 lowers the voltage of the select gate line SGD(2) from VSG to VSS, and fixes the channel voltage of each of the NAND strings NS of the string unit SU(2). In other words, the sequencer 204 sets the data of the second page PG(2) to the channel of each of the NAND strings NS in the string unit SU(2) through the processing at time t(2).

The sequencer 204 executes processing similar to that executed at time t(1) and time t(2), while changing the string unit SU to which data is set. At each of time t(3) to time t(h), the sequencer 204 sets the data of a third page PG(3) to an h-th page PG(h) to the channels of the NAND strings NS of string units SU(3) to SU(h), respectively.

Next, at time t(h+1), the sequencer 204 applies the program voltage VPGM to the selected word line WLsel, while applying the ground voltage VSS to each of the select gate lines SGD(1) to SGD(h). The selected word lines WL(1) to WLsel(h) respectively corresponding to the first page PG(1) to the h-th page PG(h) may be associated either with different word lines WL or with the same word line WL. The threshold voltage of the memory cell transistor MT to which the program voltage VPGM is applied is increased or maintained in accordance with the set data (channel voltage). Specifically, in the memory cell transistor MT in which the channel voltage is maintained at the voltage VSS, the threshold voltage is increased. On the other hand, in the memory cell transistor MT in which the channel voltage has increased in accordance with the voltage VBLinh, the increase in the threshold voltage is suppressed.

Based on the completion of the processing from time t(1) to time t(h+1), the sequencer 204 ends the multiple-value write operation, and transitions the memory device 20 from the busy state to the ready state. Accordingly, in the first example of the multiple-value write operation of the ninth embodiment, data can be written in batch writing in the cell units CU of the page set of the program target. tProg5 in FIG. 117 represents a time during which the first example of the multiple-value write operation of the ninth embodiment is being executed. tProg5 is shorter than the time in which the multiple-value write operation is executed h times, for example.

[9-4] Second Example of Multiple-value Write Operation

FIG. 118 is a timing chart illustrating a second example of the multiple-value write operation of the memory device 20 of the ninth embodiment. As illustrated in FIG. 118, when the multiple-value write operation is started, the memory device 20 transitions from the ready state to the busy state. Before the start of the write operation, the voltages of the bit lines BL and the word lines WL are, for example, the ground voltage VSS. The voltage of the bit line BL is controlled as illustrated by a solid line when the bit line BL corresponds to a bit line BL as program target ("Program" in FIG. 118), and controlled as illustrated by a broken line when the bit line BL corresponds to a bit line BL of program-inhibit ("Inhibit" in FIG. 118).

Then, at time t(0), the sequencer 204 applies a write pass voltage VPASS to each of the word lines WLsel(1) to WLsel(h), while applying the ground voltage VSS to each of the select gate lines SGD(1) to SGD(h). The write pass voltage VPASS is a voltage higher than the ground voltage VSS and lower than the program voltage VPGM. Accordingly, the channel voltage of each of the NAND strings NS of the string units SU(1) to SU(h) is boosted based on the voltage of the selected word line WLsel. At time t(0), the write pass voltage VPASS may be applied to the word lines WL other than the selected word line WLsel.

At time t(1), the sequencer 204 applies the voltage VSG to a select gate line SGD(1), and in accordance with the data of the first page, applies the ground voltage VSS to the bit line BL as the program target, the voltage VBLinh to the bit line BL as the program-inhibit, and the ground voltage VSS to the other select gate lines SGD and selected word lines WLsel. Then, via the select transistor ST1 turned on in the string unit SU(1), the channel of the NAND string NS coupled to the bit line BL as the program target is discharged. On the other hand, in the string unit SU(1), the channel of the NAND string NS coupled to the bit line BL as the program-inhibit is suppressed from being discharged due to the application of the voltage VBLinh to the bit line BL. The NAND strings NS of the string units SU other than the string unit SU(1) are not discharged, since the select transistor ST1 is off. Thereafter, the sequencer 204 lowers the voltage of the select gate line SGD(1) from VSG to VSS, and fixes the channel voltages of the NAND strings NS of the string unit SU(1). Accordingly, the sequencer 204 can set the data of the first redundant page PG1 to the channel of each of the NAND strings NS in the string unit SU(1) through the processing at time t(1).

Then, the sequencer 204 executes the processing at time t(2) to time t(h+1) in the same manner as in the first example of the multiple-value write operation in the ninth embodiment. Also in such a case, the second example of the multiple-value write operation in the ninth embodiment can write data of a plurality of pages to a plurality of cell units CU in batch writing in the same manner as in the first example of the multiple-value write operation in the ninth embodiment.

[9-5] Command Sequence of Multiple-value Write Operation

FIG. 119 is a sequence diagram showing an example of a command sequence of a multiple-value write operation of the memory device 20 of the ninth embodiment. As illustrated in FIG. 119, when instructing the memory device 20 to execute a multiple-value write operation, the memory controller 10 transmits, for example, "zzh", "80h", "ADD (1)", "DAT(1)", "ADD(2)", "DAT(2)", . . . "ADD(h) (h is an integer of 2 or more)", "DAT(h)", and "10h" to the memory device 20 in this order. "zzh" is a command designating a multiple-value write operation in batch writing for a plurality of pages as a target. "ADD (1)", "ADD (2)", . . . , "ADD (h) are addresses of a redundant page set selected as a target of a write operation. A set of ADD(1) and DAT(1), a set of ADD(2) and DAT(2), . . . and a set of ADD(h) and DAT(h) are respectively associated with the redundant pages PG(1), PG(2), . . . and PG(h).

When the memory device 20 receives the command "10h", the sequencer 204 causes the memory device 20 to transition from the ready state to the busy state based on the command and the addresses "ADD(1)", . . . , "ADD(h)" stored in the register circuit 203. The sequencer 204 executes a series of the multiple-value write operation processing as illustrated in either FIG. 117 or 118. Then, data DAT(1) to DAT (h) are written in a plurality of cell units CU respectively associated with "ADD(1)", . . . , "ADD(h)".

[9-6] Advantages of Ninth Embodiment

As described above, the memory device 20 of the ninth embodiment can write data in a plurality of pages in batch writing (simultaneously). As a result, the memory storage device 20 of the ninth embodiment can increase the speed of the write operation. Furthermore, the reliability of data can be improved by combining the sixth embodiment and the ninth embodiment. By combining the sixth embodiment and the ninth embodiment, data of a plurality of pages (h pages)×redundant page data (k pieces of data) may be written in the memory device 20 in batch writing (simultaneously) in the ninth embodiment of the memory system MS. The ninth embodiment may be combined with any of the first to eighth embodiments.

The ninth embodiment concerns a case in which, after writing the same data in a plurality of pages, the memory system MS omits a verify operation (verify read); however, the embodiment is not limited to this case. After writing the same data simultaneously in a plurality of pages, the memory system MS may execute a verify read, and may execute an additional write operation if there is a cell that does not reach a predetermined threshold. The verify read in the ninth embodiment is executed independently page by page for data of a plurality of pages that were, for example, written simultaneously. Thereafter, the memory system MS may set a channel voltage (may set data) of a NAND string NS independently page by page for the memory cell transistors MT that have not reached the verify level, and may execute an additional write operation.

[10] Others

In the data allocation of the embodiments described above, data allocation may be exchanged between pages. The commands used in the above explanations of the embodiments are mere examples. For example, each of the commands "01h" to "05h", "xxh", "yyh", and "zzh" may be replaced with any other command. The commands, such as "01h" to "05h", designating a read target page, may be omitted by including page information in an address "ADD". The address "ADD" may be transmitted in a plurality of cycles. The command sequences explained in the above-described embodiments are mere examples. Any other command sequences may be used, as long as they can instruct the operations of the embodiments described above. In the read operation of the first embodiment, the sequencer 204 may transition the memory device 20 from the busy state to the ready state based on the confirmation of data. In this case, the memory controller 10 instructs the memory device 20 to output the confirmed page data after instructing the memory device 20 to transfer the data determination result to the latch circuit XDL.

In the fourth and fifth embodiments, a plurality of planes LUN are operated in parallel; however, this is not limited to a case in which the operations are started simultaneously. The operations of the planes LUN may be started at different times, as long as certain periods of the operations overlap. For example, if the four planes LUN1 to LUN4 are operated in parallel, the operations may be executed in the order of the start of the operation of the plane LUN1, the start of the operation of the plane LUN2, the start of the operation of the plane LUN3, the start of the operation of the plane LUN4, the end of the operation of the plane LUN1, the end of the operation of the plane LUN2, the end of the operation of the plane LUN3, and the end of the operation of the plane LUN4. In this example, the start of the operation of plane LUN4 and the end of the operation of the plane LUN1 may be executed in reverse order.

The above descriptions of the fourth and fifth embodiments concern the case in which the memory device 20 includes the four planes LUN; however, the embodiments are not limited to this case. Each of the fourth and fifth embodiments is applicable to a case in which the memory device 20 includes two or more planes LUN. In the fourth and fifth embodiments, if a memory cell array 207 for a multiple value or less and a memory cell array 207 for a super-multiple value are combined, the memory cell array 207 for a multiple value or less is used as, for example, a buffer region for increasing the operation speed. Thus, in the fourth and fifth embodiments, the operation speed of the memory device 20 can be increased by combining a memory cell array 207 for a multiple value or less and a memory cell array 207 for a super-multiple value.

The operations of the redundant page read and the redundant page batch read in the sixth to ninth embodiments are mere examples. Detailed operations of the redundant page read and the redundant page batch read can be suitably changed in accordance with the circuit configuration of the sense amplifier unit SAU.

The voltage applied to the selected word line Wlsel in a read operation is, for example, the same as that the signal line CG through which the driver circuit 206 applies a voltage to the row decoder module 208. A level of the voltage applied to each of the interconnects and a period of voltage application can be roughly estimated by inspecting the voltage of the corresponding signal line CG. When estimating a voltage of a select gate line, a word line, or the like from the voltage of each signal line coupled to the driver circuit 206, a voltage drop due to a transistor TR included in a row decoder RD may be taken into consideration. In this case, the voltage of each of the select gate line and the word line is lower than that applied to the corresponding signal line by the voltage drop of the transistor TR.

In the present specification, the term "couple" refers to electrical coupling, and does not exclude interposition of another element therebetween. The "ON state" is intended to indicate that a voltage equal to or higher than the threshold voltage of the corresponding transistor ("H" level voltage) is applied to the gate of the transistor. The "OFF state" is intended to indicate that a voltage lower than the threshold voltage of the corresponding transistor ("L" level voltage) is applied to the gate of the transistor. A minute current, such as a leak current, may flow in a transistor of the OFF state. The "read voltage" may be referred to as the "read level". The "lowest read voltage" refers to the read voltage that is lowest of all voltages in a designated group. The "highest read voltage" refers to the read voltage that is highest of all voltages in a designated group.

Some or all of the embodiments described above can be described as in the following supplementary notes, but is not limited thereto:

[Supplementary Note 1]

A memory device including:
  a first memory cell array group that includes a-number of first memory cell arrays (a being an integer of 1 or more), each including a memory cell storing data with a threshold of a K-value (K being an integer of 1 or more);
  a second memory cell group that includes b-number of second memory cell arrays (b being an integer of 1 or more), each including a memory cell storing data with a threshold of an L-value (L being an integer greater than K); and
  a sequencer,
  wherein the sequencer simultaneously executes a write of data of a K-value or less into c-number of first memory cell arrays (c being equal to or smaller than a) and a write of data of an L-value or less into d-number of second memory cell arrays (d being equal to or smaller than b).

[Supplementary Note 2]

The memory device of Supplementary Note 1, further including:
  a first sense amplifier unit coupled to the memory cell of the first memory cell array; and
  a second sense amplifier unit coupled to the memory cell of the second memory cell array, wherein the second sense amplifier unit includes latch circuits greater in number than those included in the first sense amplifier unit.

[Supplementary Note 3]

A memory device including:

a first memory cell array group that includes a-number of first memory cell arrays (a being an integer of 1 or more), each including a memory cell selectably storing data with a threshold of a K-value (K being an integer of 1 or more) or a threshold of an L-value (L being an integer greater than K);

a second memory cell array group that includes b-number of second memory cell arrays (b being an integer of 1 or more), each including a memory cell selectably storing data with a threshold of the K-value (K being an integer of 1 or more) or a threshold of the L-value (L being an integer greater than K); and a sequencer, wherein the sequencer simultaneously executes a write of data of a K-value or less into c-number of first memory cell arrays (c being equal to or smaller than a) and a write of data of an L-value or less into d-number of second memory cell arrays (d being equal to or smaller than b).

[Supplementary Note 4]

The memory device of Supplementary Note 3, further including:

a first sense amplifier set coupled to the memory cell of the first memory cell array;

a second sense amplifier set coupled to the memory cell of the second memory cell array;

a latch circuit coupled to the first sense amplifier set and the second sense amplifier set; and a sequencer, wherein, when writing data of the L-value or less into the memory cell of the first memory cell array group, the sequencer drives both the first sense amplifier set and the latch circuit, and when writing data of the L-value or less into the memory cell of the second memory cell array group, the sequencer drives both the second sense amplifier set and the latch circuit.

[Supplementary Note 5]

The memory device of Supplementary Note 1 or 3, wherein the writing of data into the first memory cell array and the writing of data into the second memory cell array are started at different times.

[Supplementary Note 6]

The memory device of Supplementary Note 1 or 3, wherein the writing of data into the first memory cell array and the writing of data into the second memory cell array are started at substantially same times.

[Supplementary Note 7]

A memory device including:

a first memory cell array including a plurality of pages, each including a plurality of memory cell transistors capable of storing data of a K-value (K is an integer of 1 or more); and a controller, wherein the controller writes data into a first page and a second page included in the plurality of pages of the first memory cell array without executing a verify read.

[Supplementary Note 8]

The memory device of Supplementary Note 7, wherein the K-value is a two-value, a three-value, or a four-value.

[Supplementary Note 9]

The memory device of Supplementary Note 7, wherein, one column address is allocated to the first page and the second page, when reading the first page and the second page, if one or more of read results are "0" data, the controller treats the data of the column address as "0" data.

[Supplementary Note 10]

The memory device of Supplementary Note 7, wherein one column address is allocated to the first page and the second page, when reading the first page and the second page in batch reading, if one or more of read results are determined to be "0" data based on a sense level, the controller treats the data of the column address as "0" data.

[Supplementary Note 11]

The memory device of Supplementary Note 7, wherein, in a read operation, after reading the data of each of the first page and the second page, the controller executes majority processing from the data of the first page and the second page, and determines a result of the majority processing as a read result.

[Supplementary Note 12]

The memory device of Supplementary Note 7, wherein the controller writes data into a third page included in the plurality of pages of the first memory cell array without executing a verify read.

[Supplementary Note 13]

The memory device of Supplementary Note 12, wherein in a read operation, after reading data of each of the first page, the second page, and the third page, the controller executes majority processing from the data of the first page, the second page, and the third page, and determines a result of the majority processing as a read result.

[Supplementary Note 14]

The memory device of Supplementary Note 7, wherein the controller writes data into T page (T is an integer of 1 or more) included in the plurality of pages of the first memory cell array without executing a verify read.

[Supplementary Note 15]

The memory device of Supplementary Note 14, wherein in a read operation, after reading data of each of the first page through the T page, the controller executes majority processing from the data of the first page through the T page, and determines a result of the majority processing as a read result.

[Supplementary Note 16]

A memory system including:

the memory device of Supplementary Note 7, further including a second memory cell array including a plurality of pages, each including a plurality of memory cell transistors capable of storing data of an L-value (L is an integer greater than K); and a controller that controls the memory device, wherein the controller copies data written in the first memory cell array into the second memory cell array.

[Supplementary Note 17]

A memory system including:

the memory device of Supplemental Note 7, further including a second memory cell array including a plurality of pages, each including a plurality of memory cell transistors capable of storing data of an L-value (L is an integer greater than K); and a controller that controls the memory device, wherein, when data is written in all pages in a single block of the first memory cell array, the memory controller copies the data written in that single block into the second memory cell array, and erases the data written in that single block.

[Supplementary Note 18]

A memory system including:
  a memory cell array including a plurality of pages, each including a plurality of memory cell transistors capable of storing data of a K-value (K is an integer of 2 or more); and
  a controller that executes a write operation,
  wherein in the write operation, the controller
    writes data into a first page included in the plurality of pages without executing a verify read, and
    applies a program voltage to the memory cell transistors in the first page in (K−1) number of times or less.

[Supplementary Note 19]

The memory device of Supplementary Note 18, further including a plurality of bit lines respectively coupled to the memory cell transistors,
  wherein, when applying a program voltage to the plurality of memory cell transistors of the first page in the write operation, the controller applies first to K-th voltages different from one another respectively to the plurality of bit lines in accordance with data of the first page.

[Supplementary Note 20]

A memory device including:
  a memory cell array including a plurality of pages, each including a plurality of memory cell transistors capable of storing data of a K-value (K being an integer of 1 or more);
  a first word line coupled to the plurality of memory cell transistors of a first page of the plurality of pages;
  a plurality of first select transistors respectively coupled to the plurality of memory cell transistors of the first page;
  a second word line coupled to the plurality of memory cell transistors of a second page of the plurality of pages;
  a plurality of second select transistors respectively coupled to the plurality of memory cell transistors of the second page; and
  a controller,
  wherein, upon receipt of first page data associated with the first page, second page data associated with the second page, and a command instructing a write operation, the controller executes the write operation, and
  in the write operation, the controller
    writes data into the first page and the second page without executing a verify read,
    sets the first page data to a channel of each of the plurality of memory cell transistors of the first page, while applying a first voltage to the plurality of first select transistors,
    sets the second page data to a channel of each of the plurality of memory cell transistors of the second page, while applying the first voltage to the plurality of second select transistors, and
    after setting the first page data and the second page data, applies a program voltage higher than the first voltage to each of the first word line and the second word line, while applying a second voltage lower than the first voltage to each of the plurality of first select transistors and the plurality of second select transistors.

[Supplementary Note 21]

A memory device including:
  a plurality of first memory cells that form a threshold voltage distribution including K kinds of states (K is an integer of 3 or more), and
  a plurality of second memory cells that form a threshold voltage distribution including the K kinds of states,
  wherein N-bit data (N is an integer of 1 or more) less than a $K^2$-value is stored based on a combination of the K kinds of states of the plurality of first memory cells and the K kinds of states of the plurality of second memory cells, and
  in each of the plurality of first memory cells and the plurality of second memory cells, the width of distribution of states not used to store the N-bit data is smaller than that of distribution of states used to store the N-bit data.

While several embodiments have been described, these embodiments have been presented by way of example and are not intended to limit the scope of the invention. The novel embodiments described herein can be implemented in a variety of other forms; furthermore, various omissions, substitutions, and changes can be made without departing from the spirit of the invention. The embodiments and modifications are included in the scope and spirit of the invention and are included in the scope of the claimed inventions and their equivalents.

What is claimed is:

1. A memory device comprising:
  a plurality of memory cells each storing 5-bit data including first bit data, second bit data, third bit data, fourth bit data, and fifth bit data based on a threshold voltage, the plurality of memory cells storing a first page, a second page, a third page, a fourth page, and a fifth page, and the first page, the second page, the third page, the fourth page, and the fifth page respectively including the first bit data, the second bit data, the third bit data, the fourth bit data, and the fifth bit data;
  a word line coupled to the plurality of memory cells; and
  a controller that executes a read operation for reading data from the plurality of memory cells by applying a read voltage to the word line,
  wherein:
  the controller performs control such that numbers of times the controller applies read voltages different from one another to the word line in read operations for the first page, the second page, the third page, the fourth page, and the fifth page are 7, 6, 6, 6, and 6, respectively,
  the 5-bit data is one of a plurality of data sets including a first data set to a 32nd data set different from one another, the threshold voltage of the memory cell being included in one of a first state to a 32nd state different from one another, and the plurality of data sets being respectively allocated to the first state to the 32nd state, so that adjacent states are different only in respect of one bit,
  a first read voltage to a 31st read voltage different from one another are set to correspond to adjacent states of the first state to the 32nd state, and
  the controller performs control such that an interval between read voltages which the controller applies to the word line in a read operation for each of the first page to the fifth page corresponds to three states at minimum and eight states at maximum.

2. The memory device of claim 1, wherein one of a first condition and a second condition is satisfied, the first condition being that a lowest read voltage for use in the read operation for the first page is set apart by one state from the first read voltage, which is the lowest of all the first read voltage to the 31st read voltage, and the second condition being that a highest read voltage for use in the read operation for the first page is set apart by one state from the 31st read voltage, which is the highest of all the first read voltage to the 31st read voltage.

3. The memory device of claim 2, wherein none of the other one of the first condition and the second condition, a third condition, a fourth condition, and a fifth condition are satisfied, the third condition being that an interval between read voltages for use in the read operation for the first page corresponds to three states at minimum, the fourth condition being that an interval between read voltages for use in a read operation for a page using the first read voltage or the 31st read voltage corresponds to three states at minimum, and the fifth condition being that the first page to the fifth page include a page in which both the first read voltage and the 31st read voltage are used for a read operation.

4. The memory device of claim 1, wherein both of a second condition and a fourth condition are satisfied, the second condition being that a highest read voltage for use in the read operation for the first page is set apart by one state from the 31st read voltage, which is the highest of all the first read voltage to the 31st read voltage, and the fourth condition being that an interval between read voltages for use in a read operation for a page using the first read voltage or the 31st read voltage corresponds to three states at minimum.

5. The memory device of claim 4, wherein none of a first condition, a third condition, and a fifth condition are satisfied, the first condition being that a lowest read voltage for use in the read operation for the first page is set apart by one state from the first read voltage, which is the lowest of all the first read voltage to the 31st read voltage, the third condition being that an interval between read voltages for use in the read operation for the first page corresponds to three states at minimum, and the fifth condition being that the first page to the fifth page include a page in which both the first read voltage and the 31st read voltage are used for a read operation.

6. The memory device of claim 1, wherein all of a first condition, a second condition, and a third condition are satisfied, the first condition being that a lowest read voltage for use in the read operation for the first page is set apart by one state from the first read voltage, which is the lowest of all the first read voltage to the 31st read voltage, the second condition being that a highest read voltage for use in the read operation for the first page is set apart by one state from the 31st read voltage, which is the highest of all the first read voltage to the 31st read voltage, and the third condition being that an interval between read voltages for use in the read operation for the first page corresponds to three states at minimum.

7. The memory device of claim 6, wherein neither of a fourth condition and a fifth condition is satisfied, the fourth condition being that an interval between read voltages for use in a read operation for a page using the first read voltage or the 31st read voltage corresponds to three states at minimum, and the fifth condition being that the first page to the fifth page include a page in which both the first read voltage and the 31st read voltage are used for a read operation.

8. The memory device of claim 1, wherein all of a second condition, a third condition, and a fourth condition are satisfied, the second condition being that a highest read voltage for use in the read operation for the first page is set apart by one state from the 31st read voltage, which is the highest of all the first read voltage to the 31st read voltage, the third condition being that an interval between read voltages for use in the read operation for the first page corresponds to three states at minimum, and the fourth condition being that an interval between read voltages for use in a read operation for a page using the first read voltage or the 31st read voltage corresponds to three states at minimum.

9. The memory device of claim 6, wherein neither of a first condition and a fifth condition is satisfied, the first condition being that a lowest read voltage for use in the read operation for the first page is set apart by one state from the first read voltage, which is the lowest of all the first read voltage to the 31st read voltage, and the fifth condition being that the first page to the fifth page include a page in which both the first read voltage and the 31st read voltage are used for a read operation.

10. The memory device of claim 1, wherein all of a first condition, a second condition, a third condition, and a fourth condition are satisfied, the first condition being that a lowest read voltage for use in the read operation for the first page is set apart by one state from the first read voltage, which is the lowest of all the first read voltage to the 31st read voltage, the second condition being that a highest read voltage for use in the read operation for the first page is set apart by one state from the 31st read voltage, which is the highest of all the first read voltage to the 31st read voltage, the third condition being that an interval between read voltages for use in the read operation for the first page corresponds to three states at minimum, and the fourth condition being that an interval between read voltages for use in a read operation for a page using the first read voltage or the 31st read voltage corresponds to three states at minimum.

11. The memory device of claim 10, wherein a fifth condition is not satisfied, the fifth condition being that the first page to the fifth page include a page in which both the first read voltage and the 31st read voltage are used for a read operation.

12. The memory device of claim 1, wherein both of a third condition and a fifth condition are satisfied, the third condition being that an interval between read voltages for use in the read operation for the first page corresponds to three states at minimum, and the fifth condition being that the first page to the fifth page include a page in which both the first read voltage and the 31st read voltage are used for a read operation.

13. The memory device of claim 12, wherein none of a first condition, a second condition, and a fourth condition are satisfied, the first condition being that a lowest read voltage for use in the read operation for the first page is set apart by one state from the first read voltage, which is the lowest of all the first read voltage to the 31st read voltage, the second condition being that a highest read voltage for use in the read operation for the first page is set apart by one state from the 31st read voltage, which is the highest of all the first read voltage to the 31st read voltage, and the fourth condition being that an interval between read voltages for use in a read operation for a page using the first read voltage or the 31st read voltage corresponds to three states at minimum.

14. A memory device comprising:
a plurality of memory cells each storing 5-bit data including first bit data, second bit data, third bit data, fourth bit data, and fifth bit data based on a threshold voltage, the plurality of memory cells storing a first page, a second page, a third page, a fourth page, and a fifth page, and the first page, the second page, the third page, the fourth page, and the fifth page respectively including the first bit data, the second bit data, the third bit data, the fourth bit data, and the fifth bit data;

a word line coupled to the plurality of memory cells; and a controller that executes a read operation for reading data from the plurality of memory cells by applying a read voltage to the word line, wherein:

the controller performs control such that numbers of times the controller applies read voltages different from one another to the word line in read operations for the first page, the second page, the third page, the fourth page, and the fifth page are 7, 6, 6, 6, and 6, respectively, the 5-bit data is one of a plurality of data sets including a first data set to a 32nd data set different from one another, the threshold voltage of the memory cell being included in one of a first state to a 32nd state different from one another, and the plurality of data sets being respectively allocated to the first state to the 32nd state, so that adjacent states are different only in respect of one bit, a first read voltage to a 31st read voltage different from one another are set to correspond to adjacent states of the first state to the 32nd state, and the controller performs control such that an interval between read voltages which the controller applies to the word line in a read operation for each of the first page to the fifth page corresponds to three states at minimum and nine states at maximum.

15. The memory device of claim 14, wherein an interval between read voltages in the read operation for the first page comprises only four states.

16. A memory device comprising:

a plurality of memory cells each storing 5-bit data including first bit data to fifth bit data based on a threshold voltage, the plurality of memory cells storing a first page to a fifth page respectively corresponding to the first bit data to the fifth bit data;

a word line coupled to the plurality of memory cells; and a controller that executes a read operation, wherein:

a threshold voltage of the memory cells is included in one of a first state to a 32nd state different from one another, pieces of 5-bit data different from one another are allocated to each of the first state to the 32nd state, a first read voltage to a 31st read voltage are set to adjacent states of the first state to the 31st state in ascending order of read voltage, and the controller is configured to perform control comprising:

in the read operation for the first page, executing seven reads of respectively applying the fourth read voltage, the eighth read voltage, the 12th read voltage, the 18th read voltage, the 22nd read voltage, the 26th read voltage, and the 30th voltage to the word line;

in the read operation for the second page, executing six reads of respectively applying the sixth read voltage, the 13th read voltage, the 16th read voltage, the 20th read voltage, the 23rd read voltage, and the 28th read voltage to the word line;

in the read operation for the third page, executing six reads of respectively applying the third read voltage, the ninth read voltage, the 15th read voltage, the 21st read voltage, the 27th read voltage, and the 31st read voltage to the word line;

in the read operation for the fourth page, executing six reads of respectively applying the second read voltage, the seventh read voltage, the 10th read voltage, the 14th read voltage, the 17th read voltage, and the 24th read voltage to the word line; and in the read operation for the fifth page, executing six reads of respectively applying the first read voltage, the fifth read voltage, the 11th read voltage, the 19th read voltage, the 25th read voltage, and the 29th read voltage to the word line.

17. The memory device of claim 16, wherein each of the first read voltage and the second read voltage is negative.

18. The memory device of claim 16, wherein, in the read operation for the first page, the controller applies the 30th read voltage, the 26th read voltage, the 22nd read voltage, the 18th read voltage, the 12th read voltage, the eighth read voltage, and the fourth voltage to the word line in this order.

* * * * *